US010872820B2

(12) United States Patent
Block et al.

(10) Patent No.: US 10,872,820 B2
(45) Date of Patent: Dec. 22, 2020

(54) INTEGRATED CIRCUIT STRUCTURES

(71) Applicant: Intel Corporation, Santa Clara, CA (US)

(72) Inventors: Bruce Block, Portland, OR (US); Valluri R. Rao, Saratoga, CA (US); Patrick Morrow, Portland, OR (US); Rishabh Mehandru, Portland, OR (US); Doug Ingerly, Portland, OR (US); Kimin Jun, Portland, OR (US); Kevin O'Brien, Portland, OR (US); Paul Fischer, Portland, OR (US); Szyua S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/316,330

(22) PCT Filed: Aug. 25, 2017

(86) PCT No.: PCT/US2017/048752
§ 371 (c)(1),
(2) Date: Jan. 8, 2019

(87) PCT Pub. No.: WO2018/039645
PCT Pub. Date: Mar. 1, 2018

(65) Prior Publication Data
US 2020/0035560 A1 Jan. 30, 2020

Related U.S. Application Data

(63) Continuation-in-part of application No. PCT/US2016/068564, filed on Dec. 23, 2016, and a
(Continued)

(51) Int. Cl.
H01L 23/52 (2006.01)
H01L 27/092 (2006.01)
(Continued)

(52) U.S. Cl.
CPC .... *H01L 21/8221* (2013.01); *H01L 21/30625* (2013.01); *H01L 21/6835* (2013.01);
(Continued)

(58) Field of Classification Search
CPC . H01L 22/14; H01L 23/528; H01L 23/53233; H01L 24/03; H01L 24/05;
(Continued)

(56) References Cited

U.S. PATENT DOCUMENTS 5,869,867 A 2/1999 Takeuchi
6,424,020 B1 * 7/2002 Vu .................. A61B 3/113
257/507
(Continued)

FOREIGN PATENT DOCUMENTS

EP 1624487 A2 * 2/2006 .......... H01L 27/1116
EP 1638142 A2 * 3/2006 .......... G11C 11/412
(Continued)

OTHER PUBLICATIONS

International Search Report and Written Opinion from PCT/US2017/048752 notified Dec. 12, 2017, 14 pgs.
(Continued)

*Primary Examiner* — Ida M Soward
(74) *Attorney, Agent, or Firm* — Green, Howard & Mughal LLP

(57) ABSTRACT

Integrated circuit cell architectures including both front-side and back-side structures. One or more of back-side implant, semiconductor deposition, dielectric deposition, metallization, film patterning, and wafer-level layer transfer is integrated with front-side processing. Such double-side processing may entail revealing a back side of structures fabricated from the front-side of a substrate. Host-donor substrate assemblies may be built-up to support and protect front-side structures during back-side processing. Front-side devices,
(Continued)

such as FETs, may be modified and/or interconnected during back-side processing. Back-side devices, such as FETs, may be integrated with front-side devices to expand device functionality, improve performance, or increase device density.

11 Claims, 80 Drawing Sheets

Related U.S. Application Data continuation-in-part of application No. PCT/US2017/048475, filed on Aug. 24, 2017.

(60) Provisional application No. 62/380,316, filed on Aug. 26, 2016.

(51) Int. Cl.
| | |
|---|---|
| *H01L 27/12* | (2006.01) |
| *H01L 29/04* | (2006.01) |
| *H01L 29/06* | (2006.01) |
| *H01L 29/08* | (2006.01) |
| *H01L 29/16* | (2006.01) |
| *H01L 29/20* | (2006.01) |
| *H01L 21/822* | (2006.01) |
| *H01L 21/306* | (2006.01) |
| *H01L 21/683* | (2006.01) |
| *H01L 21/8238* | (2006.01) |
| *H01L 21/66* | (2006.01) |
| *H01L 23/528* | (2006.01) |
| *H01L 23/532* | (2006.01) |
| *H01L 23/00* | (2006.01) |
| *G01R 1/073* | (2006.01) |
| *H01L 25/065* | (2006.01) |
| *H01L 29/66* | (2006.01) |

(52) U.S. Cl.
CPC ......... *H01L 21/823807* (2013.01); *H01L 21/823814* (2013.01); *H01L 21/823821* (2013.01); *H01L 21/823871* (2013.01); *H01L 21/823878* (2013.01); *H01L 22/14* (2013.01); *H01L 23/528* (2013.01); *H01L 23/53233* (2013.01); *H01L 24/03* (2013.01); *H01L 24/05* (2013.01); *H01L 27/0924* (2013.01); *H01L 27/1207* (2013.01); *H01L 29/04* (2013.01); *H01L 29/0696* (2013.01); *H01L 29/0847* (2013.01); *H01L 29/16* (2013.01); *H01L 29/20* (2013.01); *G01R 1/07307* (2013.01); *H01L 24/08* (2013.01); *H01L 25/0657* (2013.01); *H01L 27/1214* (2013.01); *H01L 27/1222* (2013.01); *H01L 29/66545* (2013.01); *H01L 2221/68345* (2013.01); *H01L 2221/68363* (2013.01); *H01L 2221/68381* (2013.01); *H01L 2224/08147* (2013.01); *H01L 2225/06565* (2013.01)

(58) Field of Classification Search
CPC . H01L 27/0924; H01L 27/1207; H01L 29/04; H01L 29/0696; H01L 29/0847; H01L 29/16; H01L 29/20; H01L 27/1214; H01L 27/1222
See application file for complete search history.

(56) References Cited

U.S. PATENT DOCUMENTS

| | | | |
|---|---|---|---|
| 6,455,398 B1 | 9/2002 | Fonstad et al. | |
| 6,627,953 B1* | 9/2003 | Vu | A61B 3/113 |
| | | | 257/347 |
| 7,402,866 B2 | 7/2008 | Liang et al. | |
| 7,521,715 B2 | 4/2009 | Jang et al. | |
| 7,825,472 B2* | 11/2010 | Park | H01L 27/0688 |
| | | | 257/351 |
| 8,084,795 B2* | 12/2011 | Pan | H01L 27/15 |
| | | | 257/288 |
| 8,154,910 B2 | 4/2012 | Park et al. | |
| 8,301,436 B2 | 10/2012 | Wang | |
| 8,354,675 B2* | 1/2013 | Kwon | H01L 27/10867 |
| | | | 257/301 |
| 8,395,191 B2* | 3/2013 | Or-Bach | H01L 21/76898 |
| | | | 257/213 |
| 9,129,926 B2* | 9/2015 | Koo | H01L 27/1251 |
| 9,349,868 B1 | 5/2016 | Balakrishnan et al. | |
| 9,385,195 B1 | 7/2016 | Zhang | |
| 9,412,788 B2* | 8/2016 | Yokoyama | H01L 27/0694 |
| 9,450,075 B2* | 9/2016 | Huang | H01L 29/7824 |
| 9,640,531 B1* | 5/2017 | Or-Bach | H01L 27/0688 |
| 9,818,856 B2 | 11/2017 | Hoshi et al. | |
| 9,929,133 B2 | 3/2018 | Lin et al. | |
| 10,420,171 B2* | 9/2019 | Goktepeli | H01L 21/76256 |
| 2001/0028059 A1 | 10/2001 | George et al. | |
| 2003/0201488 A1 | 10/2003 | Nii | |
| 2004/0243419 A1 | 12/2004 | Wang | |
| 2005/0151276 A1 | 7/2005 | Jang et al. | |
| 2005/0205944 A1 | 9/2005 | Clark et al. | |
| 2006/0115943 A1 | 6/2006 | Koyanagi | |
| 2006/0220134 A1 | 10/2006 | Huo | |
| 2006/0226485 A1 | 10/2006 | Arakawa | |
| 2007/0001219 A1 | 1/2007 | Radosavljevic et al. | |
| 2007/0296002 A1 | 12/2007 | Liang et al. | |
| 2008/0128797 A1 | 6/2008 | Dyer et al. | |
| 2008/0179678 A1 | 7/2008 | Dyer et al. | |
| 2008/0224258 A1 | 9/2008 | Schepis et al. | |
| 2008/0316714 A1 | 12/2008 | Eichelberger et al. | |
| 2009/0152611 A1 | 6/2009 | Fujimoto | |
| 2009/0166677 A1 | 7/2009 | Shibata et al. | |
| 2010/0195375 A1 | 8/2010 | Park et al. | |
| 2010/0258870 A1 | 10/2010 | Hsu et al. | |
| 2011/0241073 A1 | 10/2011 | Cohen et al. | |
| 2012/0043663 A1 | 2/2012 | Ko et al. | |
| 2012/0088339 A1 | 4/2012 | Molin et al. | |
| 2012/0313169 A1 | 12/2012 | Wahl et al. | |
| 2013/0037795 A1 | 2/2013 | Sunamura et al. | |
| 2013/0062699 A1 | 3/2013 | Zhu et al. | |
| 2013/0130479 A1 | 5/2013 | Stuber et al. | |
| 2013/0134585 A1* | 5/2013 | Stuber | H01L 21/76251 |
| | | | 257/737 |
| 2014/0001560 A1 | 1/2014 | Cappellani et al. | |
| 2014/0054685 A1 | 2/2014 | Consentino et al. | |
| 2014/0159163 A1 | 6/2014 | Cai et al. | |
| 2014/0210058 A1 | 7/2014 | Lee et al. | |
| 2014/0231874 A1 | 8/2014 | Hoshi et al. | |
| 2014/0264632 A1 | 9/2014 | Richter et al. | |
| 2014/0286085 A1 | 9/2014 | Miyakawa | |
| 2014/0332749 A1 | 11/2014 | Yokoyama | |
| 2015/0028289 A1 | 1/2015 | Hekmatshoartabari | |
| 2015/0061020 A1 | 3/2015 | Yokoyama et al. | |
| 2015/0061026 A1 | 3/2015 | Lin et al. | |
| 2015/0069520 A1 | 3/2015 | Lee | |
| 2015/0126002 A1 | 5/2015 | Arai | |
| 2015/0137224 A1 | 5/2015 | Meiser et al. | |
| 2015/0206936 A1 | 7/2015 | Huang | |
| 2015/0235949 A1 | 8/2015 | Yu et al. | |
| 2015/0280010 A1* | 10/2015 | Shieh | H01L 29/78678 |
| | | | 257/66 |
| 2015/0311142 A1 | 10/2015 | Sekar et al. | |
| 2015/0357425 A1 | 12/2015 | Liu et al. | |
| 2015/0380305 A1 | 12/2015 | Basker et al. | |
| 2016/0095221 A1 | 3/2016 | Ramachandran et al. | |
| 2016/0247887 A1 | 8/2016 | Jun et al. | |
| 2017/0005195 A1 | 1/2017 | Ching et al. | |

(56) References Cited

U.S. PATENT DOCUMENTS

2018/0197895 A1* 7/2018 Liu .................. H01L 21/02532
2019/0057959 A1* 2/2019 Or-Bach ............. H01L 21/8221

FOREIGN PATENT DOCUMENTS

| JP | 2005203780 | 7/2005 |
| JP | 2007250863 | 9/2007 |
| KR | 20100088270 | 8/2010 |
| KR | 1020100106702 | 10/2010 |
| TW | 200513884 | 4/2005 |
| WO | 2007120293 | 10/2007 |
| WO | 2014209278 | 12/2014 |
| WO | 2017052562 | 3/2017 |
| WO | 2017052604 | 3/2017 |
| WO | 2017052626 | 3/2017 |
| WO | 2017052638 | 3/2017 |
| WO | 2017095409 | 6/2017 |
| WO | 2017171838 | 10/2017 |
| WO | 2018031175 | 2/2018 |

OTHER PUBLICATIONS

International Preliminary Report on Patentability dated Mar. 7, 2019 for PCT Patent Application No. PCT/US2017/048752.
Partial Supplementary European Search Report from European Patent Application No. 17844545.8 notified Mar. 9, 2020, 19 pgs.
Extended European Search Report from European Patent Application No. 17844545.8 dated Jul. 31, 2020, 20 pgs.

* cited by examiner

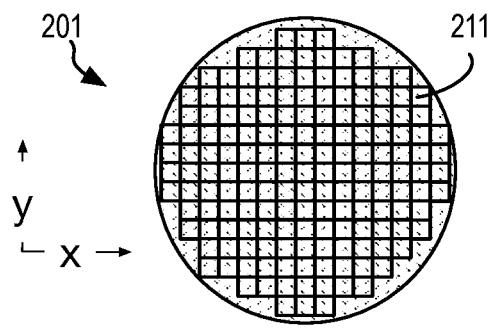
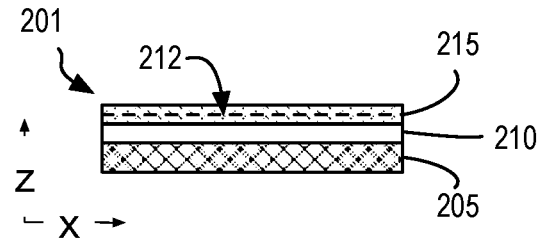
FIG. 2A  FIG. 3A
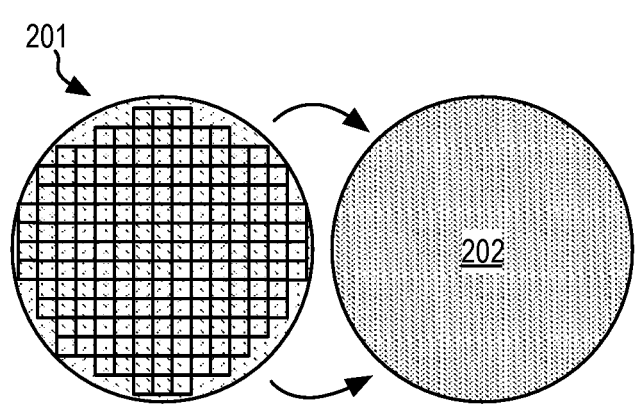
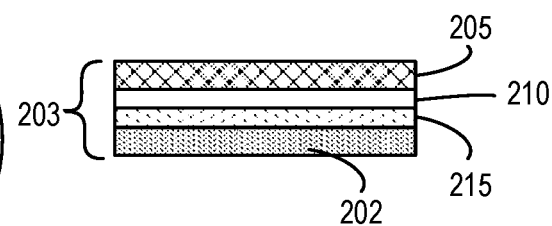
FIG. 2B  FIG. 3B
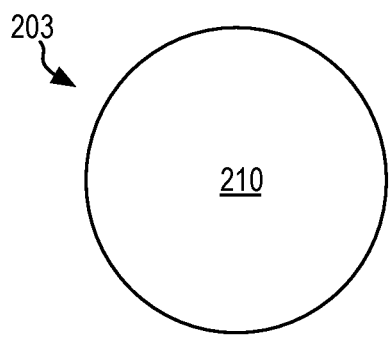
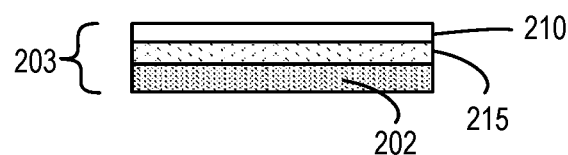
FIG. 2C  FIG. 3C

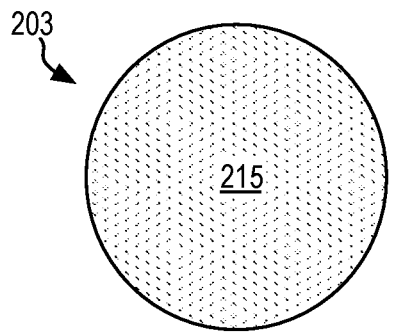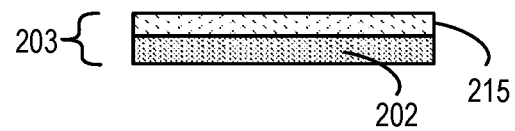
FIG. 2D         FIG. 3D
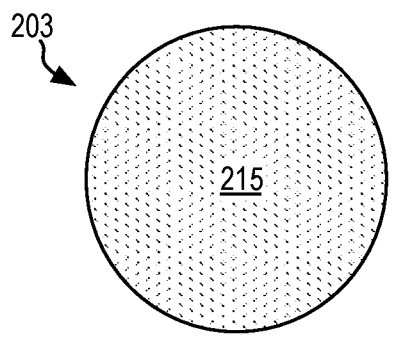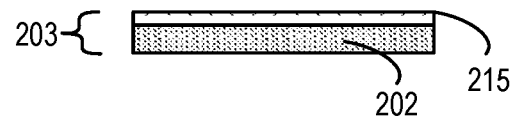
FIG. 2E         FIG. 3E
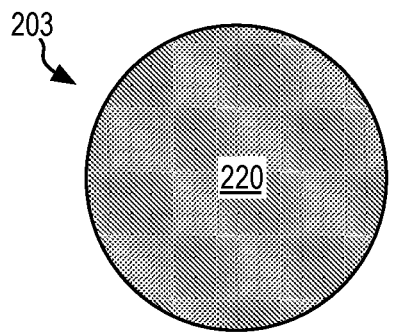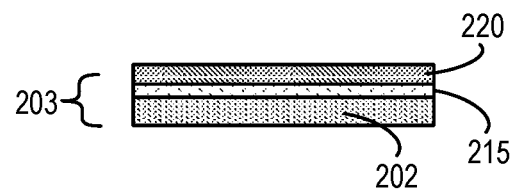
FIG. 2F         FIG. 3F

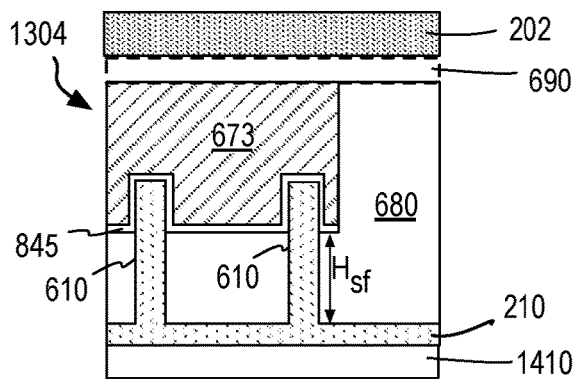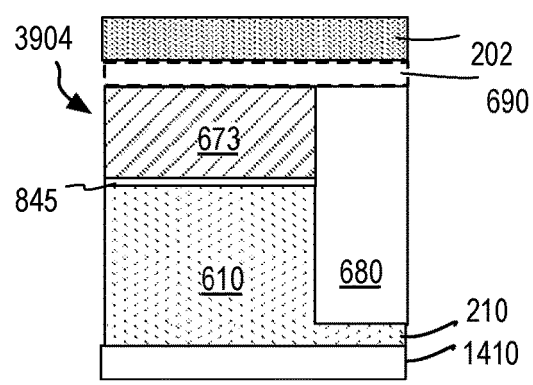
FIG. 42A  FIG. 43A
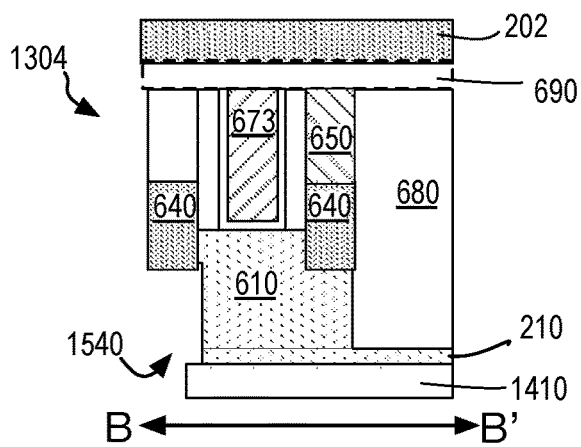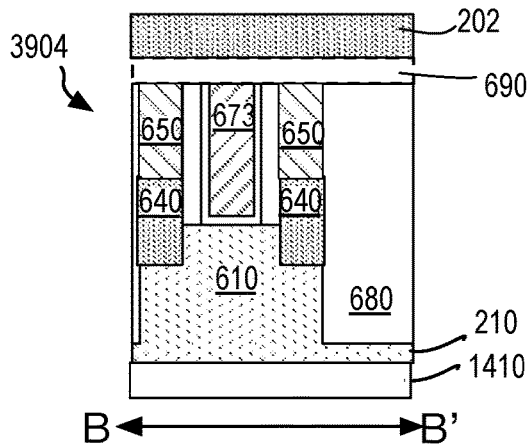
FIG. 42B  FIG. 43B
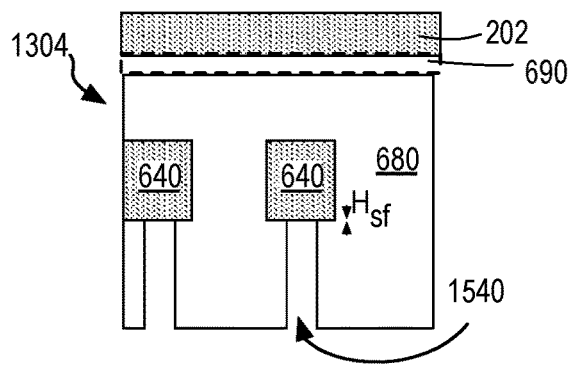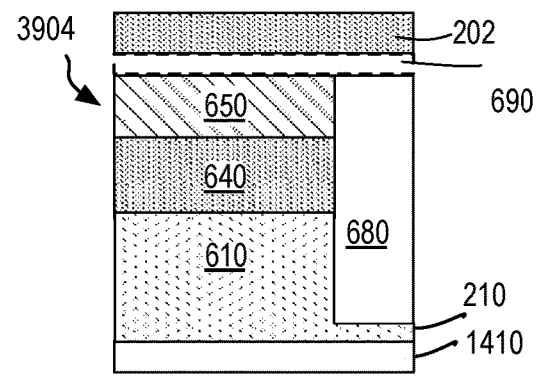
FIG. 42C  FIG. 43C

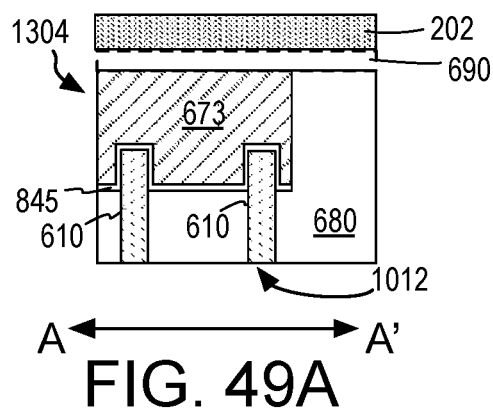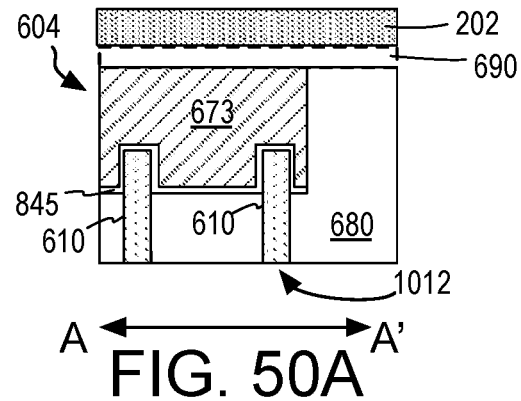
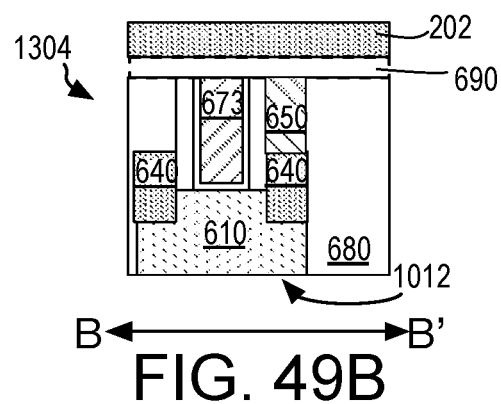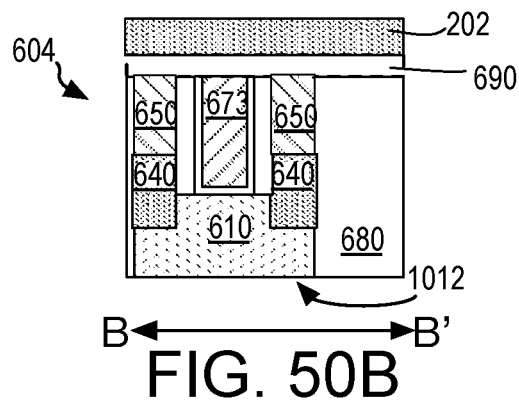
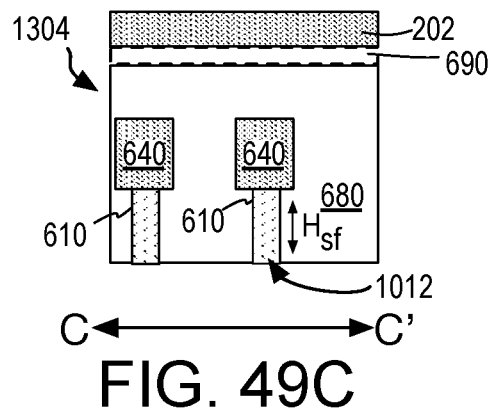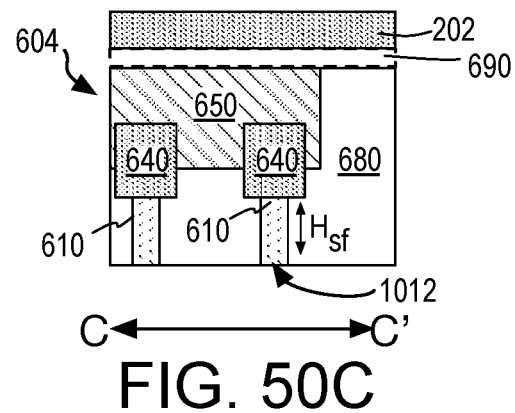

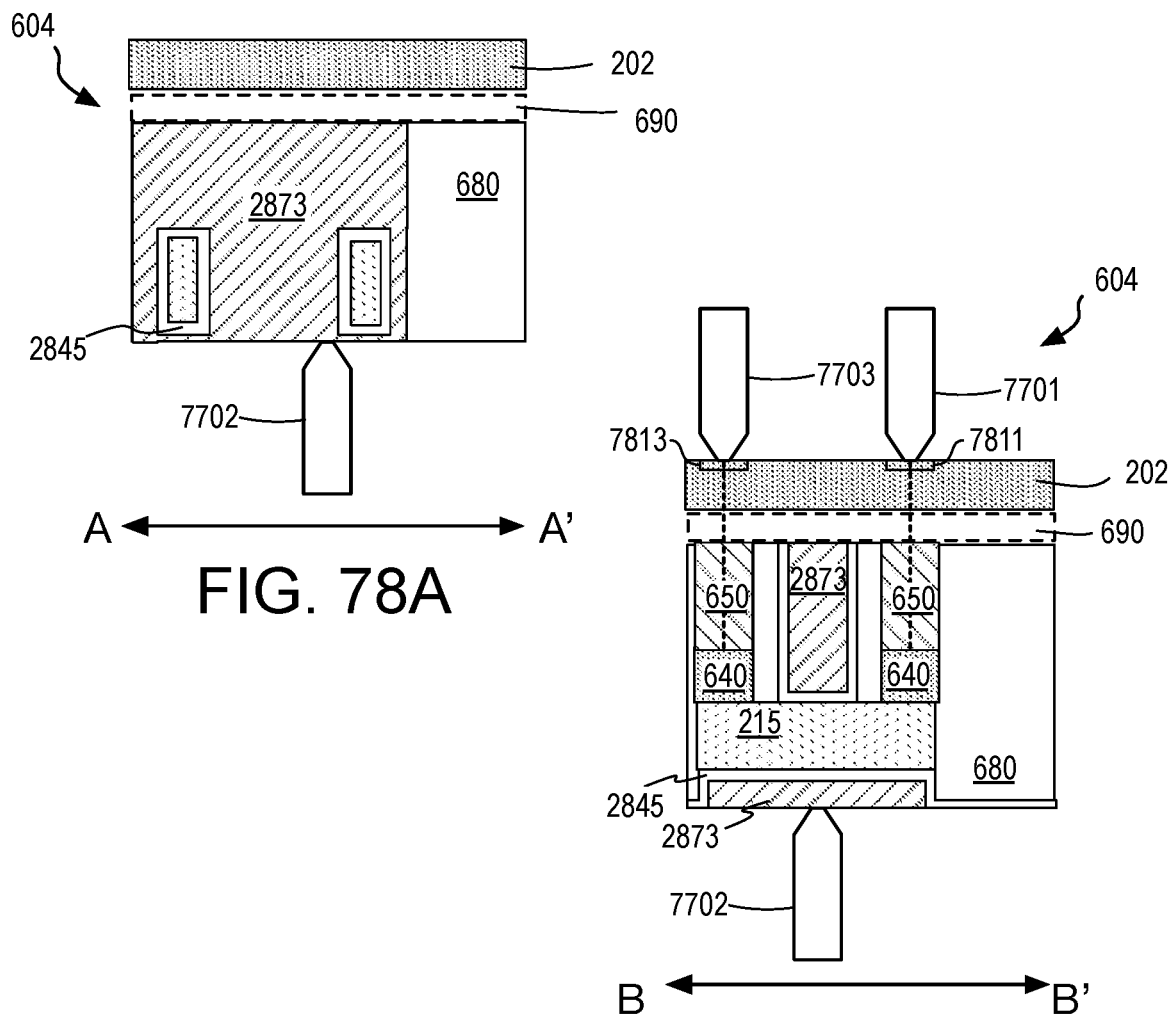
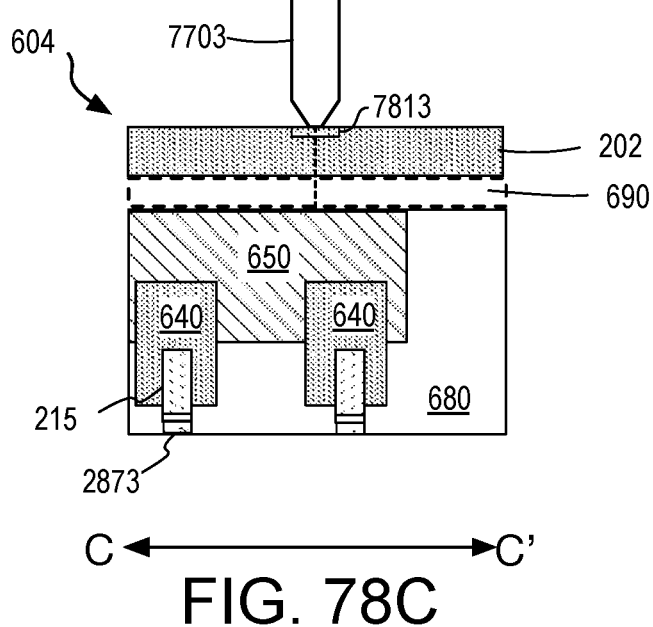
FIG. 78A
FIG. 78B
FIG. 78C

INTEGRATED CIRCUIT STRUCTURES

CLAIM OF PRIORITY

This application is a 371 Application of, and claims priority to, International Patent Application No. PCT/US17/48752, filed 25 Aug. 2017, titled, "INTEGRATED CIRCUIT DEVICE STRUCTURES AND FABRICATION TECHNIQUES WITH A BACK-SIDE REVEAL OF FRONT-SIDE STRUCTURES", which claims priority to U.S. Provisional Application No. 62/380,316 filed Aug. 26, 2016, titled, "INTEGRATED CIRCUIT DEVICE STRUCTURES AND FABRICATION TECHNIQUES WITH A BACK-SIDE REVEAL OF FRONT-SIDE STRUCTURES", and which also claims priority to International Application No. PCT/US16/68564, filed Dec. 23, 2016, titled "INTEGRATED CIRCUIT DEVICE WITH BACK-SIDE INTERCONNECTION TO DEEP SOURCE/DRAIN SEMICONDUCTOR", and which also claims priority to International Application No. PCT/US17/48475, filed Aug. 24, 2017, titled "VERTICALLY STACKED FINFETS & SHARED GATE PATTERNING", all of which are incorporated by reference in their entirety for all purposes.

RELATED APPLICATIONS

This application is related to International Patent Applications:US2015/052033, filed Oct. 1, 2015 with the title "Methods of Forming Backside Self-Aligned Vias and Structures Formed Thereby;" US2015/052440, filed Sep. 25, 2015 with the title "Backside Contact Structures and Fabrication For Metal on Both Sides of Devices"; and US2015/052288, filed Sep. 25, 2015 with the title "Backside Fin Recess Control With Multi-Hsi Option"; US2016/025576 filed Apr. 1, 2016 with the title "Layer Transferred Ferroelectric Memory Devices"; US2016/025579 filed Apr. 1, 2016 with the title "Semiconductor Diodes Employing Back-Side Semiconductor or Metal"; US2016/025593 filed Apr. 1, 2016 with the title "Transistor structures Including a Deep Via Lined With A Dielectric Material."

BACKGROUND

Device density in integrated circuits (ICs) has increased for decades in conformance with Moore's law. However, as the lateral dimensions of a device structure shrink with each technology generation, it becomes increasingly difficult to further reduce structural dimensions.

Three-dimensional (3D) scaling is now of considerable interest as reductions in z-height (device thickness) offer another avenue of increasing overall device density and IC performance. 3D scaling may be in the form of chip stacking or packaged IC stacking, for example. Known 3D integration techniques are expensive and may offer only incremental improvements in z-height and device density. For example, the majority of the thickness of a chip may be inactive substrate material. A stack of such chips may employ through-substrate via (TSV) technology as a means of vertically interconnecting the chip stack. A TSV typically extends through 20-50 µm, or more, of substrate material and therefore is generally limited to via diameters on the micron-scale. As such, TSV density is limited to far below the density of most device (e.g., transistor, memory) cells. Also, the final z-height of a chip-stack employing TSV technology may be hundreds of microns thicker than the actual device layers employed by the stacked device.

3D scaling may also be in the form of vertically-oriented devices, for example where a transistor channel length is substantially normal to a surface of a chip rather than parallel to that surface for the more common laterally-oriented transistor. One problem faced by many vertically-oriented device architectures is how to fabricate terminals on opposite ends of the device, which can be more readily achieved in laterally-oriented devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Hence, features drawn with a rectangular cross section in a plane of a reference coordinate system, actual fabricated features may instead have a cross section that is rounded or sloped at one or more ends of the features, which may result in a cross-sectional profile that is non-rectangular (e.g., hour-glass-shaped, trapezoidal, etc.). Further, where considered appropriate, reference labels have been repeated among the figures to indicate corresponding or analogous elements. In the figures:

FIGS. 2A, 2B, 2C, 2D, 2E, 2F, 2G and 2H are plan views of a substrate processed with double-sided device processing methods, in accordance with some embodiments;

FIGS. 3A, 3B, 3C, 3D, 3E, 3F, 3G, 3H, 3I and 3J are cross-sectional views of a substrate processed with double-sided device processing methods, in accordance with some embodiments;

FIGS. 42A, 42B illustrate cross-sectional views of the non-planar transistor structure as some operations in the methods illustrated in FIG. 38B are performed, in accordance with some embodiments;

FIGS. 43A, 43B, 43C illustrate cross-sectional views of the planar transistor structure as some operations in the methods illustrated in FIG. 38B are performed, in accordance with some embodiments;

FIGS. 49A, 49B, 49C illustrate cross-sectional views of the non-planar transistor structure as some operations in the methods illustrated in FIG. 38C are performed, in accordance with some embodiments;

FIGS. 50A, 50B, 50C illustrate cross-sectional views of the non-planar transistor structure as some operations in the methods illustrated in FIG. 38C are performed, in accordance with some embodiments;

FIGS. 78A, 78B, 78C illustrate cross-sectional views of logic transistor structure contacted by conductive pins for electrical test, in accordance with some embodiments;

DETAILED DESCRIPTION

Figure 1:
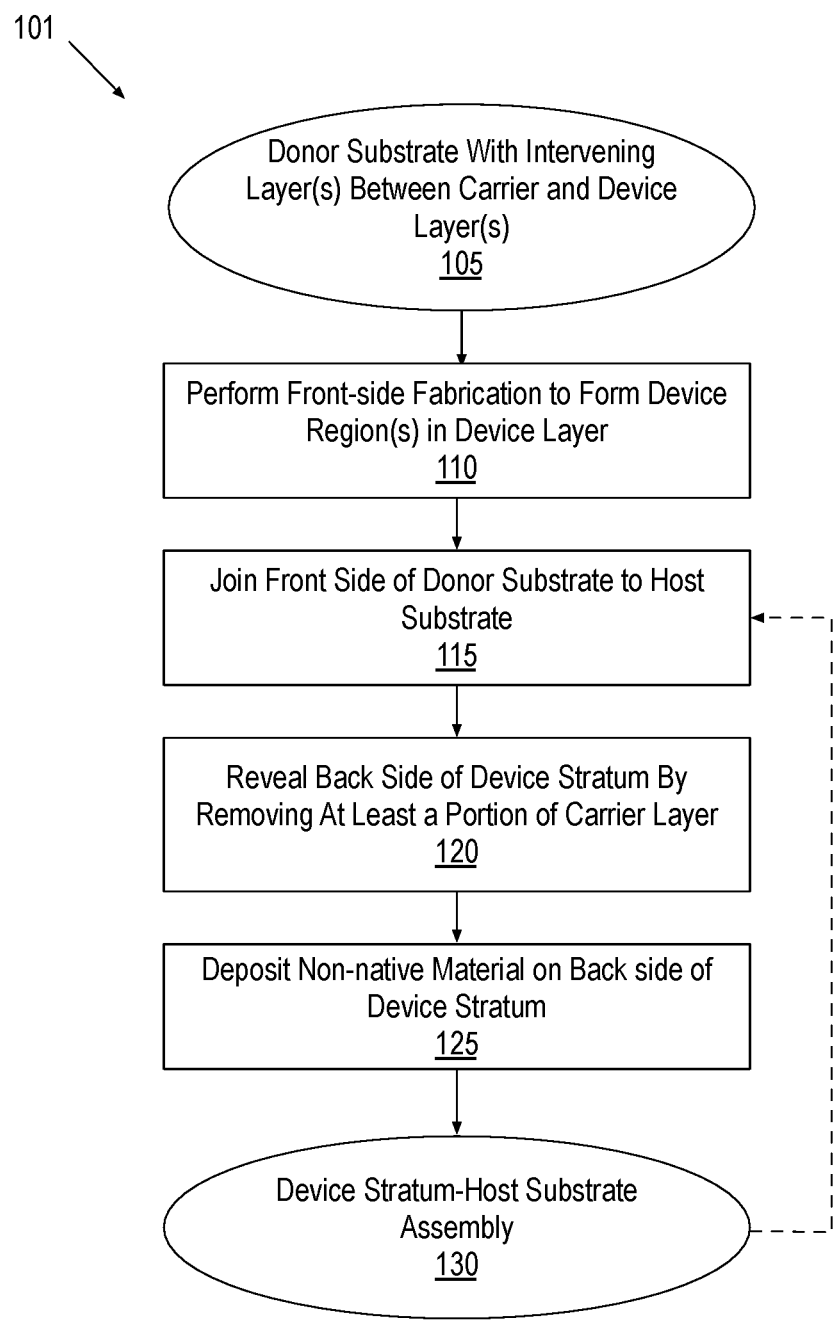
FIG. 1 is a flow diagram illustrating double-sided device processing methods, in accordance with some embodiments.

One or more embodiments are described with reference to the enclosed figures. While specific configurations and arrangements are depicted and discussed in detail, it should be understood that this is done for illustrative purposes only.

Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected" may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

IC device structures and fabrication techniques employing double-sided processing of device structures are described herein. In addition to front-side processing typically employed in the fabrication of IC device structures, double-sided processing further includes back-side processing of IC device structures. Double-sided processing may further entail atypical front-side processing designed to facilitate the back-side processing. In some exemplary embodiments, double-sided processing comprises a reveal of a back side of front-side device structures. In some exemplary embodiments, the reveal of the back side of a device structure (also referred to herein as a "back-side reveal" or "BSR") entails wafer-level back-side processing that is to either remove a bulk of substrate material globally over a wafer's area or locally within portions of a wafer's area, for example as confined by an etch mask. In contrast to a conventional TSV-type technology that is to merely provide electrical routing through a thickness of a substrate material, a back-side reveal as described herein is to facilitate the further fabrication of device structures within a device layer of an IC. Such back-side device layer fabrication may be performed at the density of individual devices (e.g., a transistor), and even within sub-regions of a single device (e.g., a terminal of a single transistor). Furthermore, such back-side reveals may be performed to remove only a portion, or substantially all, of a donor substrate upon which a device layer was disposed during front-side device processing. As such, a microns-deep TSV may become unnecessary as the thickness of semiconductor material of the device structures accessed from the back-side may be only tens or hundreds of nanometers. Notably, while a microns-deep conductive TSV may become unnecessary where more intimate back-side processing is performed according to embodiments herein, TSV-type technology might still be leveraged as a means of revealing a backside of a device layer, for example.

As described for some exemplary embodiments further below, processing of a revealed back side of a device structure may entail one or more of: removal of sacrificial device structures and/or artifacts of front-side processing; deposition of contact metallization, for example to increase device routing density, and/or permit backside electrical probing, and/or increase device terminal contact area; deposition of dielectric, for example to increase device isolation, increase gate electrode coupling, and/or reduce parasitic capacitance; deposition of semiconductor, for example to reduce parasitic resistance, and/or improve crystal quality, bandgap engineer, impart strain in the device semiconductor regions, and/or form vertically oriented devices; and/or fabricate stacked devices coupled or in intimate contact with each other.

The back-side reveal techniques described herein may enable a paradigm shift from "bottom-up" device fabrication to "center-out" fabrication, where the "center" is any layer that is employed in front-side fabrication, revealed from the back side, and again employed in back-side fabrication. As should become clear from the following discussion, processing of both a front side and a revealed back side of a device structure may address many of the challenges associated with fabricating 3D ICs by front-side processing alone.

Techniques described herein may be performed with sufficient accuracy to reveal the backside of a device layer at the transistor level (e.g., on the order of 5-10 nm). As such, virtually all material not employed by integrated devices may be discarded from a device. This accuracy is possible, in part, through advances in substrate (e.g., wafer) material uniformity control and material quality handling. To date, TSV-based backside electrical connection technology has not enabled interconnect at specific locations dimensioned down to the device (e.g., transistor) level as TSV technology typically involves grinding down the backside of a substrate only to the point where at least 20-50 μm of residual substrate material is retained through which only relatively large (e.g., 2-5 μm) diameter conductive vias can be formed.

Through a removal of a greater amount of a substrate material, electrical connection at the nanometer level becomes possible. As further described for some exemplary embodiments below, a permanent bond of a carrier ("handle") may be employed whereas techniques like through substrate via employ temporary bonds that are relatively more compliant and insufficiently rigid to achieve sufficient thickness uniformity control. For example, permanent bond, such as an oxide fusion bond, may achieve the mechanical rigidity advantageous for fabricating the structures described further herein. Oxide can be very stiff and mechanically strong and not compressive in nature.

As further described for some exemplary embodiments below, a CMP process that is very selective to oxide materials may be advantageously employed reduce material thickness in a planar manner with thickness control sufficient to remove even micrometers of material and stop to within 10 nm of a target thickness everywhere over the surface area of a substrate. With such planarity, processing typically limited to only the front-side of a substrate, such as high-resolution lithography, may be employed on the backside of the substrate as well, for example to make electrical contacts having dimensions on the same order of those typical of front-side metallization (e.g., device contacts). Such planar processing may be leveraged alone or in conjunction with other substrate removal techniques, including, but not limited to, nanometer scaled TSV-type substrate processing, for example to facilitate the formation of openings of sufficiently small lateral dimension that individual devices and/or individual terminals of an individual device may be exposed.

FIG. 1 is a flow diagram illustrating double-sided device processing methods 101, in accordance with some embodiments. Methods 101 may be practiced at the wafer-level. In some exemplary embodiments, a large format substrate (e.g., 300 or 450 mm diameter) wafer may be processed through methods 101. Methods 101 begin at operation 105 with a donor substrate including a device layer. In certain embodiments, the device layer can contain active devices or passive devices. In some embodiments, the device layer is a semiconductor material that is employed by an IC device. In specific embodiments, the device layer is a monocrystalline semiconductor material as such material often offers device performance advantages over thin film semiconductor materials that are polycrystalline or amorphous. As one example, in a transistor device, such as a field effect transistor (FET), the transistor channel is formed from the semiconductor device layer. As another example, for an optical device, such as a photodiode, the drift and/or gain semiconductor is formed from the device layer. The device layer may also be employed in a passive structure with an IC device. For example, an optical waveguide may employ semiconductor patterned from the device layer.

In some embodiments, the donor substrate comprises a stack of material layers. Such a material stack may facilitate subsequent formation of an IC device stratum. As used herein, the term "device stratum" refers to at least the device layer, and lacks other layers of the donor substrate, which are not needed for IC device functionality and therefore merely non-functional mass "overhead." For example, "device stratum" can include just one device layer, multiple device layers, or device layers with one or more intervening layers. In certain embodiments, the "device stratum" can further include other one or more non-native material layers, as explained further below, that have been deposited on or below the device layer(s). In the exemplary embodiment illustrated in FIG. 1, method 101 provides a donor substrate that includes a carrier layer separated from the device layer(s) by one or more intervening material layers. The carrier layer can provide mechanical support during front-side processing of the device layer(s). The carrier may also provide the basis for crystallinity in the semiconductor device layer(s). Although the intervening layer(s) need not be present, inclusion of one or more such material layers may facilitate removal of the carrier layer from the device layer(s), or otherwise facilitate revealing a back side of a device layer.

Methods 101 continue at operation 110 where front-side fabrication operations are performed on the donor substrate to form a device structure that includes one or more regions in a device layer. Any suitable front-side processing techniques may be employed at operation 110 to form any suitable IC device(s) and exemplary embodiments are further described elsewhere herein. Such IC devices may include devices (e.g., transistors) employing the device layer material and one or more levels of interconnect metallization formed over a front side of the device layer. At operation 115, a front side of the donor substrate can be joined to a host substrate to form a device-host assembly. The host substrate can be utilized to provide front-side mechanical support during back-side processing of the device layer. The host substrate may also include integrated circuitry to which the IC devices fabricated on the donor substrate may be interconnected. For such embodiments, joinery of the host and donor substrate may further entail formation of 3D interconnect structures through hybrid (dielectric/metal) bonding. Any suitable host substrate and wafer-level joinery techniques may be employed at operation 115, and some exemplary embodiments are further described elsewhere herein.

Methods 101 continue at operation 120 where the back side of the device stratum is revealed by removing at least a portion of the carrier layer. In some further embodiments, portions of any intervening layer below a device layer may also be removed during the reveal operation 120. In some other embodiments, front-side materials deposited over a front side of the device layer may also be removed during the reveal operation 120. As described elsewhere herein in the context of some exemplary embodiments, an intervening layer(s) may facilitate a highly-uniform exposure of the device stratum back-side, for example serving as one or more of an etch marker or etch stop employed in the wafer-level backside reveal process.

At operation 125, device stratum surfaces exposed from the back side are processed to form a double-sided device stratum. In certain embodiments, native materials, such as any of those of the donor substrate that contact any region of a device layer, may be replaced with one or more non-native materials at operation 125. For example, a portion of a semiconductor device layer or intervening layer may be replaced with one or more other semiconductor, metal, or dielectric materials. In some other embodiments, non-native materials may be deposited over or on at least a portion of the back side of the device stratum. In some further embodiments, portions of the front-side materials removed during the reveal operation 120 may also be replaced at operation 125. For example, a portion of a semiconductor body, dielectric spacer, gate stack, or contact metallization formed during front-side device fabrication may be replaced with one or more other semiconductor, metal, or dielectric materials during backside deprocessing/reprocessing of the front-side device. In still other embodiments, a second device stratum or metal interposer is bonded to the revealed back-side.

Methods 101 complete with output of a device stratum-host substrate assembly at operation 130. The device stratum-host assembly may then be further processed. For example, any suitable technique may be employed to singulate and package the device stratum-host substrate assembly. Where the host substrate is entirely sacrificial, packaging of the device stratum-host substrate may entail separation of the host substrate from the device stratum. Where the host substrate is not entirely sacrificial (e.g., where the host substrate also includes a device stratum), the device stratum-host assembly output at operation 130 may be fed back as a host substrate input to operation 115 during a subsequent iteration of methods 101 (dashed line in FIG. 1). As a host substrate, the device stratum-host assembly may be joined with another donor substrate and methods 101 iterated. Iteration of methods 101 may thereby form a wafer-level assembly of any number of double-sided device strata, each only tens or hundreds of nanometers in thickness, for example. In some embodiments, and as further described elsewhere herein, one or more devices (e.g., transistors) or device cells (e.g., 1T-1R memory cells) within a device stratum are electrically tested at operation 130, for example as a yield control point in the fabrication of a wafer-level assembly of double-sided device strata. In some embodiments described further below, the electrical test entails back-side device probing.

Figure 2G:
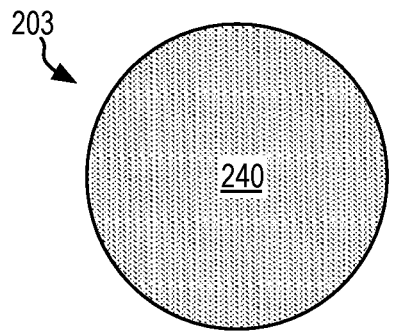
Figure 3G:
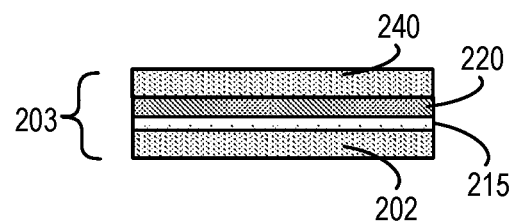

FIGS. 2A, 2B, 2C, 2D, 2E, 2F and 2G are plan views of a substrate processed with double-sided device processing methods, such as methods 101, in accordance with some embodiments. FIGS. 3A, 3B, 3C, 3D, 3E, 3F, 3G, 3H, and 3I are corresponding cross-sectional views of a substrate processed with double-sided device processing methods, in accordance with some embodiments. As shown in FIGS. 2A and 3A, donor substrate 201 includes a plurality of IC die 211 in an arbitrary spatial layout over a front-side wafer surface. Front-side processing of IC die 211 may have been performed following any techniques to form any device structures. In exemplary embodiments, die 211 includes one or more semiconductor regions within device layer 215. Die 211 further includes one or more front-side interconnect metallization levels (not depicted) over a front side of device layer 215. An intervening layer 210 separates a back side of device layer 215 from carrier layer 205. In the exemplary embodiment, intervening layer 210 is in direct contact with both carrier layer 205 and device layer 215. Alternatively, one or more spacer layers may be disposed between intervening layer 210 and device layer 215 and/or carrier layer 205. Donor substrate 201 may further include other layers, for example over device layer 215 and/or below carrier layer 205.

Device layer 215 may include one or more layers of any device material composition known to be suitable for a particular IC device, such as, but not limited to, transistors, diodes, and resistors. In some exemplary embodiments, device layer 215 includes one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). Device layer 215 may also comprise one or more group II-VI semiconductor material layers, or semiconductor transition metal dichalcogenide (TMD or TMDC) layers. In other embodiments, device layer 215 comprises one or more graphene layer, or a graphenic material layer having semiconductor properties. In still other embodiments, device layer 215 comprises one or more oxide semiconductor layers. Exemplary oxide semiconductors include oxides of a transition metal (e.g., IUPAC group 4-10) or post-transition metal (e.g., IUPAC groups 11-14). In advantageous embodiments, the oxide semiconductor includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof. In other embodiments, device layer 215 includes one or more magnetic, ferromagnetic, ferroelectric material layer. For example device layer 215 may include one or more layers of any material known to be suitable for a tunneling junction device, such as, but not limited to a magnetic tunneling junction (MTJ) device.

In some embodiments, device layer 215 is substantially monocrystalline. Although monocrystalline, a significant number of crystalline defects may nonetheless be present. In other embodiments, device layer 215 is amorphous or polycrystalline (e.g., micro or nano crystalline). Device layer 215 may be any thickness (e.g., z-dimension in FIG. 3A). In some exemplary embodiments, device layer 215 has a thickness greater than a z-thickness of at least some of the semiconductor regions employed as functional semiconductor regions of die 211. Functional regions built on and/or embedded within device layer 215 need not extend through the entire thickness of device layer 215. In some embodiments, semiconductor regions of die 211 are disposed only within a top-side thickness of device layer 215 demarked in FIG. 3A by dashed line 212. For example semiconductor regions of die 211 may have a z-thickness of 200-300 nm, or less, while device layer may have a z-thickness of 700-1000 nm, or more. As such, around 600 nm of device layer thickness may separate semiconductor regions of die 211 from intervening layer 210. Greater device layer thicknesses are also possible, for example ranging from 1000 nm to 10 μm.

Carrier layer 205 may have the same material composition as device layer 215, or may have a material composition different than device layer 215. For embodiments where carrier layer 205 and device layer 215 have the same composition, the two layers may be identified by their position relative to intervening layer 210. In some embodiments where device layer 215 is a crystalline group IV, group III-V or group III-N semiconductor, carrier layer 205 is the same crystalline group IV, group III-V or group III-N semiconductor as device layer 215. In alternative embodiments, where device layer 215 is a crystalline group IV, group III-V or group III-N semiconductor, carrier layer 205 is a different crystalline group IV, group III-V or group III-N semiconductor than device layer 215. In still other embodiments, carrier layer 205 may include, or be, a material onto which device layer 215 was transferred, or grown upon. For example, carrier layer 205 may include one or more amorphous oxide layers (e.g., glass) or crystalline oxide layer (e.g., sapphire), polymer sheets, or any material(s) built up or laminated into a structural support known to be suitable as a carrier during IC device processing. Carrier layer 205 may be any thickness (e.g., z-dimension in FIG. 3A) as a function of the carrier material properties and the substrate diameter. For example, where carrier layer 205 is a large format (e.g., 300-450 mm) semiconductor substrate, the carrier layer thickness may be 700-1000 µm, or more.

In some embodiments, one or more intervening layers 210 are disposed between carrier layer 205 and device layer 215. In some exemplary embodiments, an intervening layer 210 is compositionally distinct from carrier layer 205 such that it may serve as a marker detectable during subsequent removal of carrier layer 205. In some such embodiments, an intervening layer 210 has a composition that, when exposed to an etchant of carrier layer 205, will etch at a significantly slower rate than carrier layer 205 (i.e., intervening layer 210 functions as an etch stop for a carrier layer etch process). In further embodiments, intervening layer 210 has a composition distinct from that of device layer 215. Intervening layer 210 may be a metal, semiconductor, or dielectric material, for example.

In some exemplary embodiments where at least one of carrier layer 205 and device layer 215 are crystalline semiconductors, intervening layer 210 is also a crystalline semiconductor layer. Intervening layer 210 may further have the same crystallinity and crystallographic orientation as carrier layer 205 and/or device layer 215. Such embodiments may have the advantage of reduced donor substrate cost relative to alternative embodiments where intervening layer 210 is a material that necessitates formation of an amorphous insulator, or a bonding (e.g., thermal-compression bonding) of intervening layer 210 to device layer 215 and/or to carrier layer 205.

For embodiments where intervening layer 210 is a semiconductor, one or more of the primary semiconductor lattice elements, alloy constituents, or impurity concentrations may vary between at least carrier layer 205 and intervening layer 210. In some embodiments where at least carrier layer 205 is a group IV semiconductor, intervening layer 210 may also be a group IV semiconductor, but of a different group IV element or alloy and/or doped with an impurity species to an impurity level different than that of carrier layer 205. For example, intervening layer 210 may be a silicon-germanium alloy epitaxially grown on a silicon carrier. For such embodiments, a pseudomorphic intervening layer may be grown heteroepitaxially to any thickness below the critical thickness at which point the intervening layer become heteromorphic. Alternatively, the intervening layer 210 may be a relaxed buffer layer having a thickness greater than the critical thickness.

In other embodiments, where at least carrier layer 205 is a group III-V semiconductor, intervening layer 210 may also be a group III-V semiconductor, but of a different group III-V alloy and/or doped with an impurity species to an impurity level different than that of carrier layer 205. For example, intervening layer 210 may be an AlGaAs alloy epitaxially grown on a GaAs carrier. In some other embodiments where both carrier layer 205 and device layer 215 are crystalline semiconductors, intervening layer 210 is also a crystalline semiconductor layer, which may further have the same crystallinity and crystallographic orientation as carrier layer 205 and/or device layer 215.

In embodiments where both carrier layer 205 and intervening layer 210 are of the same or different primary semiconductor lattice elements, impurity dopants may differentiate the carrier and intervening layer. For example, intervening layer 210 and carrier layer 205 may both be silicon crystals with intervening layer 210 lacking an impurity present in carrier layer 205, or doped with an impurity absent from carrier layer 205, or doped to a different level with an impurity present in carrier layer 205. The impurity differentiation may impart etch selectivity between the carrier and intervening layer, or merely introduce a detectable species that can serve to as a marker upon which backside processing may be predicated.

Intervening layer 210 may be doped with impurities that are electrically active (i.e., rendering intervening layer 210 an n-type or p-type semiconductor), or not, as the impurity may provide any basis for detection of the intervening layer 210 during subsequent carrier layer removal, such as described in operation 120. Exemplary electrically active impurities for some semiconductor materials include group III elements (e.g., B), group IV elements (e.g., P). Any other element may be employed as a non-electrically active species. Impurity dopant concentration within intervening layer 210 need only vary from that of carrier layer 205 by an amount sufficient for detection, which may be predetermined as a function of the detection technique and detector sensitivity.

As described further elsewhere herein, intervening layer 210 may have a composition distinct from device layer 215. In some such embodiments, intervening layer 210 may have a different band gap than that of device layer 215. For example, intervening layer 210 may have a wider band-gap than device layer 215.

In embodiments where intervening layer 210 comprises a dielectric material, the dielectric material may be an inorganic material (e.g., SiO, SiN, SiON, SiOC, hydrogen silsesquioxane, methyl silsesquioxane) or organic material (polyimide, polynorbornenes, benzocyclobutene). For some dielectric embodiments, intervening layer 210 may be formed as an embedded layer (e.g., SiOx through implantation of oxygen into a silicon device and/or carrier layer). Other embodiments of a dielectric intervening layer may necessitate bonding (e.g., thermal-compression bonding) of carrier layer 205 to device layer 215. For example, where donor substrate 201 is a semiconductor-on-oxide (SOI) substrate, either or both of carrier layer 205 and device layer 215 may be oxidized and bonded together to form a SiO intervening layer 210. Similar bonding techniques may be employed for other inorganic or organic dielectric materials.

In some other embodiments, intervening layer 210 includes two or more materials laterally (i.e., x-direction in FIG. 3A) spaced apart within the layer. The two or more materials may include a dielectric and a semiconductor, a dielectric and a metal, a semiconductor and a metal, a dielectric and a semiconductor, two different dielectric, two different semiconductors, or two different metals. Within such an intervening layer, a first material may surround islands of the second material that extend through the thickness of the intervening layer. For example, an intervening layer may include a field isolation dielectric that surrounds islands of semiconductor, which extend through the thickness of the intervening layer. The semiconductor may be epitaxially grown within openings of a patterned dielectric or the dielectric material may be deposited within openings of a patterned semiconductor.

In some exemplary embodiments, semiconductor features, such as fins or mesas, are etched into a front-side surface of a semiconductor device layer. Trenches surrounding these features may be subsequently backfilled with an isolation dielectric, for example following any known shallow trench isolation (STI) process. One or more of the semiconductor feature or isolation dielectric may be employed for terminating a back-side carrier layer removal process, for example as a back-side reveal etch stop. In some embodiments, a reveal of trench isolation dielectric may stop, significantly retard, or induce a detectable signal for terminating a back-side carrier polish. For example, a CMP polish of carrier semiconductor employing a slurry with high selectivity favoring removal of carrier semiconductor (e.g., Si) over removal of isolation dielectric (e.g., SiO) may slow significantly upon exposure of a (bottom) surface of the trench isolation dielectric surrounding semiconductor features including the device layer. Because the device layer is disposed on a front side of the intervening layer, the device layer need not be directly exposed to the back-side reveal process.

As another example, islands of semiconductor may be grown from a crystalline carrier surface within pin-holes extending through a thickness of a dielectric layer disposed over the carrier layer. For such embodiments, the intervening layer is a composite of the semiconductor islands embedded within the dielectric layer. Fabrication of the donor substrate may proceed with a crystalline carrier layer, such as silicon, another group IV semiconductor, or alternate. A dielectric layer (e.g., SiO) may by deposited over the carrier layer, masked and etched to form a high-density array of openings through the dielectric layer. Such openings may be trenches or pin-holes. The critical dimension (CD) of such openings may be on the order of tens of nanometers to a few microns. In some embodiments, aspect ratio of the openings is sufficient (e.g., 4:1, or more) to implement aspect ratio trapping (ART) of crystalline defects within semiconductor grown in the openings. A crystalline surface of the carrier layer is exposed within each of the openings. Heteroepitaxial, or homoepitaxial growths from the exposed carrier surface backfill the array of openings with crystalline semiconductor. In some embodiments for example, silicon is grown within the ART pattern on a non-silicon seeding surface. In some other embodiments, a III-V material is grown within the ART pattern on a group III-V or group IV seeding surface. In some other embodiments, a III-N material is grown within the ART pattern on an elemental or alloyed group IV seeding surface. In some further embodiments, lateral epitaxial overgrowth (LEO) of crystalline semiconductor is subsequently performed using any known technique to bridge the islands of crystalline semiconductor and form a continuous device layer 215 extending over a pin-holed intervening layer 210.

Figure 4A:
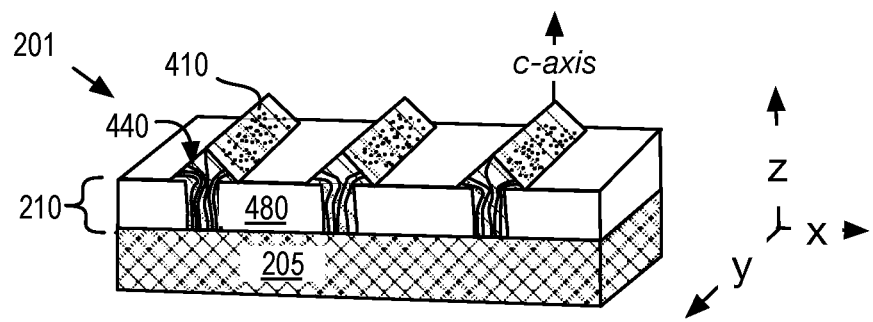
FIG. 4A, 4B, 4C are isometric views further illustrating an intervening layer including both III-N semiconductor and dielectric materials, in accordance with some embodiments.
Figure 4B:
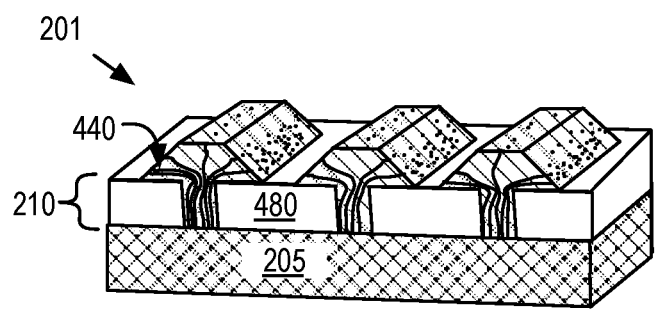
Figure 4C:
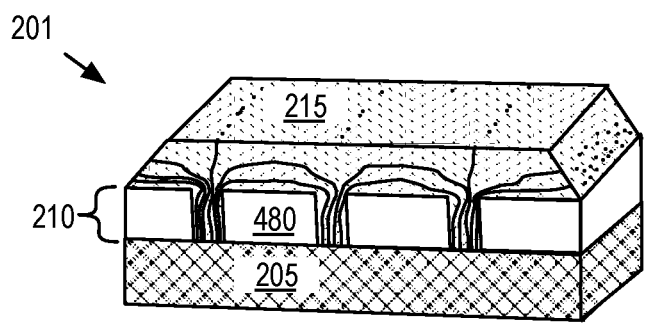

FIGS. 4A, 4B and 4C are isometric views further illustrating some exemplary embodiments where a III-N semiconductor is grown as both a portion of intervening layer 210 and as device layer 215. In some such heteroepitaxial embodiments, the intervening layer semiconductor can be a group III-N material (e.g., GaN) grown on a group IV (e.g., silicon) carrier layer. Each III-N epitaxial island may be relaxed with the hexagonal/wurzite c-axis substantially orthogonal to the carrier growth surface. As shown in FIG. 4A, donor substrate 201 includes a field isolation dielectric layer 480 (e.g., SiO) deposited over carrier layer 205 (e.g., crystalline silicon). Semiconductor 410 is a III-N material (e.g., GaN) heteroepitaxially grown from a surface of carrier layer 205, backfilling openings in field isolation dielectric layer 480. LEO of III-N semiconductor is further depicted in FIG. 4B. For additional description of the epitaxial growth parameters that may be employed for the growth processes illustrated in FIG. 4A-4C, the interested reader is referred to International Application PCT/US2014/56299 (U.S. application Ser. No. 15/504,634), filed on Sep. 19, 2014 and under common ownership or assignment. As shown in FIG. 4B, for hexagonal crystals with the depicted orientation, crystal defects 440 will glide laterally during lateral overgrowth, becoming more parallel to the c-plane of the III-N semiconductor as device layer 215 grows over field isolation dielectric layer 480. Upon merging of the III-N semiconductor islands, as illustrated FIG. 4C, a contiguous III-N semiconductor device layer 215 is formed. Additional material layers, such as a polarization layer (not depicted), may be grown as a further component of device layer 215. The polarization layer may promote a 2D electron gas (2DEG) at the material interface within device layer 215.

Advantageously, donor substrate 201 illustrated in FIG. 4C may be fabricated without any bonding of separate substrates and/or transfer of device layer 215. Donor substrate 201 may be further processed following any of the methods described elsewhere herein. In some III-N device layer embodiments, high-electron mobility transistors (HEMT) are fabricated in the III-N device layer 215. Carrier layer 205 and/or intervening layer 210 may be removed from device layer 215, for example as described elsewhere herein. Advantageously, pin-holed field isolation dielectric layer 480 may also provide an excellent etch stop during subsequent removal of carrier layer 205. Following the etch stop, the back-side reveal process may further remove intervening layer 210, exposing a back-side of device layer 215.

Figure 4D:
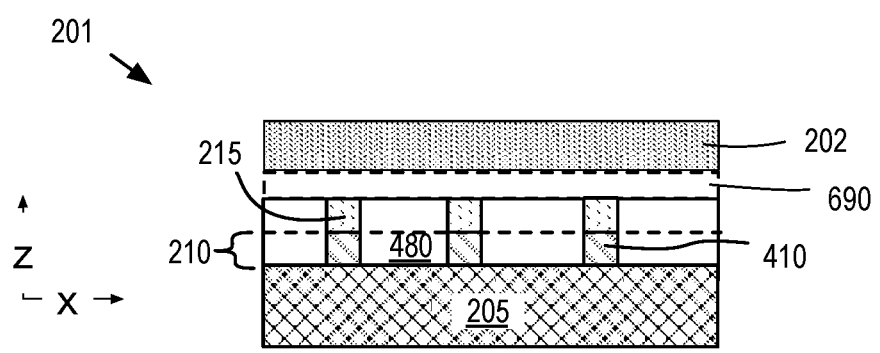
FIG. 4D is a cross-sectional view further illustrating an intervening layer including both III-V semiconductor and dielectric materials, in accordance with some embodiments.

Semiconductor material within an intervening layer that includes both semiconductor and dielectric may also be heteroepitaxially grown III-V material. As used herein heteroepitaxial growth refers to the growth of a crystal of one material composition from the surface of another crystal of another material composition. As one example, a III-V epitaxial device layer (e.g., InAlAs, InGaAs, etc.) may be grown through a pin-holed dielectric disposed over a crystalline group IV (e.g., Si, Ge, SiGe) or group III-V (e.g., GaAs) carrier layer. For some such embodiments, donor substrate 201 may be substantially as shown in FIG. 4D where intervening layer 210 comprises a pin-holed or trenched field isolation dielectric layer 480 and semiconductor 410 is a III-V compound (e.g., InAlAs) grown within a base portion the pin-holes and/or trenches. Device layer 215 is further grown over semiconductor 410, within a top portion of the pin-holes and/or trenches. In some exemplary embodiments, device layer 215 is a second III-V material of different alloy composition (e.g., InGaAs) than that grown as part of intervening layer 210. Subsequent processing may then form a device (e.g., a transistor) within device layer 215. For example, as described elsewhere herein, device layer 215 may be fabricated into a fin or other non-planar structure.

Notably, for embodiments where an intervening layer includes both semiconductor and dielectric, the thickness of the intervening layer may be considerably greater than the critical thickness where relaxation occurs as a result of lattice mismatch between the intervening layer and carrier. Whereas an intervening layer below critical thickness may be an insufficient thickness to accommodate non-uniformity of a wafer-level back-side reveal process, embodiments with greater thickness may advantageously increase the back-side reveal process window. Embodiments with pin-holed dielectric may also facilitate subsequent separation of a carrier layer from a device stratum as well as improve crystal quality within the device stratum (e.g., within device layer 215).

Semiconductor material within intervening layers that include both semiconductor and dielectric may also be homoepitaxial. As used herein, homoepitaxial growth refers to the growth of a crystal of one material composition from the surface of another crystal of that same material composition. In some exemplary embodiments, a silicon epitaxial device layer is grown through a pin-holed dielectric disposed over a silicon carrier layer. For such embodiments, the donor substrate structure may also be substantially as shown in FIG. 4D where the pin-holed dielectric may facilitate the subsequent separation of carrier and device layers.

Intervening layers that include both semiconductor and dielectric may also include semiconductor features etched into a front side of a carrier layer, such as, but not limited to a silicon layer. These features, when surrounded with a dielectric material (e.g., STI) may then have substantially the same architecture as homoepitaxial structures grown into a pin-holed dielectric. For such embodiments, the donor substrate structure may again be similar to that shown in FIG. 4D with device layer 215 and semiconductor within intervening layer 210 being the same material as carrier layer 205. In such embodiments, dielectric material 480 may again facilitate the subsequent separation of the carrier and device layers.

Continuing with description of FIGS. 2A and 3A, intervening layer 210 may also be a metal. For such embodiments, the metal may be of any composition known to be suitable for bonding to carrier layer 205 or device layer 215. For example, either or both of carrier layer 205 and device layer 215 may be finished with a metal, such as, but not limited to Au or Pt, and subsequently bonded together, for example to form a Au or Pt intervening layer 210. Such a metal may also be part of an intervening layer that further includes a patterned dielectric surrounding metal features.

Intervening layer 210 may be of any thickness (e.g., z-height in FIG. 3A). The intervening layer 210 should be sufficiently thick to ensure the carrier removal operation can be reliably terminated before exposing device regions and/or device layer 215. Exemplary thicknesses for intervening layer 210 range from a few hundred nanometers to a few micrometers. The thickness may vary as a function of the amount of carrier material that is to be removed, the uniformity of the carrier removal process, and the selectivity of the carrier removal process, for example. For embodiments where the intervening layer 210 has the same crystallinity and crystallographic orientation as carrier layer 205, the carrier layer thickness may be reduced by the thickness of intervening layer 210. In other words, intervening layer 210 may be a top portion of a 700-1000 µm thick group IV crystalline semiconductor substrate also employed as the carrier layer 205. In pseudomorphic heteroepitaxial embodiments, intervening layer thickness may be limited to the critical thickness. For heteroepitaxial intervening layer embodiments employing ART or another fully relaxed buffer architecture, the intervening layer 210 may have any thickness.

As further illustrated in FIGS. 2B and 3B, for embodiments where back side processing is to remove carrier substrate material over a substantial portion of a wafer area (e.g., over the entirety of the wafer), donor substrate 201 may be first joined to a host substrate 202 to form a donor-host substrate assembly 203. In alternative embodiments where back side processing down to sub-micron thicknesses is confined to sufficiently small regions (e.g., coinciding with a subset of transistors in an IC), such host substrate joinery may be avoided. In the illustrated embodiments however, a front-side surface of donor substrate 201 is joined to a surface of host substrate 202 such that device layer 215 is proximal to the host substrate 202 and the carrier layer 205 is distal from host substrate 202. Host substrate 202 may be any substrate known to be suitable for joinery to device layer 215 and/or a front-side stack fabricated over device layer 215. In some embodiments, host substrate 202 includes one or more additional device strata. For example, host substrate 202 may further include one or more device layer (not depicted). Host substrate 202 may include integrated circuitry with which the IC devices fabricated in a device layer of host substrate 202 are interconnected, in which case joinery of device layer 215 to host substrate 202 may further entail formation of 3D interconnect structures through the wafer-level bond.

Although not depicted in detail by FIG. 3B, any number of front-side layers, such as interconnect metallization levels and interlayer dielectric (ILD) layers, may be present between device layer 215 and host substrate 202. The thickness of host substrate 202 and donor substrate 201 may vary, from substantially the same thickness to one being significantly thicker (e.g., 5-10×) than the other. For some embodiments, host substrate 202 is many microns (e.g., 20-50 µm) in thickness and also includes integrated circuitry. In some embodiments, donor and host substrates may be bonded back-to-face (e.g., a back of host substrate 202 bonded to a face of donor substrate 201). For such embodiments, circuitry on host substrate 201 may include TSVs extending through microns of host substrate thickness. These TSVs may be bonded to features on donor substrate 201 according to any known techniques. In this manner, a tens of microns thick host substrate 202 may serve as a permanent feature of an IC with the greater thickness bootstrapping subsequent back side processing of donor substrate 201 that is unconstrained through the mechanical support provided by host substrate 202. Alternatively, the donor and host substrates may be bonded face-to-face. For such embodiments, circuitry on host substrate 201 need not include TSVs extending through microns of host substrate thickness. Instead, features on the face of donor substrate 201 may be bonded to features on the face of host substrate 202 according to any known techniques. A tens of microns thick host substrate 202 may again serve to bootstrap subsequent back side processing of donor substrate 201 that has a thickness free from minimum thickness constraints because of the mechanical support provided by host substrate 202. With the back of host substrate 202 exposed, host substrate 202 may eventually be thinned, for example at the end of a fabrication flow after the rigidity provided by the host substrate thickness is no longer advantageous.

Any technique may be employed to join host substrate 202 and donor substrate 201. In some exemplary embodiments further described elsewhere herein, the joinery of donor substrate 201 to host substrate 202 is through metal-metal, oxide-oxide, or hybrid (metal/oxide-metal/oxide) thermal compression bonding. Such a permanent bonding technique can provide advantageously high rigidity.

With host substrate 202 facing device layer 215 on a side opposite carrier layer 205, at least a portion of carrier layer 205 may be removed as further illustrated in FIGS. 2C and 3C. Where the entire carrier layer 205 is removed, donor-host substrate assembly 203 maintains a highly uniform thickness with planar back side and front side surfaces. Alternatively, carrier layer 205 and intervening layer 210 may be selectively removed (e.g., carrier layer 205 masked and intervening layer 210 exposed or removed only in unmasked sub-regions) to form a non-planar back side surface. In the exemplary embodiments illustrated by FIG. 2C, 3C, carrier layer 205 is removed from the entire back-side surface of donor-host substrate assembly 203. Carrier layer 205 may be removed, for example by cleaving, grinding, and/or polishing (e.g., chemical-mechanical polishing), and/or wet chemical etching, and/or plasma etching through a thickness of the carrier layer to expose intervening layer 210. One or more operations may be employed to remove carrier layer 205. Advantageously, the removal operation(s) may be terminated based on duration or an endpoint signal sensitive to exposure of intervening layer 210.

In further embodiments, for example as illustrated by FIGS. 2D and 3D, intervening layer 210 is also at least partially etched to expose a back side of device layer 215. At least a portion of intervening layer 210 may be removed subsequent to its use as a carrier layer etch stop and/or carrier layer etch endpoint trigger. Where the entire intervening layer 210 is removed (e.g., with highly-selective CMP) donor-host substrate assembly 203 maintains a highly uniform device layer thickness with planar back-side and front-side surfaces afforded by the intervening layer being much thinner than the carrier layer. Alternatively, intervening layer 210 may be masked and device layer 215 exposed only in unmasked sub-regions, thereby forming a non-planar back-side surface. In the exemplary embodiments illustrated by FIG. 2D, 3D, intervening layer 210 is removed from the entire back-side surface of donor-host substrate assembly 203. Intervening layer 210 may be so removed, for example, by polishing (e.g., chemical-mechanical polishing), and/or blanket wet chemical etching, and/or blanket plasma etching through a thickness of the intervening layer to expose device layer 215. One or more operations may be employed to remove intervening layer 210. Advantageously, the removal operation(s) may be terminated based on duration or an endpoint signal sensitive to exposure of device layer 215.

In some further embodiments, for example as illustrated by FIGS. 2E and 3E, device layer 215 is partially etched to expose a back side of a device structure previously formed from during front-side processing. At least a portion of device layer 215 may be removed subsequent to its fabrication in one or more of the device semiconductor regions, and/or its use as an intervening layer etch stop or endpoint trigger. Where device layer 215 is thinned over the entire substrate area, donor-host substrate assembly 203 maintains a highly uniform reduced thickness with planar back and front surfaces. Alternatively, device layer 215 may be masked and device structures (e.g., device semiconductor regions) selectively revealed only in unmasked sub-regions, thereby forming a non-planar back-side surface. Some such embodiments are described further below. In the exemplary embodiments illustrated by FIGS. 2E and 3E however, device layer 215 is thinned over the entire back-side surface of donor-host substrate assembly 203. Device layer 215 may be thinned, for example by polishing (e.g., chemical-mechanical polishing), and/or wet chemical etching, and/or plasma etching through a thickness of the device layer to expose one or more device semiconductor regions, and/or one or more other device structures (e.g., front-side device terminal contact metallization, a gate electrode spacer dielectric, etc.) previously formed during front-side processing of device layer 215. One or more operations may be employed to thin device layer 215. Advantageously, the device layer thinning may be terminated based on duration or an endpoint signal sensitive to exposure of patterned features within device layer 215. For example, where front-side processing forms device isolation features (e.g., shallow trench isolation), back-side thinning of device layer 215 may be terminated upon exposing the isolation dielectric material.

A non-native material layer may be deposited over a back-side surface of an intervening layer, device layer, and/or specific device regions within device layer 215, and/or over or more other device structures (e.g., front-side device terminal contact metallization, spacer dielectric, etc.). One or more materials exposed (revealed) from the backside may be covered with a non-native material layer or replaced with such a material. In some embodiments, illustrated by FIG. 2F, 3F, non-native material layer 220 is deposited on device layer 215. Non-native material layer 220 may be any material having a composition and/or microstructure distinct from that of the material removed to reveal the backside of the device stratum. For example, where intervening layer 210 is removed to expose device layer 215, non-native material layer 220 may be another semiconductor of different composition or microstructure than that of intervening layer 210. In some such embodiments where device layer 215 is a III-N semiconductor, non-native material layer 220 may also be a III-N semiconductor of the same or different composition that is regrown upon a revealed backside surface of a III-N device region. This material may be epitaxially regrown from the revealed III-N device region, for example, to have better crystal quality than that of the material removed, and/or to induce strain within the device layer and/or device regions within the device layer, and/or to form a vertical (e.g., z-dimension) stack of device regions suitable for fabricating a stacked (multi-layer) device.

In some other embodiments where device layer 215 is a III-V semiconductor, non-native material layer 220 may also be a III-V semiconductor of the same or different composition that is regrown upon a revealed backside surface of a III-V device region. This material may be epitaxially regrown from the revealed III-V device region, for example, to have relatively better crystal quality than that of the material removed, and/or to induce strain within the device layer or a specific device region within the device layer, and/or to form a vertical stack of device semiconductor regions suitable for a stacked (multi-layer) device.

In some other embodiments where device layer 215 is a group IV semiconductor, non-native material layer 220 may also be a group IV semiconductor of the same or different composition that is regrown upon a revealed backside surface of a group IV device region. This material may be epitaxially regrown from the revealed group IV device region, for example, to have relatively better crystal quality than that of the material removed, and/or to induce strain within the device region, and/or to form a stack of device semiconductor regions suitable for a stacked (multi-layer) device.

In some other embodiments, non-native material layer 220 is a dielectric material, such as, but not limited to SiO, SiON, SiOC, hydrogen silsesquioxane, methyl silsesquioxane, polyimide, polynorbornenes, benzocyclobutene, or the like. Deposition of such a dielectric may serve to electrically isolate various device structures, such as semiconductor device regions, that may have been previously formed during front-side processing of donor substrate 201. Such a dielectric material layer may be a first layer of a back-side material stack further including interconnect metallization layers or levels.

In some other embodiments, non-native material layer 220 is a conductive material, such as any elemental metal or metal alloy known to be suitable for contacting one or more surfaces of device regions revealed from the backside. In some embodiments, non-native material layer 220 is a metallization suitable for contacting a device region revealed from the backside, such as a transistor source/drain (i.e., source or drain) region.

In some embodiments, non-native material layer 220 is a stack of materials, such as a FET gate stack that includes both a gate dielectric layer and a gate electrode layer. As one example, non-native material layer 220 may be a gate stack suitable for contacting a semiconductor device region revealed from the backside, such as a transistor channel region. Any of the other materials described as options for device layer 215 may also be deposited over a backside of device layer 215. For example, non-native material layer 220 may be any of the oxide semiconductors, TMDC, or tunneling materials described above, which may be deposited on the back-side, for example, to incrementally fabricate vertically-stacked device strata.

Back-side wafer-level processing may continue in any manner known to be suitable for front-side processing. For example, non-native material layer 220 may be patterned into active device regions, device isolation regions, device contact metallization, or device interconnects using any known lithographic and etch techniques. Back-side wafer-level processing may further fabricate one or more interconnect metallization levels coupling terminals of different devices into an IC. In some embodiments further described elsewhere herein, back-side processing may be employed to interconnect a power bus to various device terminals within an IC.

In some embodiments, back-side processing includes bonding to a secondary host substrate. Such bonding may employ any layer transfer process to join the back-side (e.g., non-native) material layer to another substrate. Following such joinery, the former host substrate may be removed as a sacrificial donor to re-expose the front-side stack and/or the front side of the device layer. Such embodiments may enable iterative side-to-side lamination of device strata with a first device layer serving as the core of the assembly. In some embodiments illustrated in FIGS. 2G and 3G, secondary host substrate 240 joined to non-native material layer 220 provides at least mechanical support while host substrate 202 is removed.

Any bonding, such as, but not limited to, thermal-compression bonding or similar sintering processes may be employed to join secondary host substrate 240 to non-native material layer 220. In some embodiments, both a surface layer of secondary host substrate 240 and non-native material layer 220 are continuous dielectric layers (e.g., SiO), which are thermal-compression bonded. In some other embodiments, both a surface layer of secondary host substrate 240 and non-native material layer 220 comprise a metal layer (e.g., Au, Pt, etc.), which are thermal-compression bonded. In other embodiments, at least one of surface layer of secondary host substrate 240 and non-native material layer 220 are patterned, including both patterned metal surface (i.e., traces) and surrounding dielectric (e.g., isolation), which are thermal-compression bonded to form a hybrid (e.g., metal/oxide) joint. For such embodiments, structural features in the secondary host substrate 240 and the patterned non-native material layer 220 may be aligned (e.g., optically) during the bonding process. In some embodiments, non-native material layer 220 includes one or more conductive back-side traces coupled to a terminal of a transistor fabricated in device layer 215. The conductive back-side trace may, for example, be bonded to metallization on secondary host substrate 240.

In alternative embodiments, a secondary donor substrate is bonded to non-native material layer 220. The assembly shown in FIG. 3G is also applicable for such embodiments, however host substrate 202 is not removed, at least not until back side processing of the secondary donor substrate is completed, for example in substantially the same manner as described above for donor substrate 201. In this manner, any number of donor substrates may be stacked and thinned in reliance of the support provided by host substrate 202. After such support is no longer needed, host substrate 202 may be thinned (e.g., where host substrate 202 was bonded face-to-face with donor substrate 201.

Figure 2H:
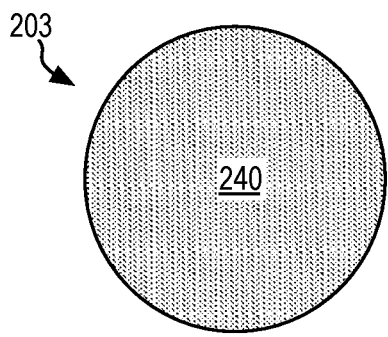

Bonding of device strata to a host (or secondary donor) substrate may proceed from the front-side and/or back-side of a device layer before or after front-side processing of the device layer has been completed. A bonding process may be performed after front-side fabrication of a device (e.g., transistor) on the donor substrate is substantially complete. Alternatively, bonding of the host (or secondary donor) substrate may be performed prior to completing front-side fabrication of a device (e.g., transistor) on the donor substrate, in which case the front side of the device layer on the donor substrate may receive additional processing following back-side bonding to the host (or secondary donor) substrate. As further illustrated in FIGS. 2H and 3H for example, front-side processing includes removal of host substrate 202 to re-expose the front side of device layer 215. At this point, donor-host substrate assembly 203 includes secondary host substrate 240 joined to device layer 215 through non-native material layer 220.

Figure 3H:
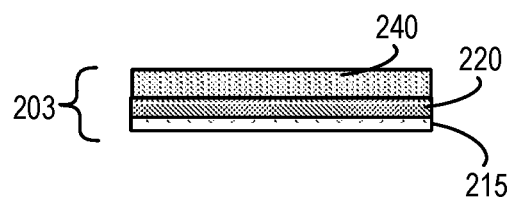
Figure 3I:
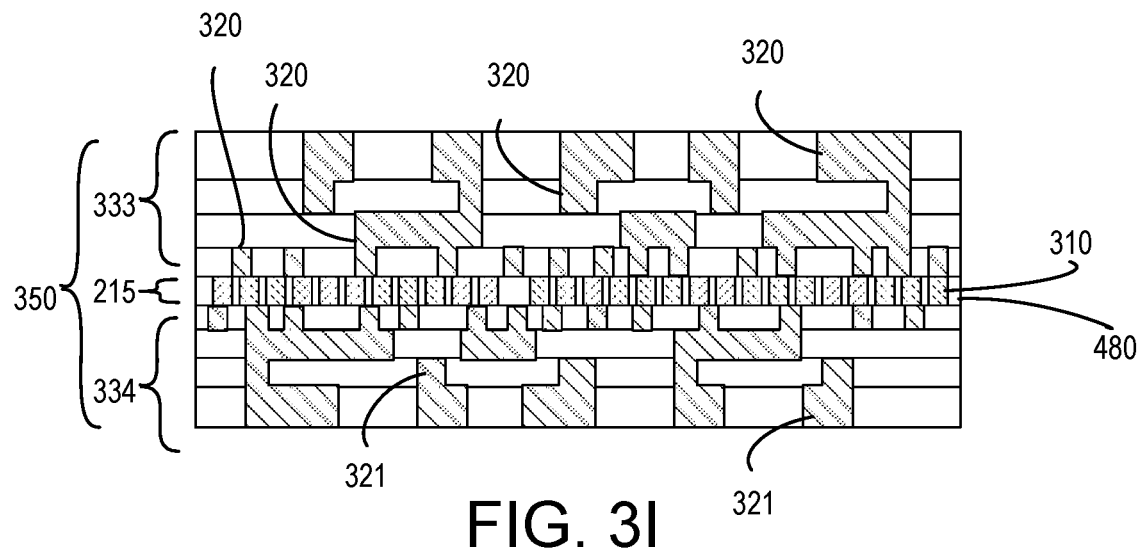

FIG. 3I shows a magnified view of device layer 215 that further illustrates front-side and back-side metallization, in accordance with some embodiments. In FIG. 3I, a host substrate is not shown, for example having been removed during a device packaging process. Device layer 215 includes a plurality of semiconductor bodies 310 surrounded by an isolation dielectric 480. Each of the semiconductor bodies 310 may be a component of one or more finFETs, for example. Front-side interconnect metallization 333 includes a plurality of interconnect metallization levels 320 embedded within inter-layer dielectric (ILD). Back-side interconnect metallization 334 includes a plurality of interconnect metallization levels 321 embedded within inter-layer dielectric (ILD). Front-side interconnect metallization 333 and back-side interconnect metallization 334 may have different material compositions and/or dimensions, for example as further described below. Each of interconnect metallizations 333 and 334 may have any number of levels with higher levels typically having dimensions relaxed from those of lower levels. Device layer 215, as fully interconnected with both front-side interconnect metallization 333 and back-side interconnect metallization 334, is one IC stratum 350. An IC stratum may comprise only one, or both, front-side interconnect metallization and back-side interconnect metallization. A single IC stratum may be packaged according to any suitable techniques. Alternatively, as described above, an IC stratum may be joined with secondary host or donor substrate that includes another device stratum.

Figure 3J:
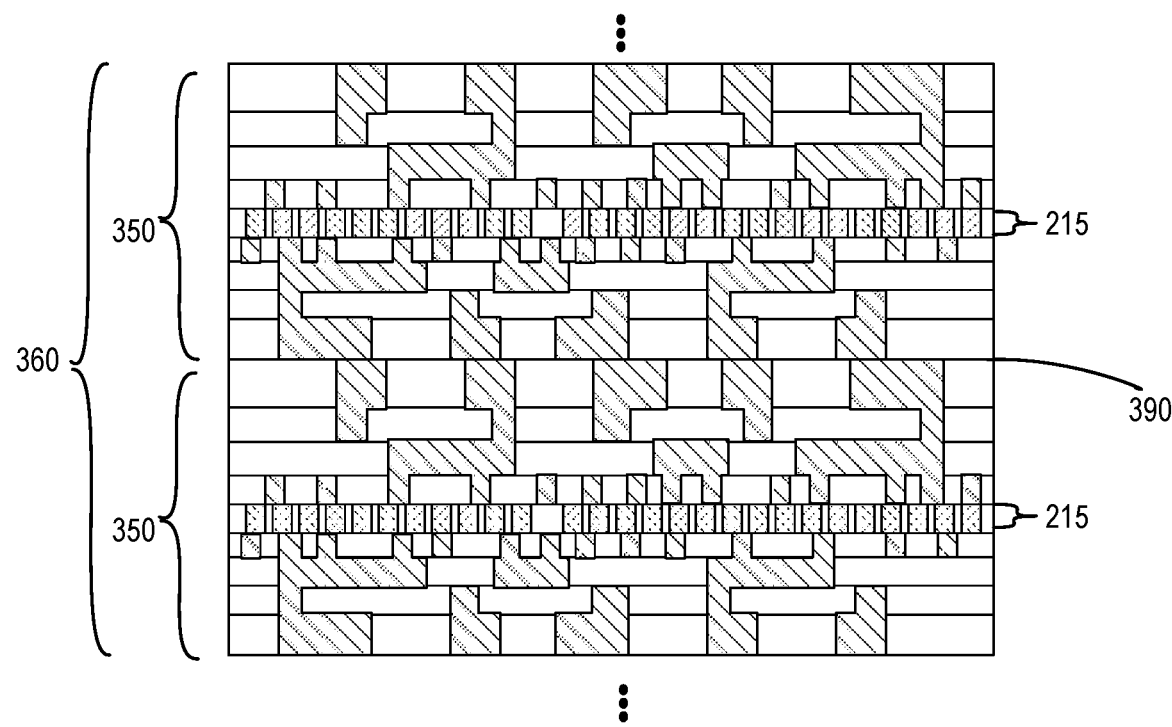

FIG. 3J further illustrates a plurality of IC strata 350 joined into a 3D IC 360, in accordance with some embodiments. Each IC stratum 350 includes a device layer 215, for example having any of the properties described elsewhere herein. As shown, 3D IC 360 lacks any of the thickness overhead associated with bulk crystalline substrate material. In the absence of such material, 3D IC 360 has no microns-thick TSV structures. Instead, IC strata 350 interface one other through a bond 390, which may be any suitable bonding technology, such as, but not limited to, thermal compression bonding or solder bonding. Bond 390 is between two interconnect metallization layers of sufficient geometry to achieve adequate alignment between interconnect metallization features of separate IC stratum. Any number of IC strata 350 may be joined, for example according to one or more of the techniques described herein. In some embodiments, pairs of IC strata are joined face-to-face (front-side to front-side). In some embodiments, pairs of IC strata are joined back-to-back (back-side to back-side). In some embodiments, pairs of IC strata are joined face-to-back (front-side to back-side), with distinctions between front-side and back-side being dependent on the implementation. In some embodiments having at least four IC strata, a first (inner) pair of IC strata are joined face-to-face while individual ones of the first pair are joined back-to-back with individual ones of a second (outer) pair of IC strata.

Figure 5:
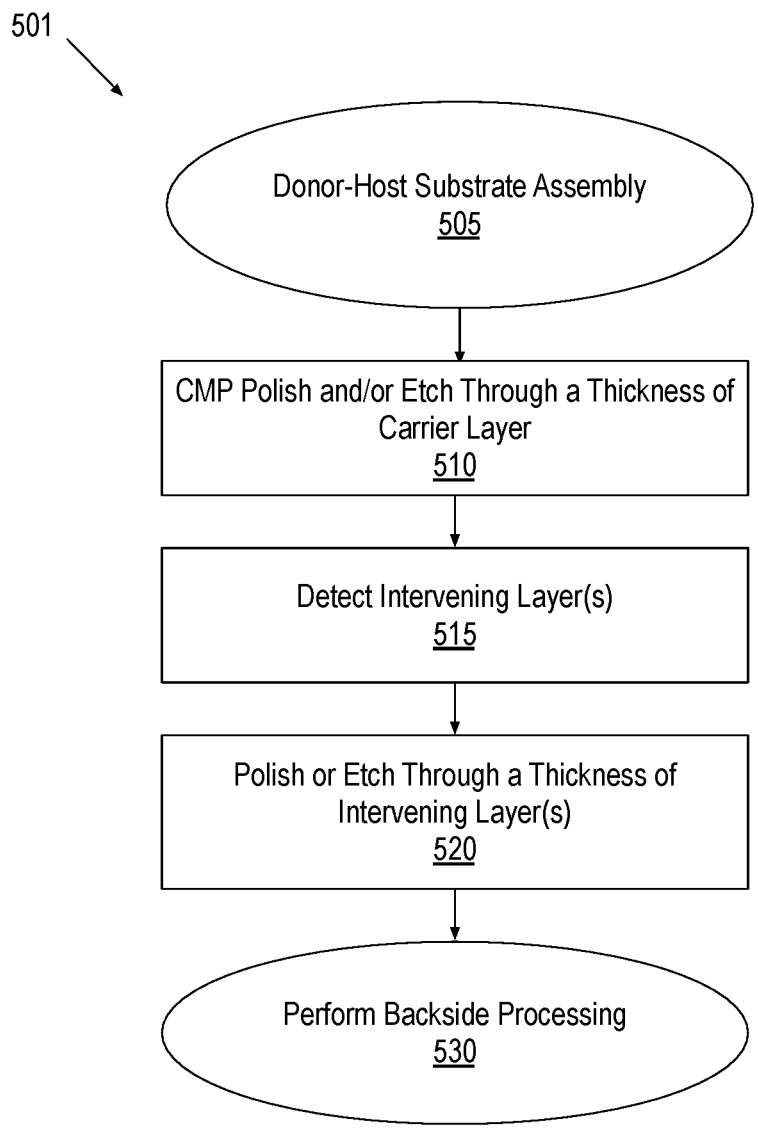
FIG. 5 is a flow diagram illustrating back-side reveal methods, in accordance with some embodiments.

FIG. 5 is a flow diagram illustrating back-side reveal methods 501, in accordance with some embodiments. Methods 501 may be employed for example to remove at least a portion of a carrier layer and intervening layer of a donor-host substrate assembly, for example as part of operation 120 (FIG. 1) and as illustrated in FIGS. 2C-2E and 3C-3E. Methods 501 begin with an input of a donor-host substrate assembly at operation 505. In some embodiments, the donor-host substrate assembly received at operation 505 is donor-host substrate assembly 203 as illustrated in FIG. 3B. At operation 510, a thickness of a carrier layer in the donor-host substrate is polished off (e.g., CMP) and/or etched through with a wet or dry (e.g., plasma) etch process. Any grind, polish, and/or masked or unmasked wet/dry etch process known to be suitable for the composition of the carrier layer may be employed at operation 510. For example, where the carrier layer is a group IV semiconductor (e.g., silicon) a CMP slurry known to be suitable for thinning the semiconductor may be employed at operation 510. As another example, any wet etchant or plasma etch process known to be suitable for etching features into the group IV semiconductor may also be employed at operation 510.

In some embodiments, operation 510 is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off. Any blanket implant known to promote a wafer-level fracture may be employed at operation 510. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish, and/or etch operation 510 may be enlisted to remove a greater thickness of the carrier layer.

At operation 515, exposure of an intervening layer is detected. Detection operation 515 is to identify when the back-side surface of the donor substrate has advanced to the intervening layer prior to exposing a device layer. Any endpoint detection technique known to be suitable for detecting a transition between the materials employed for the carrier layer and the intervening layer may be practiced at operation 515. In some embodiments, one or more endpoint criteria are based on detecting a change in optical absorbance or emission of the back-side surface of the donor substrate during polishing and/or etching at operation 510. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of operation 510 may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection operation 515 may even be skipped if the grind, polish and/or etch operation 510 removes the intervening layer at a rate sufficiently below the rate at which the carrier layer is removed. If an endpoint criteria is not employed at operation 515, a grind, polish and/or etch operation 510 of a predetermined fixed duration may stop on the intervening layer material if the thickness of the intervening layer is sufficient for the selectivity of the etch. In some examples where the carrier is a semiconductor and the intervening layer is a dielectric, the carrier etch rate:intervening layer etch rate may be 3:1-10:1, or more. A CMP process employed at operation 510 may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

Upon exposing the intervening layer, at least a portion of the intervening layer may be removed at operation 520. For example, one or more component layers of the intervening layer may be removed. Operation 520 is optional, however. A thickness of the intervening layer may be removed uniformly by a polish, for example. Alternatively, a thickness of the intervening layer may be removed with a masked or blanket etch process. Operation 520 may employ the same polish or etch process as that employed to thin the carrier at operation 515, or may be a distinct process with distinct process parameters. For example, where the intervening layer provides an etch stop for the carrier removal process, operation 520 may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed at operation 520 may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions within a device layer. In some embodiments, the backside device layer processing includes a further polish or wet/dry etch through a thickness of the device layer disposed between the intervening layer and a device region previously fabricated in the device layer, such as a source/drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further elsewhere herein, the patterning may be within a single device structure (i.e., "intra-cell" patterning) or may be across multiple (e.g., all) device cells (i.e., "inter-cell" patterning). In some patterned etch embodiments, at least a partial thickness of the intervening layer is employed as a hard mask for back-side device layer patterning. Hence, a masked etch at operation 520 may preface a correspondingly masked device layer etch.

The output of methods 501 is a donor-host substrate assembly that includes IC devices that have a back side of an intervening layer, a back side of the device layer, and/or back side of one or more semiconductor regions within the device layer, and/or front-side metallization revealed where the front-side metallization has been deposited into topography formed into/through the device layer. Additional back-side processing of any of these revealed regions may then be performed down stream of methods 501. In some exemplary embodiments, the backside processing performed downstream of methods 501 includes deposition of a non-native material over the revealed region(s), for example as further described elsewhere herein.

Figure 6:
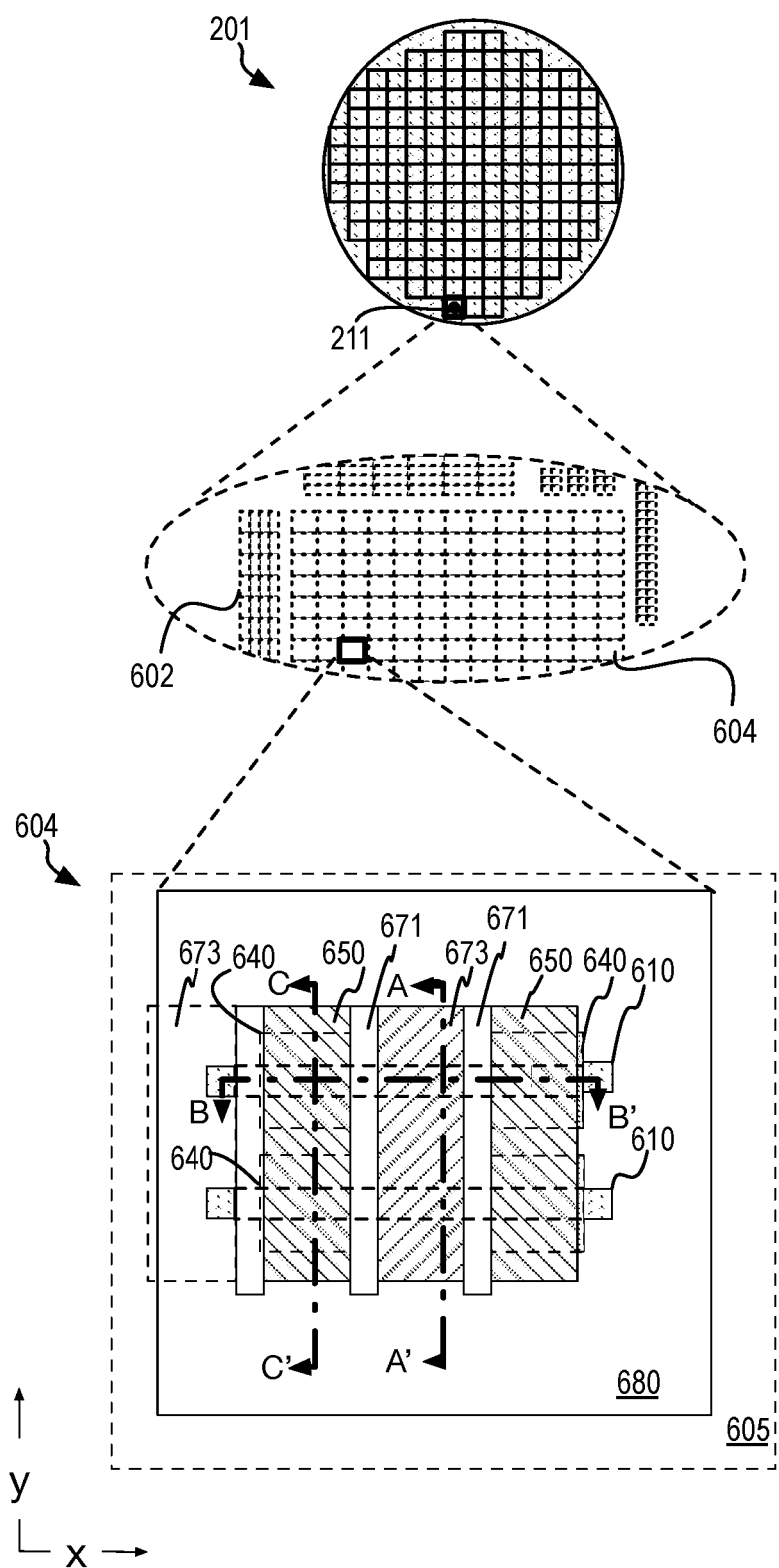
FIG. 6 is a plan view of a substrate with expanded views of IC die on the substrate, and of a transistor structure on the IC die, in accordance with some embodiments.

FIG. 6 is a plan view of donor substrate 201 with an expanded view of an IC die 211, and of a further expanded view of a logic transistor structure 604 disposed within IC die 211, in accordance with some embodiments. As described above, donor substrate 201 may be an input to methods 101 (FIG. 1), for example. In further reference to FIG. 6, a plurality of logic transistor structures 604 are arrayed over an area of a device layer within IC die 211. Additional device cells 602 may be, for example, any of memory cells, power transistor structures, RF transistor structures, optical device cells, or the like. Transistor structure 604 includes a field effect FET with a source terminal, a drain terminal, and a gate terminal, in accordance with some illustrative embodiments. In some embodiments, the source and drain terminals include semiconductor having the same conductivity type. In other embodiments, the source and drain terminals include semiconductor having complementary conductivity type (i.e., a tunnel FET, or TFET). The FET may also include a heterojunction (i.e., HFET) and may also qualify as a high electron mobility transistor (HEMT) when the channel comprises a III-V or III-N material. In FIG. 6, solid lines within transistor structure 604 denote salient materials formed overlying other material or structural features denoted in dashed lines within the transistor structure stratum. Heavy dot-dashed lines in FIG. 6 denote planes A-A', B-B' and C-C' along which cross-sectional views are further provided as FIGS. 8A, 8B, 8C, 9A, 9B, 9C and 11A, 11B, 11C, where the letter in the figure number corresponds to the cross-sectional plane designated by that same letter.

As further shown in FIG. 6, transistor structure 604 is supported by a back-side substrate 605 with semiconductor bodies 610 that are embedded within a front-side field isolation dielectric material 680. In some embodiments, back-side substrate 605 includes a carrier layer (e.g., carrier layer 205 of FIG. 3A). In some embodiments, an intervening layer (not depicted) separates back-side substrate 605 from transistor structure 604. In some other embodiments, back-side substrate 605 includes both a carrier layer (e.g., carrier layer 205 of FIG. 3A) and an intervening layer (e.g., intervening layer 210 of FIG. 3A). In one example, transistor structure 604 is fabricated on donor substrate 201 (FIG. 3A). In certain embodiments, the transistor cell 604 contains non-planar FETs, such as FinFETs, Tri-Gates, omega-gates, and the like. In further reference to FIG. 6, transistor structure 604 includes a gate electrode 673 strapping across a channel region of each of a first and a second semiconductor body 610. Although two semiconductor bodies 610 are illustrated in FIG. 6, a non-planar FET may include one or more such semiconductor bodies. In some exemplary embodiments, semiconductor bodies 610 include at least one semiconductor region that originates from a device layer of donor substrate 201. For example, a transistor channel region within semiconductor bodies 610 may be derived from semiconductor device layer 215 of FIG. 3A. As such, semiconductor bodies 610 may include one or more semiconductor region having any of the compositions described above for a donor substrate device layer (e.g., device layer 215 shown in FIG. 3A) that are suitable for a field effect transistor. Exemplary materials include, but are not limited to, group IV semiconductors (e.g., Si, Ge, SiGe), group III-V semiconductors (e.g., GaAs, InGaAs, InAs, InP), group III-N semiconductors (e.g., GaN, AlGaN, InGaN), oxide semiconductors, TMDCs, graphene, etc. In some advantageous embodiments, semiconductor bodies 610 are monocrystalline.

As further illustrated in FIG. 6, source/drain metallization 650 is disposed adjacent to gate electrode 673 and also extends across semiconductor bodies 610. In the illustrated embodiment, source/drain metallization 650 is disposed on regrown or raised source/drain semiconductor 640, which is further disposed in contact with semiconductor bodies 610. Source/drain semiconductor 640 may be doped with electrically active impurities imparting n-type or p-type conductivity. For some exemplary embodiments, both the source and drain semiconductor 640 is doped to the same conductivity type (e.g., n-type for NMOS and p-type for PMOS). In alternative embodiments (e.g., for a tunneling FET), source and drain semiconductor 640 is doped to have complementary conductivity (e.g., n-type source and p-type drain). Source/drain semiconductor 640 may be any semiconductor material compatible with semiconductor bodies 610, such as, but not limited to, group IV semiconductors (e.g., Si, Ge, SiGe), and/or group III-V semiconductors (e.g., InGaAs, InAs), and/or group III-N semiconductors (e.g., InGaN), and/or (metal) oxide semiconductors.

An electrically insulating spacer dielectric 671 laterally separates gate electrode 673 from source/drain metallization 650 and/or source/drain semiconductor 640. Source/drain metallization 650 may include one or more metals (e.g., Ti, W, Pt, their alloys, and nitrides) that form an ohmic or tunneling junction with doped source/drain semiconductor 640. Spacer dielectric 671 may be or any dielectric such as, but not limited to, silicon dioxide, silicon nitride, or silicon oxynitride, or any known low-k material having a relative permittivity below 4.0. Although only one gate electrode 673 is illustrated in solid line as being part of a single logic transistor structure, an exemplary second gate electrode 673 is drawn in dashed line as being associated with an adjacent transistor structure. The second gate electrode is also laterally separated from metallization 650 and/or source/drain semiconductor 640 by spacer dielectric 671.

Figure 7:
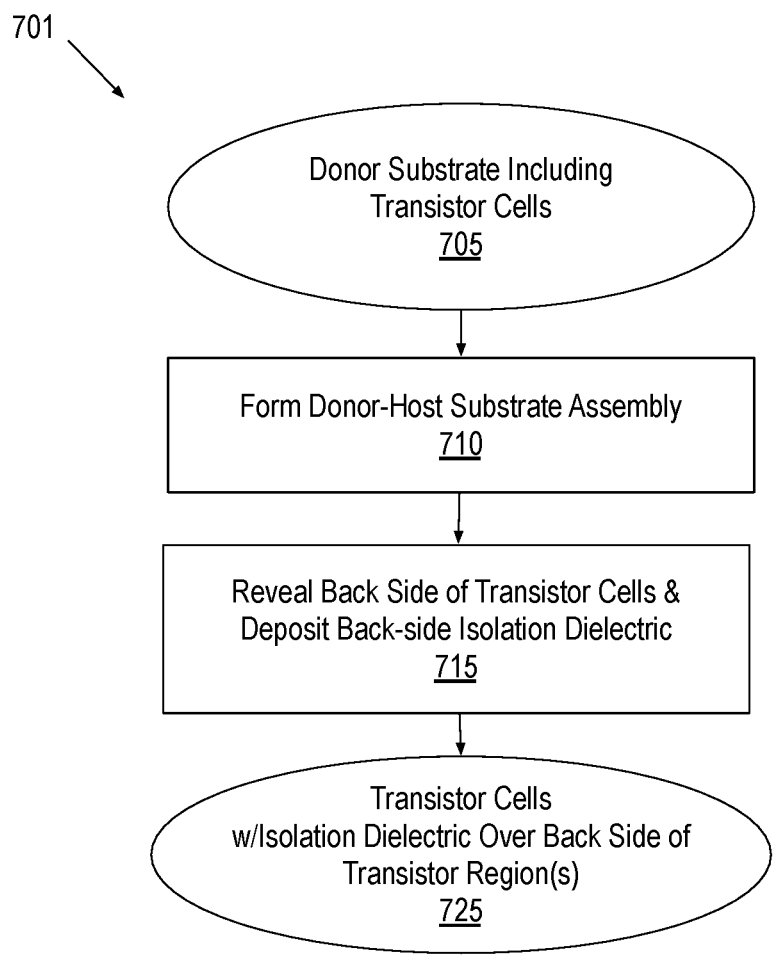
FIG. 7 is a flow diagram illustrating back-side processing methods including electrical isolation of transistor semiconductor bodies, in accordance with some embodiments.

FIG. 7 is a flow diagram illustrating methods 701 for back-side isolation of transistors, in accordance with some embodiments. Methods 701 further exemplify formation of a transistor structure stratum that may be no more than a few hundred nanometers in thickness. Methods 701 further illustrate how the techniques introduced above in the context of FIG. 1-5 may be applied to provide back-side isolation structures to a device stratum. As described elsewhere herein, such a stratum is amenable to being vertically stacked into a 3D IC having potentially very high vertical cell density (e.g., high strata count/micrometer thickness). Methods 701 may also improve electrical isolation of transistors, for example by reducing through-substrate leakage between adjacent devices. Methods 701 begin with a donor substrate including transistor structures employing a device layer of the donor substrate at input 705. The transistor structures may be completely operable as fabricated from the front side, for example including three terminals as illustrated in FIG. 6. Alternatively, one or more terminals may be absent such that the transistor structure will not be operable until back-side processing is complete. The donor substrate may have one or more of the features described above, such as, but not limited to, an intervening layer and a carrier layer. Notably however, a carrier layer and/or intervening layer is not required to perform methods 701. At operation 710 a donor-host substrate assembly is formed, for example as described elsewhere herein (e.g., following methods 101). At operation 715, the back side of the transistor structure is revealed by removing at least at portion of the donor substrate to form a transistor stratum-host substrate assembly. Isolation dielectric may then be deposited over the revealed backside surface, which in exemplary embodiments is a surface of a semiconductor or metal. At operation 720, the backside isolated transistor stratum-host substrate assembly is output from methods 701 and is ready to undergo further processing, for example following a subsequent iteration of methods 101 (FIG. 1).

FIGS. 8A, 9A, 10A, and 11A illustrate cross-sectional views of transistor structure 604 along the A-A' plane denoted in FIG. 6, as operations in methods 701 are performed, in accordance with some embodiments. FIGS. 8B, 9B, 10B, and 11B illustrate cross-sectional views of transistor structure 604 along the B-B' plane denoted in FIG. 6 as operations in methods 701 are performed, in accordance with some embodiments. FIGS. 8C, 9C, 10C, and 11C illustrate cross-sectional views of transistor structure 604 along the C-C' plane denoted in FIG. 6 as operations in methods 701 are performed, in accordance with some embodiments. Notably, while transistor structure 604 illustrates a non-planar transistor structure with a gate electrode that couples to multiple surfaces of a semiconductor body, methods 701 may also be applied in a similar fashion to planar transistor structures.

Figure 8A:
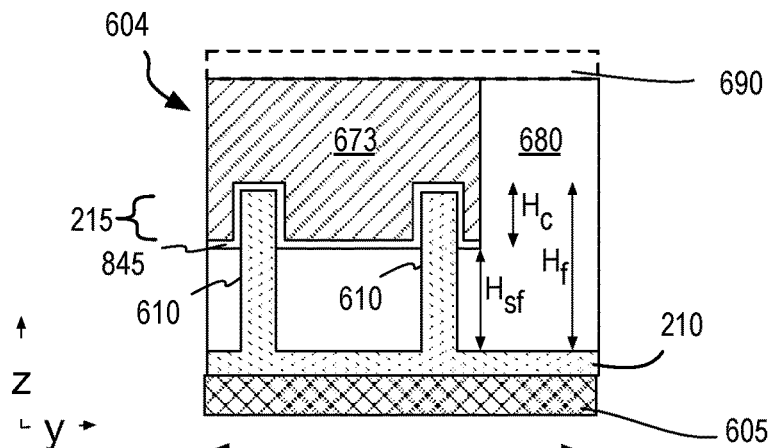
FIG. 8A, 8B, 8C illustrate cross-sectional views of a transistor structure as some operations in the methods illustrated in FIG. 7 are performed, in accordance with some embodiments.
Figure 8B:
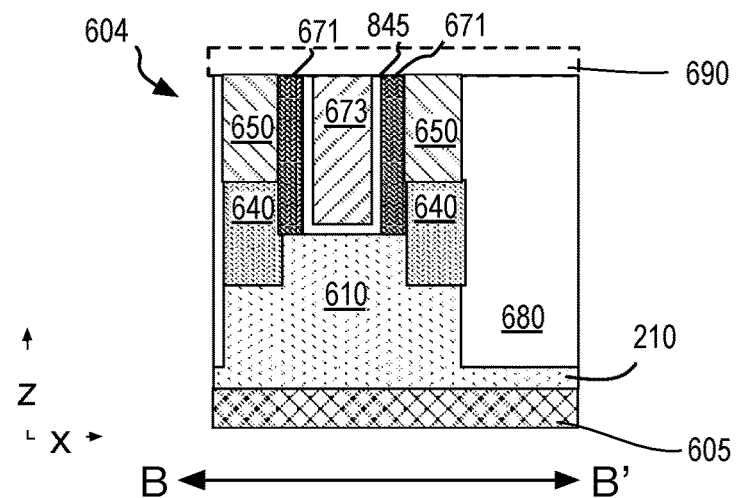
Figure 8C:
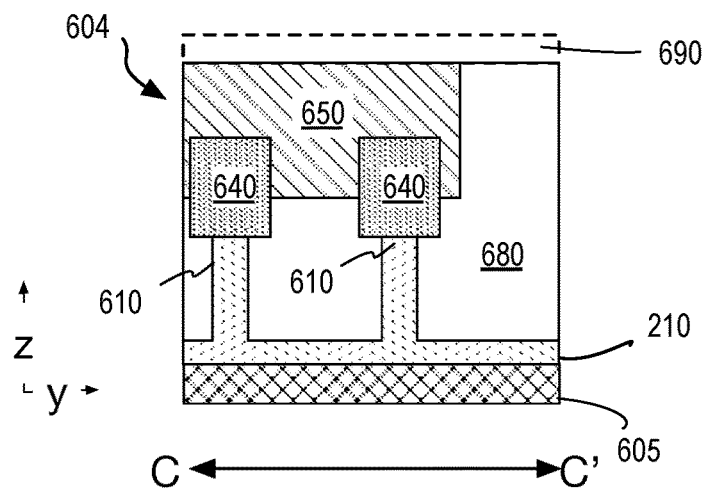

FIG. 8A-8C illustrate structures present in an exemplary transistor structure following front-side processing of a donor substrate. Semiconductor bodies 610 are fin structures extending vertically (e.g., z-dimension) by a fin height $H_f$. Semiconductor bodies 610 include a channel portion having a channel height $H_c$. In some exemplary embodiments, channel height $H_c$ comprises device layer 215. In the embodiments illustrated in FIG. 8A-8C, semiconductor bodies 610 further include a sub-fin portion having a sub-fin height $H_{sf}$ that also comprises device layer 215. Transistor semiconductor bodies 610 may have been formed, for example, with a patterned front-side recess etch of device layer 215. As described further elsewhere herein, semiconductor fin bodies may alternatively include a sub-fin semiconductor of a different composition than the channel portion, in which case the device layer 215 may only be the channel portion while the sub-fin semiconductor may be a component of intervening layer 210 (FIG. 3A). Alternatively, the sub-fin semiconductor may be considered a spacer between device layer 215 and back-side substrate 605, which may further include an intervening layer between the sub-fin semiconductor and a carrier layer. Surrounding one or more sidewalls of semiconductor bodies 610 is field isolation dielectric 680. Field isolation dielectric 680 may be one or more materials suitable for providing electrical isolation between laterally (e.g., x or y dimension) adjacent transistors. In some exemplary embodiments, field isolation dielectric 680 includes silicon dioxide. Other materials, such as, but not limited to, SiN SiON, SiOC, polyimide, HSQ, or MSQ are also possible. In some embodiments, field isolation dielectric 680 and the sub-fin portion of semiconductor bodies 610 make up the intervening layer upon which a carrier removal process is stopped.

A gate stack including gate electrode 673 disposed over a gate dielectric 845 intersecting a channel portion of transistor semiconductor bodies 610 is further illustrated in FIGS. 8A and 8B. An intersection of source/drain metallization with source/drain semiconductor 640 is further illustrated in FIG. 8C. Semiconductor body channel portions are coupled to the gate stack and have a sidewall height $H_c$, below which is a sub-fin having a sub-fin z-height $H_{sf}$. While any gate stack materials known to be suitable for semiconductor bodies 610 may be utilized, in some exemplary embodiments the gate stack includes a high-k dielectric material (with a bulk relative permittivity greater than 9) and a metal gate electrode having a work function suitable for semiconductor bodies 610. Exemplary high-k materials include metal oxides, such as, but not limited to $Al_2O_3$, $HfO_2$, $HfAlO_x$. Silicates, such as, but not limited to $HfSiO_x$, or $TaSiO_x$ may also be suitable for some semiconductor body compositions (e.g., Si, Ge, SiGe, III-V). Gate electrode 673 may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in gate electrode 673, such as, but not limited to, C, Ta, W, Pt, and Sn.

FIG. 8A-8C further illustrate a front-side stack 690 disposed over the front-side surface. Front-side stack 690 is illustrated in dashed line as being a portion of the transistor structure stratum that may vary without limitation and may, for example, include any number of backend interconnect metallization levels. Such levels may be separated from semiconductor bodies 610 and/or from each other by one or more inter-level dielectric (ILD) layer. Back-side substrate 605, which might further include an intervening layer and/or carrier layer, is disposed over the back-side surface.

Figure 9A:
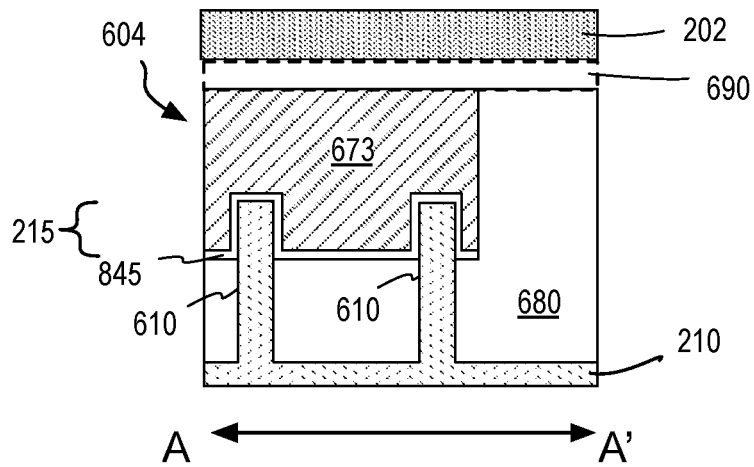
FIG. 9A, 9B, 9C illustrate cross-sectional views of a transistor structure as some operations in the methods illustrated in FIG. 7 are performed, in accordance with some embodiments.
Figure 9B:
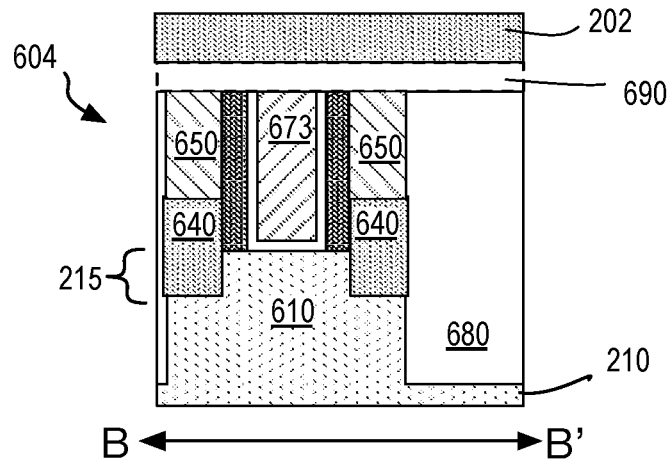
Figure 9C:
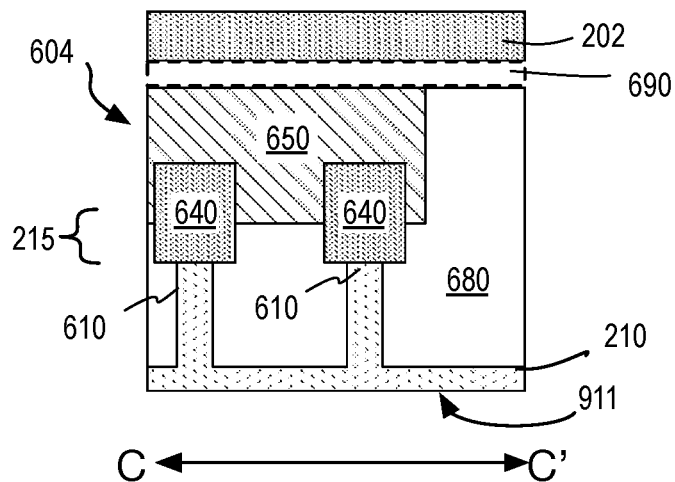

FIG. 9A-9C depict transistor structure 604 following joinery of the donor substrate to host substrate 202. Host substrate 202 may have any of the properties described elsewhere herein. As shown, host substrate 202 is joined to a front-side surface of front-side stack 690, for example by thermal-compression bonding. As further illustrated in FIG. 9A-9C, back-side substrate 605 has been removed, exposing a back side surface 911 of intervening layer 210. Back-side substrate 605 may be removed by any technique, such as, but not limited to, methods 501 (FIG. 5). A marker or etch stop, for example, may have been present within an intervening layer 210 terminating the carrier removal operation prior to revealing the back side of field isolation dielectric 680.

Figure 10A:
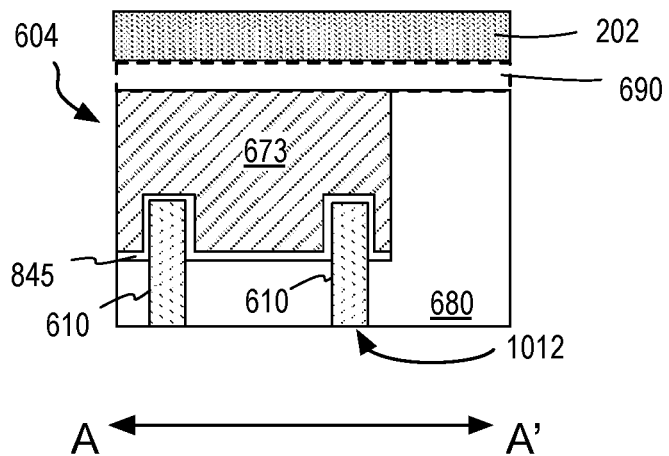
FIG. 10A, 10B, 10C illustrate cross-sectional views of a transistor structure as some operations in the methods illustrated in FIG. 7 are performed, in accordance with some embodiments.
Figure 10B:
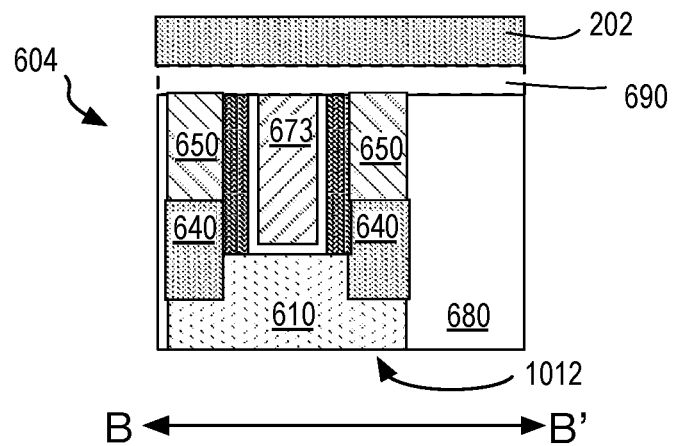
Figure 10C:
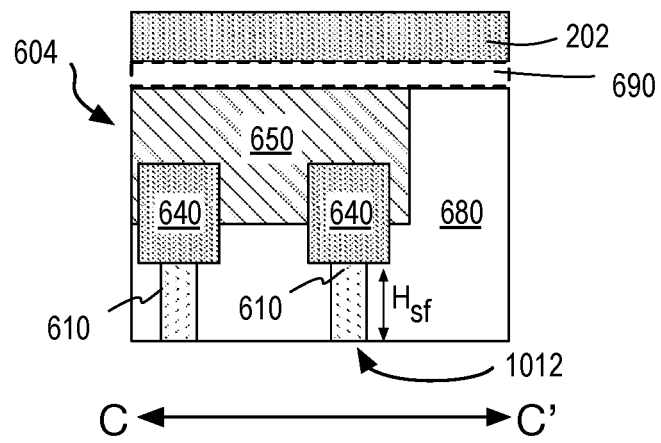

FIG. 10A-10C depict transistor structure 604 following a reveal of a backside 1012 of semiconductor bodies 610. To reveal the back side of transistor semiconductor bodies 610, portions of bulk semiconductor to which transistor semiconductor bodies 610 were anchored may be polished back and/or recess etched with a wet and/or dry etch process, for example as described above for operation 520 (FIG. 5). In some exemplary embodiments where a highly selective (e.g., 200-300:1) CMP slurry having a higher etch rate of device layer semiconductor (e.g., Si) than dielectric (e.g., Sift) is employed, the back-side polish of intervening layer 210 may be stopped upon exposure of field isolation dielectric 680. Any amount of over-etch (over-polish) may be performed to reduce sub-fin height $H_{sf}$ by further thinning the intervening layer comprising the sub-fin portion of semiconductor bodies 610 and adjacent field isolation dielectric 680. In some embodiments, the entire sub-fin for one or more semiconductor bodies within a transistor structure may be removed during the back-side reveal operation.

Figure 11A:
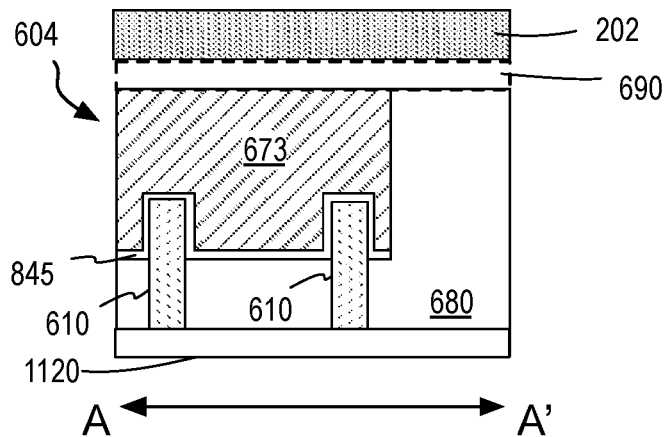
FIG. 11A, 11B, 11C illustrate cross-sectional views of a transistor structure as some operations in the methods illustrated in FIG. 7 are performed, in accordance with some embodiments.
Figure 11B:
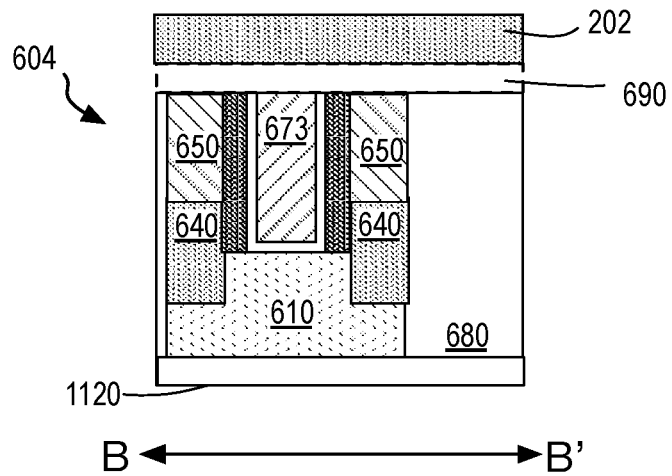
Figure 11C:
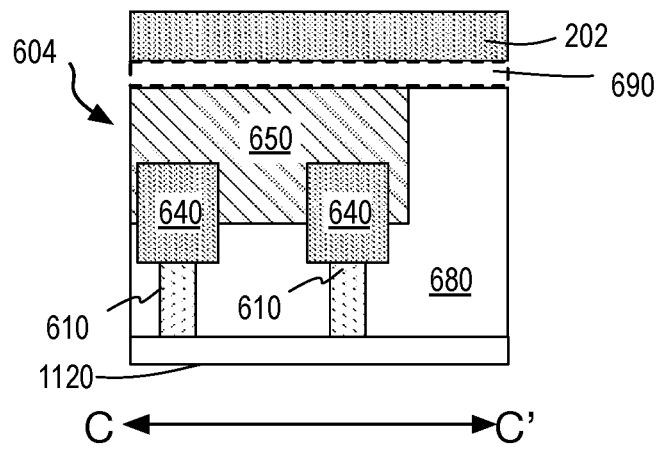

FIG. 11A-11C depict transistor structure 604 following a deposition of back-side isolation dielectric 1120 over the revealed backside of transistor semiconductor bodies 610. Back-side isolation dielectric 1120 is one example of a non-native material replacing a portion of an intervening layer removed to expose transistor semiconductor regions. Back-side isolation dielectric 1120 may be any dielectric material suitable for electrical isolation of transistors. In some exemplary embodiments, back-side isolation dielectric 1120 is silicon dioxide. Notably however, because back-side isolation dielectric 1120 is deposited after back-side reveal rather than having been previously incorporated into the donor substrate, a wider selection of materials is possible than, for example, in an SOI substrate where the insulator layer is provided upstream as an embedded layer of the substrate. Hence, in some advantageous embodiments, back-side isolation dielectric 1120 has a low relative permittivity (e.g., as measured for the material in a bulk state). Such materials are often unable to sustain high temperature processing associated with many front-side fabrication processes (e.g., source/drain formation). Back-side isolation dielectric may be a low-k dielectric material, such as any of those known to be suitable as a front-side ILD in a back-end interconnect stack. In some embodiments, back-side isolation dielectric 1120 has a relative permittivity no greater than that of field isolation dielectric 680, and more advantageously less than that of field isolation dielectric 680. In some embodiments, back-side isolation dielectric 1120 has a relative permittivity less than 3.9, and more advantageously less than 3.5. In some embodiments, back-side isolation dielectric 1120 has the same composition as one or more ILD layer in front-side stack 690. Exemplary back-side isolation dielectric materials include SiOC, SiOCH, HSQ, or MSQ. Other low-k dielectrics are also possible. Likewise, other dielectric materials having a relative permittivity higher than 3.9 (e.g., SiN SiON) are also possible.

Figure 11D:
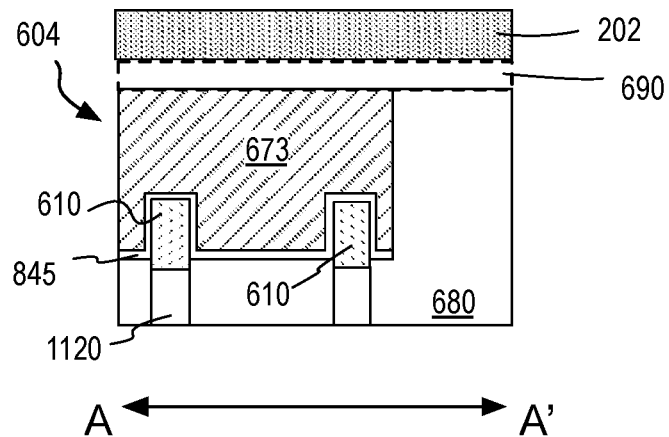
FIG. 11D, 11E, 11F illustrate cross-sectional views of a transistor structure as some operations in the methods illustrated in FIG. 7 are performed, in accordance with some embodiments.
Figure 11E:
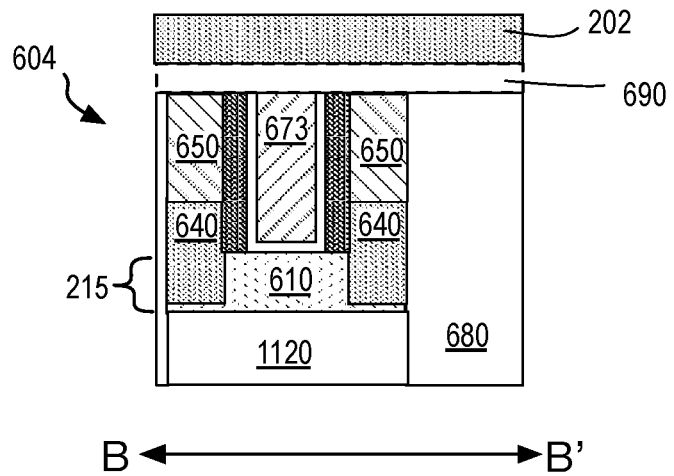
Figure 11F:
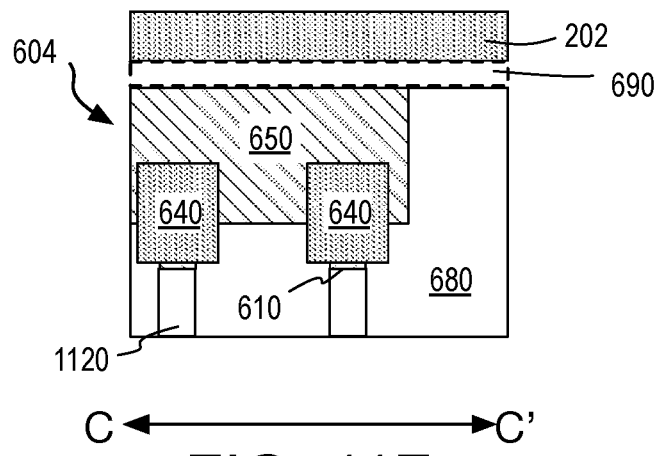

FIG. 11D-11F depict transistor structure 604 following a replacement of at least a portion of semiconductor bodies 610 with back-side isolation dielectric 1120. FIG. 11D provides a view of transistor structure 604 along the A-A' plane denoted in FIG. 6, in accordance with some embodiments. FIG. 11E illustrates cross-sectional views of transistor structure 604 along the B-B' plane denoted in FIG. 6, and FIG. 11F illustrates cross-sectional views of transistor structure 604 along the B-B' plane denoted in FIG. 6. In some illustrative embodiments, a sub-fin portion of semiconductor bodies 610 is etched from the back side, for example with any etch process selective to the sub-fin semiconductor over field isolation 680. The back-side sub-fin recession may reveal the back side of device layer 215 (e.g., including the channel semiconductor), or not. Back-side isolation dielectric 1120 is then back-filled into the resulting recesses. In alternative embodiments, a portion of an intervening layer below the device layer is converted into an isolation dielectric. For example, the sub-fin portion of semiconductor bodies 610 may be converted into back-side isolation dielectric 1120. In some advantageous embodiments, at least a partial thickness of the semiconductor bodies 610 (e.g., silicon) below device layer 215 is converted to $SiO_2$ using any known thermal and/or wet chemical and/or plasma-enhanced chemical oxidation process to form back-side isolation dielectric 1120.

Figure 12:
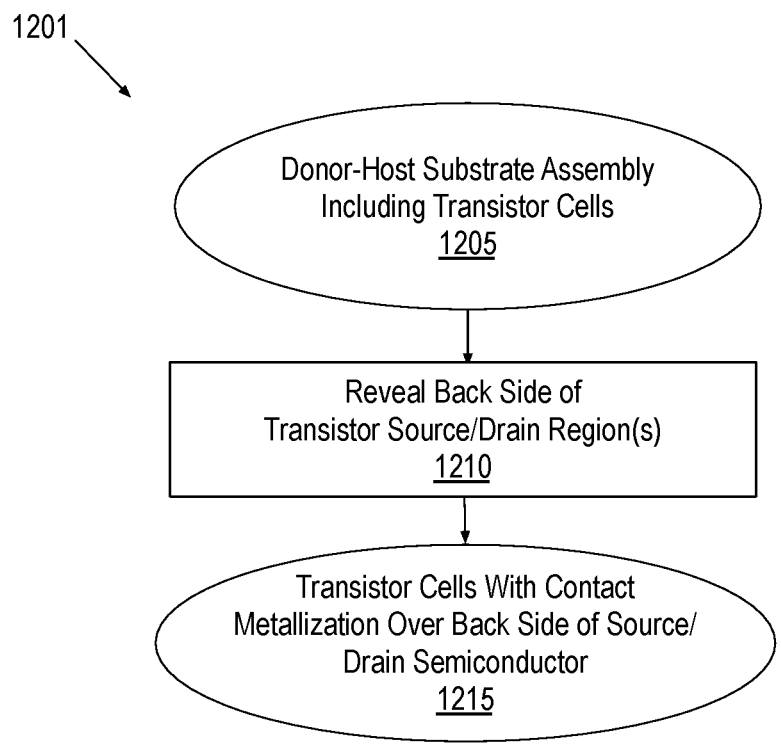
FIG. 12 is a flow diagram illustrating back-side processing methods including back side transistor source/drain contact metallization, in accordance with some embodiments.

FIG. 12 is a flow diagram illustrating methods 1201 for forming back side transistor source/drain contact metallization, in accordance with some embodiments. Methods 1201 further exemplify formation of a transistor structure stratum that may be no more than a few hundred nanometers in thickness. Methods 1201 begin with a donor-host substrate assembly including transistor structures as an input 1205. The donor substrate may have one or more of the features described above, such as, but not limited to, an intervening layer and a carrier layer. Notably however, a carrier layer and/or intervening layer is not required to perform methods 1201. The transistor structures at the input of methods 1201 may be completely operable, for example including three terminals as illustrated in FIG. 6. Alternatively, one or more terminals may be absent such that the transistor structure will not be operable until back-side processing is complete.

Figure 13:
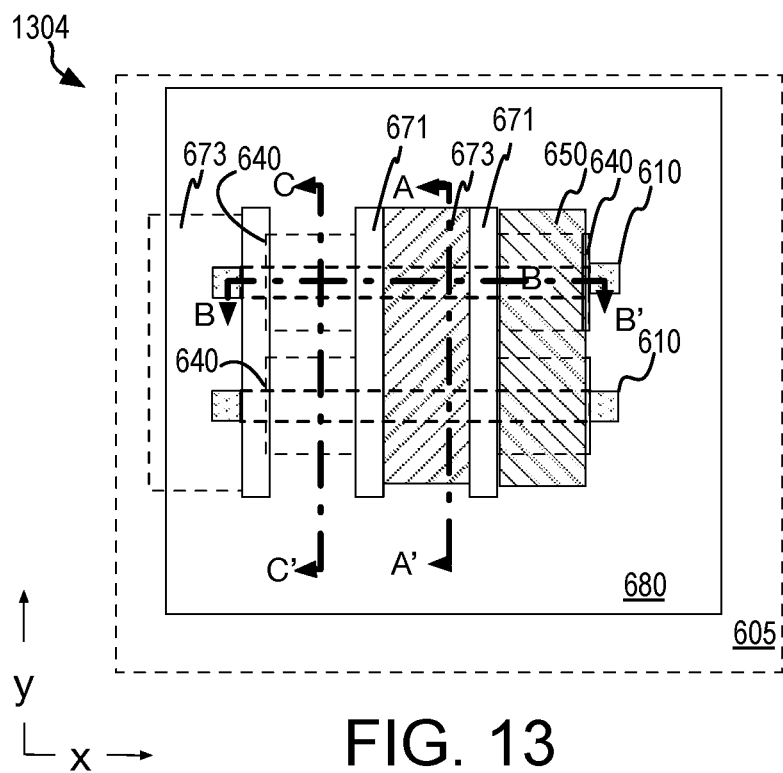
FIG. 13 is a plan view of a transistor structure suitable for forming a back-side transistor source/drain contact metallization, in accordance with some embodiments.

FIG. 13 is a plan view of a transistor structure 1304 lacking one source/drain metallization 650. Heavy dot-dashed lines denote planes along which cross-sectional views are further provided as FIGS. 14A-14C, 15A-15C and 16A-16C. In the absence of a source or drain metallization 650, pitch and/or critical dimension constraints for source/drain metallization 650 and/or other front-side metallization levels (e.g., gate electrode 673 or higher metallization levels) may be advantageously relaxed. The absence of a source or drain metallization 650 may render transistor structure 1304 inoperable until the third terminal connection is fabricated, for example, with back-side transistor source/drain contact metallization methods 1201 (FIG. 12). Such back-side transistor source/drain contact metallization may couple a power rail (e.g., $V_{cc}$) into a transistor structure, advantageously placing power and signal (gate electrode voltage) routing on opposite sides of a transistor structure stratum. Similar advantages are possible for memory cells, such as an SRAM or other memory cell. For example, bit line, source line, and/or word line metallization may be on opposite sides of one memory cell stratum. Notably, back-side transistor source/drain contact metallization methods 1201 may be also practiced on a transistor structure that is fully-functional as fabricated from the front-side (e.g., includes all device terminals). For such embodiments, the back-side transistor source/drain contact metallization methods 1201 may be practiced to tie the source/drain transistor terminal into interconnect traces disposed on both sides of a transistor stratum, which may advantageously reduce source/drain contact resistance and/or enable a transistor source/drain semiconductor region to be a circuit node that is directly fanned out to at least two other circuit nodes.

At operation 1210, a back side of at least one transistor source/drain region is revealed. In some embodiments, a patterned back-side recess etch is performed at operation 1210 to reveal a source drain region selectively to other regions of a transistor structure. Alternatively, where a source/drain semiconductor (or any sacrificial material) at a source/drain location) extends from the front side to a depth greater than other transistor regions, operation 1210 may entail an unpatterned back-side recess etch or polish that is halted upon exposing the source/drain semiconductor (or other sacrificial material) prior to exposure of other device regions, such as the channel semiconductor. Once revealed, methods 1201 complete at operation 1215 where source/drain semiconductor and/or contact metallization is deposited over the back side of the source/drain semiconductor. The source/drain semiconductor and/or contact metallization are further examples of non-native materials that may be deposited, for example as described above in the context of operation 125 in FIG. 1.

Figure 14A:
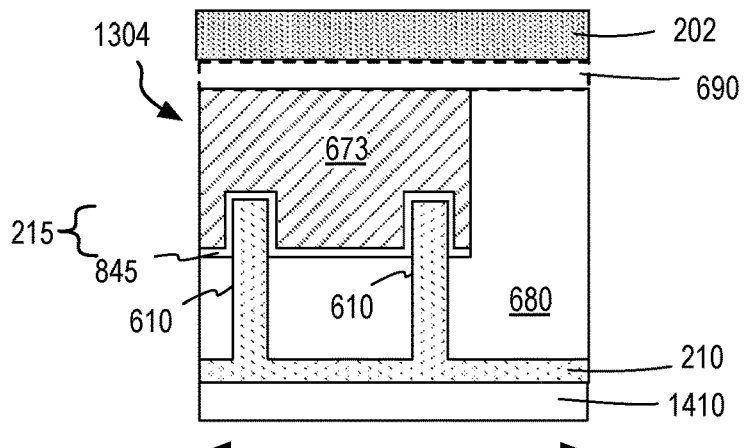
FIG. 14A, 14B, 14C illustrate cross-sectional views of a transistor structure as some operations in the methods illustrated in FIG. 12 are performed, in accordance with some embodiments.
Figure 14B:
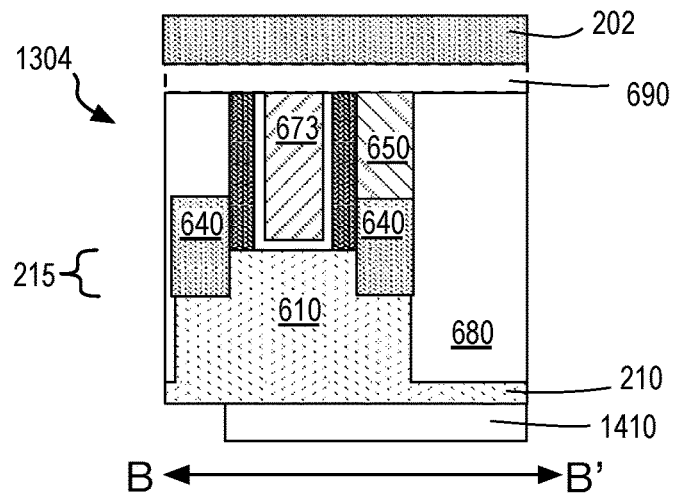
Figure 14C:
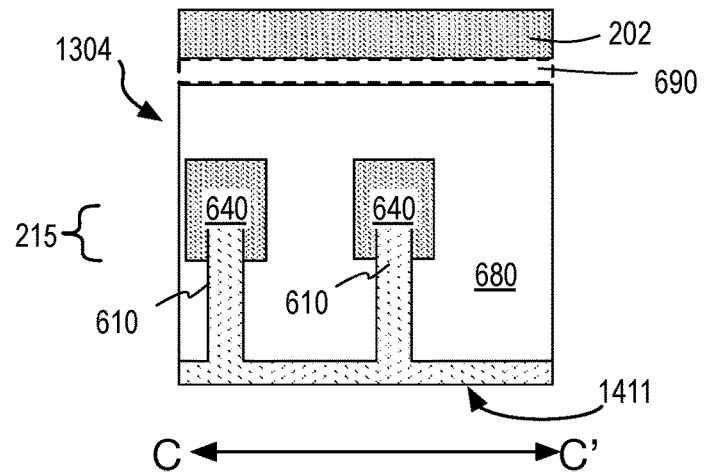
Figure 15A:
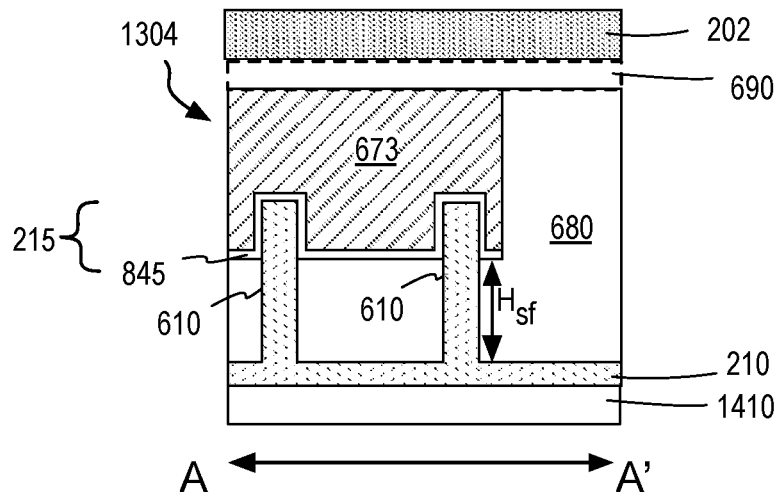
FIG. 15A, 15B, 15C illustrate cross-sectional views of a transistor structure as some operations in the methods illustrated in FIG. 12 are performed, in accordance with some embodiments.
Figure 15B:
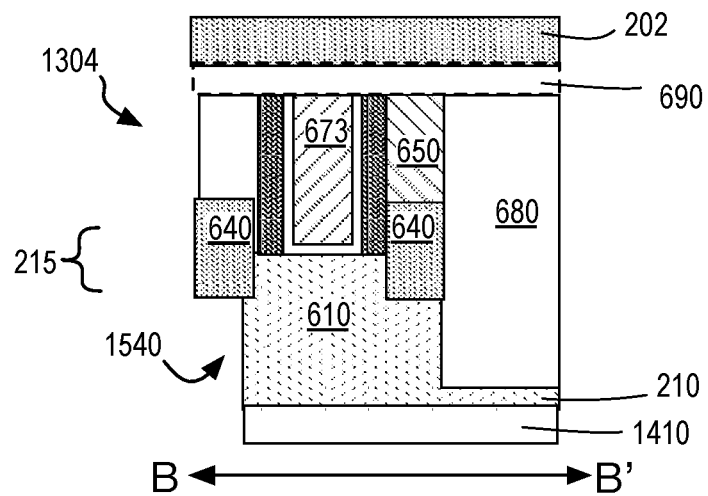
Figure 15C:
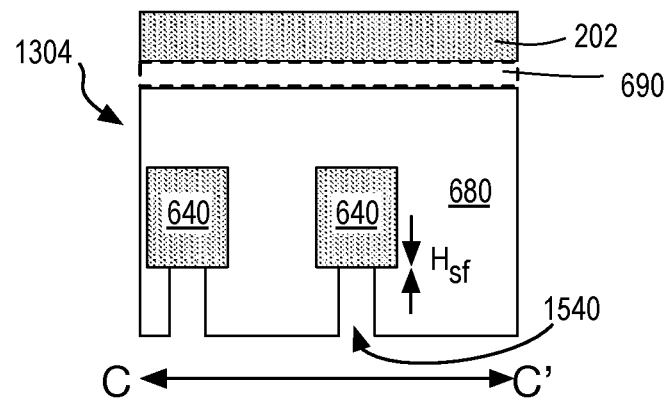
Figure 16A:
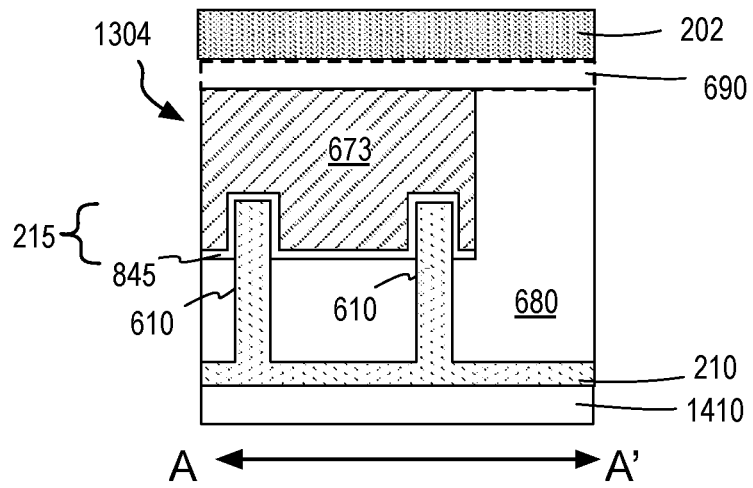
FIG. 16A, 16B, 16C illustrate cross-sectional views of a transistor structure as some operations in the methods illustrated in FIG. 12 are performed, in accordance with some embodiments.
Figure 16B:
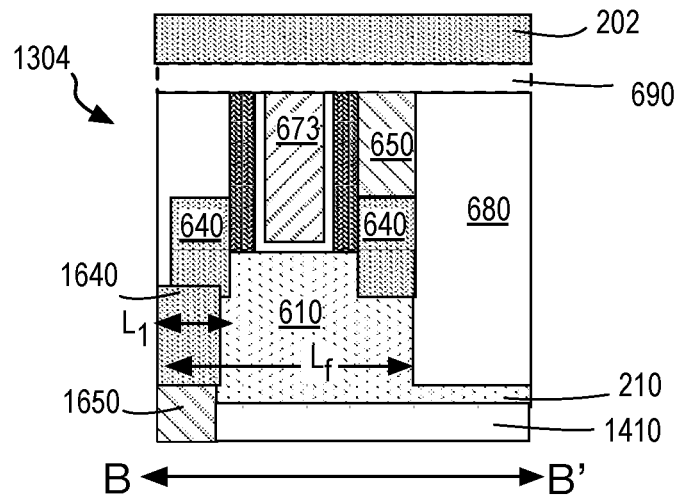
Figure 16C:
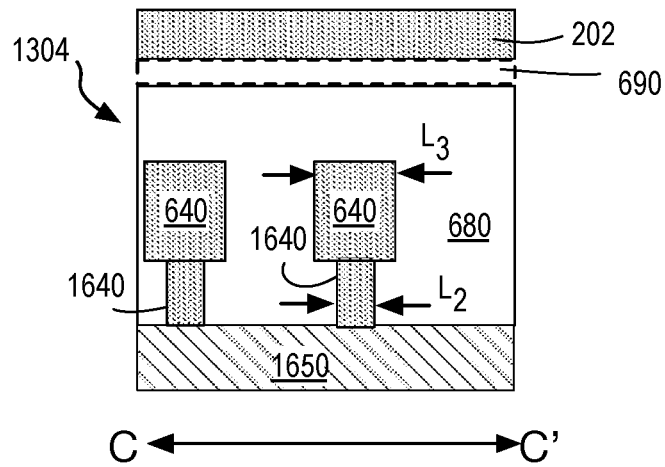

FIGS. 14A, 15A and 16A illustrate cross-sectional views of transistor structure 1304 along the A-A' plane denoted in FIG. 13, as operations in methods 1201 are performed, in accordance with some embodiments. FIGS. 14B, 15B and 16B illustrate cross-sectional views of transistor structure 1304 along the B-B' plane denoted in FIG. 13 as operations in methods 1201 are performed, in accordance with some embodiments. FIGS. 14C, 15C and 16C illustrate cross-sectional views of transistor structure 1304 along the C-C' plane denoted in FIG. 13 as operations in methods 1201 are performed, in accordance with some embodiments.

FIG. 14A-14C illustrate structures present in an exemplary transistor structure following front-side processing of a donor substrate and joinery to host substrate 202. As further illustrated in FIG. 14A-14C, the back-side substrate has been removed by any technique, such as, but not limited to, methods 501 (FIG. 5). The structural features illustrated in FIG. 14A-14C may have any of the properties described above (e.g., FIGS. 8A-8C and 9A-9C) for like reference numbers. An etch mask 1410 is aligned to front-side transistor features visible upon removal of the back-side substrate. Alignment relative to source/drain semiconductor 640 need not be exact and overlap with gate electrode 673 minimized or avoided. Etch mask 1410 is to protect only a portion of intervening layer 210. Etch mask 1410 may be, for example, another intervening layer of the back-side substrate. Alternatively, etch mask 1410 may be a dielectric (e.g., SiO, SiN, etc.) deposited following exposure of intervening layer 210 during carrier layer removal. In still other embodiments, etch mask 1410 is a soft mask (e.g., photo-sensitive resist) applied over a back-side surface of device layer 215. Unprotected device semiconductor region(s) 1411 is then recessed etch with any wet and/or plasma etch process known to be suitable for the material composition. For example, dry etch and/or wet etch having selectivity to silicon over the etch mask may be employed to selectively remove a portion of a silicon semiconductor sub-fin and reveal the transistor source/drain.

Figure 14D:
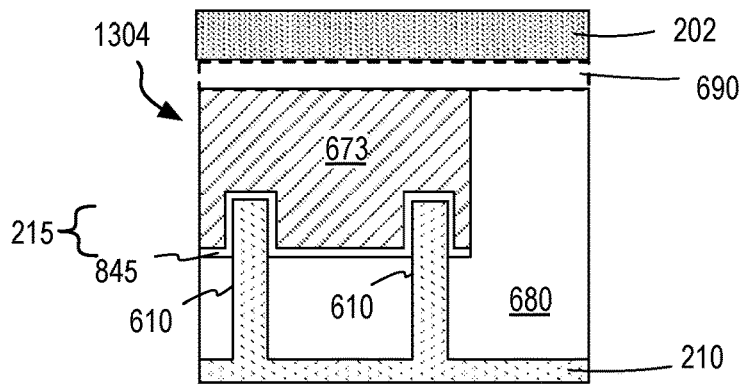
FIG. 14D, 14E, 14F illustrate cross-sectional views of a transistor structure as some operations in the methods illustrated in FIG. 12 are performed, in accordance with some alternative embodiments.
Figure 14E:
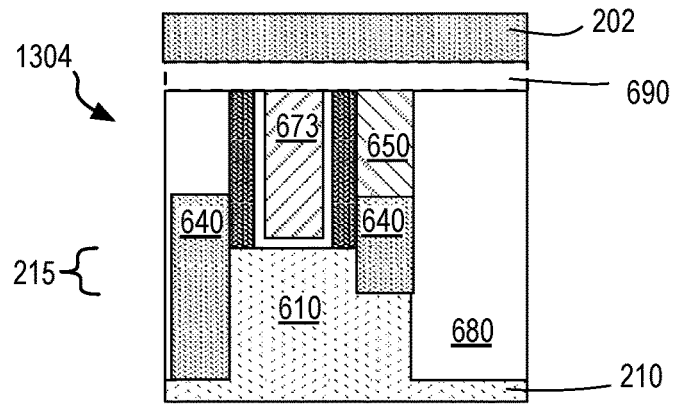
Figure 14F:
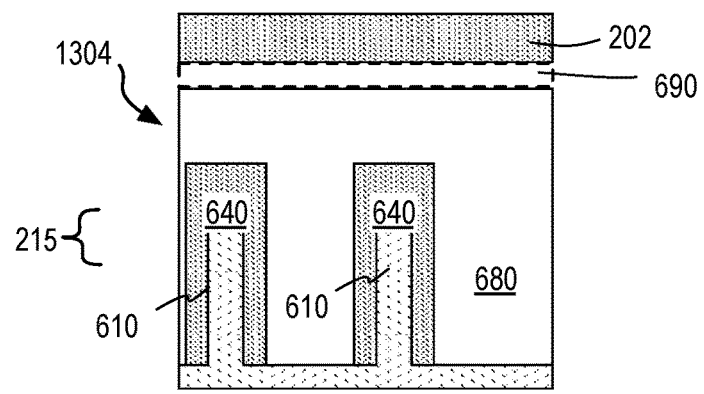

FIG. 14D-14F illustrate structures present in an exemplary transistor structure following front-side processing of a donor substrate and joinery to host substrate 202. As further illustrated in FIG. 14D-14F, the back-side substrate has been removed by any technique, such as, but not limited to, methods 501 (FIG. 5). The structural features illustrated in FIG. 14D-14F may have any of the properties described above (e.g., FIGS. 8A-8C and 9A-9C) for like reference numbers. For this embodiment, no etch mask is employed to selectively reveal one source or drain semiconductor 640. Instead, front-side processing has differentiated the z-depth between two regions of source and drain semiconductor 640 on opposite sides of the channel. In the illustrative embodiment, a source semiconductor 640 has a depth substantially equal to the height of the semiconductor bodies 610, although it may have a lesser or greater depth than illustrated.

FIG. 15A-15C are a continuation of the structures shown in FIG. 14A-14C. As shown in FIG. 15A-15C, a substantial portion of transistor semiconductor bodies 610 is removed within selective reveal recess 1540, while sub-fin height $H_{sf}$ is maintained in transistor structure regions protected by etch mask 1410. Selective reveal recess 1540 may be of any depth and lateral dimension. For example, selective reveal recess 1540 may completely remove the sub-fin portion of semiconductor body 610 (i.e., the semiconductor portion of intervening layer 210) and expose source/drain semiconductor 640. In other embodiments, selective reveal recess 1504 may be employed as a back-side fin cut which bifurcates a fin into two separate fins, for example to enable a first of the fins to implement a PMOS FET while a second of the fins implements an NMOS FET. Whereas when limited to front-side processing, fin bifurcation is typically early in the process during fin patterning, with back-side fin bifurcation, no fin ends need be defined at all though the front-side processing. As such, front-side fin processing may better match a 1D grating pattern with even NMOS and PMOS FETs fabricated together in a single fin. Upon the back-side reveal, individual transistors may be delineated through a back-side fin cut.

Figure 15D:
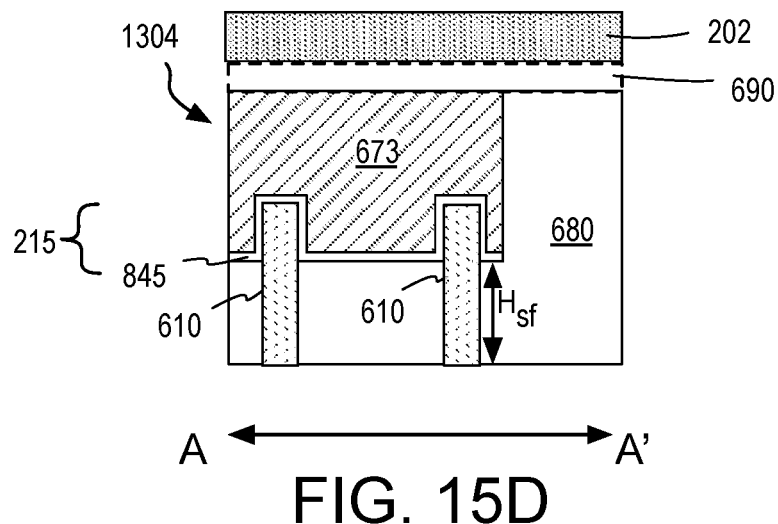
FIG. 15D, 15E, 15F illustrate cross-sectional views of a transistor structure as some operations in the methods illustrated in FIG. 12 are performed, in accordance with some alternative embodiments.
Figure 15E:
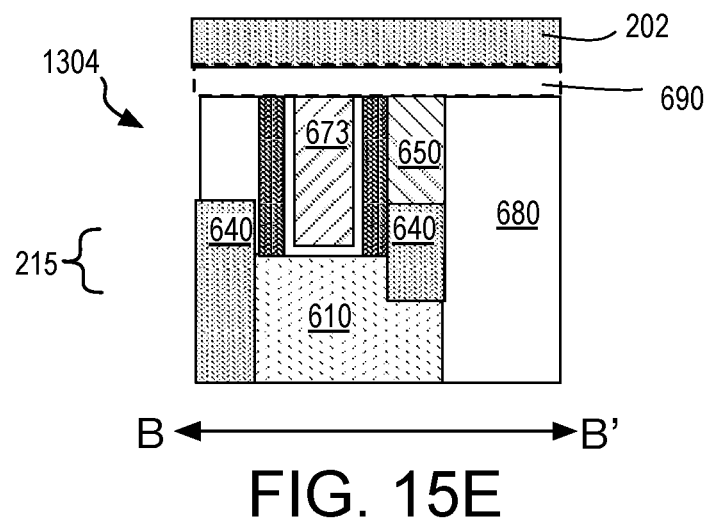
Figure 15F:
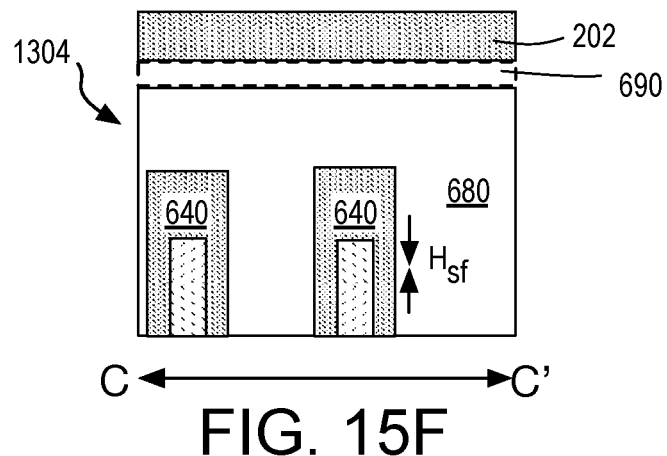

FIG. 15D-15F are a continuation of the structures shown in FIG. 14D-14F. Intervening layer 210 has been removed, for example with a blanket polish or etch process to reveal the deep transistor source/drain selectively to the shallow source/drain. As shown in FIG. 15D-15F, deep source/drain semiconductor 640 is exposed while maintaining sub-fin height $H_{sf}$ is maintained in other regions transistor structure 1304.

FIG. 16A-16C are a continuation of the structures shown in FIG. 15A-15C. FIG. 16A-16C illustrate transistor structure 1304 following an epitaxial growth or deposition of p-type or n-type impurity-doped back-side source/drain semiconductor 1640, and a subsequent deposition of back-side source/drain metallization 1650. Any epitaxial growth or deposition process may be employed to form back-side source/drain semiconductor 1640. For example, the same epitaxial or deposition process employed to form source/drain semiconductor 640 may be employed to form back-side source/drain semiconductor 1640. Likewise, any metal deposition process may be employed to form back-side source/drain metallization 1650. For example, the same deposition process employed to form source/drain metallization 650 may be employed to form back-side source/drain metallization 1650. Back-side source/drain semiconductor 1640 has a longitudinal length $L_1$ that is less than the longitudinal length $L_f$ of semiconductor body 610 and a transverse length $L_2$ that is substantially equal to that of semiconductor body 610. Therefore, in the illustrative embodiment, source/drain semiconductor 640 has a larger transverse length $L_3$ than back-side source/drain semiconductor 1640. Likewise, longitudinal lengths of the front-side and back-side source/drain semiconductors may differ. For example, in some embodiments where the back-side source/drain semiconductor 1640 is operable as a source of the transistor, a tip region (e.g., lightly-doped source semiconductor) may be included that is absent from source/drain semiconductor 640 that is operable as the drain of the transistor. Such a selective source tip region may be formed during epitaxial growth of the impurity-doped back-side source/drain semiconductor 1640, for example. Tipless transistor drains may display less drain-induced barrier lowering (DIBL), for example, while lowest source resistance may rely on a tipped doped source semiconductor. However, it is often difficult to introduce asymmetry in a FET source/drain architecture through front-side processing alone. Hence, decoupling fabrication of the drain semiconductor from the source semiconductor into discrete front-side/back-side processes may facilitate the formation of asymmetric source/drain architectures.

In some further embodiments represented by FIG. 16A-16C, back-side metallization over burden is removed by polish (e.g., CMP), re-exposing etch mask 1410 and/or intervening layer 210 with source/drain contact metallization then confined to backfill selective reveal recess 1540. Subsequent back-side processing may further include fabrication of one or more back-side interconnect metallization level (not depicted) electrically coupling to at least source/drain metallization 1650. In some such embodiments, such back-side interconnect metallization is of a different composition than the front-side interconnect metallization levels. For example, where front-side interconnect metallization is primarily copper (e.g., a Cu-rich alloy), back-side metallization is copper-lean (e.g., an Al-rich alloy). In another example where front-side interconnect metallization is copper-lean (e.g., an Al-rich alloy), back-side metallization is primarily copper (e.g., a Cu-rich alloy). Back-side interconnect metallization may also be dimensionally different (e.g., larger) than a corresponding level of the front-side interconnect metallization. For example, in some embodiments where back-side interconnect metallization supplies power to the transistor structure, the backside metallization comprises lines of larger lateral width and/or vertical height (e.g., z-dimension). Back-side metallization with greater dimensions may be advantageous for architectures where power rails are confined to the back-side metallization and signal lines are confined to front-side metallization. Back-side metallization with greater dimensions may also be advantageous for architectures where long bus lines or clock distribution lines are provided on the back-side of a device stratum.

Figure 16D:
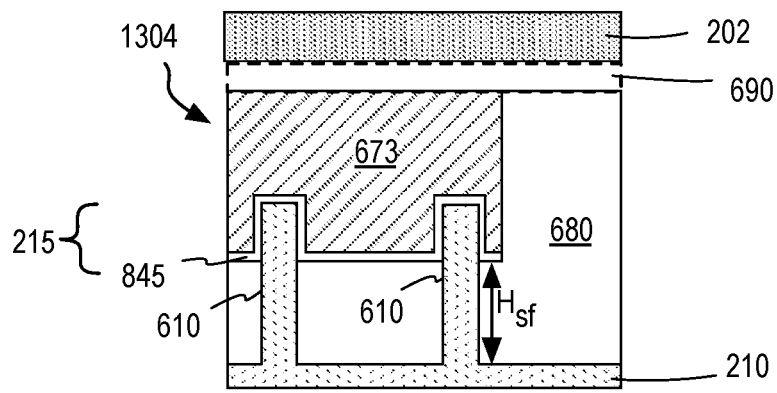
FIG. 16D, 16E, 16F illustrate cross-sectional views of a transistor structure as some operations in the methods illustrated in FIG. 12 are performed, in accordance with some alternative embodiments.
Figure 16E:
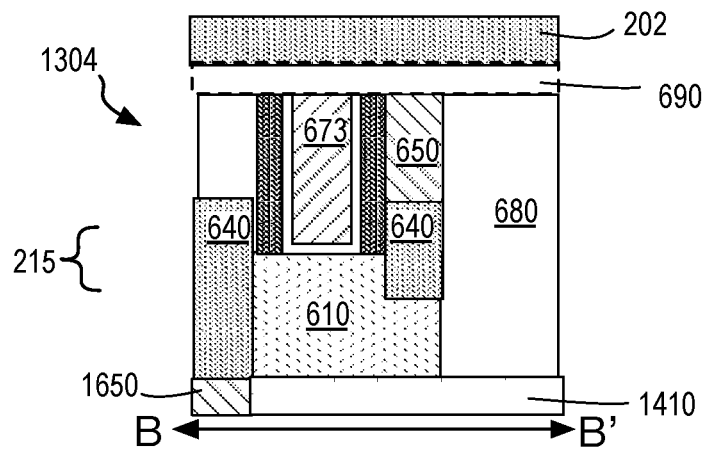
Figure 16F:
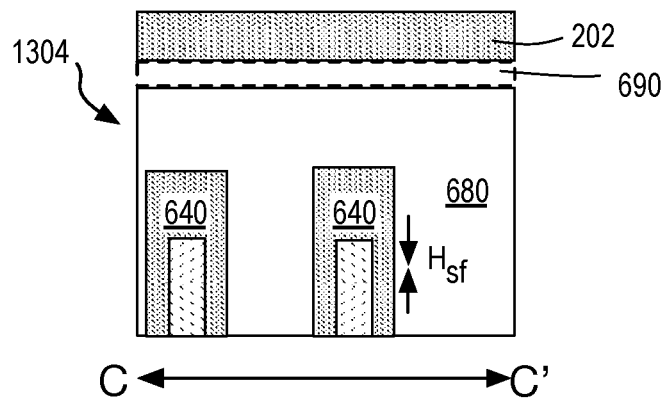

FIG. 16D-16F are a continuation of the structures shown in FIG. 15D-15F. In FIG. 16D-16F, transistor structure 1304 is illustrated following a deposition of back-side source/drain metallization 1650 in contact with deep source/drain semiconductor 1650. Any metal deposition process may be employed to form back-side source/drain metallization 1650. For example, the same deposition process employed to form source/drain metallization 650 may be employed to form back-side source/drain metallization 1650. The formation of back-side source/drain metallization 1650 may further entail formation of back-side dielectric 1410, for example following any known damascene interconnect metallization techniques.

While the discussion above has provided some illustrative examples of back-side metallization structures, other structures may be fabricated using substantially the same techniques. Generally, any terminal of a device fabricated in a device stratum may comprise a back-side metallization structure. For example, rather than (or in addition to) back-side source and/or drain contact metallization illustrated above, other terminals of a transistor may be interconnected by back-side metallization. For example, in a three terminal device, a third terminal (e.g., gate electrode in a FET or base in a bipolar junction transistor) may comprise a back-side metallization structure. Likewise, in a four terminal device, a fourth terminal (e.g., a floating body tap or a field plate) may comprise a back-side metallization structure.

Figure 17:
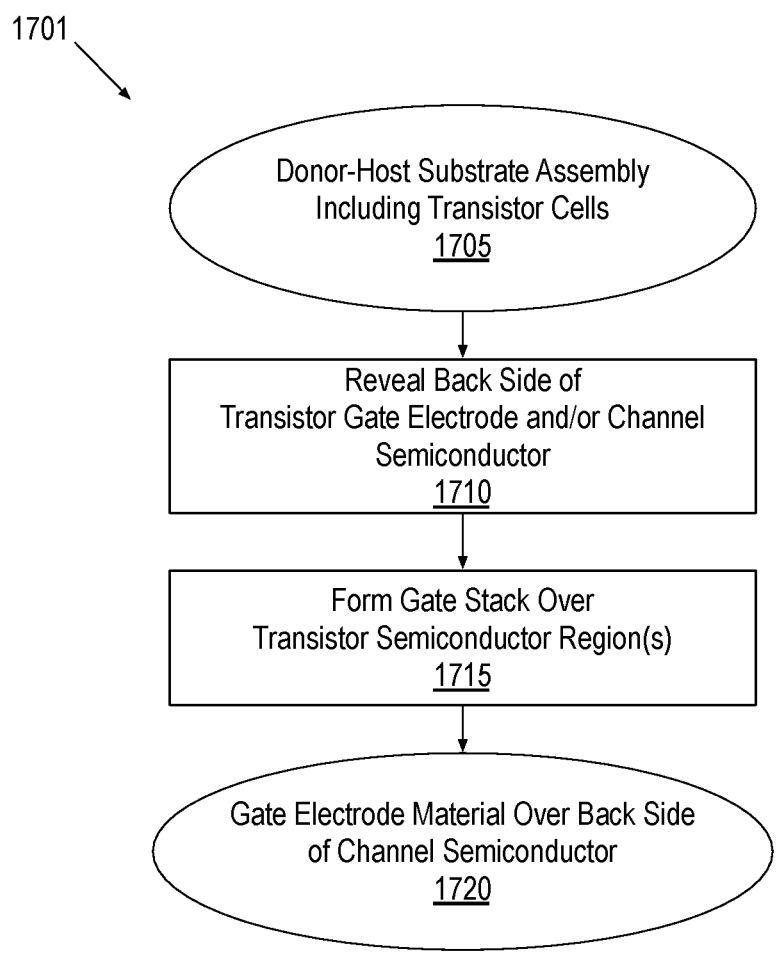
FIG. 17 is a flow diagram illustrating back-side processing methods including back side transistor gate metallization, in accordance with some embodiments.

Hence, a back-side reveal of a transistor structure may further comprise exposing a transistor gate electrode and/or channel semiconductor. In some embodiments, back-side gate electrode processing is employed to completely surround a transistor channel with the gate electrode, thereby forming a nanowire transistor with a wrap-around gate electrode. Additionally, or in the alternative, an exposed gate electrode may be coupled to back-side interconnect further fabricated on the back side of a stratum containing the transistor structure. It some other embodiments, back-side gate electrode processing replaces a sacrificial gate mandrel or placeholder that was fabricated during front-side processing. FIG. 17 is a flow diagram illustrating methods 1701 for forming back-side transistor gate electrode, in accordance with some embodiments. Methods 1701 further exemplify back-side processing of a transistor structure stratum that may be no more than a few hundred nanometers in thickness. Methods 1701 begin with a donor-host substrate assembly including transistor structures as an input 1705. The donor substrate may have one or more of the features described above, such as, but not limited to, an intervening layer and a carrier layer. Notably however, a carrier layer and/or intervening layer is not required to perform methods 1701.

The transistor structures may be completely operable as received at input 1705, for example including three terminals as illustrated in FIG. 6. Alternatively, one or more terminals (e.g., the gate electrode) may be absent such that the transistor structure will not be operable until back-side processing is complete. At operation 1710, a back side of the transistor gate electrode, sacrificial gate mandrel, and/or transistor channel semiconductor is exposed during a back-side reveal process. In some embodiments, the back-side reveal process performed at operation 1710 includes one or more of the operations of methods 501 (FIG. 5). The back-side reveal process may, for example, reveal a semiconductor channel region by removing at least at portion of the donor substrate (e.g., carrier layer). At operation 1715, a gate stack is formed from the back side of the device stratum. The gate stack may be formed on a back side of the semiconductor channel, and may also be formed on the front side of the semiconductor channel depending on how much of the channel semiconductor is revealed at operation 1710. Methods 1701 end with output of a transistor structure stratum including gate electrode material disposed over a back side of the transistor channel semiconductor.

In some embodiments, methods 1701 are facilitated by one or more front-side processing operation. For example, during front-side processing the depth (e.g., z-dimensional position) of the transistor gate electrode, or a gate mandrel, is made greater than that of one or more transistor source/drain regions to facilitate revealing the gate electrode or gate mandrel from the back side without revealing one or more source/drain regions. To illustrate such synergy between front-side and back-side processing, FIG. 18A-26A provide cross-sectional views along the A-A' plane denoted by heavy dot-dashed line in the plan view of exemplary transistor structure 604 (FIG. 6), in accordance with some exemplary embodiments. FIG. 18B-26B illustrate cross-sectional views along the B-B' plane denoted by heavy dot-dashed line in the plan view of exemplary transistor structure 604, as front-side transistor processing is performed, in accordance with some exemplary embodiments. The front-side transistor processing illustrated may be performed, for example, upstream of back-side processing embodiments described elsewhere herein. In the illustrated example, the semiconductor device layer is a transistor fin formed with an additive process. Alternatively, the semiconductor layer may be a transistor fin formed by any subtractive process (e.g., patterning of a continuous semiconductor device layer).

Figure 18A:
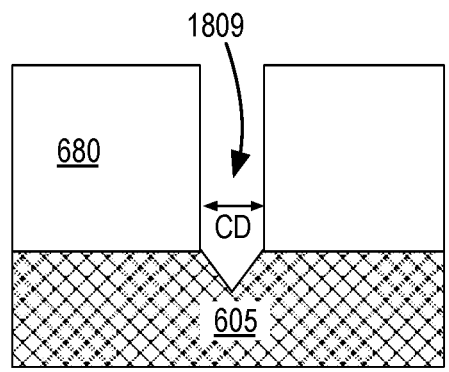
FIGS. 18A, 19A, 20A, 21A, 22A, 23A, 24A and 25A illustrate cross-sectional views of a transistor structure as some front-side fabrication operations are performed, in accordance with some embodiments.
Figure 18B:
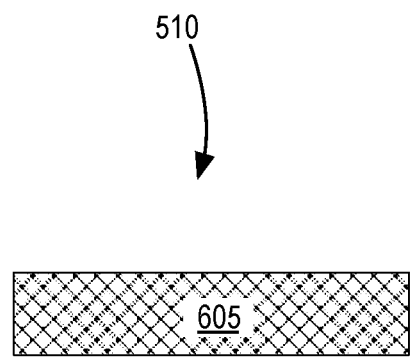
FIGS. 18B, 19B, 20B, 21B, 22B, 23B, 24B and 25B illustrate cross-sectional views of a transistor structure as some front-side fabrication operations are performed, in accordance with some embodiments.
Figure 19A:
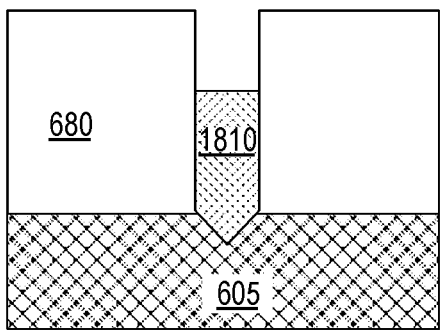
Figure 19B:
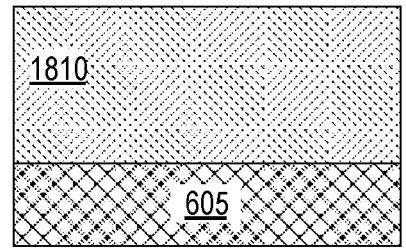

In the embodiments shown in FIGS. 18A and 18B, a trench 1809 is anistropically etched into field isolation dielectric 680, exposing a portion of back-side substrate 605 at the bottom of trench 1809. In some embodiments, the exposed portion of back-side substrate 605 is recessed etched as shown. In some embodiments, trench 1809 has a CD of between 10 and 200 nm. However, trench material z-thickness and CD may be scaled as needed to maintain a workable aspect ratio for a predetermine fin height selected for a desired transistor current carrying width. As further illustrated in FIG. 19A, 19B, sub-fin semiconductor 1810 is epitaxially grown selectively to the substrate seeding surface to partially back fill trench 1809. In some exemplary embodiments sub-fin semiconductor 1810 is to further serve as an intervening layer (e.g., 210 in FIG. 3A) employed in the subsequent removal of back-side substrate 605. Semiconductor device layer 215 is further epitaxially grown from the sub-fin seeding surface as semiconductor body 610 extending from the sub-fin surface still contained within the trench. Device layer 215 and sub-fin semiconductor 1810 may be of the same or different compositions. For example, both device layer 215 and sub-fin semiconductor 1810 may be silicon. Alternatively, device layer 215 may be a first semiconductor alloy and sub-fin semiconductor 1810 is a second semiconductor alloy.

Figure 20A:
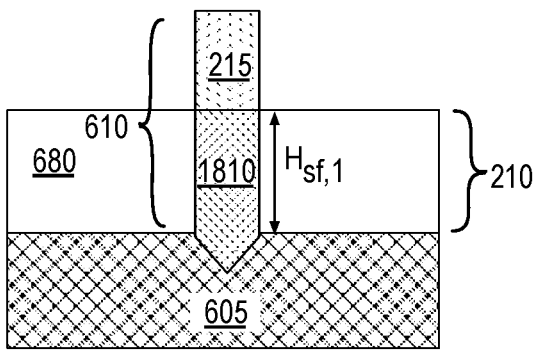
Figure 20B:
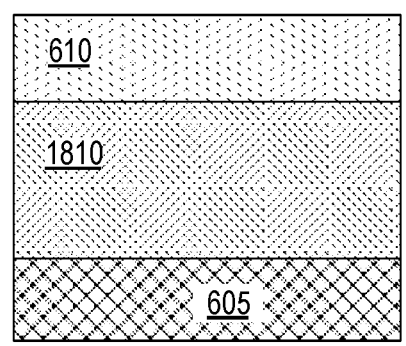

After epitaxial fin growth, the surrounding field isolation dielectric 680 may be selectively recessed to a desired level below device layer 215, as further depicted in FIG. 20A. In the illustrative embodiment, field isolation dielectric 680 is recessed sufficiently to fully expose device layer 215 in preparation for a raised source/drain regrowth. At this point in front-side processing, sub-fin semiconductor 1810 of sub-fin height $H_{sf,1}$ is embedded within field isolation dielectric 680. Notably, a subtractive patterning process in which a fin pattern is etched into backside substrate 605 may arrive at substantially the same fin structure illustrated in FIG. 20A. For such embodiments device layer 215 and sub-fin semiconductor 1810 may be the same semiconductor material (e.g., both silicon), or different semiconductor materials.

Figure 21A:
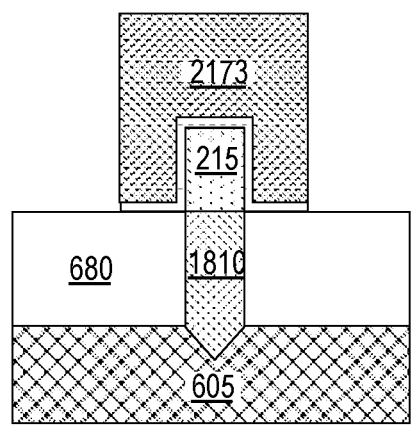
Figure 21B:
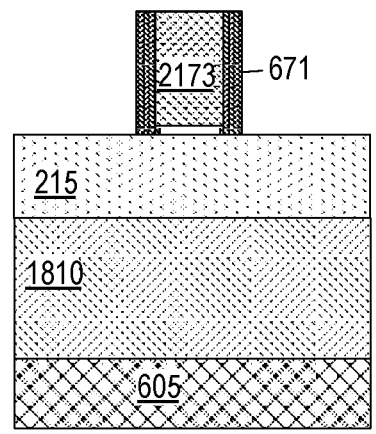
Figure 22A:
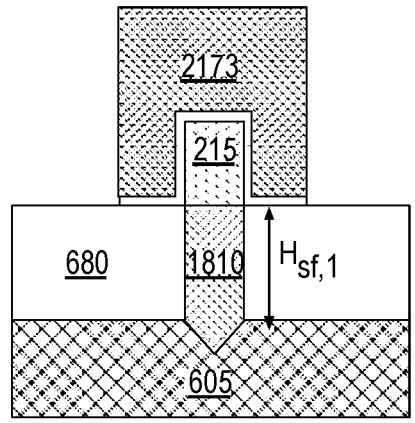
Figure 22B:
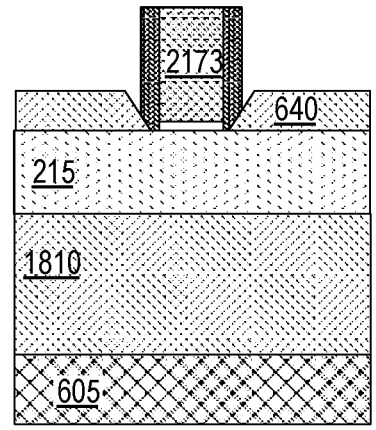
Figure 23A:
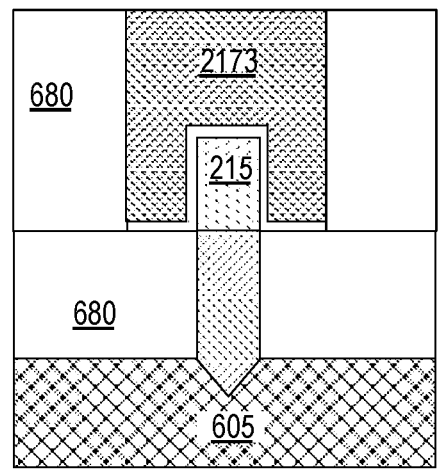
Figure 23B:
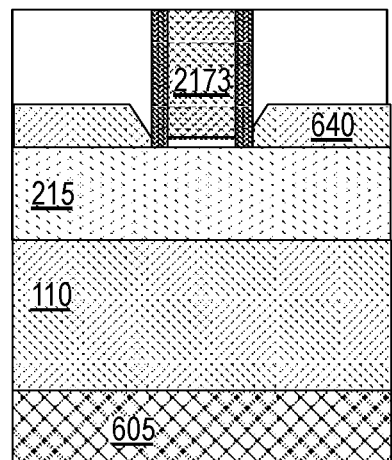

As shown in FIGS. 21A and 21B, a gate stack mandrel including sacrificial gate material 2173 (e.g., polysilicon) is formed over device layer 215 using any conventional technique. Sacrificial gate material 2173 may be formed on at least two sidewalls of device layer 215, landing on field isolation dielectric 680. Spacer dielectric 671 may also be formed using any conventional technique. For the embodiment depicted in FIG. 21A, sacrificial gate material 2173 does not cover any portion of sidewalls of sub-fin material 110, but it may as a function of the isolation dielectric recess. Subsequent to forming the gate mandrel, a doped semiconductor (or any sacrificial material) is formed at the source/drain ends of semiconductor device layer 215. In some embodiments, a raised source/drain region is formed by depositing a heavily-doped semiconductor of any composition suitable for semiconductor device layer 215. In the exemplary embodiment illustrated in FIG. 22A, 22B, an epitaxial process is employed to form monocrystalline raised source/drain semiconductor 640. Additional field isolation dielectric 680 is then deposited over raised source/drain semiconductor 640 and planarized with the gate mandrel, as further depicted in FIG. 23A, 23B.

Figure 24A:
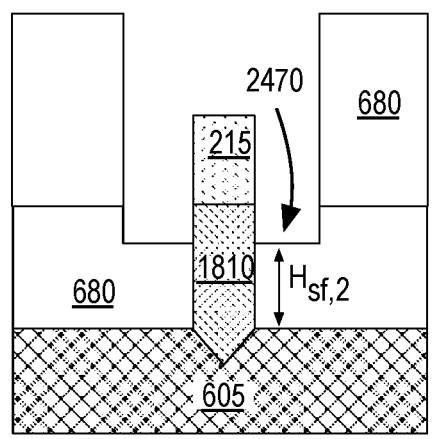
Figure 24B:
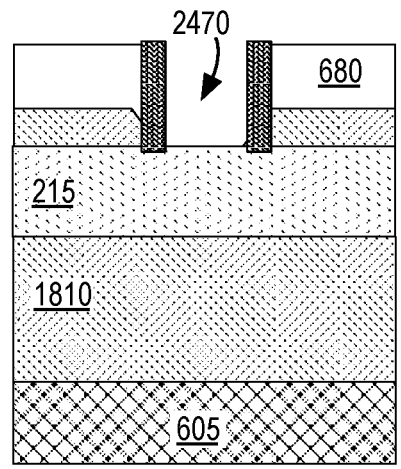
Figure 25A:
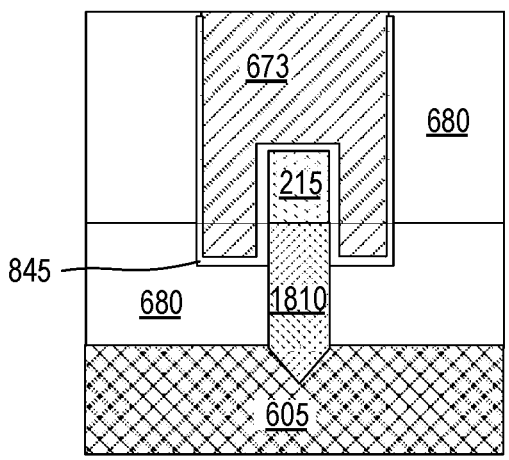
Figure 25B:
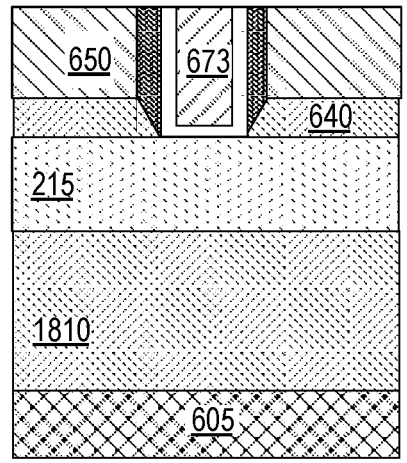

In FIG. 24A, 24B, sacrificial gate material 2173 is removed selectively relative to the surrounding field isolation dielectric 680, exposing semiconductor device layer 215. Any conventional technique may be used to remove the sacrificial gate mandrel. Following gate mandrel removal, exposed field isolation dielectric 680 may be further recessed selectively to other regions, thereby further exposing at least a portion of sub-fin semiconductor 1810 within recess 2470. As shown, after field isolation dielectric 680 is recessed, the portion of sub-fin semiconductor 1810 embedded within field isolation dielectric 680 is reduced to $H_{sf,2}$ within the region of the transistor semiconductor channel. As further illustrated in FIG. 25A, 25B, a gate stack including gate dielectric 845 and gate electrode 673 is deposited into recess 2470. Any gate stack backfilling process known to be suitable for replacement gate applications may be performed.

For transistors in which the gate electrode depth extends below that of the device layer, the gate electrode may be revealed from the backside (e.g., during the practice of methods 1101) as further illustrated in FIGS. 26A-26C, 27A-27C, and 28A-28C, which depict cross-sectional views along the A-A', B-B' and C-C' planes denoted by heavy dot-dashed lines in the plan view of exemplary transistor structure 604 (FIG. 6). Such techniques may be further combined with a reveal of one or more source/drain region, for example as described elsewhere herein.

Figure 26A:
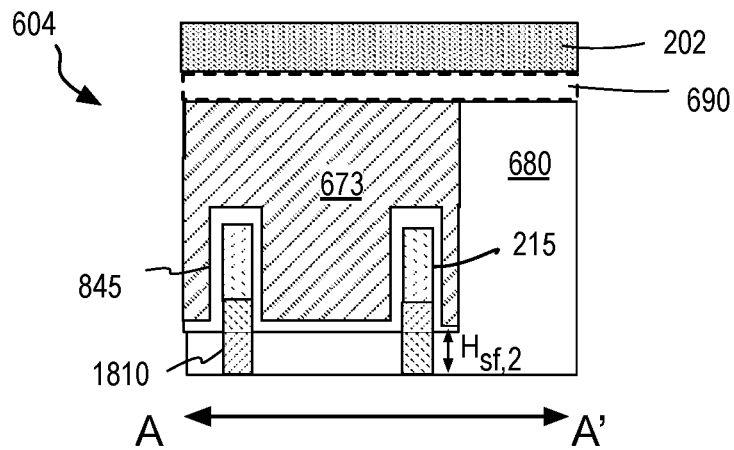
FIG. 26A, 26B, 26C illustrate cross-sectional views of a transistor structure as some operations in the methods illustrated in FIG. 17 are performed, in accordance with some embodiments.
Figure 26B:
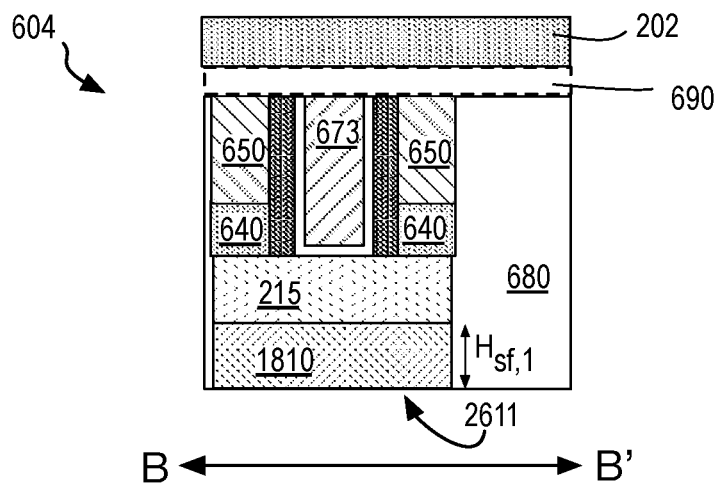
Figure 26C:
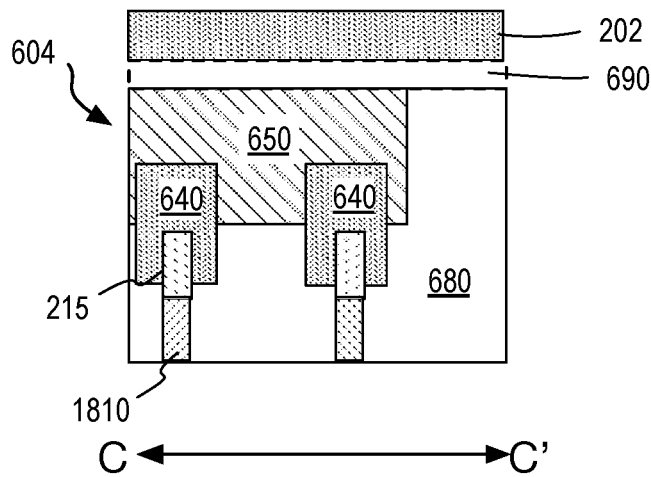

FIG. 26A-26C further illustrate a front-side stack 690 disposed over the front-side cell surface. Front-side stack 690 is illustrated in dashed line as being a portion of the transistor structure stratum that may vary without limitation and may, for example, include any number of backend interconnect metallization levels. Host substrate 202 may, for example, have any of the properties described elsewhere herein. As shown, host substrate 202 is joined to a front-side surface of front-side stack 690, for example by thermal-compression bonding. As further illustrated in FIG. 26A-26C, at least a portion of the donor substrate has been removed, exposing a back side surface 2611 of sub-fin semiconductor 1810. Donor substrate may be thinned and/or removed by any technique, such as, but not limited to, methods 501 (FIG. 5). In methods 501, for example, the intervening layer may be one or more of sub-fin semiconductor 1810 and field isolation dielectric 680. Alternatively, the intervening layer enlisted in methods 501 may be an uppermost layer of back-side substrate 605.

Figure 27A:
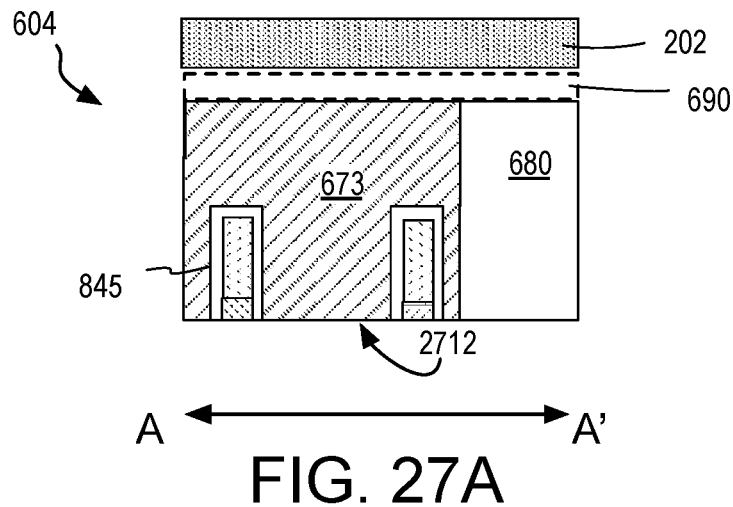
FIG. 27A, 27B, 27C illustrate cross-sectional views of a transistor structure as some operations in the methods illustrated in FIG. 17 are performed, in accordance with some embodiments.
Figure 27B:
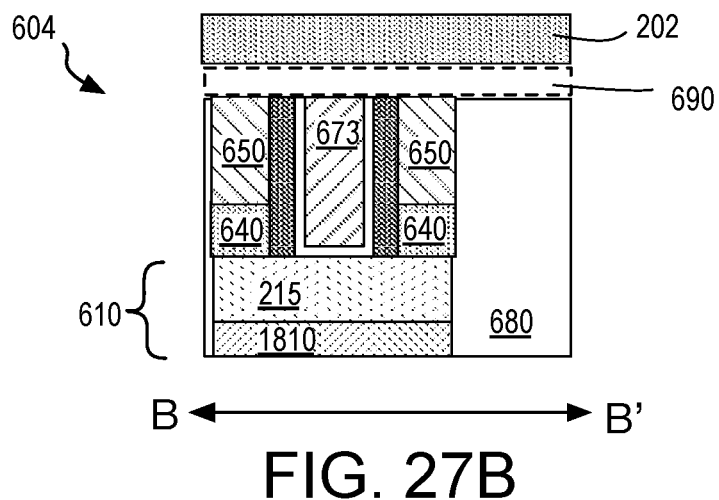
Figure 27C:
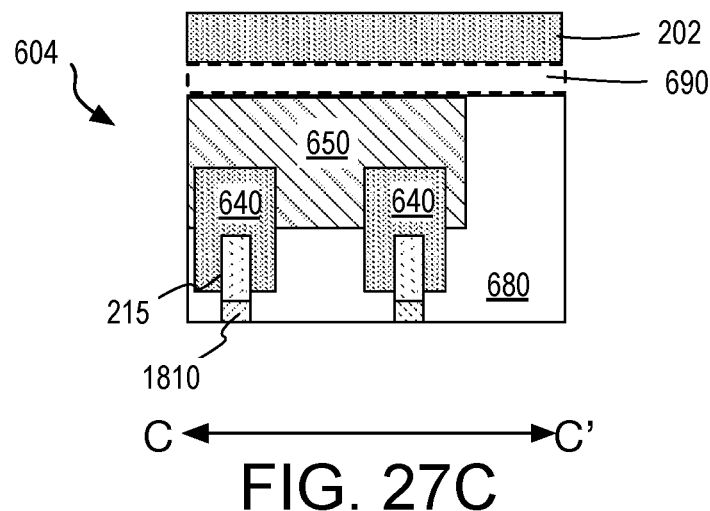

FIG. 27A-27C depict transistor structure 604 following a reveal of a backside 2712 of gate electrode 673. To reveal the back side of gate electrode 673, portions of sub-fin semiconductor 1810 may be polished back (e.g., CMP) and/or recess etched with a wet and/or dry etch process, for example as described above for operation 525 (FIG. 5). Such etch processes may be masked, or not. In some exemplary embodiments where a highly selective (e.g., 200-300:1) CMP slurry having a higher etch rate of semiconductor (e.g., Si) than dielectric is employed, the back-side polish of device layer 215 may be stopped upon exposure of gate dielectric 845. Any amount of over-etch (over-polish) may be performed. In some embodiments, the entire sub-fin for one or more semiconductor bodies within a transistor structure may be removed during the backside reveal operation. In the exemplary embodiment shown in FIG. 27A-27C, gate electrode 673 is revealed before source/drain semiconductor 640 is revealed and the reveal process stopped prior to exposing source/drain semiconductor 640.

For some embodiments, back-side metallization is deposited over the back-side surface of gate electrode 673. For example, low power logic state signals may be passed to transistor structure 604 from other transistor structures of an IC through back-side metallization contacting gate electrode 673. Hence, back-side metallization may provide interconnection of either or both source/drain and gate electrode between transistor structures. In some other embodiments, gate electrode 673 is augmented from the back-side to form a nanowire or gate-all-around (GAA) transistor, in which a gate electrode surrounds the semiconductor body on all sides. For such embodiment, a back side of semiconductor device layer 215 is revealed, a back-side gate stack deposited over the back side of semiconductor device layer 215, and interconnected with gate electrode 673.

Figure 28A:
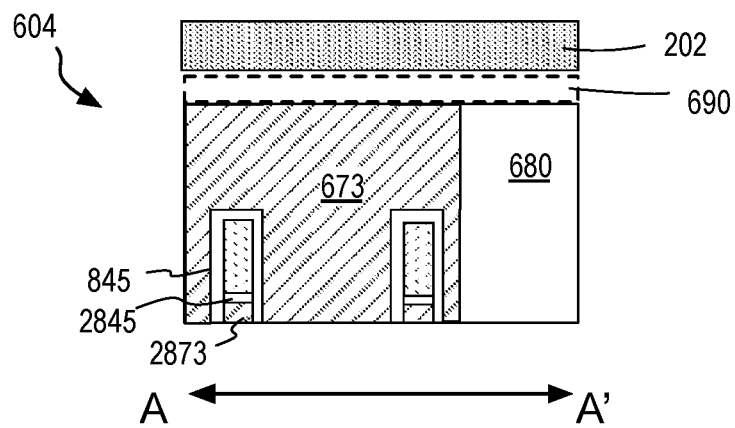
FIG. 28A, 28B, 28C illustrate cross-sectional views of a transistor structure as some operations in the methods illustrated in FIG. 17 are performed, in accordance with some embodiments.
Figure 28B:
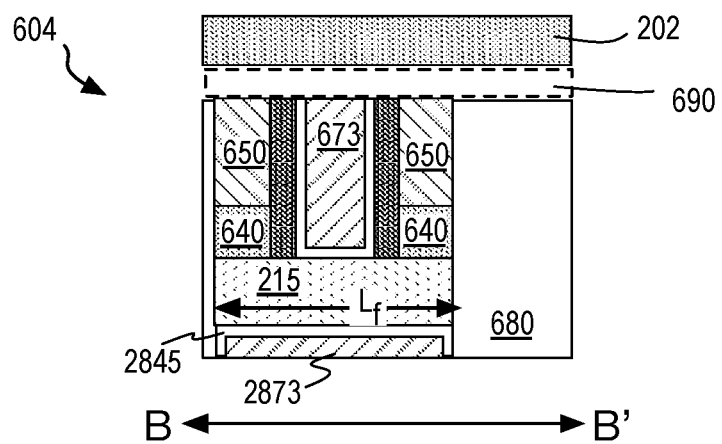
Figure 28C:
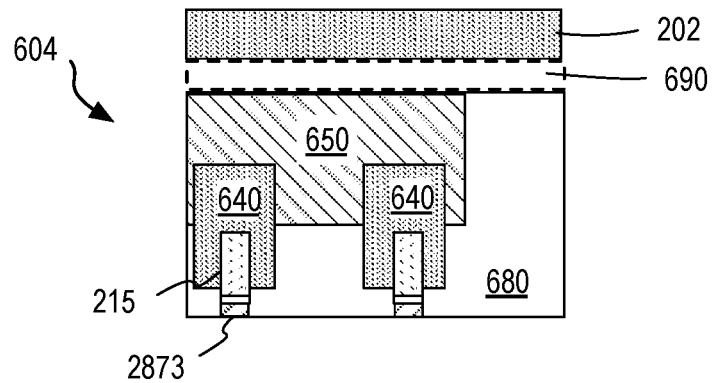

FIG. 28A-28C further depict transistor structure 604 following deposition of a back-side gate stack including back-side gate dielectric 2845 and back-side gate electrode 2873. As shown in this exemplary embodiment, the back-side gate stack is deposited directly on a revealed surface of semiconductor device layer 215. To reveal device layer 215, any remaining portion of sub-fin semiconductor 1810 may be selectively etched (e.g., with wet or dry chemical etch), recessing the back-side surface of the semiconductor fin relative to the back-side surface of gate electrode 673 and/or field isolation dielectric 680, as illustrated in FIG. 28A-28C. For embodiments where sub-fin semiconductor 1810 has a different composition than device layer 215, the recess etch may be further selective to device layer 215, effectively stopping upon exposure of device layer 215. For embodiments where sub-fin semiconductor 1810 has the same composition as device layer 215 (e.g., both are silicon of a fin patterned from the device layer), the recess etch may be of a predetermined fixed duration or may be stopped at an impurity dopant interface.

Back-side gate dielectric 2845 is deposited over or on the revealed device layer 215. Back-side gate dielectric 2845 is another example of a non-native material deposited over a back side of transistor semiconductor regions. Back-side gate dielectric 2845 may be any dielectric material known to be suitable for field effect transistors. In some exemplary embodiments, back-side gate dielectric is any of the materials described elsewhere herein for gate dielectric 845, and may be the same material.

Back-side gate electrode 2873, which may be deposited over back-side gate dielectric 2845, and/or directly on a revealed surface of gate electrode 673, is another example of a non-native material deposited over a back side of transistor semiconductor regions. Back-side gate electrode 2873 may be any doped semiconductor or metal known to be suitable for gating field effect transistors. In some exemplary embodiments, back-side gate electrode 2873 is any of the materials described elsewhere herein for gate electrode 673, and may be the same material. For some nanowire transistor embodiments, back-side gate electrode 2873 may be deposited over back-side gate dielectric 2845 and planarized (e.g., by CMP) with a surrounding back-side surface of gate electrode 673. In some embodiments, a subsequent back-side metallization layer (not depicted) is deposited in direct contact with gate electrode 673 and back-side gate electrode 2873 as an interconnect between gate electrode 673 and back-side gate electrode 2873 and/or other IC nodes located within other transistor structures. With gate electrodes 2873 and 673 tied together to a same electrical potential, the channel region of the FET may be fully depleted.

In alternative embodiments, a front-side gate electrode is electrically independent from a back-side gate electrode. Such an independent back-side gate electrode is controllable to one of a plurality of predetermined voltage levels, each associated with a predetermined transistor threshold voltage ($V_t$). With the ability to set different threshold voltages, a transistor becomes a multi-state device (i.e., having more states than on/off). In some such embodiments, electrical potential of the back-side gate electrode is controlled through a back-side interconnect metallization that does not also contact the (front-side) gate electrode. Likewise, the front-side gate electrode may be controlled by a front-side interconnect metallization, for example disposed within a front-side stack, thereby implementing a four terminal device.

Figure 28D:
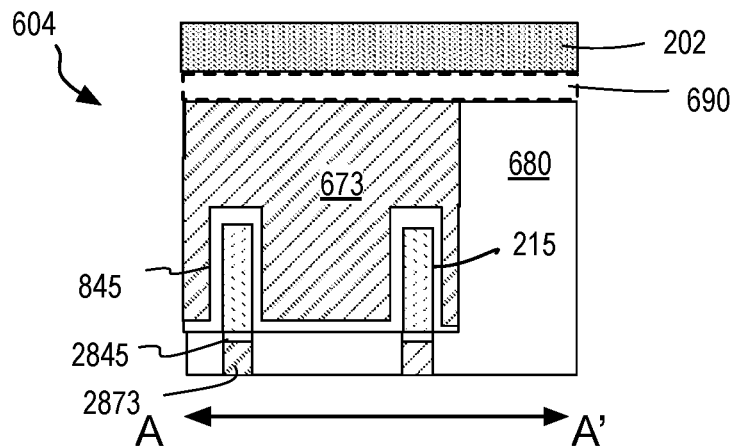
FIG. 28D, 28E, 28F illustrate cross-sectional views of a transistor structure as some operations in the methods illustrated in FIG. 17 are performed, in accordance with some alternative embodiments.
Figure 28E:
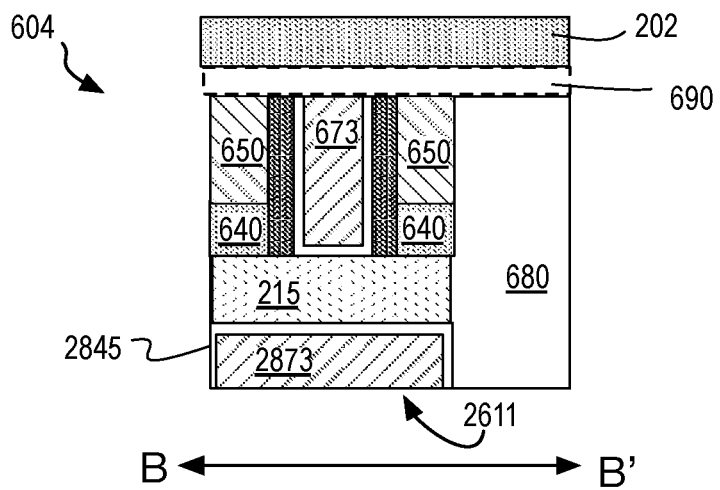
Figure 28F:
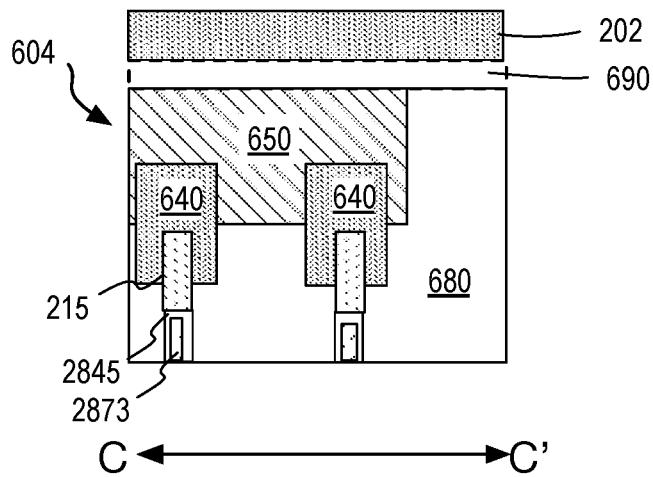

Such a double-gate transistor structure architecture may be readily fabricated according methods 1701. For example, in further reference to the front-side processing illustrated in FIG. 18A-24A, the recessing of exposed field isolation dielectric 680 following gate mandrel removal illustrated in FIG. 24A may be skipped, thereby avoiding any exposure of sub-fin semiconductor 1810 within recess 2470. For such embodiments, gate electrode 673 will then not extend along sidewalls of sub-fin semiconductor 1810 in the manner shown in FIG. 25A. Instead, the depth of gate electrode 673 will be substantially planar with the interface of device layer 215 and sub-fin semiconductor 1810. Sub-fin semiconductor 1810 may then be selectively recessed or polished back by a predetermined amount without exposing the back side of gate electrode 673. As further shown in FIGS. 28D, 28E, and 28F for example, sub-fin semiconductor 1810 has been selectively recessed from the back side of field isolation dielectric 680. The resulting backside recess has been back-filled with the back-side gate stack (gate dielectric 2845 and gate electrode 2873). A subsequent back-side metallization layer (not depicted) deposited in direct contact with back-side gate electrode 2873 will then be electrically isolated from gate electrode 673.

In some embodiments, a back side of a transistor gate mandrel is revealed. For such embodiments, the gate mandrel may be fabricated with front-side transistor processing, for example using any known techniques. The mandrel may then be subsequently exposed and replaced with a permanent gate electrode during back-side processing. Hence, the performance of back-side processing may be staged relative to front-side processing operations to delay formation of one or more transistor device region, for example, until after front-side interconnect metallization levels and interlayer dielectric (ILD) have been formed. Higher temperature processing may therefore be staged prior to temperature-sensitive processing, potentially increasing thermal budget of the transistor structure.

Figure 29A:
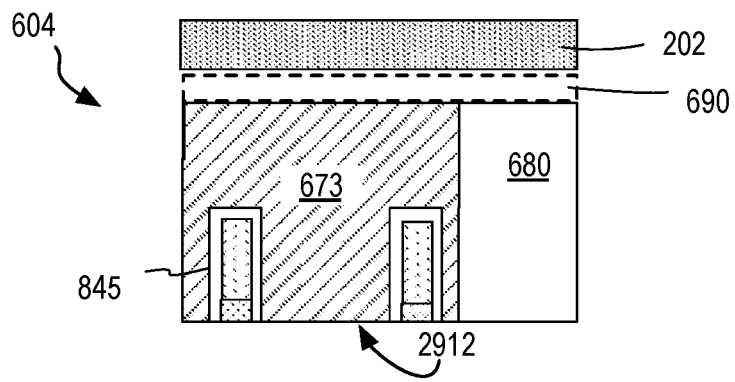
FIG. 29A, 29B, 29C illustrate cross-sectional views of a transistor structure as some operations in the methods illustrated in FIG. 17 are performed, in accordance with some alternative embodiments.
Figure 29B:
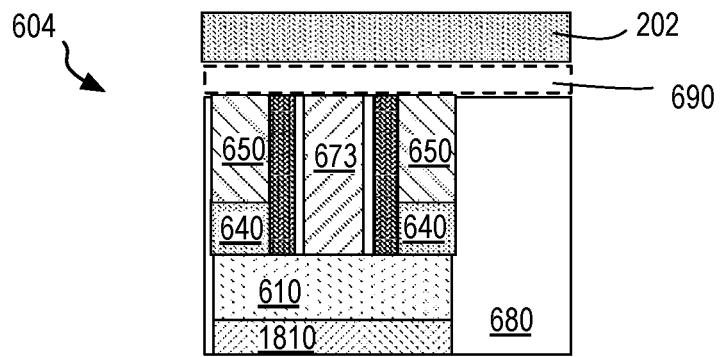
Figure 29C:
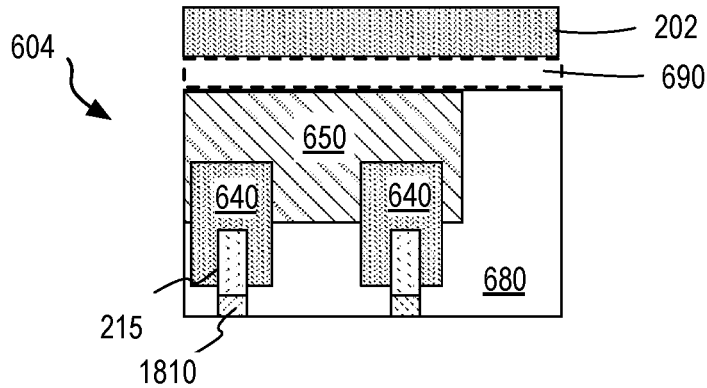

For transistors in which the gate mandrel depth extends below that of the device layer, the gate mandrel may be revealed from the backside (e.g., during the practice of methods 1101) as further illustrated in FIGS. 29A-29C, 30A-31C, and 32A-32C, which depict cross-sectional views along the A-A', B-B' and C-C' planes denoted by heavy dot-dashed lines in the plan view of exemplary transistor structure 604 (FIG. 6). Transistor structures illustrated in FIG. 29A-29C are substantially the same as those illustrated in FIG. 27A-27C. Hence, the transistor structures illustrated in FIG. 29A-29C may be fabricated with front-side processing substantially as described for FIG. 18A-25A with the exception that gate electrode 673 and/or gate dielectric 845 is to be subsequently replaced as a secondary mandrel. As such, gate electrode 673 and/or gate dielectric 845 may have compositions selected to etch preferentially to semiconductor device layer 215. For example, gate electrode 673 may have the same composition as sacrificial gate material 2173 (e.g., polysilicon) where semiconductor device layer 215 is other than silicon (e.g., SiGe, III-V, or III-N). Alternatively, where semiconductor device layer 215 is silicon, gate electrode 673 may be another polycrystalline semiconductor, such as, but not limited to SiGe, or Ge. Gate dielectric 845, if also sacrificial, may be silicon dioxide, for example. Gate dielectric 845, if not also sacrificial, may be a high-k material, such as any of those described above, for example.

FIG. 29A-29C depict transistor structure 604 following a reveal of a backside 2912 of (sacrificial) gate electrode 673. Portions of sub-fin semiconductor 1810 may be polished back (e.g., CMP) and/or recess etched with a wet and/or dry etch process, for example as described above for operation 525 (FIG. 5). In some exemplary embodiments where a highly selective (e.g., 200-300:1) CMP slurry having a higher etch rate of semiconductor (e.g., Si) than dielectric is employed, the back-side polish may be stopped upon exposure of (sacrificial) gate dielectric 845. In some alternative embodiments where a dry or wet semiconductor etch is performed, the etch may be stopped upon exposure of gate dielectric 845. Any amount of over-etch (over-polish) may be performed. In some embodiments, the entire sub-fin for one or more semiconductor bodies within a transistor structure are removed during the backside reveal operation. In the exemplary embodiment shown, gate electrode 673 is revealed before source/drain semiconductor 640 is revealed and the reveal process may be stopped prior to exposing source/drain semiconductor 640.

Figure 30A:
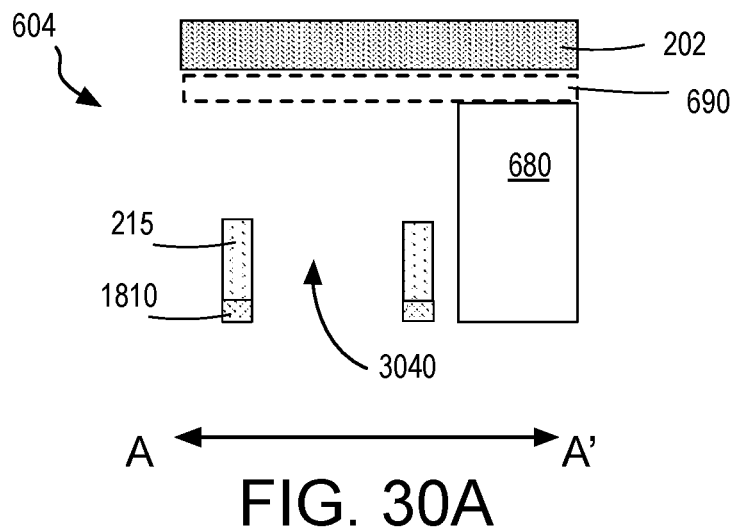
FIG. 30A, 30B, 30C illustrate cross-sectional views of a transistor structure as some operations in the methods illustrated in FIG. 17 are performed, in accordance with some alternative embodiments.
Figure 30B:
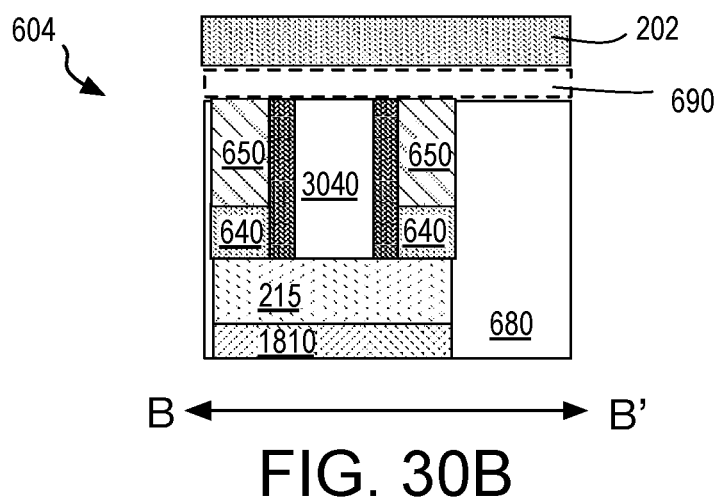
Figure 30C:
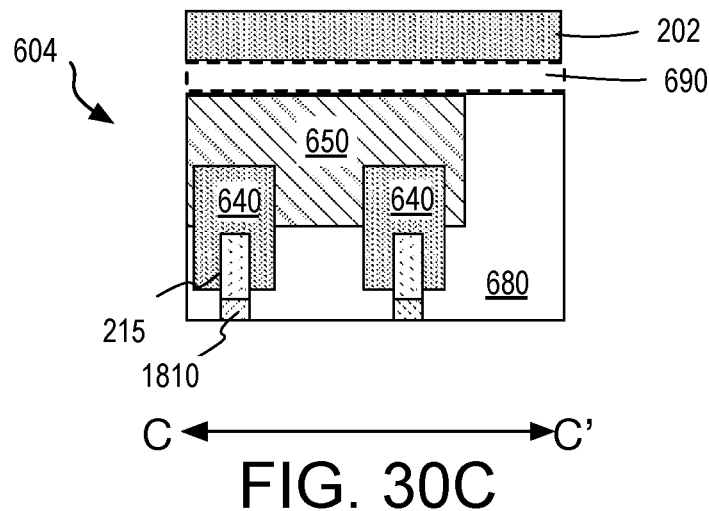
Figure 31A:
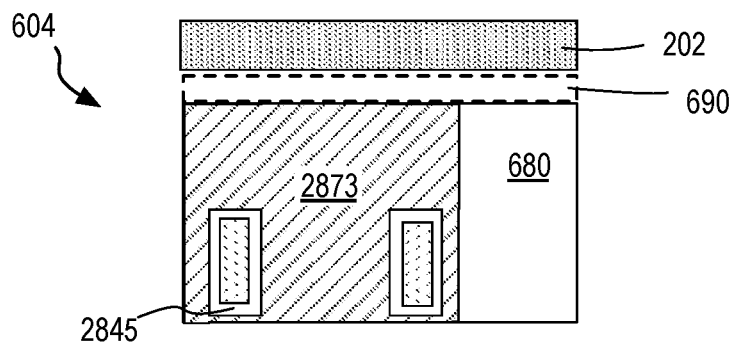
FIG. 31A, 31B, 31C illustrate cross-sectional views of a transistor structure as some operations in the methods illustrated in FIG. 17 are performed, in accordance with some alternative embodiments.
Figure 31B:
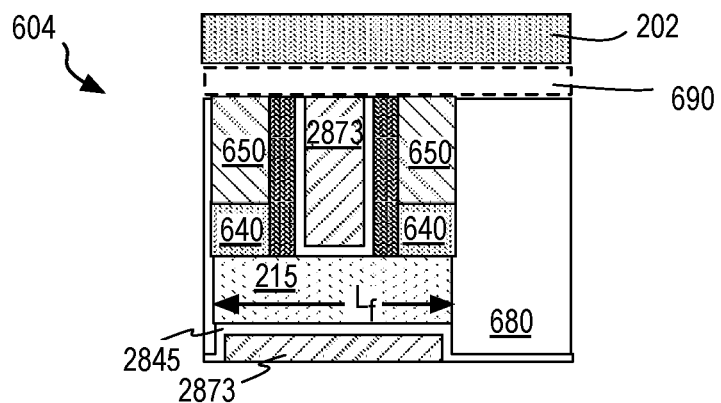
Figure 31C:
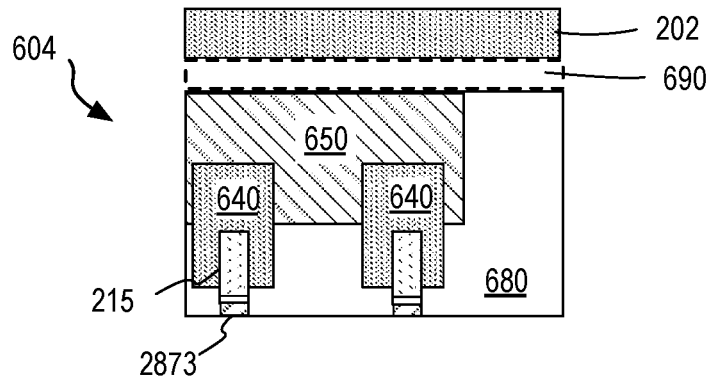

Gate electrode 673 is then removed with a selective etch process, forming void 3040 illustrated in FIG. 30A-30C. Any etch process known to etch the (sacrificial) gate electrode 673 may be employed. For example, a polysilicon etchant, SiGe etchant, or Ge etchant may be employed to isotropically remove gate electrode 673. Following removal, the exposed surface of semiconductor device layer 215 may then be covered with a permanent gate electrode stack. As further shown in FIG. 31A-31C, the back-side gate stack is deposited directly on a revealed surface of semiconductor device layer 215. To fully reveal device layer 215, any remaining portion of sub-fin semiconductor 1810 may be selectively etched (e.g., with wet or dry chemical etch), recessing the back-side surface of the semiconductor fin relative to the back-side surface of field isolation dielectric 680. For embodiments where sub-fin semiconductor 1810 has a different composition than device layer 215, the recess etch may be further selective to device layer 215, effectively stopping upon exposure of device layer 215. For embodiments where sub-fin semiconductor 1810 has the same composition as device layer 215 (e.g., both are silicon of a fin patterned from the device layer), the recess etch may be of a predetermined fixed duration. Back-side gate dielectric 2845 and back-side gate electrode 2873 are then deposited over or on the revealed device layer 215 substantially as described above.

Notably, even where the same gate stack materials are employed for both front-side and back-side gate stacks, various structural features may distinguish a nanowire transistor structure fabricated exclusively from a front-side from those fabricated with back-side processing, in accordance with some embodiments herein. For example, the presence of back-side gate dielectric 2845 over portions of device layer 215 that extend beyond a channel region contacted by front-side gate dielectric 845 is indicative of back-side gate stack deposition and patterning process that is self-aligned to structures other than those employed for front-side patterning of the gate stack. Likewise, a difference in the extent or location of back-side gate electrode 2873 relative to front-side gate electrode 673 is indicative of a back-side fabrication process. For example, as shown in both FIG. 28A and FIG. 31A, back-side gate electrode 2873 extends a longitudinal length of the back-side surface semiconductor device layer 215 that is greater than that of gate electrode 673, but approximately equal to, or just slightly less than, the longitudinal length fin length $L_f$ semiconductor device layer 215 as the recess is self-aligned to the semiconductor body.

Back-side processing of a revealed portion of a device stratum may include deprocessing and/or replacement of other transistor structures formed during front-side fabrication processes. During such deprocessing, one or more materials deposited, or structures formed, during front-side processing may be removed during back-side processing after such materials and/or temporary structures or mandrels are no longer needed in the device fabrication, and/or their retention as a component of the device is non-optimal for device operation. For example, sidewall spacer dielectrics are often employed during front-side transistor processing to facilitate self-alignment of transistor features and/or prevent electrical shorts between adjacent features. Such sidewall spacer dielectrics however may be non-optimal for device operation, for example contributing to parasitic capacitances. Back-side deprocessing may therefore subsequently remove such a spacer dielectric from the device structure and improve device operation. Once removed, the spacer dielectric may be replaced with another material more favorable for device operation, or a void where the spacer dielectric was removed may be retained as an artifact within the transistor stratum. In some advantageous embodiments, the spacer dielectric employed in front-side processing is replaced during back-side processing with another dielectric having a relative permittivity below that of the spacer dielectric. Often, low-k materials are susceptible to damage upon exposure to subsequent processing, such as a plasma etch. As such, higher-k material may be advantageous as spacer dielectric during front-side fabrication. However, this higher-k material, if retained in the transistor stratum, will increase the parasitic capacitance of the device during operation. Following a backside reveal in accordance with some embodiments, the higher-k material is replaced with low-k material. The back-filled low-k material is then spared any damage associated with exposure to frontend-processing.

Figure 32:
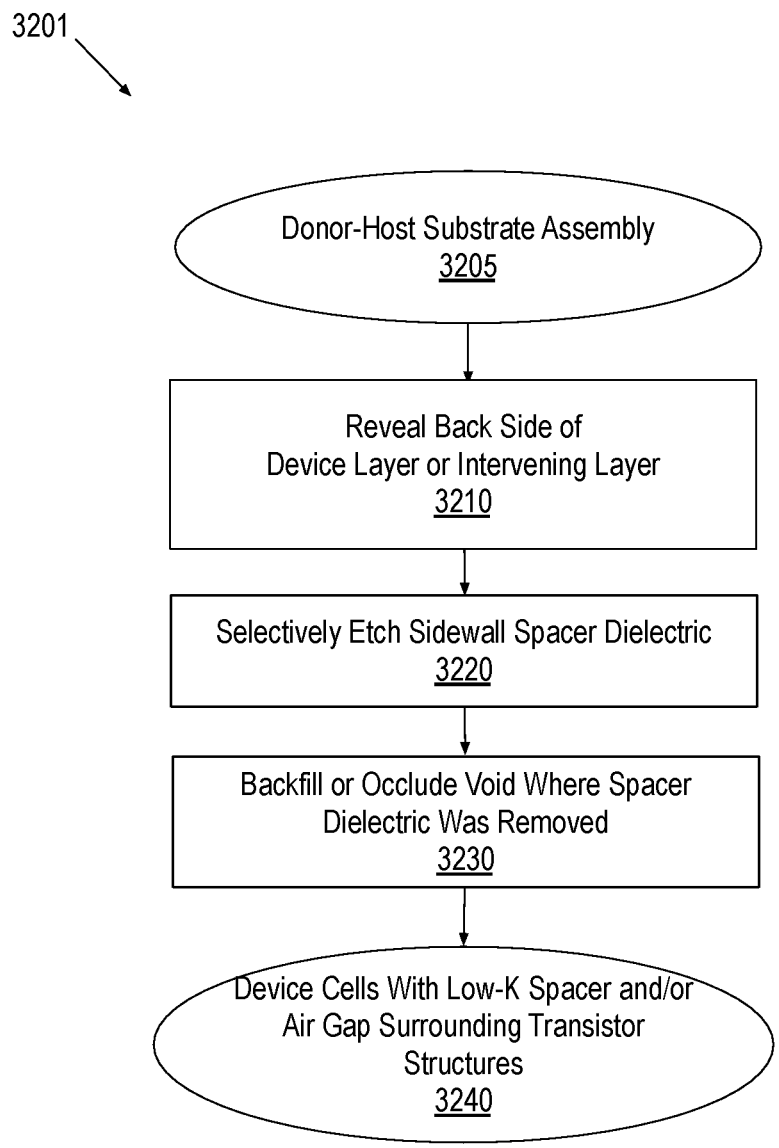
FIG. 32 is a flow diagram illustrating back-side processing methods including dielectric spacer replacement, in accordance with some embodiments.

FIG. 32 is a flow diagram illustrating back-side processing methods 3201 including removal of sidewall spacer dielectric, in accordance with some embodiments. Methods 3201 further exemplify back-side processing of a device (e.g., transistor structure) stratum that may be no more than a few hundred nanometers in thickness. Methods 3201 begin with a donor-host substrate assembly including a device layer as an input 3205. The donor substrate may have one or more of the features described above, such as, but not limited to, an intervening layer and a carrier layer. Notably however, a carrier layer and/or intervening layer is not required to perform methods 3201. At operation 3210, a back side of the device layer or intervening layer is exposed during a back-side reveal process. In some embodiments, the back-side reveal process performed at operation 3210 includes one or more of the operations of methods 501 (FIG. 5). The back-side reveal process may, for example, reveal the device layer or intervening layer by removing at least at portion of the donor substrate (e.g., carrier layer).

Figure 33A:
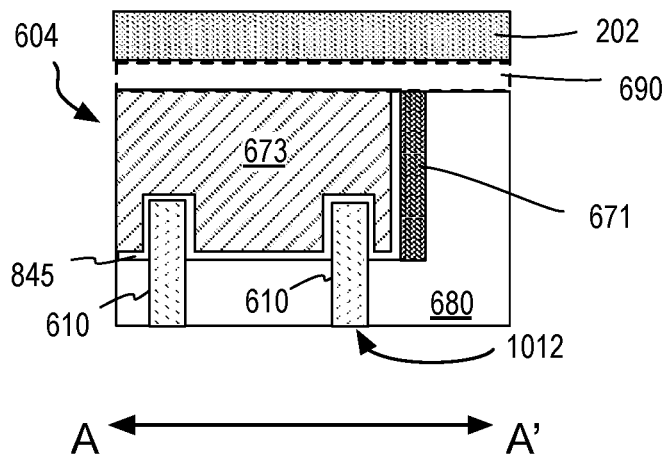
FIG. 33A, 33B, 33C illustrate cross-sectional views of a transistor structure as some operations in the methods illustrated in FIG. 32 are performed, in accordance with some alternative embodiments.
Figure 33B:
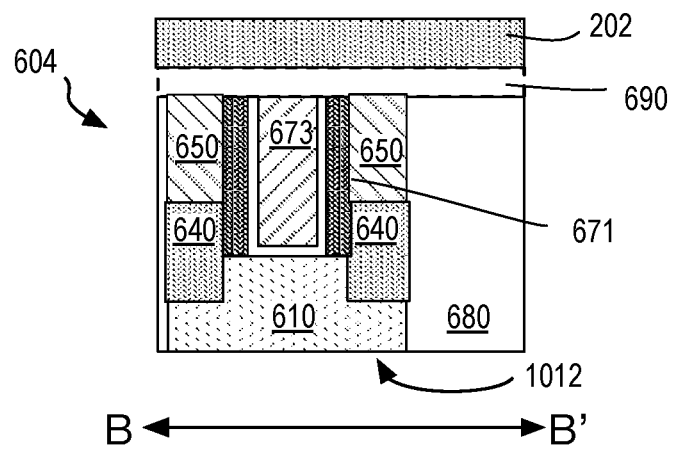
Figure 33C:
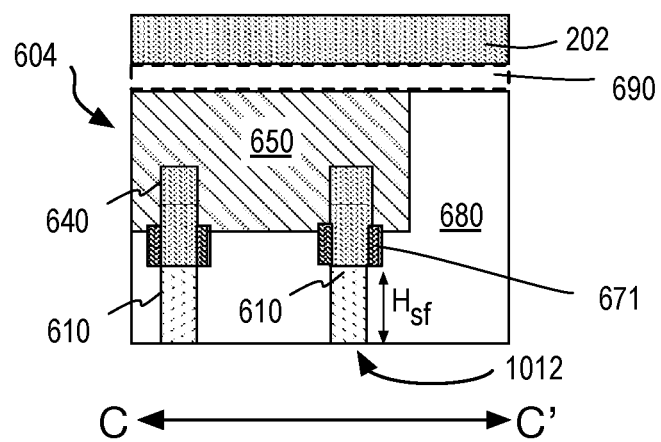

FIGS. 33A-33C, 34A-34C, 35A-35C, and 36A-36C depict cross-sectional views along the A-A', B-B' and C-C' planes denoted by heavy dot-dashed lines in the plan view of exemplary transistor structure 604 (FIG. 6). Transistor structures illustrated in FIG. 33A-33C are substantially the same as those illustrated in FIG. 10A-10C following a back-side reveal process that exposes the backside 1012 of semiconductor bodies 610. In some embodiments, the transistor structures illustrated in FIG. 33A-33C may be fabricated with any front-side processing known to be suitable for fabricating a finFET. In some embodiments, once the semiconductor bodies 610 are formed by any known technique, front-side processing proceeds as described above in the context of FIG. 20A-25A.

FIG. 33A-33C further depict locations where a dielectric sidewall spacer may be found for some illustrative embodiments. In FIG. 33A, spacer dielectric 671 is disposed at a transverse end of gate electrode 673. Such a sidewall spacer may be formed in an embodiment where the spacer dielectric is deposited after the (sacrificial) gate electrode has been fully patterned. For example, where spacer dielectric is deposited after ends in the sacrificial gate material 2173 have been patterned (FIG. 21A, B). Alternatively, where sidewall spacer dielectric is deposited before such patterning, spacer dielectric 671 may only be present on the longitudinal sidewalls of gate electrode 673 shown in FIG. 33B. Spacer dielectric may have been deposited for the purpose of forming a self-aligned spacer along a sidewall of the gate electrode that demarks a boundary between the transistor channel and source/drain regions. However, because of non-planarity in the semiconductor body, a self-aligned spacer may also form along one or more sidewall of the semiconductor body as an artifact of the front-side processing. As one example, FIG. 33C illustrates spacer dielectric 671 further disposed along a sidewall of semiconductor body 610.

Figure 34A:
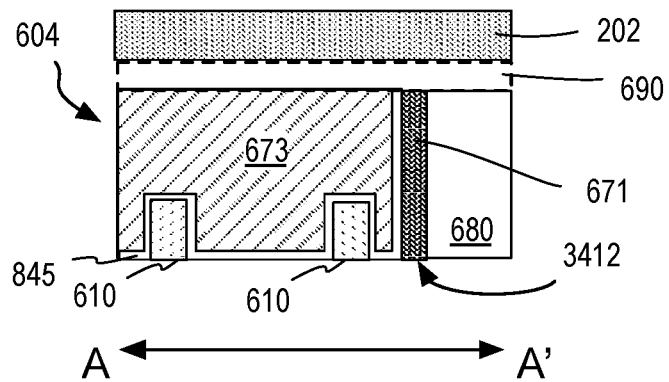
FIG. 34A, 34B, 34C illustrate cross-sectional views of a transistor structure as some operations in the methods illustrated in FIG. 32 are performed, in accordance with some alternative embodiments.
Figure 34B:
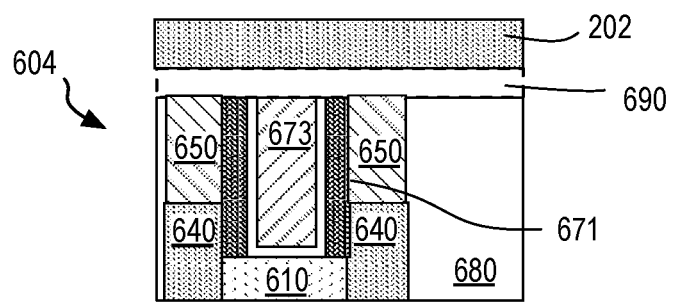
Figure 34C:
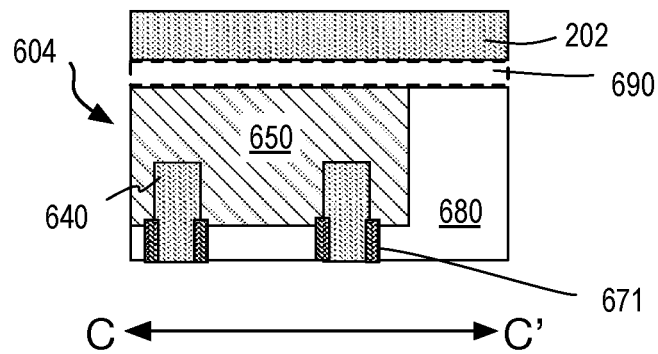

FIG. 34A-34C further illustrate how the back-side reveal process may continue to fully remove an intervening layer and expose a back side of semiconductor bodies 610. Notably, such removal may be with masked processes and or other selective techniques such that only portions of a back side are revealed. To arrive at the structures shown in FIG. 34A-34C, for example, a back-side etch or CMP polish through a (sub-fin) portion of semiconductor bodies 610 may be performed for a predetermined time, or terminated upon detection of one or more of source/drain semiconductor 640, spacer dielectric 671, gate dielectric 845, gate electrode 673. As shown in FIG. 34A-34C, reveal of the device layer also reveals spacer dielectric 671 disposed between gate electrode 673 and source/drain semiconductor 640 and/or source/drain metallization 650.

Returning to FIG. 32, methods 3201 proceed with etching at least a portion of the exposed spacer dielectric at operation 3220. Ideally, the spacer dielectric etching is highly selective to the targeted dielectric material, not significantly impacting surrounding semiconductor, dielectric and/or metallization also exposed at the back side. In some embodiments, the dielectric spacer is removed with an isotropic etch (e.g., wet chemical etch or plasma etch). For example, a wet chemical etch may isotropically remove a spacer dielectric including one or more of silicon nitride (SiN), carbon-doped silicon (SiC), or carbon-doped silicon nitride (SiCN), a the spacer dielectric. In the example shown in FIG. 35A-35C, removal of spacer dielectric 671 is selective to a gate stack that includes gate electrode 673 and gate dielectric 845, forming spacer recesses 3512.

Continuing with FIG. 32 at operation 3220, the recesses formed from deprocessing the dielectric spacer may be backfilled with another material (e.g., low-k dielectric), or alternatively occluded with any suitable dielectric material to incorporate one or more air gaps or voids into the transistor stratum. In some advantageous embodiments, the dielectric material deposited at operation 3230 has a lower relative permittivity than that which was removed at operation 3220. In some such embodiments, the dielectric material deposited at operation 3230 has a relative permittivity below 4.5, advantageously below 3.9, and more advantageously below 3.5. For some embodiments where voids are to be occluded, a dielectric material may be deposited with any nonconformal deposition technique, such as, but not limited to physical vapor deposition (sputter deposition) or some chemical vapor depositions. Voids with sufficiently high aspect ratios will then be sealed by the non-conformal dielectric material.

Figure 35A:
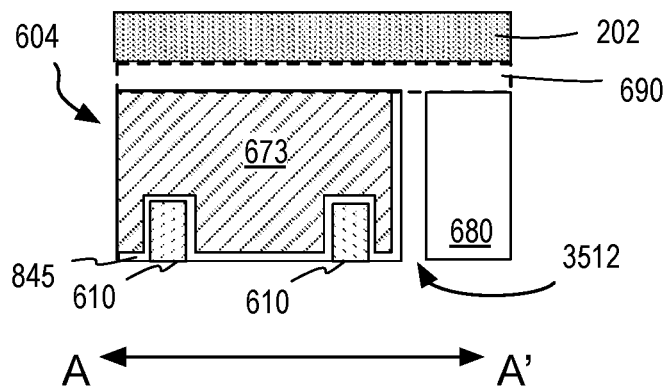
FIG. 35A, 35B, 35C illustrate cross-sectional views of a transistor structure as some operations in the methods illustrated in FIG. 32 are performed, in accordance with some alternative embodiments.
Figure 35B:
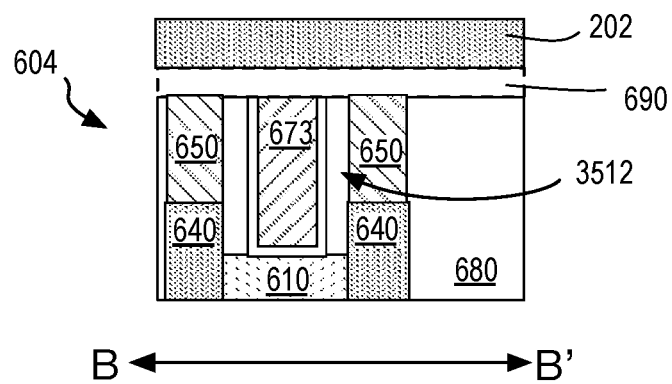
Figure 35C:
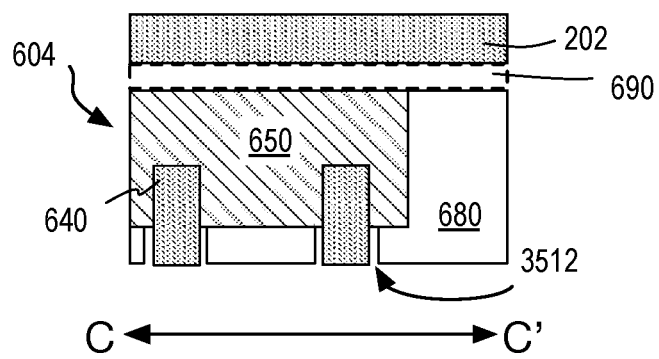
Figure 36A:
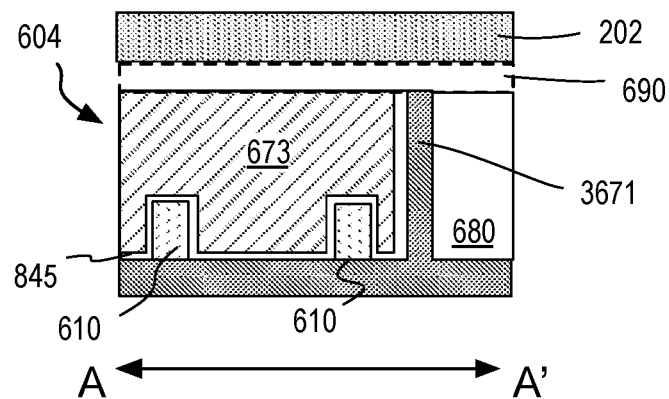
FIG. 36A, 36B, 36C illustrate cross-sectional views of a transistor structure as some operations in the methods illustrated in FIG. 32 are performed, in accordance with some alternative embodiments.
Figure 36B:
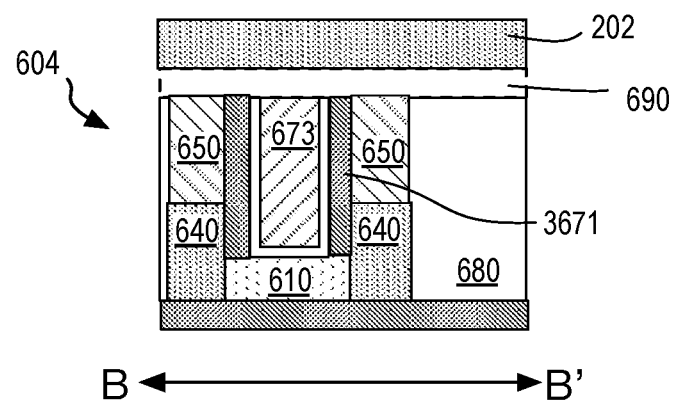
Figure 36C:
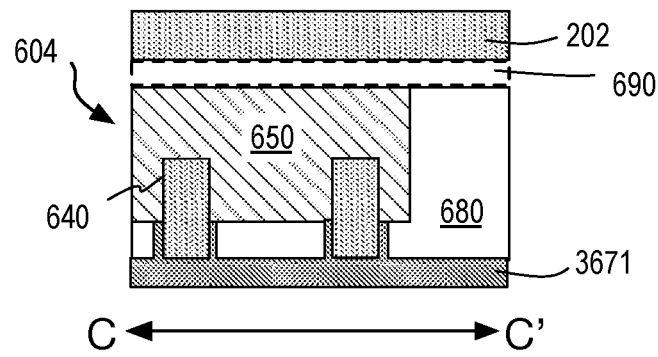

In the example illustrated in FIG. 36A-36C, back-side dielectric 3671 backfills spacer recesses 3512 (FIG. 35A-35C). Back-side dielectric 3671 may be any material known to have a low relative permittivity (e.g., less than about 4.5). Exemplary materials include SiOC, SiOCH, HSQ, or MSQ. The deposition technique may be any known to be suitable for backfilling a recess with chosen the material, such as but not limited to, chemical vapor deposition (CVD) and spin-on processes. In the example illustrated in FIG. 35A-35C, back-side dielectric 3671 also covers back-side surfaces of semiconductor bodies 610 and source/drain semiconductor 640. If desired, back-side dielectric 3671 may be subsequently planarized with the back-side surface of semiconductor bodies 610.

Figure 37A:
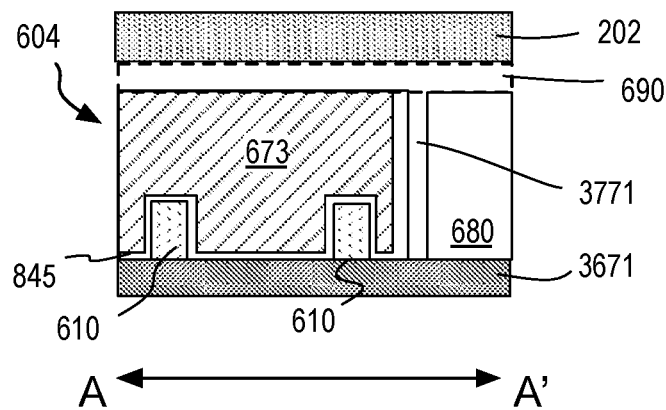
FIG. 37A, 37B, 37C illustrate cross-sectional views of a transistor structure as some operations in the methods illustrated in FIG. 32 are performed, in accordance with some alternative embodiments.
Figure 37B:
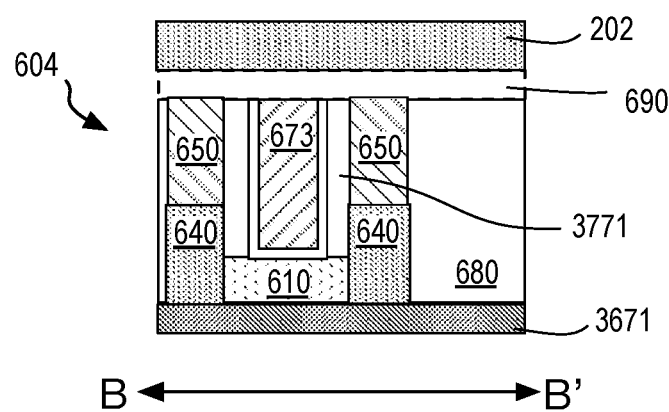
Figure 37C:
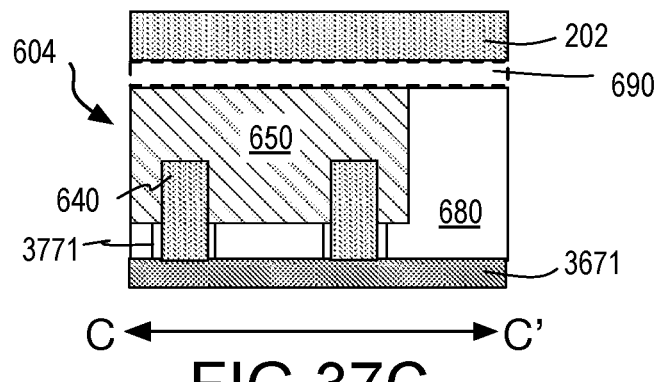

In another example illustrated in FIG. 37A-37C, back-side dielectric 3671 has insufficient conformality to backfill the high aspect ratio spacer recesses 3512 (FIG. 35A-35C), but occludes an opening of the recesses to form voids 3771. Voids 3771 may then be permanently retained as a structural feature of transistor structure 604. Methods 3201 (FIG. 32) are then substantially complete with the output 3240 including device structures with low-k spacer and/or an air gap surrounding one or more transistor structures, such as a gate electrode and/or semiconductor body.

Any front-side device structures may be removed and/or replaced substantially as described above in the context of dielectric spacer replacement. Depending on where in the device fabrication flow the back side processing is performed, a sacrificial placeholder for any portion of a device layer (e.g., transistor channel region) or terminal (e.g., transistor gate electrode or transistor source/drain semiconductor and/or metallization) may be exposed during back-side processing, at least partially removed selectively from surrounding structures, and backfilled with a suitable replacement material. In some embodiments for example, a sacrificial device terminal material (e.g., any suitable dielectric) may be formed during front-side processing to facilitate its subsequent selective removal during back-side processing. Once removed, terminal semiconductor (e.g., transistor source/drain semiconductor) and/or metallization (e.g., transistor source/drain contact metallization) may be deposited in the resulting recess. Front-side device processing may then follow a paradigm where various structures are fabricated to facilitate their subsequent exposure during back-side processing. For example, during front-side processing, the depth (z-height) of a sacrificial structure that is to be removed from the back side may be made deeper than a non-sacrificial structure that is not to be removed through the back side so that the sacrificial structure is earlier exposed during a backside reveal process and may then be replaced selectively.

Hence, any of the front-side structures described elsewhere herein (e.g., transistor gate electrode, source/drain contact metallization, etc.) may be sacrificial and ultimately replaced during back-side processing. The various structures fabricated during front-side processing to facilitate their subsequent exposure during back-side processing need not be sacrificial, however. During front-side processing, the depth (z-height) of a non-sacrificial structure (e.g., a source or drain semiconductor, a gate electrode or source/drain contact metallization) that is to be electrically contacted through the back side may be made deeper than another non-sacrificial structure (e.g., a source or drain semiconductor, a gate electrode or source/drain contact metallization) that is not to be contacted through the back side. During a backside reveal process, the deep structure is exposed before the shallower structure. Hence, any of the front-side structures described elsewhere herein (e.g., transistor gate electrode, source/drain semiconductor or contact metallization, etc.) may be sacrificial and ultimately replaced during back-side processing, or non-sacrificial and ultimately contacted during back-side processing.

Notably, any of the back-side reveal techniques and device architectures described above may be implemented globally over an entire wafer area, or selectively to a subset of regions on a wafer. In some embodiments, masked reveal techniques may be employed to reveal regions of non-planar power transistor structures selective to regions of non-planar logic transistor structures, or vice versa. Furthermore, selective reveal processing may be within a single device structure (e.g., on an inter-cell basis), may be across multiple device structures (e.g., on an intra-cell basis), or an arbitrary regional basis. Device-level selectivity of the backside reveal process is facilitated by the permanent bonding and rigidity of the host-donor substrate architectures, for example as described above. Device-level selectivity of the backside reveal process is also facilitated by the employ of highly selective reveal techniques, for example as also described above. Such selective reveal processing may provide differentiation between logic transistors and power transistors, or between any other classes of transistors (e.g., RF and logic, memory access transistors and logic, planar transistors and non-planar transistors, etc.). Exemplary embodiments further illustrating selective reveal techniques are describe below in the context of some of the double-sided transistor architectures introduced above. These same techniques may be similarly applied to fabricate stacked front-side/back-side devices within some regions selectively to other regions of a fabrication substrate (e.g., wafer).

Figure 38A:
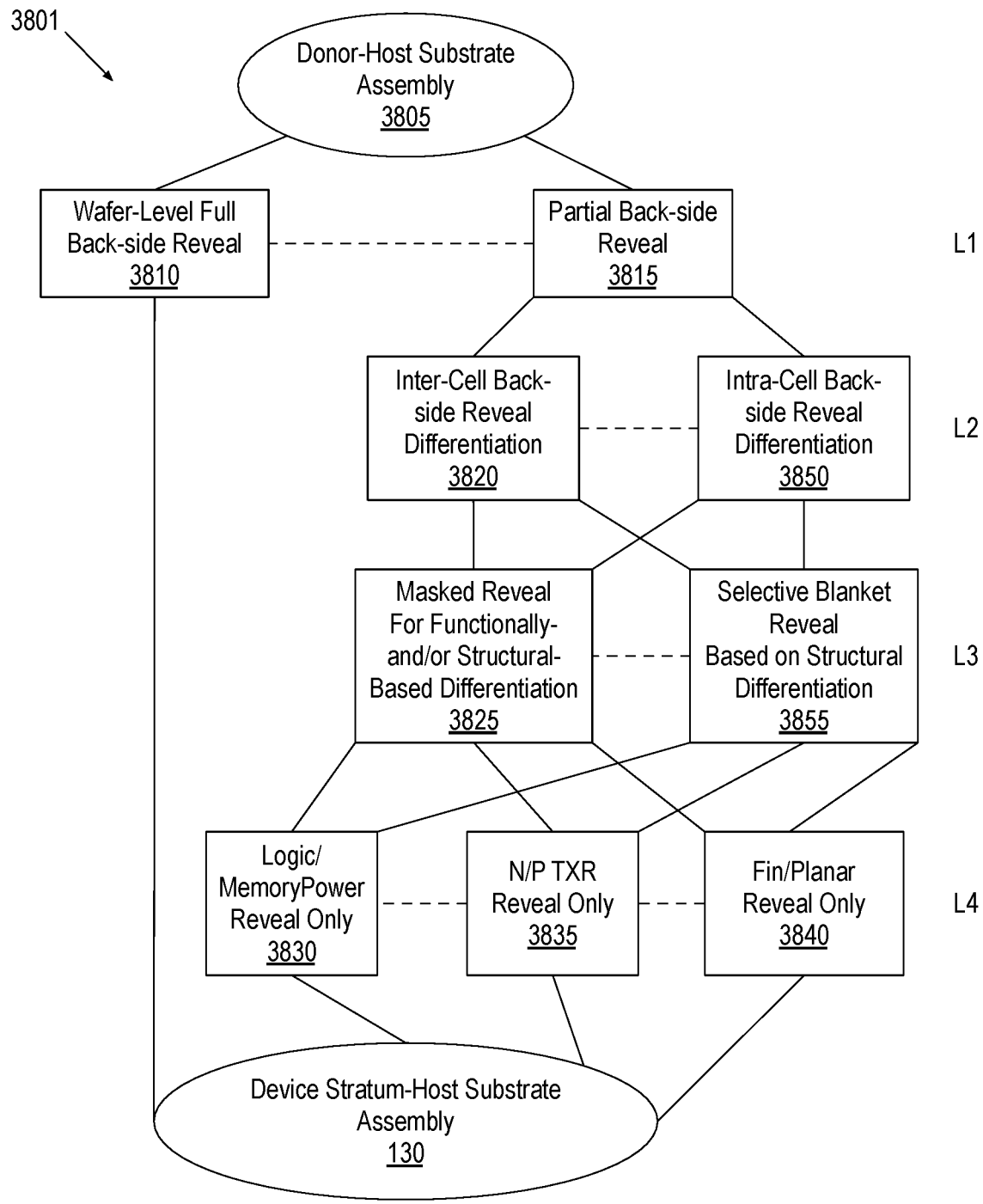
FIG. 38A illustrates back-side reveal methods, in accordance with some embodiments.

FIG. 38A is a flow diagram illustrating back-side reveal methods 3801, in accordance with some embodiments. Methods 3801 may be employed, for example, to remove at least a portion of a carrier layer, an intervening layer (if present), and/or a portion of a device layer of a donor-host substrate assembly to selectively reveal the device layer or device region for back-side processing. The device region may be any suitable material such as a semiconductor, a metal, or a dielectric. As described elsewhere herein, the reveal of the device region may provide for back-side contact to the device region, for back-side access to remove the device region or a portion thereof, etc.

As shown in FIG. 38A, methods 3801 begin with an input of a donor-host substrate assembly at operation 3805. In some embodiments, the donor-host substrate assembly received at operation 3805 is donor-host substrate assembly 203 (refer to FIG. 3B). However, the donor-host substrate assembly received at operation 3805 may be any suitable donor-host substrate assembly discussed herein.

The donor-host substrate assembly may include any suitable structures. In an embodiment, methods 3801 provide a technique for fabricating an integrated circuit and the donor-host substrate assembly includes a substrate having a front-side device layer (e.g., a semiconductor device layer) over a back-side layer. The device layer includes a first device region of a first device and a second device region of a second device. The first and/or second device regions may be any semiconductor, metal, or dielectric materials or structures such as a channel semiconductor, a source/drain semiconductor, a source/drain metal, a gate metal, a dielectric layer or material, or the like. The first device and the second device may be the same type of devices or they may be different. Such differences between the first and second devices may be functional, structural, or both. For example, the first and/or second devices may be any combination of logic transistors, memory transistors, power transistors, n-type transistors, p-type transistors, planar transistors, non-planar transistors, or the like. Furthermore, the first device and the second device may be in the same architectural cell of an integrated circuit (e.g., such that intra-cell back-side reveal differentiation is the same for each of many identical cells), or they may be in different cells of the integrated circuit (e.g., such that inter-cell back-side reveal differentiation occurs between different cells). Also, the first device region of the first device and the second device region of the second device may be the same or they may be different. For example, the first and/or second device regions may be any combination of a channel semiconductor, a source/drain semiconductor, a source/drain metal, a gate metal, a dielectric layer or material, or the like.

In methods 3801, a back-side of the first device region is revealed selectively to the second device region by removing at least a partial thickness of the aforementioned back-side layer(s). Such selective reveal may advantageously provide access to the first device region via a back-side while not revealing the second device region to (i.e., protecting the second device region from) further processing. For example, the further processing may thereby be selectively applied to the first device region and not the second device region. The selective back-side reveal of the back-side of the first device region may be provided using any suitable technique or techniques such as masked reveal techniques, blanket reveal techniques, or both.

In an embodiment, a patterned mask is formed over the back-side layer such that the patterned mask protects a back-side of the second device region. A recess is etched in unmasked portions of the back-side layer to expose the first device region while the second device region is protected by the patterned mask. The removed portion of the back-side layer may be an intervening layer and/or a portion of a device layer. Such techniques are discussed further herein with respect to FIG. 38B and FIG. 39-45.

In an embodiment, a full back-side removal of the back-side layer is performed to reveal a back-side of the front-side semiconductor device layer. A patterned dielectric hardmask layer is formed over the back-side of the front-side semiconductor device layer such that the patterned dielectric hardmask layer protects a back-side of the second device region. A recess is etched in at least a partial thickness of the front-side semiconductor device layer in unmasked portions of the front-side semiconductor device layer to expose the first device region while the second device region is protected by the patterned dielectric hardmask layer. In such techniques, the patterned dielectric hardmask layer may remain after processing to provide an isolation dielectric between devices. For example, the patterned dielectric hardmask layer may be an oxide or a nitride or the like. Such techniques are discussed herein with respect to FIGS. 38C and 46-54.

In an embodiment, the partial thickness of the back-side layer is removed across both the first device region of the first device and the second device region of the second device to reveal the back-side of the first device region. For example, the first device region of the first device and the second device region of the second device of the front-side semiconductor device layer may have a structural difference such that the first device region is revealed selective to the second device region when a blanket reveal is provided for the integrated circuit. Such techniques may include any operations or structures discussed herein. Structural feature differentiation of a gate electrode, for example as described above with respect to FIGS. 17 and 24-34, may be employed to selectively reveal a subset of gate electrodes from a back side of a device stratum. For example, a first gate electrode (e.g., first device region) of a first non-planar device may extend deeper into or through the device stratum than a gate electrode (e.g., second device region) of a second non-planar device such that, upon blanket reveal (e.g., planar processing), the first gate electrode is exposed while the second gate electrode is not.

As shown in FIG. 38A, methods 3801 provide a variety of processing branches for providing back-side reveal and related techniques for the received donor-host substrate assembly. For example, operations 3820, 3850, 3825 and 3855 are illustrated as coupled through dashed lines within a given level (e.g., L2) and coupled through solid lines between two levels (e.g., L2 and L3) to exemplify the various permutations possible. The selection of such processing branches may be based, at least in part, on the received donor-host substrate assembly, the desired structures to be revealed, and/or the desired processing to be performed on the back-side revealed structures. As shown, a first level (e.g., L1) of methods 3801 (e.g., operations 3810 and/or 3815) may include a wafer-level full back-side reveal, a partial back-side reveal, or both. The first level may provide for a back-side reveal technique. A second level (e.g., L2) of methods 3801 (e.g., operations 3820 and/or 3850) may include a cell level differentiation provided by the implemented reveal technique. The second level may provide a reveal on an inter-cell basis, an intra-cell basis, or both (represented by the dashed line). A third level (e.g., L3) of methods 3801 (e.g., operations 3825 and/or 3858) may include a reveal type used for partial back-side reveal. The third level may provide for the reveal type to be a masked reveal, a blanket reveal, or both. All of these reveal types may be employed to achieve either inter-cell differentiation or intra-cell differentiation, as represented by the crossing solid line connections between L2 and L3. Furthermore, the third level may provide for a differentiation basis of the reveal. For example, the reveal may be based on a functionality of the devices being selectively revealed, a structure of the devices being selectively revealed, or both. A fourth level (e.g., L4) of methods 3801 (e.g., operations 3830, 3835, and/or 3840) may provide for functionality and/or structural differentiation options of devices as revealed by operations 3825 and/or 3858. For example, reveal of devices may be selectively performed based on devices being logic, memory, or power devices, based on devices being n-type or p-type, based on devices being non-planar or planar, or any combination thereof.

As shown, methods 3801 include a branch from operation 3805 through operation 3810 to operation 130, which provides for the output of a device stratum-host substrate assembly. Operation 3810 provides a wafer-level full back-side reveal of the received donor-host substrate assembly to provide a device stratum-host substrate assembly at operation 130. Such wafer-level full back-side reveal techniques have been discussed with respect to FIG. 5 and elsewhere herein. For example, wafer-level full back-side reveal may include polishing and/or etching through a thickness of a carrier layer, detecting intervening layer(s), and polishing and/or etching through a thickness of the intervening layer(s). As the name suggests, such processing is performed on an entirety of the received donor-host substrate assembly without masking or the like. In an embodiment, wafer-level full back-side reveal is performed to reveal an intervening layer. In an embodiment, wafer-level full back-side reveal is performed to reveal a back-side of a device layer. In an embodiment, the received donor-host substrate assembly does not include the carrier layer and the wafer-level full back-side reveal removes a thickness or an entirety of the intervening layer(s). In an embodiment, the wafer-level full back-side reveal exposes an intervening layer and/or a device layer such that further processing (e.g., masked or blanket reveal processing) is performed to reveal a first device region of a first device selective to a second device region of a second device. In an embodiment, the wafer-level full back-side reveal reveals a first device region of a first device selective to a second device region of a second device as discussed above. For example, such wafer-level full back-side reveal for selective device region reveal may be based on a structural difference between the first and second device devices such that a first device region is revealed upon wafer-level full back-side reveal processing while a second device region of a second device is not revealed after such processing.

Also as shown, by the hatched line connecting operations 3810 and 3815, in some embodiments, wafer-level full back-side reveal as provided by operation 3810 may be followed by a partial back-side reveal at operation 3815. For example, a wafer-level full back-side reveal of the received donor-host substrate assembly at operation 3810 may reveal an intervening layer and/or a device layer (e.g., but not the device region to be revealed) and a partial back-side reveal at operation 3815 via any branch shown therewith may provide a reveal of a device layer or a portion thereof (e.g., the device region to be revealed selective to another device region). An example of such wafer-level full back-side reveal followed by partial back-side reveal is illustrated with respect to FIG. 38C and elsewhere herein.

Methods 3801 also include a variety of branches from operation 3805 (or operation 3810 as discussed) beginning at operation 3815. At operation 3815, a partial back-side reveal is provided or initiated. Such a partial back-side reveal may provide for a range of back-side reveal options. In an embodiment, the back-side reveal is based on the layout of regions of the donor-host substrate assembly. For example, the back-side reveal may provide a selective reveal based on an inter-cell reveal at operation 3820, an intra-cell reveal at operation 3850, a region-based reveal (not shown), or the like. In this context, a cell is a smallest functional unit within a device stratum. A transistor cell for example includes one transistor, a 1T-1R memory cell includes one transistor and one resistor, a 1T-1C memory cell includes one transistor and one capacitor. For cells that include a passive device, such as a resistor or capacitor, an inter-cell reveal at operation 3820 may reveal only the active device (e.g., transistor), only the passive device, or both the active and passive device, for example as a function of their relative location within a cell.

Inter-cell back-side reveal differentiation as provided at operation 3820 provides a back-side reveal of device regions within certain cells while leaving device regions within other cells covered (or non-revealed). The device regions revealed within the cells may be any suitable region or regions such as a channel semiconductor, a source/drain semiconductor, a source/drain metal, a gate metal, a dielectric layer or material, or the like. In some embodiments, as shown at operation 3825, such inter-cell back-side reveal differentiation is provided using masked reveal techniques. In other embodiments, as shown at operation 3858, such inter-cell back-side reveal differentiation is provided using blanket reveal techniques.

Continuing with operation 3825, such inter-cell masked reveal techniques may provide functionally-based and/or structural-based differentiation such that the devices corresponding to the device regions being revealed have a different functionality and/or a different structure with respect to the devices having device regions that are not being revealed. As shown with respect to operations 3830, 3835, and 3840, such functionality- and/or structural-based differentiation may correspond to revealing only device regions of transistors or other devices in a variety of contexts. As shown with respect to operation 3830, inter-cell functionality- and/or structural-based differentiation may correspond to revealing only device regions of logic transistors selective to device regions of memory and/or power transistors, revealing only device regions of memory transistors selective to device regions of logic and/or power transistors, revealing only device regions of power transistors selective to device regions of logic and/or memory transistors, or the like. In some embodiments, such differentiation may be based on device design rules, device critical dimensions, or the like. As shown with respect to operation 3835, inter-cell functionality- and/or structural-based differentiation may correspond to revealing only device regions of n-type transistors selective to device regions of p-type transistors or vice versa. As shown with respect to operation 3840, inter-cell functionality- and/or structural-based differentiation may correspond to revealing only device regions of non-planar transistors (e.g., fin transistors) selective to device regions of planar transistors or vice versa.

Furthermore, as shown with respect to the hatched lines connecting operations 3830, 3835, and 3840, differentiation among combinations of such logic/memory/power reveal, n-type/p-type reveal, and non-planar/planar reveal are available. For example, device regions of logic n-type planar devices may be revealed selective to memory/power n-type planar devices, logic p-type planar devices, logic n-type non-planar devices, memory/power p-type planar devices, memory/power p-type non-planar devices, and so on. To illustrate but one other example, device regions of power p-type planar devices may be may be revealed selective to logic/memory p-type planar devices, power n-type planar devices, power p-type non-planar devices, logic/memory n-type planar devices, or logic/memory n-type non-planar devices. For example, such selectivity may be provided between device functionality types (e.g., selected from logic/memory/power), polarity (e.g., selected from n-type/p-type), and/or device structure (e.g., selected from planar/non-planar), in any permutation. Furthermore, additional options are available such as differentiation between device type (e.g., transistor, resistor, diode, etc.) and/or other structures. For example, device regions may be revealed selectively based on any suitable combination of functionality, type, structure, or other suitable characteristics.

Returning to the third level of methods 3801, as shown at operation 3855, inter-cell back-side reveal differentiation may be provided using blanket reveal techniques where selectivity of the reveal is a function of structural differences in device features that are created by front side processing. Such blanket reveal techniques may include polishing and/or etching through a thickness of an intervening layer or layers and/or a thickness of a device layer to reveal the first device region while not revealing the second device region. Such blanket reveal processing is performed on an entirety of the intervening layer and/or device layer without masking. In an embodiment, the blanket reveal processing reveals a first device region of a first device selective to a second device region of a second device based on the first device region being situated to be exposed and the second device region being situated not to be exposed by such blanket reveal processing. For example, the first device region or a portion thereof may extend below (e.g., in a direction toward the back-side) the second device region such that in a planar operation or an etch operation, the first device region is exposed prior to exposure of the second device region. The blanket reveal processing may be stopped (e.g., based on timing or a marker or the like) when the first device region is exposed and the second device region is not exposed.

As shown at operation 3855, selective blanket reveal processing may rely on structural differentiation between the first device and the second device with respect to the first device region and second device region. The structural difference may be the first device region extending below the second device region, as discussed, a material difference between the first and second device regions, or the like. In addition to the structural difference for back-side reveal (e.g., a back-side reveal structural difference), the first and second devices may have any suitable functionality and/or other structural differences to provide inter-cell differentiation. For example, such back-side reveal structural differences may be provided between transistors of different functionality such that the first device (e.g., having a first device region to be back-side revealed) is a logic transistor and the second device (e.g., having a second device region that is not revealed) is a memory or power transistor. In an embodiment, back-side reveal structural differences may be provided between transistors of different polarity such that the first device (e.g., having a first device region to be back-side revealed) is an n-type transistor and the second device (e.g., having a second device region that is not revealed) is a p-type transistor or vice versa. In an embodiment, back-side reveal structural differences may be provided between transistors of different device structures such that the first device (e.g., having a first device region to be back-side revealed) is a non-planar transistor and the second device (e.g., having a second device region that is not revealed) is a planar transistor or vice versa. In an embodiment, back-side reveal structural differences may be provided in devices that are otherwise of the same functionality, polarity, and/or structure.

For example, as shown with respect to operations 3830, 3835, and 3840, back-side reveal structural differences may provided across device functionality types (e.g., selected from logic/memory/power), polarity (e.g., selected from n-type/p-type), and/or device structure (e.g., selected from planar/non-planar), in any permutation. Furthermore, additional options are available such as differentiation between device type (e.g., transistor, resistor, diode, etc.) and/or other structures. For example, device regions may be revealed selectively based on any suitable combination of functionality, type, structure, or other suitable characteristics.

Turning now to intra-cell back-side reveal differentiation as provided at operation 3850, such intra-cell reveal provides a back-side reveal of a device region or regions of a particular device or devices while other device region(s) of other devices within the same cell are not revealed (e.g., remained covered from the back-side). The device regions revealed may be any suitable regions such as a channel semiconductor, a source/drain semiconductor, a source/drain metal, a gate metal, a dielectric layer or material, or the like. Also, as shown with respect to the hatched line connecting operations 3820 and 3850, such inter- and intra-cell reveal differentiation may be used together in various combinations. For example, differentiation may be provided such that no device regions of first cells are revealed while particular device regions of second cells are revealed. Such differentiation provides inter-cell differentiation between the first cells and the second cells. Furthermore, within the second cells, particular device regions of first devices are revealed while device regions of second devices are not revealed. Such differentiation between the first devices and second devices within the second cells provides intra-cell differentiation between the first and second devices of the second cells. Although discussed with respect to differentiation between two cells with one cell having two device types, such differentiation may be provided on an inter-cell level between any number of cell types and on an intra-cell level with different revealed inter-cells being revealed differently on an intra-cell basis. For example, of three cell types, one may not be revealed at all and a second and third may be revealed such that all devices of the second cell type have a device region revealed while intra-cell differentiation is provided within the third cell (e.g., some devices in the third cell are not revealed while other devices have device regions that are revealed).

In some embodiments, as shown at operation 3825, masked reveal techniques facilitate back-side reveal differentiation. Furthermore, such masked reveal techniques may provide functionally-based and/or structural-based differentiation such that the devices corresponding to the regions revealed have a different functionality with respect to the devices having regions that are not revealed. For example, as shown with respect to operation 3830, intra-cell functionality-based and/or structural-based differentiation may correspond to revealing only device regions of logic transistors selective to device regions of memory and/or power transistors, revealing only device regions of memory transistors selective to device regions of logic and/or power transistors, revealing only device regions of power transistors selective to device regions of logic and/or memory transistors, or the like. In some embodiments, such differentiation may be based on device design rules, device critical dimensions, or the like. As shown with respect to operation 3835, intra-cell functionality-based and/or structural-based differentiation may correspond to revealing only device regions of n-type transistors selective to device regions of p-type transistors or vice versa. As shown with respect to operation 3840, intra-cell functionality-based and/or structural-based differentiation may correspond to revealing only device regions of non-planar transistors (e.g., fin transistors) selective to device regions of planar transistors or vice versa.

Furthermore, as discussed with respect to inter-cell differentiation and as shown with respect to the hatched lines connecting operations 3830, 3835, and 3840, differentiation among combinations of such logic/memory/power reveal, n-type/p-type reveal, and non-planar/planar reveal are available on an intra-cell basis. For example, such selectivity may be provided between device functionality types (e.g., selected from logic/memory/power), polarity (e.g., selected from n-type/p-type), and/or device structure (e.g., selected from planar/non-planar), in any permutation. Furthermore, additional options are available such as differentiation between device type (e.g., transistor, resistor, diode, etc.) and/or other structures. For example, device regions may be revealed selectively based on any suitable combination of functionality, type, structure, or other suitable characteristics.

Referring again to the third level of methods 3801, as shown at operation 3855, intra-cell back-side reveal differentiation may be provided using blanket reveal techniques. As discussed, such blanket reveal techniques may include polishing and/or etching through a thickness of an intervening layer or layers and/or a thickness of a device layer to reveal the first device region without revealing the second device region. The blanket reveal processing may reveal a first device region of a first device selective to a second device region of a second device based on the first device region being situated so as to be exposed and the second device region being situated so as to avoid exposure by such blanket reveal processing. For example, the first device region or a portion thereof may extend below (e.g., in a direction toward the back-side) the second device region such that in a planarizing operation or an etch operation, the first device region is exposed prior to exposure of the second device region. The blanket reveal processing may be stopped (e.g., based on timing or a marker, etc.) when the first device region is exposed and the second device region is not exposed.

For intra-cell differentiation, such blanket reveal processing may rely on a structural differentiation between the first device and the second device with respect to the first device region and second device region. The structural difference may be the first device region extending below the second device region, as discussed, or a material difference between the first and second device regions, for example. In addition to the structural difference for back-side reveal (e.g., a back-side reveal structural difference), the first and second devices may have any suitable functionality and/or other structural differences to provide intra-cell differentiation. For example, such back-side reveal structural differences may be provided between transistors of different functionality such that the first device (e.g., having a first device region to be back-side revealed) is a logic transistor and the second device (e.g., having a second device region that is not revealed) is a memory or power transistor. In an embodiment, back-side reveal structural differences may be provided between transistors of different polarity such that the first device (e.g., having a first device region to be back-side revealed) is an n-type transistor and the second device (e.g., having a second device region that is not revealed) is a p-type transistor or vice versa. In an embodiment, back-side reveal structural differences may be provided between transistors of different device structures such that the first device (e.g., having a first device region back-side revealed) is a non-planar transistor and the second device (e.g., having a second device region that is not revealed) is a planar transistor, or vice versa. In an embodiment, back-side reveal structural differences may be provided in devices that are otherwise of the same functionality, polarity, and/or structure.

For example, as shown with respect to operations 3830, 3835, and 3840, structural differences may be provided across device functionality types (e.g., selected from logic/memory/power), polarity (e.g., selected from n-type/p-type), and/or device structure (e.g., selected from planar/non-planar), in any permutation. Furthermore, additional options are available such as differentiation between device type (e.g., transistor, resistor, diode, etc.) and/or other structures. For example, device regions may be revealed selectively based on any suitable combination of functionality, type, structure, or other suitable characteristics.

As discussed, in some embodiments, the back-side reveal is based on the device functionality and/or structure within such regions, defining such regions, or as interspersed throughout the donor-host substrate assembly. For example, the back-side reveal may be provide a selective reveal between logic devices and memory devices, between logic devices and power devices, between memory devices and power devices, or otherwise based on device functionality, device critical dimensions, or the like (e.g., at operation 3830). In other examples, the back-side reveal provides a selective reveal between n-type devices and p-type devices (e.g., at operation 3835), between fin or non-planar based devices and planar devices (e.g., at operation 3840), or the like. Furthermore, other device type based back-side reveal options are available.

As discussed with respect to operation 3815, in some embodiments, partial back-side reveal is provided based on a masked reveal. For example, such techniques may include masking areas, regions, IC cells, sub-cells, or the like that are not to be revealed and selectively removing material (e.g., via etch or the like) from un-masked areas, regions, cells, sub-cells, or the like. Such techniques may provide selective back-side reveal between cells (e.g., inter-cell), among cells (e.g., intra-cell), between devices of different functionality, between devices having different structures, etc.

Furthermore, as shown with respect to operation 3855 in some embodiments, partial back-side reveal is provided by a blanket reveal process. In such embodiments, no masking need be provided and back-side reveal may be provided based on a structural difference between the devices having a region revealed (e.g., a back-side reveal structural difference) and those devices not having a region revealed. For example a blanket reveal may provide a selective back-side reveal based on the structural differences between the devices revealed and those not revealed. Such structural differences may be between devices in different cells, sub-cells, or the like, and they may be provided between the same or different devices. Such different devices may differ in functionality, structure(s) other than the back-side reveal structural difference, or the like.

The various branches of methods 3801 provided by operations 3815, 3820, 3850, 3825, 3855, 3830, 3858, 3836, 3835, and 3840 may be implemented to generate a range of device stratum-host substrate assemblies to be output at operation 130. For example, operations 3805, 3815, 3820, 3825, 3830, and 130 provides for a partial back-side reveal (e.g., at operation 3815) of a received donor-host substrate assembly (e.g., received at operation 3805) to provide inter-cell back-side reveal differentiation (e.g., at operation 3820) between logic transistors and memory and/or power transistors, between memory and logic and/or power transistors, or between power and logic and/or memory transistors (e.g., at operation 3830). Operations 3805, 3815, 3850, 3825, 3835, and 130 provides for a partial back-side reveal (e.g., at operation 3815) of a received donor-host substrate assembly (e.g., received at operation 3805) to provide intra-cell back-side reveal differentiation (e.g., at operation 3825) between n-type transistors and p-type transistors (e.g., at operation 3830). As shown, a wide range of other operations is available.

For example, FIG. 38A illustrating methods 3801 may be read to provide for the following options to provide a selective back-side reveal (e.g., of one device region selective to another device region) for a received donor-host substrate assembly (e.g., received at operation 3805). Either or both of wafer-level full back-side reveal and partial back-side reveal may be performed (e.g., at L1 operations 3810 and 3815). Inter-cell and or intra-cell back-side reveal differentiation may be provided (e.g., at L2 operations 3820 and 3850). Such inter-cell or intra-cell level differentiation may be provided by masked and/or blanket reveal (e.g., at L3 operations 3825 and 3855). Masked reveal may provide for functionally-based and/or structurally-based differentiation in the back-side reveal. The differentiation (e.g., inter-cell or intra-cell) as provided by the selective back-side reveal (e.g., using masked reveal or blanket reveal) may provide differentiation among logic/memory/power transistors, between n-type and p-type transistors, between planar and non-planar transistors, or any combination thereof. As shown, the device stratum-host substrate assembly output having selective back-side reveal and/or additional processing is provided at operation 130.

Discussion now turns to particular exemplary techniques further illustrating methods 3801. A first embodiment is provided with respect to FIG. 38B and FIGS. 39-45 and a second embodiment is provided with respect to FIG. 38C and FIGS. 46-54. The exemplary techniques described with respect to such embodiments may be extended to any particular methods or branches of methods 3801.

Figure 38B:
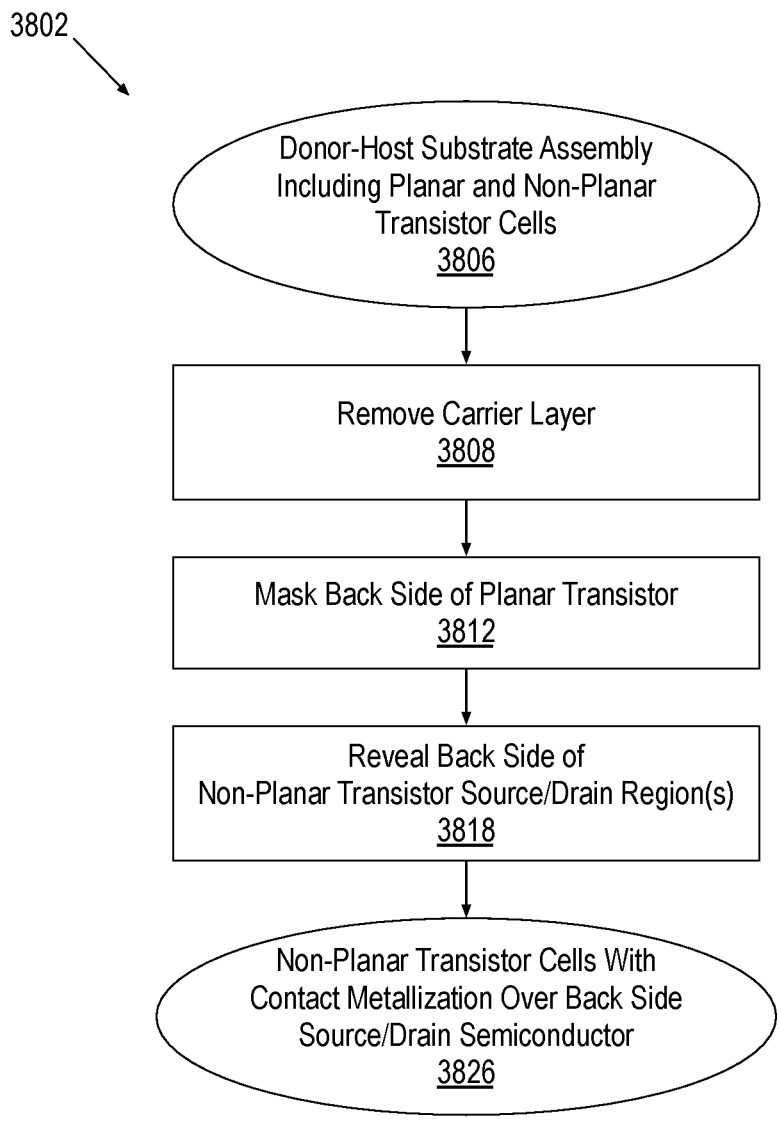
FIG. 38B is a flow diagram illustrating methods for forming non-planar transistor back-side source/drain semiconductor and contact metallization selective to planar transistors, in accordance with some embodiments.

FIG. 38B is a flow diagram illustrating methods 3802 for forming non-planar transistor back-side transistor source/drain semiconductor and contact metallization selective to planar transistors, in accordance with some embodiments. Methods 3802 begin with a donor-host substrate assembly including planar transistor structures and non-planar transistor structures as an input 3806. The donor substrate may have one or more of the features described herein, such as, but not limited to, an intervening layer and a carrier layer. However, a carrier layer is not required to perform methods 3802. The non-planar and/or planar transistor structures at the input of methods 3802 may be completely operable, for example. Alternatively, one or more terminals may be absent such that the non-planar transistor structure will not be operable until back-side processing is complete.

Figure 39:
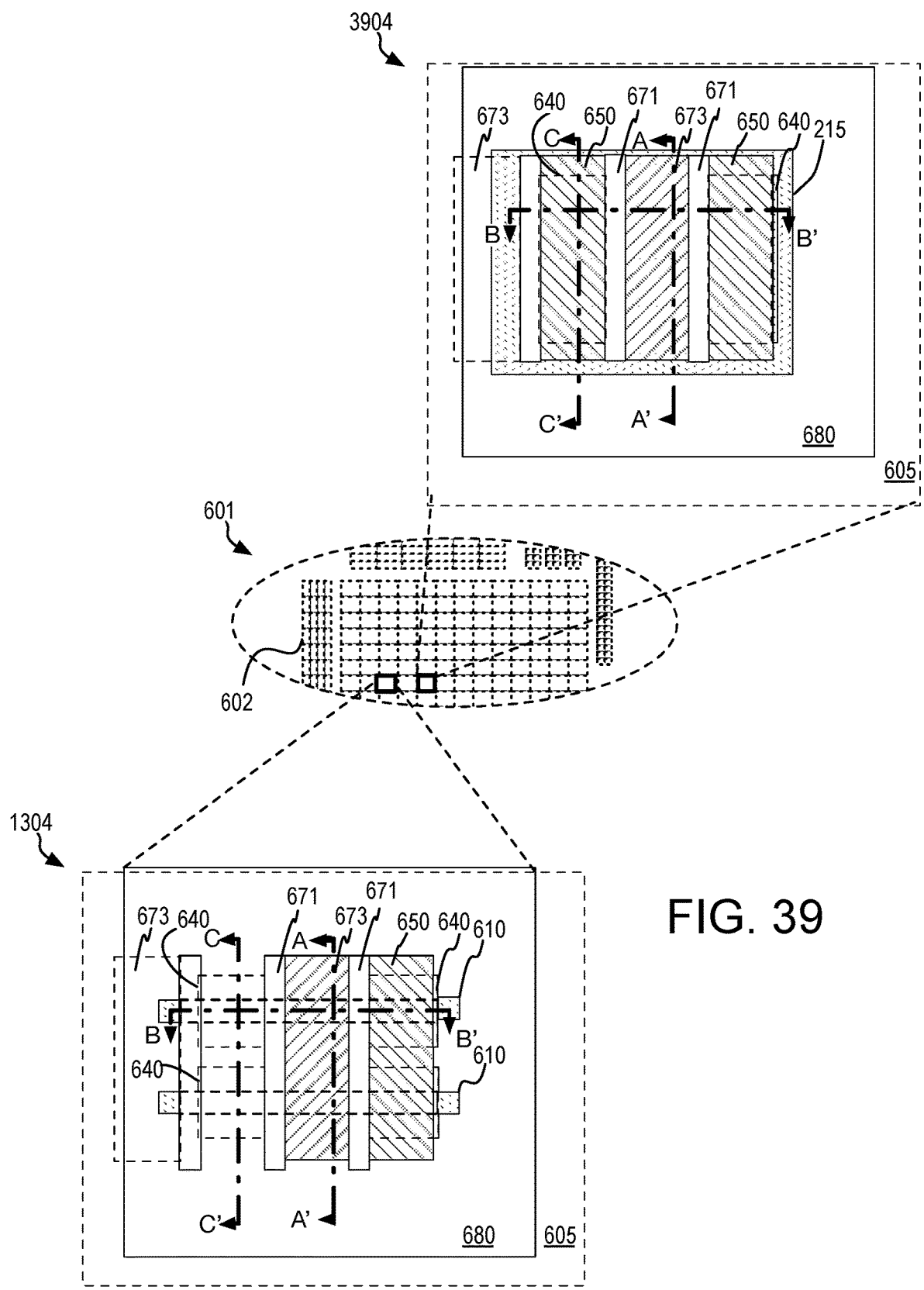
FIG. 39 is a plan view of a non-planar transistor structure lacking one source/drain contact metallization and a planar transistor structure with both source/drain metallizations, in accordance with some embodiments.

FIG. 39 is a plan view of a non-planar transistor structure 1304 lacking one source/drain metallization 650 and a planar transistor structure 3904 with both source/drain metallizations 650, in accordance with some embodiments. Heavy dot-dashed lines illustrated with respect to non-planar transistor structure 1304 denote planes along which cross-sectional views are further provided as FIGS. 40A-40C, 42A-42C and 44A-44C. Similarly, heavy dot-dashed lines illustrated with respect to planar transistor structure 3904 denote planes along which cross-sectional views are further provided as FIGS. 41A-41C, 43A-43C and 45A-45C. Using the techniques discussed herein and shown with respect to methods 3802, selective back-side processing may be provided for non-planar transistor structure 1304 without providing back-side processing for planar transistor structure 3904.

Returning to FIG. 38B, the selective back-side processing provided by methods 3802 provides back-side reveal of source/drain semiconductor 640 (e.g., a first device region) of non-planar transistor structure 1304 (e.g., a first device). Furthermore, selective back-side processing provided by methods 3802 reveals the back-side of source/drain semiconductor 640 of non-planar transistor structure 1304 selective to planar transistor structure 3904 (e.g., a second device) and, thereby, selective to each device region of planar transistor structure 3904. For example, the selective back-side reveal of source/drain semiconductor 640 of non-planar transistor structure 1304 is selective to source/drain semiconductor 640, source/drain metallization 650, spacer dielectric 671 separating gate electrode 673 from source/drain metallization 650 and/or source/drain semiconductor 640, field isolation dielectric 680, and device layer 215 of planar transistor structure 3904. Although discussed with respect to selective back-side reveal of source/drain semiconductor 640 of non-planar transistor structure 1304 selective to planar transistor structure 3904, methods 3802 may provide for selective back-side reveal of any one or more device regions of planar transistor structure 3904 selective to any one or more device regions of non-planar transistor structure 1304. Furthermore, methods 3802 may provide for selective back-side reveal of any one or more device regions of non-planar transistor structure 1304 selective to any one or more device regions of planar transistor structure 3904.

Furthermore, methods 3802 may provide for disposing (e.g., by deposition or the like) of one or more non-native material over the revealed source/drain semiconductor 640 (e.g., the revealed first device region). In the example of methods 3802, back-side source/drain semiconductor 1640 and back-side source/drain metallization 1650 are disposed over the revealed (e.g., back-side revealed) source/drain semiconductor 640. Although discussed with respect to disposing back-side source/drain semiconductor 1640 and back-side source/drain metallization 1650 over source/drain semiconductor 640, any suitable non-native material(s) may be disposed over any exposed device region. For example, the non-native material or materials may include semiconductor materials, metal materials, or dielectric materials.

As shown in FIG. 39, in some embodiments, non-planar transistors and planar transistors may be integrated in the same integrated circuit. For example, non-planar transistor structure 1304 and planar transistor structure 3904 may be integrated on IC die 601. In planar transistor structure 3904, like numbers with respect to non-planar transistor structure 1304 indicate like structures. For example, planar transistor structure 3904 includes gate electrode 673, source/drain semiconductor 640, source/drain metallization 650, spacer dielectric 671 separating gate electrode 673 from source/drain metallization 650 and/or source/drain semiconductor 640, field isolation dielectric 680, and device layer 215. As will be appreciated, in contrast to non-planar transistor structure 1304, gate electrode 673 (and gate dielectric 845 in FIG. 41) does not wrap around a channel region of the transistor channel.

With respect to non-planar transistor structure 1304, in the absence of source or drain metallization 650, pitch and/or critical dimension constraints for source/drain metallization 650 and/or other front-side metallization levels (e.g., gate electrode 673 or higher metallization levels) may be advantageously relaxed. The absence of a source or drain metallization 650 may render non-planar transistor structure 1304 inoperable until the third terminal connection is fabricated, for example, with back-side transistor source/drain contact metallization methods 3802 (FIG. 38B). Such back-side transistor source/drain contact metallization may couple a power rail (e.g., $V_{cc}$) into a transistor structure, advantageously placing power (source) and signal (gate electrode voltage) routing on opposite sides of a transistor structure stratum. Notably, selective back-side transistor source/drain contact metallization methods 3802 may be also practiced on a transistor structure that is fully-functional as fabricated from the front-side (e.g., includes all device terminals). For such embodiments, the back-side transistor source/drain contact metallization methods 3802 may be practiced to tie the source/drain transistor terminal into interconnect traces disposed on the both side of the transistor stratum, which may advantageously reduce source/drain contact resistance and/or enable a transistor source/drain device region to be a circuit node that is directly fanned out to at least two other circuit nodes.

As discussed further herein and illustrated with respect to FIGS. 40-45, during such back-side transistor source/drain contact metallization of non-planar transistor structure 1304, planar transistor structure 3904 are masked and selectively non-revealed (e.g., device regions of planar transistor structure 3904 are not revealed during the back-side reveal of source/drain semiconductor 640 of non-planar transistor structure 1304). For example, selective back-side transistor source/drain contact metallization methods 3802 may be performed on planar transistor structure 3904 such that the planar transistor structure is fully-functional as fabricated from the front-side (e.g., includes all device terminals) and the back-side processing of non-planar transistor structure 1304 does not affect the functionality of planar transistor structure 3904.

Returning to FIG. 38B, at operation 3808, the back-side of the device stratum (e.g., an intervening layer or layers) is revealed by removing the carrier layer. In some further embodiments, portions of any intervening layer and/or front-side materials deposited over the device layer may also be removed during the reveal operation 3808. As described elsewhere herein in the context of some exemplary embodiments, an intervening layer(s) may facilitate a highly-uniform exposure of the device stratum back-side, for example serving as one or more of an etch marker or etch stop employed in the wafer-level back-side reveal process. For example, an intervening layer(s) may separate a device layer from the removed carrier layer such that, prior to removal, the intervening layer(s) were in direct contact with both the carrier layer and the device layer. As discussed, in some embodiments, the donor-host substrate assembly including planar transistor structures and non-planar transistor structures received at operation 3806 does not include a carrier layer and, in such embodiments, operation 3808 may be skipped.

Methods 3802 continues at operation 3812, where the back-side of planar transistor structures are masked. Such selective masking of the back-side of planar transistor structures provides selective exposure or access to the back-side of non-planar transistor structures (e.g., access to the back-side of selective device regions of the non-planar transistor structures). Furthermore, at operation 3812, portions of the back-side of the non-planar transistors may also be masked to provide selective access to particular structure(s) (e.g., source/drain semiconductor regions) of the non-planar transistors. The mask provided at operation 3812 may include any suitable mask applied using any suitable technique or techniques.

Methods 3802 continues at operation 3818, where a back-side of at least one non-planar transistor source/drain region within the non-planar transistor structure is revealed. In some embodiments, a back-side recess etch is performed at operation 3818 such that the back-side recess etch has a pattern provided by the mask applied at operation 3812. The back-side recess etch may reveal a source/drain semiconductor region (e.g., a first device region) of the non-planar transistor structure (e.g., a first device) selectively to other regions of the non-planar transistor structure (e.g., those device regions that are not to be revealed) and selectively to device regions (e.g., a second region or regions) of planar transistor structures (e.g., a second device). As discussed, the selectivity to device regions of planar transistor structures may provide a selectively to an entirety (e.g., all device regions) of the planar transistor structures.

Once selective source/drain semiconductor regions of the non-planar transistor structure are revealed, methods 3802 complete at operation 3826 where non-native source/drain semiconductor is deposited from the back-side and on or over the revealed source/drain regions of the non-planar transistor and/or contact metallization is deposited over the source/drain semiconductor applied from the back-side. The source/drain semiconductor and/or contact metallization are examples of non-native materials that may be disposed over a back-side revealed semiconductor region. As shown, operation 3826 outputs non-planar transistor structures with contact metallization over back-side source/drain semiconductor integrated with planar transistor structures that have been selectively unrevealed by such back-side processing.

Figure 40A:
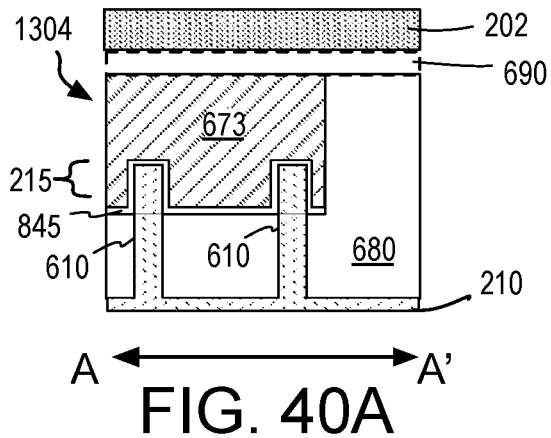
FIGS. 40A, 40B, 40C illustrate cross-sectional views of a non-planar transistor structure as some operations in the methods illustrated in FIG. 38B are performed, in accordance with some embodiments.
Figure 41A:
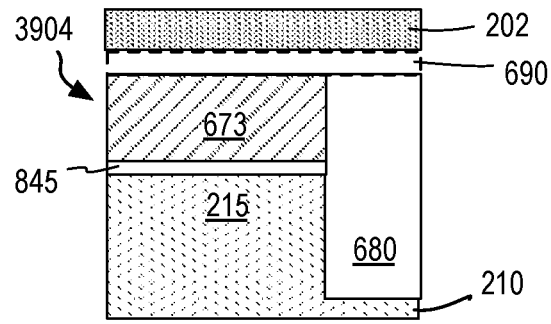
FIGS. 41A, 41B, 41C illustrate cross-sectional views of a planar transistor structure as some operations in the methods illustrated in FIG. 38B are performed, in accordance with some embodiments.
Figure 40B:
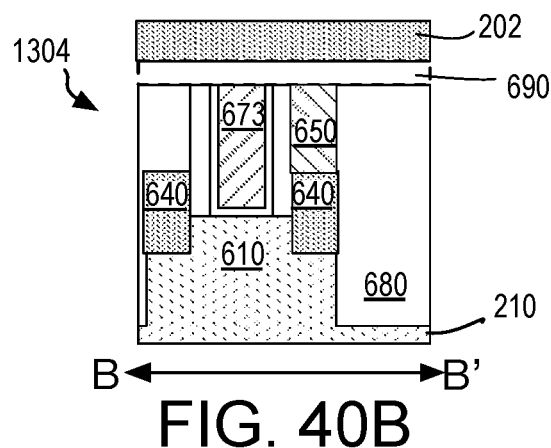
Figure 41B:
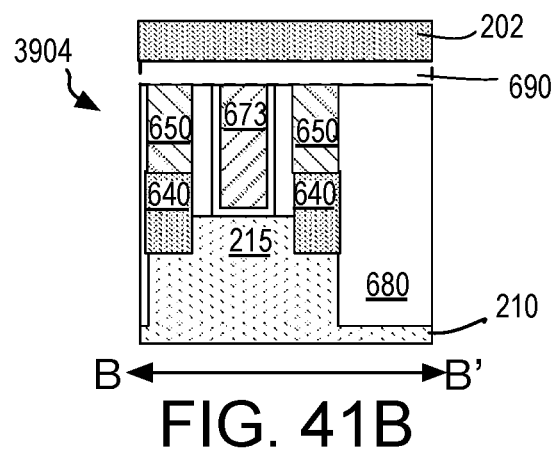
Figure 40C:
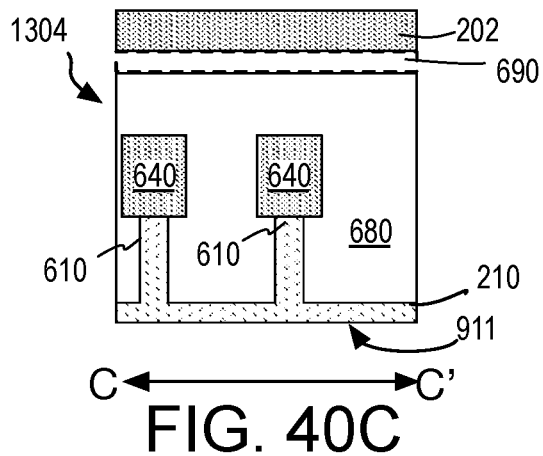
Figure 41C:
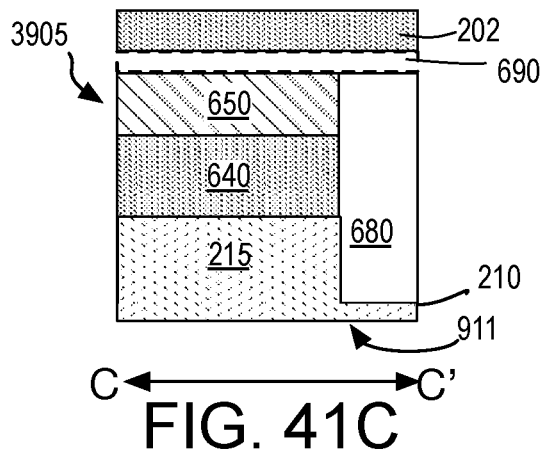
Figure 44A:
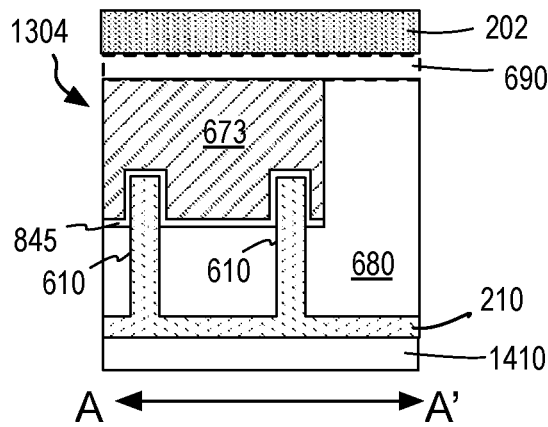
FIGS. 44A, 44B, 44C illustrate cross-sectional views of the non-planar transistor structure as some operations in the methods illustrated in FIG. 38B are performed, in accordance with some embodiments.
Figure 45A:
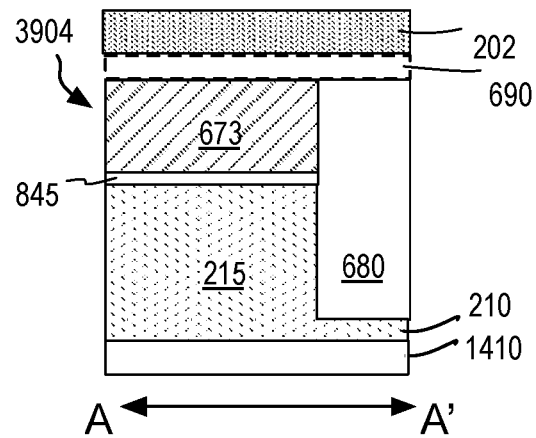
FIGS. 45A, 45B, 45C illustrate cross-sectional views of the planar transistor structure as some operations in the methods illustrated in FIG. 38B are performed, in accordance with some embodiments.
Figure 44B:
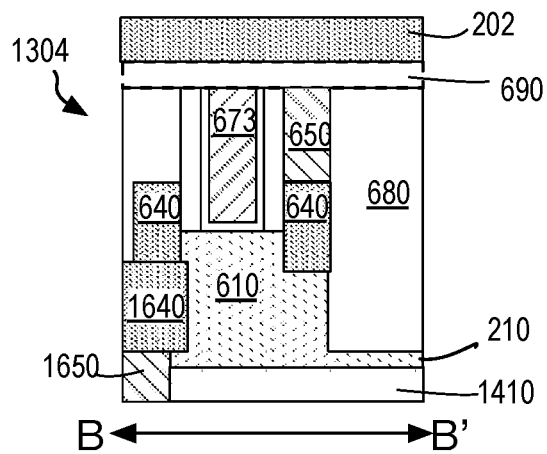
Figure 45B:
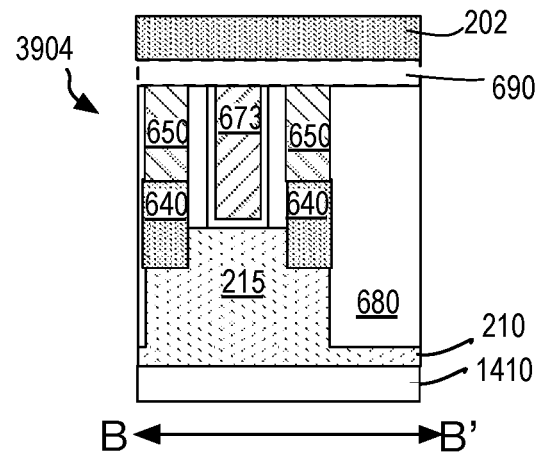
Figure 44C:
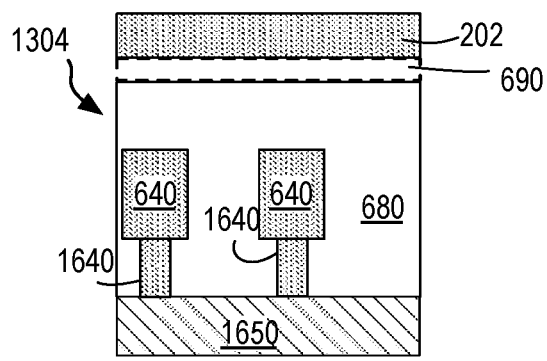
Figure 45C:
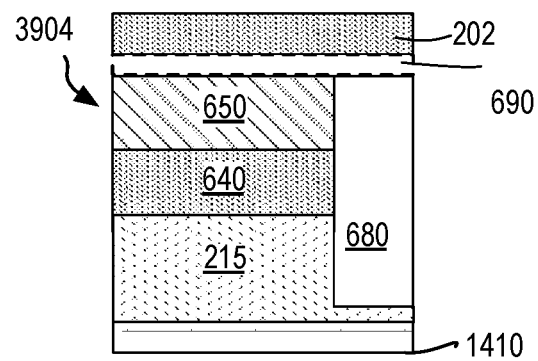

FIGS. 40A, 42A and 44A illustrate cross-sectional views of non-planar transistor structure 1304 along the A-A' plane denoted in FIG. 39 as operations in methods 3802 are performed, in accordance with some embodiments. FIGS. 41A, 43A and 45A illustrate cross-sectional views of planar transistor structure 3904 along the A-A' plane denoted in FIG. 39 as operations in methods 3802 are performed, in accordance with some embodiments. FIGS. 40B, 42B and 44B illustrate cross-sectional views of non-planar transistor structure 1304 along the B-B' plane denoted in FIG. 39 as operations in methods 3802 are performed, in accordance with some embodiments. FIGS. 41B, 43B and 45B illustrate cross-sectional views of planar transistor structure 3904 along the B-B' plane denoted in FIG. 39 as operations in methods 3802 are performed, in accordance with some embodiments. FIGS. 40C, 42C and 44C illustrate cross-sectional views of non-planar transistor structure 1304 along the C-C' plane denoted in FIG. 39 as operations in methods 3802 are performed, in accordance with some embodiments. FIGS. 41C, 43C and 45C illustrate cross-sectional views of planar transistor structure 3904 along the C-C' plane denoted in FIG. 39, as operations in methods 3802 are performed, in accordance with some embodiments.

FIGS. 40A-40C illustrate cross-sectional views of structures present in an exemplary non-planar transistor structure 1304 following front-side processing and/or optional carrier removal, in accordance with some embodiments. The structural features illustrated in FIGS. 40A-40C may have any of the properties described herein for like reference numbers. Furthermore, FIGS. 41A-41C illustrate structures present in an exemplary planar transistor structure 3904 following front-side processing and/or optional carrier removal. The structural features illustrated in FIGS. 41A-41C may also have any of the properties described herein for like reference numbers. For example, FIGS. 40A-40C and 41A-41C illustrate cross-sectional views of non-planar transistor structure 1304 and planar transistor structure 3904 after operation 3806 of methods 3802 is performed (refer to FIG. 38B).

As shown in FIGS. 42A-42C and 43A-43C, etch mask 1410 (e.g., a patterned mask) is aligned to back-side structures of non-planar transistor structure 1304 and planar transistor structure 3904. Furthermore, intervening layer(s) 210 and a substantial portion of transistor semiconductor bodies 610 (e.g., a portion of device layer 215) is removed to provide selective reveal recess 1540 within unmasked portions defined by etch mask 1410. In alternative embodiments where there is a structural difference between the source/drain regions (e.g., in difference in depth), etch mask 1410 may be limited so as to protect only structure 3904 with processing of structure 1304 proceeding as described elsewhere in the context of 14D, 15D, and 16D.

As shown, etch mask 1410 masks the entirety of back-side of planar transistor structure 3904 (refer to FIGS. 43A-43C). Furthermore, etch mask 1410 reveals a back-side portion of non-planar transistor structure 1304 that allows access to or reveal of source/drain semiconductor 640 by selective reveal recess 1540 (refer to FIGS. 42A-42C). Alignment relative to source/drain semiconductor 640 need not be exact such that overlap with gate electrode 673 can be minimized or avoided. As discussed, etch mask 1410 may be another intervening layer of the back-side substrate, deposited following exposure of intervening layer 210, a soft mask (e.g., photosensitive resist) applied over a back-side surface of intervening layer 210, or the like. As discussed, unprotected device region(s) (e.g., unmasked or exposed regions) are then recessed etched with any wet and/or plasma etch process known to be suitable for the applicable material composition.

Furthermore, upon removal of intervening layer 210 and a substantial portion of transistor semiconductor bodies 610, sub-fin height $H_{sf}$ is maintained in regions of non-planar transistor structure 1304 protected by etch mask 1410. Selective reveal recess 1540 may be of any depth and lateral dimension. For example, selective reveal recess 1540 may completely remove the sub-fin portion of semiconductor body 610 (e.g., the semiconductor portion of intervening layer 210) and expose source/drain semiconductor 640. As shown, etch mask 1410 masks the entirety of the back-side of planar transistor structure 3904 (refer to FIGS. 43A-43C). For example, FIGS. 42A-42C and 43A-43C illustrate cross-sectional views of non-planar transistor structure 1304 and planar transistor structure 3904, respectively, after operations 3812 and 3818 (FIG. 38B) are performed.

FIGS. 44A-44C and 45A-45C illustrate non-planar transistor structure 1304 and planar transistor structure 3904 following an epitaxial growth or deposition of p-type or n-type impurity doped back-side source/drain semiconductor 1640 and a subsequent deposition of back-side source/drain metallization 1650. As shown, back-side source/drain semiconductor 1640 is disposed adjacent to or over source/drain semiconductor 640. Back-side source/drain semiconductor 1640 may be disposed over source/drain semiconductor 640 using any suitable technique or techniques such as an epitaxial growth process, a deposition process, or the like. For example, the same epitaxial or deposition process employed to form source/drain semiconductor 640 may be employed to form back-side source/drain semiconductor 1640. Back-side source/drain semiconductor 1640 may be any suitable material such as, but not limited to, group IV semiconductors (e.g., Si, Ge, SiGe), and/or group III-V semiconductors (e.g., InGaAs, InAs), and/or group III-N semiconductors (e.g., InGaN).

Also as shown, back-side source/drain metallization 1650 is disposed adjacent to or over back-side source/drain semiconductor 1640. Back-side source/drain metallization 1650 may be disposed over source/drain semiconductor 1640 using any suitable technique or techniques such as a metal deposition process. For example, the same deposition process employed to form back-side source/drain metallization 650 may be employed to form back-side source/drain metallization 1650. Back-side source/drain metallization 1650 may include any suitable material such as Ti, W, Pt, their alloys, or the like. Also as shown, in FIGS. 45A-45C, planar transistor structure 3904 may continue to be masked by etch mask 1410 such that no back-side source/drain semiconductor nor back-side source/drain contact metallization is provided for planar transistor structure 3904. For example, non-native materials back-side source/drain semiconductor 1640 and back-side source/drain metallization 1650 may be provided selectively to non-planar transistor structure 1304 while not being applied to planar transistor structure 3904. For example, FIGS. 42A-42C and 43A-43C illustrate cross-sectional views of non-planar transistor structure 1304 and planar transistor structure 3904, respectively, after operation 3826 (FIG. 38B) is performed.

In some further embodiments represented by 44A-44C and 45A-45C, back-side metallization over burden is removed by polish (e.g., CMP), re-exposing etch mask 1410 and/or intervening layer 210 with source/drain contact metallization then confined to backfill selective reveal recess 1540. Subsequent back-side processing may further include fabrication of one or more back-side interconnect metallization level (not depicted) electrically coupling to at least source/drain metallization 1650. In some such embodiments, such back-side interconnect metallization is of a different composition than the front-side interconnect metallization levels and/or back-side interconnect metallization has larger lateral dimensions or thicknesses than a corresponding level of the front-side interconnect metallization. For example, relative the back-side interconnect metallization the front-side interconnect metallization may have a higher proportion of Cu, and may be predominantly copper (e.g., mostly Cu or a Cu-rich alloy). Back-side interconnect metallization may instead be predominantly other than copper (e.g., mostly not Cu, a Cu-lean alloy, or an alloy devoid of Cu). Front-side interconnect metallization may likewise be predominantly other than copper, while back-side interconnect metallization may be predominantly copper. Where interconnect metallization is not copper-based, back-side interconnect metallization may be any other suitable metal/metal alloy including one or more of Ru, Rh, Pd, Ir, Pt, Au, W, Cr, or Co. Separation of the metallization compositions between front and back sides of a device stratum may advantageously partition the use of dissimilar material systems and interconnect technologies between front-side (e.g., Ru) and back-side processing (e.g., Cu).

Lateral interconnect dimensions and/or thicknesses for a given level (e.g., metal 1, metal 2, etc.) may also be different between the front and back sides of a device strata. For example, power lines coupled to transistor source terminals via back-side interconnect metallization may have larger lateral dimensions (e.g., line widths) and/or thicknesses than front-side interconnect metallization coupled to transistor gate terminals and/or drain terminals via front-side interconnect metallization. Partitioning of dimensions and thickness between front-side and back-side interconnect metallization may advantageously add degrees of freedom to the interconnect fabrication process. In some embodiments where back-side interconnect metallization has larger lateral dimensions and/or thicknesses, the back-side interconnect metallization is copper-based while front-side interconnect metallization of smaller lateral dimensions and/or thicknesses is other than copper (e.g., Ru-based).

Using the discussed techniques, a back-side reveal of source/drain semiconductor 640 of non-planar transistor structure 1304 is selective to device regions of planar transistor structure 3904. Such masked reveal techniques may be extended to reveal any device regions (e.g., channel, gate dielectric, gate electrode, etc.) of non-planar transistor structure 1304 selective to any device regions of planar transistor structure 3904, or vice versa. Furthermore, such selective reveal processing may be on an inter-cell basis (as shown), an intra-cell basis, a regionals basis, or the like. Such selective reveal processing provides differentiation between non-planar transistors and planar transistors. Such non-planar and planar transistors may also have differentiation based on functionality and/or polarity as discussed herein. In an embodiment, non-planar transistors are logic transistors and planar transistors are memory and/or power transistors.

Figure 38C:
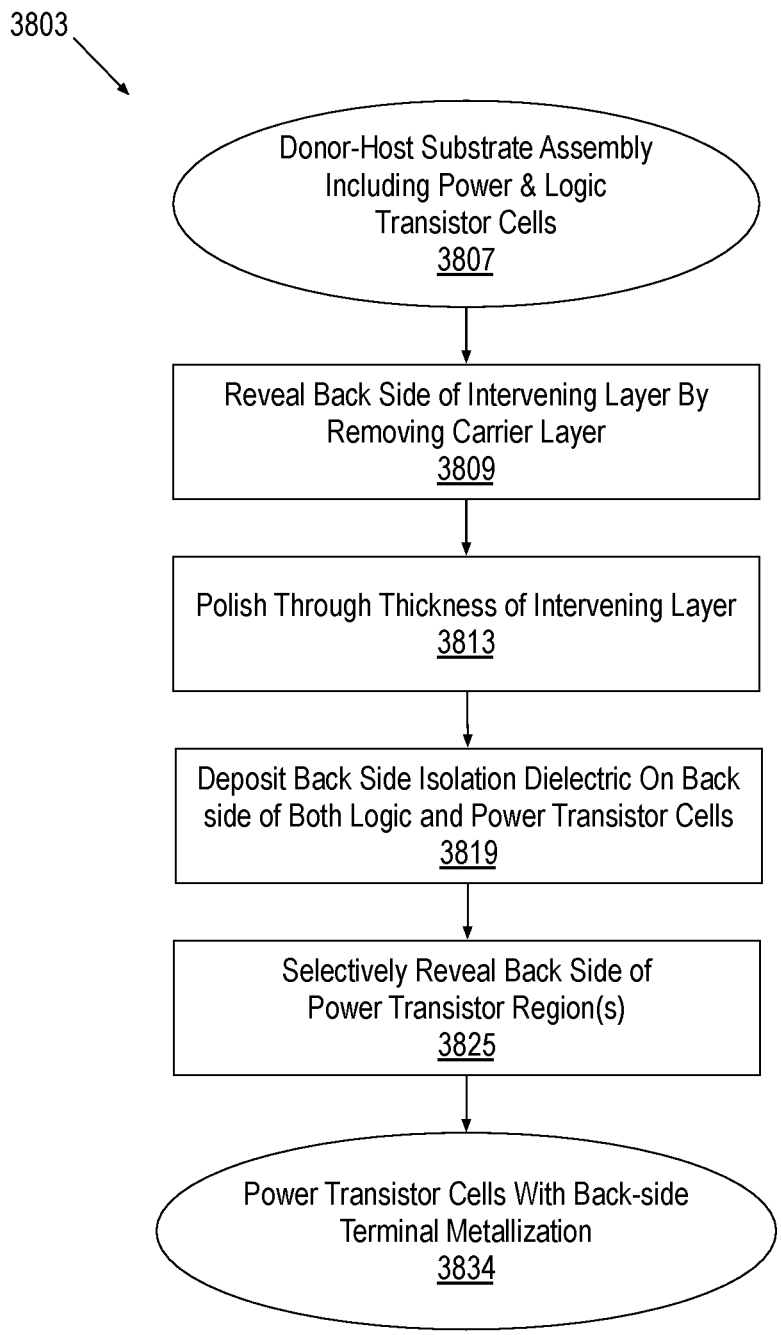
FIG. 38C is a flow diagram illustrating methods for forming non-planar transistor back-side source/drain semiconductor and contact metallization selective to other non-planar transistors, in accordance with some embodiments.

FIG. 38C is a flow diagram illustrating methods 3803 for forming non-planar transistor back-side transistor source/drain semiconductor and contact metallization selective to other non-planar transistors, in accordance with some embodiments. Methods 3803 begin with a donor-host substrate assembly including first and second (e.g., power and logic) non-transistor structures as an input 3807. The donor substrate may have one or more of the features described herein, such as, but not limited to, an intervening layer and a carrier layer. However, a carrier layer and/or intervening layer are not required to perform methods 3803. The non-planar power and/or non-planar logic transistor structures at the input of methods 3803 may be completely operable or one or more terminals may be absent such that the non-planar transistor structure will not be operable until back-side processing is complete.

Figure 46:
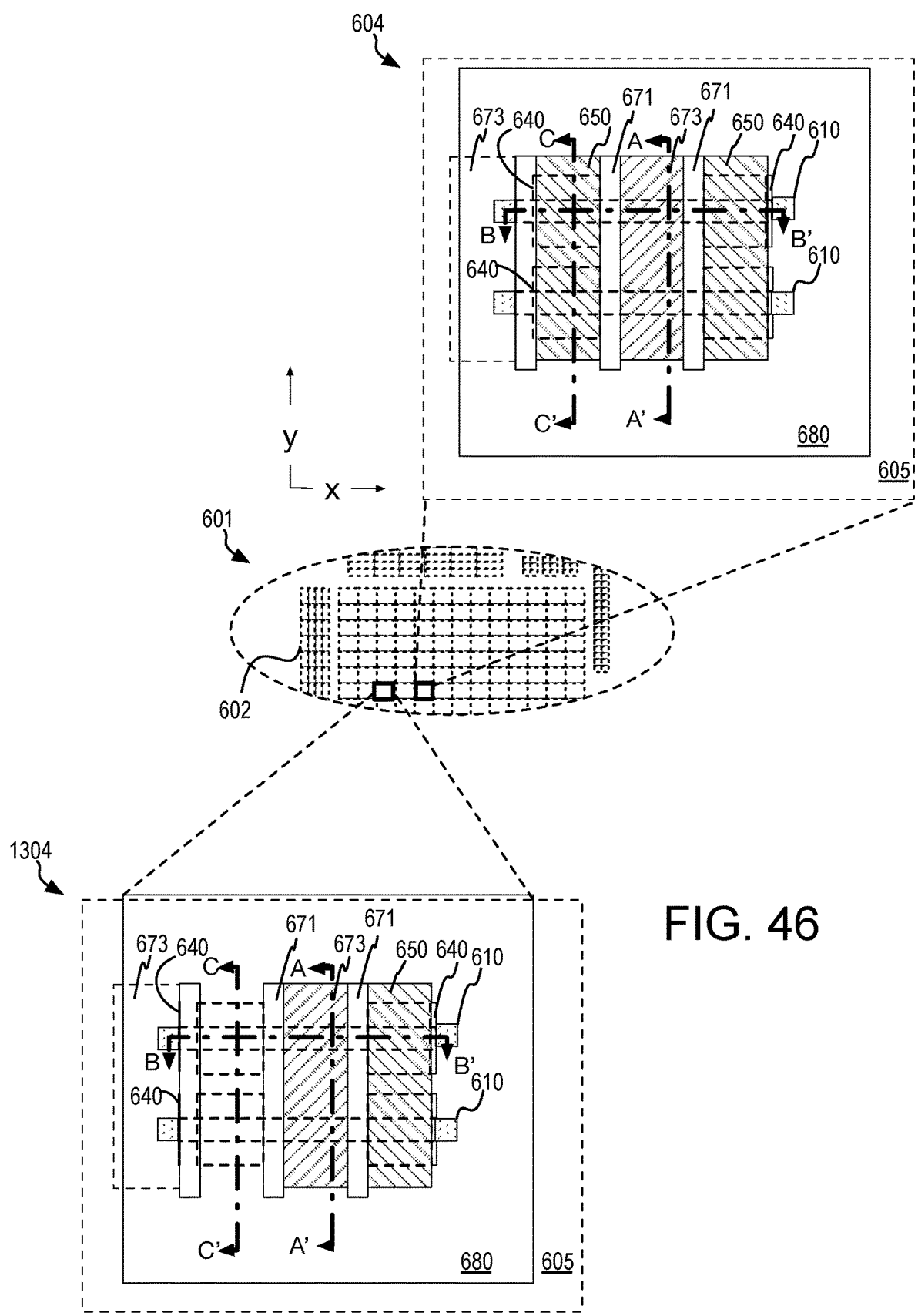
FIG. 46 is a plan view of a non-planar transistor structure lacking one source/drain contact metallization and a non-planar transistor structure with both source/drain metallizations, in accordance with some embodiments.

FIG. 46 is a plan view of a non-planar (e.g., power) transistor structure 1304 lacking one source/drain metallization 650 and a non-planar (e.g., logic) transistor structure 604 with both source/drain metallizations 650, in accordance with some embodiments. Heavy dot-dashed lines illustrated with respect to non-planar (e.g., power) transistor structure 1304 denote planes along which cross-sectional views are further provided as FIGS. 48A-48C, 50A-50C, 52A-52C, and 54A-54C. Similarly, heavy dot-dashed lines illustrated with respect to non-planar (e.g., logic) transistor structure 604 denote planes along which cross-sectional views are further provided as FIGS. 47A-47C, 49A-49C, 51A-51C, and 53A-53C. Using the techniques discussed herein in reference to methods 3802, selective back-side processing may be provided for non-planar transistor structure 1304 without providing back-side processing for non-planar transistor structure 1304.

Returning to FIG. 38C, the back-side processing provided by methods 3803 provides back-side reveal of source/drain semiconductor 640 (e.g., a first device region) of non-planar transistor structure 1304 (e.g., a first device) such that the back-side processing reveals the back-side of source/drain semiconductor 640 of non-planar transistor structure 1304 selectively to non-planar transistor structure 604 (e.g., a second device) and, thereby, selective to each device region of non-planar transistor structure 604. The back-side reveal of source/drain semiconductor 640 of non-planar transistor structure 1304 is selective to source/drain semiconductor 640, source/drain metallization 650, spacer dielectric 671 separating gate electrode 673 from source/drain metallization 650 and/or source/drain semiconductor 640, field isolation dielectric 680, and device layer 215 of non-planar transistor structure 604. Methods 3803 may alternatively provide for selective back-side reveal of any one or more device regions of non-planar transistor structure 604 selective to any one or more device regions of non-planar transistor structure 1304. Furthermore, methods 3803 may provide for selective back-side reveal of any one or more device regions of non-planar (e.g., power) transistor structure 1304 selective to any one or more device regions of non-planar (e.g., logic) transistor structure 604.

Also as shown with respect to operation 3834, methods 3803 may form (e.g., by deposition, or the like) one or more non-native material over the revealed source/drain semiconductor 640 (e.g., the revealed first device region). In the example of methods 3803, back-side source/drain semiconductor 1640 and back-side source/drain metallization 1650 are disposed over the revealed (e.g., back-side revealed) source/drain semiconductor 640. Any suitable non-native material(s) may be disposed over any exposed device region using methods 3803. For example, the non-native material or materials may include semiconductor materials, metal materials, or dielectric materials.

As shown in FIG. 46, in some embodiments, non-planar power transistors and non-planar logic transistors may be integrated in the same integrated circuit. For example, non-planar transistor structure 1304 and non-planar transistor structure 604 may be integrated as power and logic transistors, respectively, on IC die 601. In FIG. 46, like numbers with respect to non-planar transistor structure 1304 and non-planar transistor structure 604 indicate like structures with respect to other discussion herein.

As discussed with respect to FIG. 39, in the absence of source or drain metallization 650 in non-planar transistor structure 1304, pitch and/or critical dimension constraints for source/drain metallization 650 and/or other front-side metallization levels may be relaxed and the absence of a source or drain metallization 650 may render non-planar (e.g., power) transistor structure 1304 inoperable until the third terminal connection is fabricated. Such back-side transistor source/drain contact metallization may couple a power rail into a power transistor structure, placing power and signal (gate electrode voltage) routing on opposite sides of a transistor structure stratum. Alternatively, selective back-side transistor source/drain contact metallization methods 3803 may be also practiced on a transistor structure that is fully-functional as fabricated from the front-side such that back-side transistor source/drain contact metallization methods 3802 may be practiced to tie the source or drain transistor terminal into interconnect traces disposed on the both sides of the transistor stratum.

Also, as discussed further herein and illustrated with respect to FIGS. 47-54, during such back-side transistor source/drain contact metallization of non-planar (e.g., power) transistor structure 1304, non-planar (e.g., logic) transistor structure 604 is masked and remains unrevealed. For example, selective back-side transistor source/drain contact metallization methods 3803 may be performed on non-planar transistor structure 604 such that the non-planar power transistor structure is fully-functional as fabricated from the front-side, and the back-side processing of non-planar transistor structure 1304 does not affect the functionality of non-planar transistor structure 604.

Returning to FIG. 38C, at operation 3809, the back-side of the device stratum (e.g., an intervening layer or layers) is revealed by removing the carrier layer. In some embodiments, portions of any intervening layer and/or front-side materials deposited over the device layer may also be removed during the operation 3809. An intervening layer(s) may facilitate a highly-uniform exposure of the device stratum back-side as discussed herein. For example, an intervening layer(s) may separate a device layer from the removed carrier layer such that, prior to removal, the intervening layer(s) were in direct contact with both the carrier layer and the device layer. As discussed, in some embodiments, the donor-host substrate assembly including non-planar logic transistor structures and non-planar power transistor structures received at operation 3807 does not include a carrier layer and operation 3808 may be skipped.

Methods 3802 continues at operation 3813, where at least a thickness of the revealed intervening layer is removed. In the example of methods 3802, the thickness of the revealed intervening layer is removed by a polish operation. However, the thickness of the revealed intervening layer may be removed using any suitable technique or techniques. For example, one or more component layers of an intervening layer or layers may be removed. In an embodiment, a thickness of the intervening layer is removed uniformly by a polish operation. In an embodiment, a thickness of the intervening layer is removed with a masked or blanket etch process. Operation 3813 may employ the same polish and/or etch process as employed to remove the carrier layer at operation 3809 or operation 3813 may be a distinct process with distinct process parameters. For example, where the intervening layer provides an etch stop for the carrier removal process, operation 3813 may employ a different polish or etch process.

Methods 3802 continue at operation 3819, where a back-side isolation dielectric is disposed on the back-side of the non-planar logic transistor structures and non-planar power transistor structures. The back-side isolation dielectric may be disposed on the back-side of the non-planar logic transistor structures and non-planar power transistor structures using any suitable technique or techniques such as dielectric deposition techniques. Furthermore, the back-side isolation dielectric may be any suitable material such as silicon dioxide, silicon nitride, SiOC, SiOCH, HSQ, MSQ, SiON, or the like.

Methods 3802 continues at operation 3825, where a back-side of at least one source/drain region within the non-planar power transistor structure is revealed selective to the non-planar logic transistor structure. In some embodiments, the back-side isolation dielectric is patterned to form an etch mask and a back-side recess etch is performed at operation 3825 such that the back-side recess etch has a pattern defined by the etch mask. The patterning of the back-side isolation dielectric to generate the etch mask may be performed using any suitable patterning techniques such as lithography techniques. Furthermore, the back-side recess etch may be performed using any suitable techniques such as wet or dry etch techniques. The back-side recess etch may reveal a source/drain semiconductor region (e.g., a first device region) of the non-planar power transistor structure (e.g., a first device) selectively to other regions of the non-planar power transistor structure (e.g., those device regions that are not to be revealed) and selectively to device regions (e.g., a second region or regions) of non-planar logic transistor structures (e.g., a second device). As discussed, the selectivity to device regions of non-planar logic transistor structures may provide a selectively to an entirety (e.g., all device regions) of the non-planar logic transistor structures.

Once selective source/drain semiconductor regions of the non-planar power transistor structure are revealed, methods 3803 complete at operation 3834 where non-native source/drain semiconductor is deposited from the back-side and on or over the revealed source/drain regions of the non-planar power transistor and/or contact metallization is deposited over the source/drain semiconductor applied from the back-side. The source/drain semiconductor and/or contact metallization are examples of non-native materials that may be disposed over a back-side revealed semiconductor region. As shown, operation 3834 outputs non-planar power transistor structures with back-side terminal metallization over back-side source/drain semiconductor integrated with non-planar logic transistor structures that have been selectively unrevealed by such back-side processing.

FIGS. 47A, 49A, 51A, and 53A illustrate cross-sectional views of non-planar transistor structure 1304 along the A-A' plane denoted in FIG. 46 as operations in methods 3803 are performed, in accordance with some embodiments. FIGS. 48A, 50A, 52A, and 54A illustrate cross-sectional views of non-planar transistor structure 604 along the A-A' plane denoted in FIG. 46 as operations in methods 3803 are performed, in accordance with some embodiments. FIGS. 47B, 49B, 51B, and 53B illustrate cross-sectional views of non-planar transistor structure 1304 along the B-B' plane denoted in FIG. 46 as operations in methods 3803 are performed, in accordance with some embodiments. FIGS. 48B, 50B, 52B, and 54B illustrate cross-sectional views of non-planar transistor structure 604 along the B-B' plane denoted in FIG. 46 as operations in methods 3803 are performed, in accordance with some embodiments. FIGS. 47C, 49C, 51C, and 53C illustrate cross-sectional views of non-planar transistor structure 1304 along the C-C' plane denoted in FIG. 46, as operations in methods 3803 are performed, in accordance with some embodiments. FIGS. 48C, 50C, 52C, and 54C illustrate cross-sectional views of non-planar transistor structure 604 along the C-C' plane denoted in FIG. 46, as operations in methods 3803 are performed, in accordance with some embodiments.

Figure 47A:
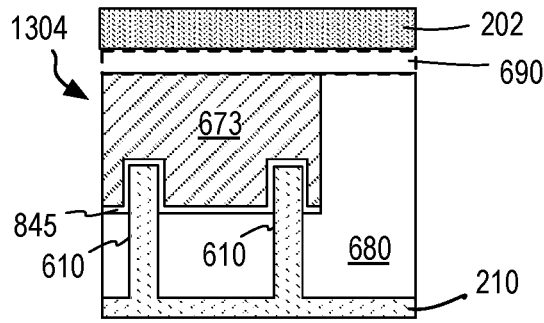
FIGS. 47A, 47B, 47C illustrate cross-sectional views of a non-planar transistor structure as some operations in the methods illustrated in FIG. 38C are performed, in accordance with some embodiments.
Figure 48A:
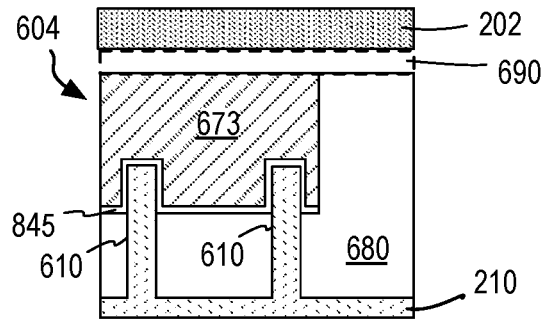
FIGS. 48A, 48B, 48C illustrate cross-sectional views of a non-planar transistor structure as some operations in the methods illustrated in FIG. 38C are performed, in accordance with some embodiments.
Figure 47B:
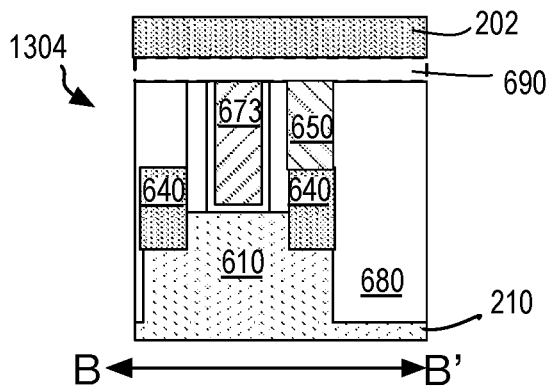
Figure 48B:
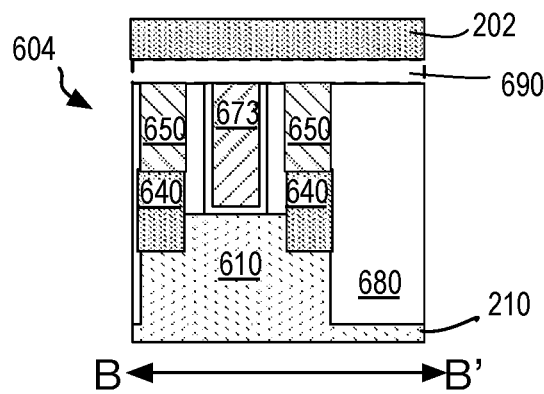
Figure 47C:
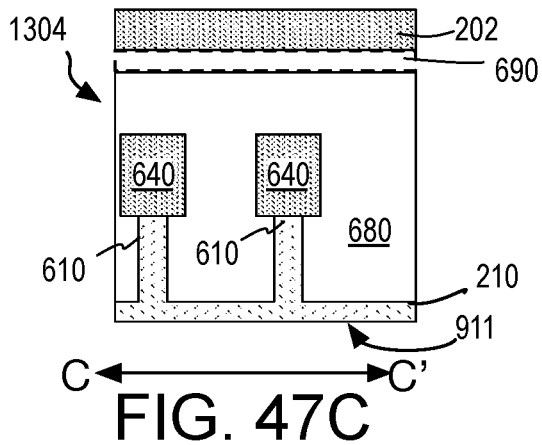
Figure 48C:
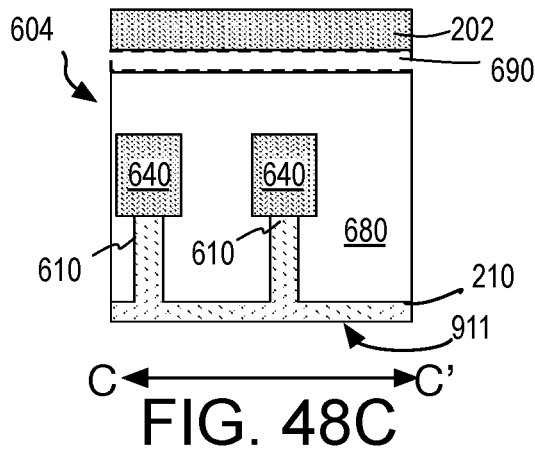

FIGS. 47A-47C illustrate cross-sectional views of structures present in an exemplary non-planar transistor structure 1304 following front-side processing and/or optional carrier removal, in accordance with some embodiments. In some embodiments, non-planar transistor structure 1304 is a power transistor. The structural features illustrated in FIGS. 47A-47C may have any of the properties described herein for like reference numbers. FIGS. 48A-48C illustrate structures present in an exemplary non-planar transistor structure 604 following front-side processing and/or optional carrier removal. In some embodiments where non-planar transistor structure 1304 is a power transistor, non-planar transistor structure 604 is a logic transistor. The structural features illustrated in FIGS. 41A-41C may also have any of the properties described herein for like reference numbers. For example, FIGS. 47A-47C and 48A-48C illustrate cross-sectional views of non-planar transistor structures 1304 and 604 after operation 3809 (FIG. 38C) is performed.

As shown in FIGS. 49A-49C and 50A-50C, back-side 1012 of semiconductor bodies 610 and/or other structures, such as field isolation dielectric 680, of non-planar transistor structure 1304 and non-planar transistor structure 604 are revealed by removal of intervening layer 210. Such a reveal may be performed using any suitable technique or techniques. For example, to reveal the back-side of transistor semiconductor bodies 610, portions of bulk semiconductor to which transistor semiconductor bodies 610 were anchored may be polished back and/or recess etched with a wet and/or dry etch process, for example as described herein with respect to operation 510 (refer to FIG. 5). In some embodiments, a back-side polish of intervening layer 210 may be stopped upon exposure of the polish to field isolation dielectric 680. Any amount of over-etch (or over-polish) may be performed to reduce sub-fin height $H_{sf}$ by further thinning the device layer including the sub-fin portion of semiconductor bodies 610 and adjacent field isolation dielectric 680. For example, FIGS. 49A-49C and 50A-50C illustrate cross-sectional views of non-planar transistor structure 1304 and non-planar transistor structure 604 after operation 3813 of methods 3803 is performed (refer to FIG. 38C).

As shown in FIGS. 51A-51C and 52A-52C, etch mask 1410 (e.g., a patterned mask) is aligned to back-side structures of non-planar transistor structure 1304 and non-planar transistor structure 604. Furthermore, a removal of a substantial portion of transistor semiconductor bodies 610 (e.g., a portion of device layer 215) is performed to provide selective reveal recess 1540 within unmasked portions provided by etch mask 1410.

In the context of FIGS. 51A-51C and 52A-52C, etch mask 1410 is a hard mask layer and dielectric layer that will remain to provide isolation. Etch mask 1410 may be provided using any suitable technique or techniques. In an embodiment, a back-side isolation dielectric (e.g., back-side isolation dielectric 1120) is deposited over the revealed back-side. The back-side solation dielectric is an example of a non-native material replacing a portion of an intervening layer removed to expose transistor semiconductor regions and the back-side isolation dielectric may be any dielectric material suitable for electrical isolation of transistors such as silicon dioxide, a low relative permittivity material, a material with a relative permittivity less than that of field isolation dielectric 680, a material with a relative permittivity less than 3.9 or less than 3.5, SiOC, SiOCH, HSQ, MSQ, SiN, SiON, or the like. The back-side isolation dielectric is then patterned to provide etch mask 1410.

Figure 51A:
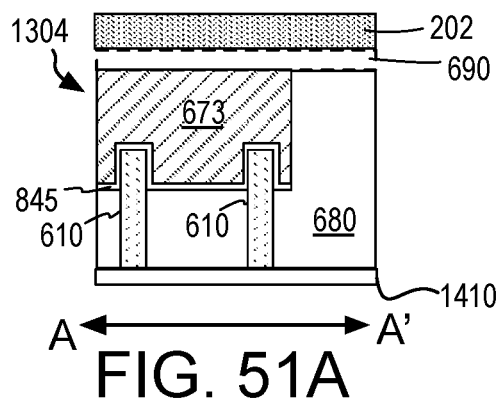
FIGS. 51A, 51B, 51C illustrate cross-sectional views of the non-planar transistor structure as some operations in the methods illustrated in FIG. 38C are performed, in accordance with some embodiments.
Figure 52A:
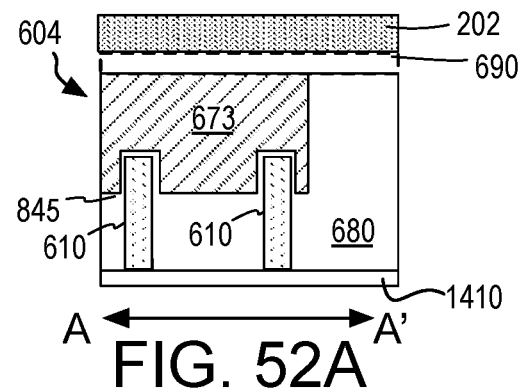
FIGS. 52A, 52B, 52C illustrate cross-sectional views of the non-planar transistor structure as some operations in the methods illustrated in FIG. 38C are performed, in accordance with some embodiments.
Figure 51B:
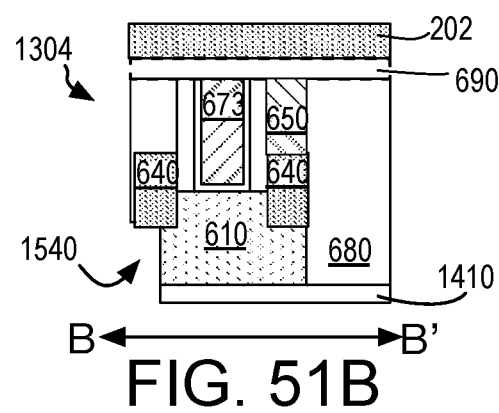
Figure 52B:
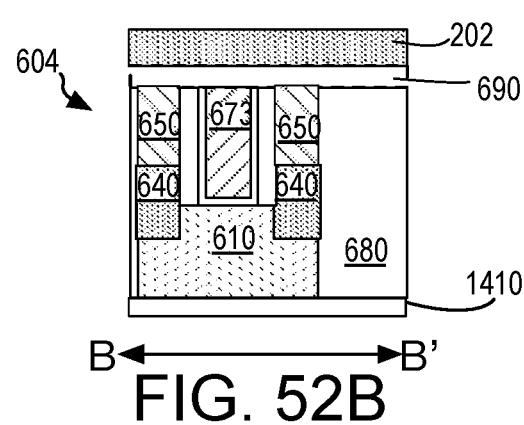
Figure 51C:
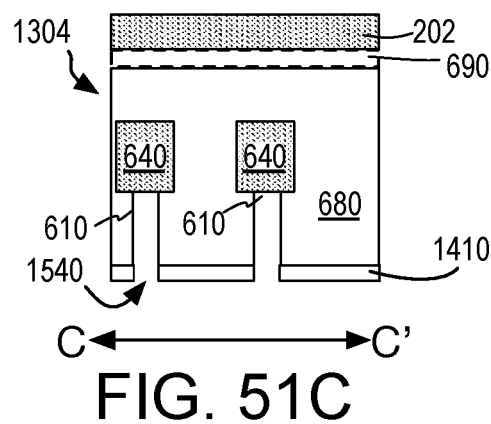
Figure 52C:
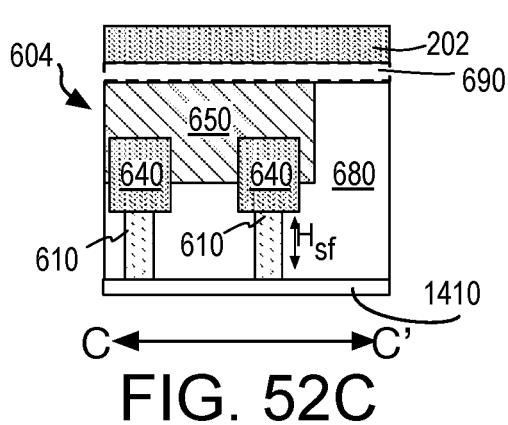
Figure 53A:
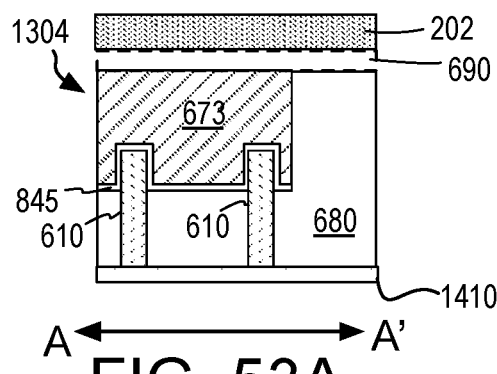
FIGS. 53A, 53B, 53C illustrate cross-sectional views of the non-planar transistor structure as some operations in the methods illustrated in FIG. 38C are performed, in accordance with some embodiments.
Figure 54A:
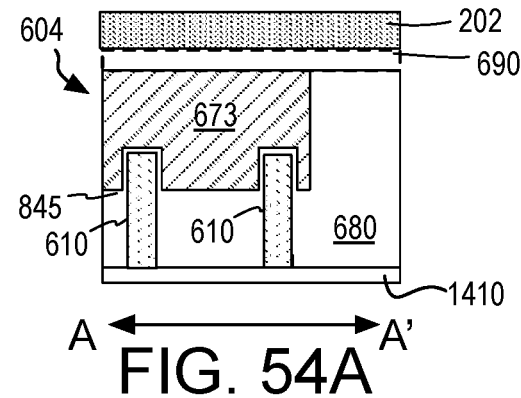
FIGS. 54A, 54B, 54C illustrate cross-sectional views of the non-planar transistor structure as some operations in the methods illustrated in FIG. 38C are performed, in accordance with some embodiments.
Figure 53B:
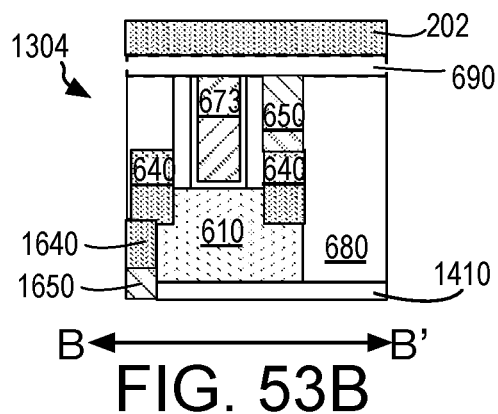
Figure 54B:
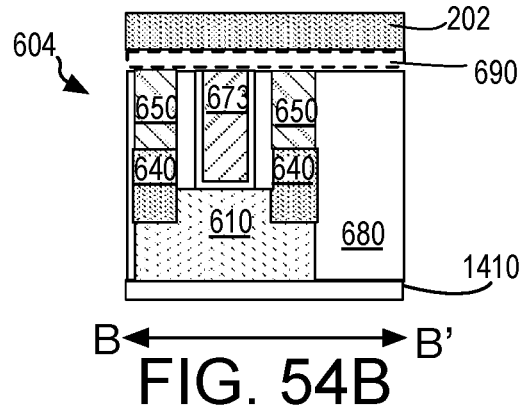
Figure 53C:
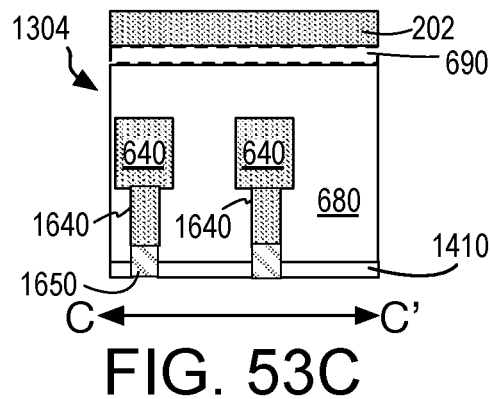
Figure 54C:
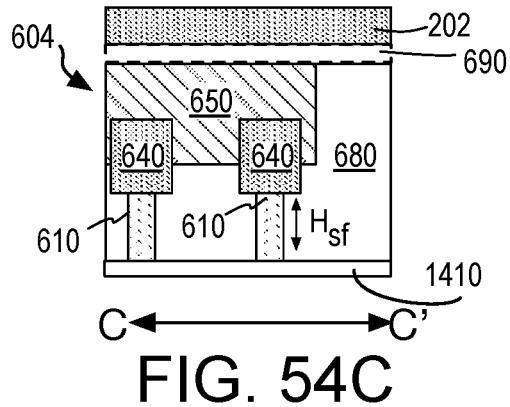

As shown, etch mask 1410 masks the entirety of non-planar transistor structure 604 (refer to FIGS. 51A-51C). Furthermore, etch mask 1410 reveals a back-side portion of non-planar transistor structure 1304 that allows access to or reveal of source/drain semiconductor 640 by selective reveal recess 1540 (refer to FIGS. 52A-52C). Alignment relative to source/drain semiconductor 640 need not be exact such that overlap with gate electrode 673 can be minimized or avoided. As discussed, etch mask 1410 may be an isolation dielectric deposited following reveal of back-side 1012. Also as discussed, unprotected device region(s) (e.g., unmasked or exposed regions) are then recessed etched with any wet and/or plasma etch process known to be suitable for the applicable material composition.

Upon removal of the substantial portion of transistor semiconductor bodies 610, sub-fin height $H_{sf}$ is maintained in regions of non-planar transistor structure 1304 protected by etch mask 1410. Selective reveal recess 1540 may be of any depth and lateral dimension. For example, selective reveal recess 1540 may completely remove the sub-fin portion of semiconductor body 610 (e.g., the semiconductor portion of an intervening layer 210) and expose source/drain semiconductor 640. As shown, etch mask 1410 masks the entirety of the back-side of non-planar transistor structure 604 (refer to FIGS. 52A-52C). For example, FIGS. 51A-51C and 52A-52C illustrate cross-sectional views of non-planar transistor structure 1304 and non-planar transistor structure 604 after operation 3819 (FIG. 38C) is performed.

FIGS. 53A-53C and 54A-54C illustrate non-planar transistor structure 1304 and non-planar transistor structure 604 following an epitaxial growth or deposition of p-type or n-type impurity doped back-side source/drain semiconductor 1640 and a subsequent deposition of back-side source/drain metallization 1650. As shown, back-side source/drain semiconductor 1640 is disposed adjacent to or over source/drain semiconductor 640. Back-side source/drain semiconductor 1640 may be disposed over source/drain semiconductor 640 using any suitable technique or techniques such as an epitaxial growth process, a deposition process, or the like. For example, the same epitaxial or deposition process employed to form source/drain semiconductor 640 may be employed to form back-side source/drain semiconductor 1640. Back-side source/drain semiconductor 1640 may be any suitable material such as, but not limited to, group IV semiconductors (e.g., Si, Ge, SiGe), and/or group III-V semiconductors (e.g., InGaAs, InAs), and/or group III-N semiconductors (e.g., InGaN).

Also as shown, back-side source/drain metallization 1650 is disposed adjacent to or over back-side source/drain semiconductor 1640. Back-side source/drain metallization 1650 may be disposed over source/drain semiconductor 1640 using any suitable technique or techniques such as a metal deposition process. For example, the same deposition process employed to form back-side source/drain metallization 650 may be employed to form back-side source/drain metallization 1650. Back-side source/drain metallization 650 may include any suitable material such as Ti, W, Pt, their alloys, or the like. Also as shown, in FIGS. 53A-53C, non-planar transistor structure 604 may continue to be masked by etch mask 1410 such that no back-side source/drain semiconductor nor back-side source/drain contact metallization is provided for non-planar transistor structure 604. For example, non-native materials back-side source/drain semiconductor 1640 and back-side source/drain metallization 1650 may be provided selectively to non-planar transistor structure 1304 while not being applied to non-planar transistor structure 604. For example, FIGS. 52A-52C, 53A-53C and 54A-54C illustrate cross-sectional views of non-planar transistor structure 1304 and planar transistor structure 3904 after operation 3834 (FIG. 38B) is performed.

In some further embodiments represented by 53A-53C and 54A-54C, back-side metallization over burden is removed by polish (e.g., CMP), re-exposing etch mask 1410 with source/drain contact metallization then confined to backfill selective reveal recess 1540. Subsequent back-side processing may further include fabrication of one or more back-side interconnect metallization level (not depicted) electrically coupling to at least source/drain metallization 1650. In some such embodiments, such back-side interconnect metallization is of a different composition than the front-side interconnect metallization levels and/or back-side interconnect metallization has larger lateral dimensions and/or greater thickness than a corresponding level of the front-side interconnect metallization.

The above discussion describes various back-side processing operations that may be employed to complete and/or modify a front-side transistor structure. Such processes may, for example, be employed to prepare a device stratum for singulation and packaging, or for bonding with another device stratum for stacked 3D device strata embodiments. It is also noted that back-side processing may be extended to fabricate a second device (e.g., FET, TFET, TFT, STTM) upon the revealed back side of a device strata. Such double-sided stratum fabrication may be considered a supplement or alternative to wafer-level strata bonding in which a revealed back-side is bonded to another pre-fabricated device stratum. If such a double-side stratum is subsequently bonded to another stratum, the bond interface will separate a pair of stacked devices from another device or another pair of stacked devices.

A given device stack may be better suited to one or the other of double-sided incremental device fabrication or pre-fabricated device strata bonding as a function of the level of compatibility between the processing conditions and/or materials required by the stacked devices. For example, a back-side device that requires high-temperature activation anneals (e.g., post-impurity dopant implant anneals) or high-temperatures semiconductor growths (e.g., epitaxial growths) may not be well-suited to incremental fabrication by back-side processing because the back-side processing conditions may be detrimental to the front-side device, in which case wafer-level back-side bonding is preferred. In contrast, low-temperature compatible devices such as many TFTs, oxide semiconductor TFETs, or STTM devices may be well-suited to being incrementally fabricated with back-side processing.

Notably, back-side processing may be performed serially, either upon completion of all front-side processing, prior to performance of any front-side processing, or inserted between stages of front-side processing. While concurrent double-sided processing is conceivable, the practical benefits of a supporting (e.g., donor, or host) substrate favor performance of substantially all processing on a first side before imitating processing on the second side. Hence, in some embodiments, substantially all of the front-side processing may be performed (e.g., all the way through many levels of backend metallization) before the back side is revealed. Upon revealing the back side, substantially all of the back-side processing may be performed (e.g., all the way through one or more levels of backend metallization). Different front-side and back-side metallizations may be implemented with such completely serialized front-side and back-side processing stages that are each completely in their entirety once commenced. Different front-side and back-side devices may also be implemented in this manner. Alternative implementations where front-side and back-side processing operations are interleaved, an additional transfers between donor and host substrates may be needed, adding complexity and cost to the manufacturing process. For example, where all back-side processing is inserted between front-side device cell fabrication and front-side backend interconnect metallization, one additional transfer from a front-side host substrate to a back-side host substrate may be performed.

As noted above, back-side processing may be purposefully differentiated from front-side processing. Different material sets and/or processing conditions may be employed for back-side processing than are employed for front-side processing. For example, front-side metallization may employ a first metal, such as a Cu-based metal (i.e., a metal alloy that is predominantly, or more than 50%, Cu), and the back-side metallization employing a second metal other than a Cu-based metal (i.e., a metal alloy that is predominantly, or more than 50%, a metal other than Cu). Front-side devices may employ first a material system (e.g., semiconductor compositions) while back-side devices employ a second, different material system. In this same vein, the back-side reveal and subsequent back-side processing may be positioned within a manufacturing process relative to various front-side processing operations so as to partition a double-sided manufacturing process in a manner that adds another degree of freedom in device integration. For example, back-side processing may be employed as a means of integrating a planar FET with a non-planar FET, or as a means of integrating devices having different thermal budgets. For example, with high-temperature processing (e.g., >350° C.) relegated to front-side processing, and back-side processing limited to low-temperature (e.g., <350° C.).

Back-side processing of a revealed portion of a device stratum may include implanting species into structures formed during front-side fabrication processes. Implantation is one example of a process that may entail high-temperature processing (such as for an activation anneal), in which case it may be integrated with front-side processing at a point before the front-side backend interconnect is formed. In some embodiments, dopant species may be implanted into a device layer or intervening layer from the revealed backside of the device and/or intervening layer. Backside implantation techniques may leverage the backside reveal process as a means for modifying the composition of one or more non-semiconductor regions of a device structure, or surrounding structure. For example, portions of a dielectric (gate spacer, gate dielectric, etc.) or metal (e.g., gate metal, source/drain contact metal, etc.) may be modified after they are fabricated by front-side processing. Material modification by backside implant may take the form of microstructural modification (e.g., amorphization) and/or compositional modification. Such material modification may be employed as a basis for subsequent selective material removal or growth, for example.

Implantation techniques may also leverage the backside reveal process as a means for modifying the electrical prosperities of the semiconductor structures formed during front-side processing. Post-backside reveal implantation may effectively delay the introduction of dopants into one or more semiconductor structure, increasing thermal budget for a given device, and/or sharpening dopant diffusion profiles. Post-backside reveal implantation operations may also enable doping of semiconductor regions that would be inaccessible from a front side of the device and also inaccessible from a back side of the device until a back-side of the semiconductor region to be doped is revealed (e.g., through substrate thinning or removal). Post-backside reveal implantation operations may modify an active device region (e.g., channel, source, drain of a FET), enable backside coupling to the active device region, or enhance backside isolation of the active device region. Post-backside reveal implantation operations requiring an activation anneal may be performed between front-end device processing that is compatible with the activation anneal temperature and processing that is limited to lower temperature processes, such as front-side interconnect metallization. Post-backside reveal implantation operations requiring an activation anneal may also be performed after all front-end device processing is complete, including front-side interconnect metallization where the activation anneal entails a thermal process that maintains a large temperature gradient across the thickness of a donor-host assembly. For example, a host substrate may be maintained at a first temperature well below 400° C. while heat is rapidly applied to the revealed backside surface of a device layer.

Figure 55:
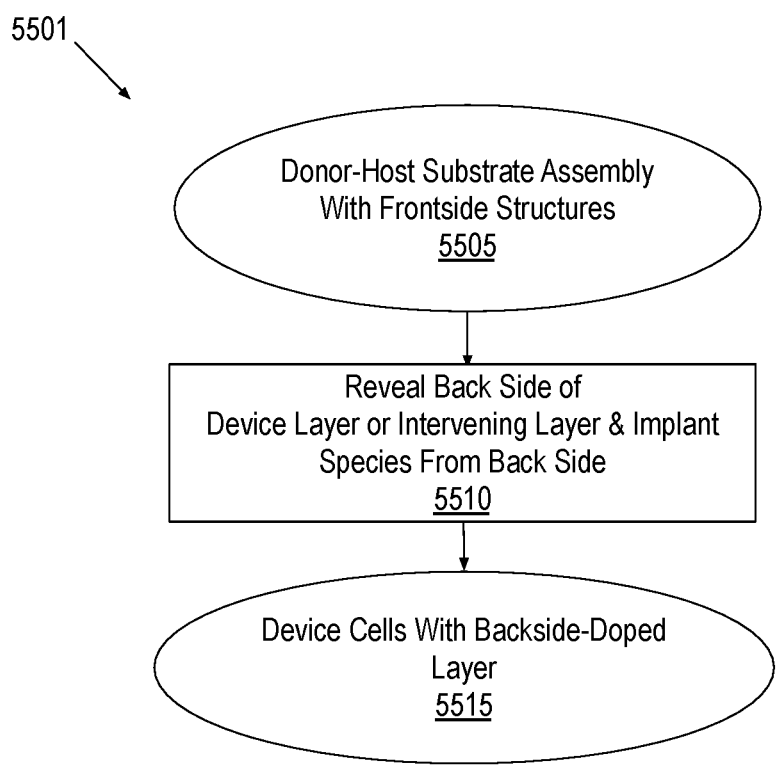
FIG. 55 is a flow diagram illustrating back-side processing methods including back-side impurity implantation, in accordance with some embodiments.

FIG. 55 is a flow diagram illustrating back-side processing methods 5501 including backside-implantation of a dopant into a semiconductor device structure, in accordance with some embodiments. Methods 5501 further exemplify back-side processing of a device (e.g., transistor) cell stratum that may be no more than a few hundred nanometers in thickness. Methods 5501 begin with a donor-host substrate assembly including a device layer as an input 5505. The donor substrate may have one or more of the features described above, such as, but not limited to, an intervening layer and a carrier layer. Notably however, a carrier layer and/or intervening layer is not required to perform methods 5501. At operation 5510, a back side of the device layer or intervening layer is exposed during a back-side reveal process. In some embodiments, the back-side reveal process performed at operation 5510 includes one or more of the operations of methods 501 (FIG. 5). The back-side reveal process may, for example, reveal the device layer or intervening layer by removing at least at portion of the donor substrate (e.g., carrier layer). One or more dopants are then implanted into the revealed device layer and/or intervening layer. Output 5515 includes device cells with a back-side doped layer, which can be expected to have a dopant profile indicative of the dopant species introduction from the back-side of the device structure and/or indicative of the dopant species introduction subsequent to front-side structure fabrication. Dopant profiles may show, for example, that there is a higher species concentration proximal a back side of the device structure than proximal a front side of the device structure. Dopant species introduced from the back-side may be present in materials surrounding the semiconductor structures that were formed during front side processing prior to the back-side implantation process. The combination of materials containing the dopant species and/or the profile of the dopant species within these materials in view of the surrounding front-side structures may be indicative of a post-back-side reveal implantation process in accordance with an embodiment of methods 5501.

Figure 56A:
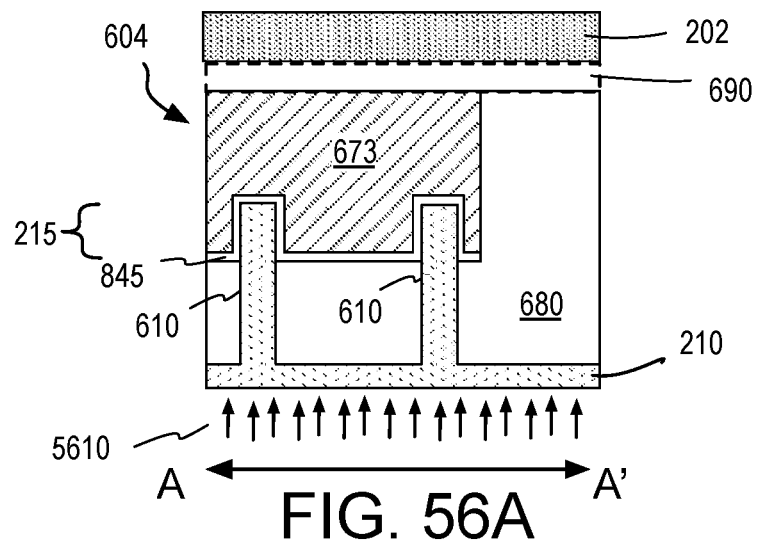
FIGS. 56A, 56B, and 56C illustrate cross-sectional views of a transistor structure as some operations in the methods illustrated in FIG. 55 are performed, in accordance with some embodiments.
Figure 56B:
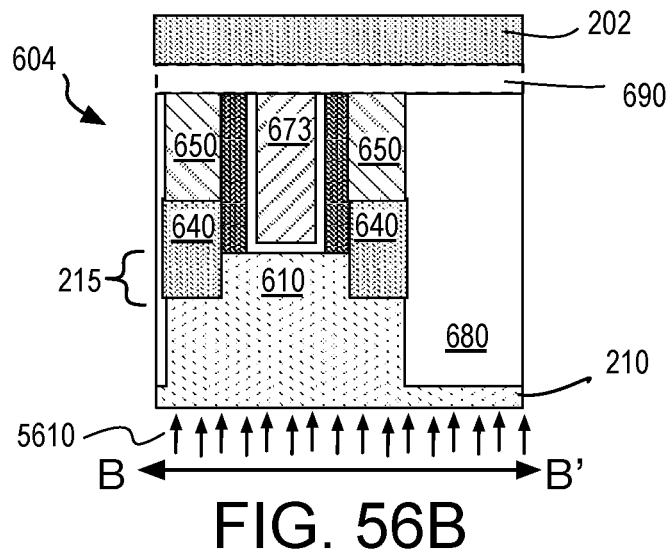
Figure 56C:
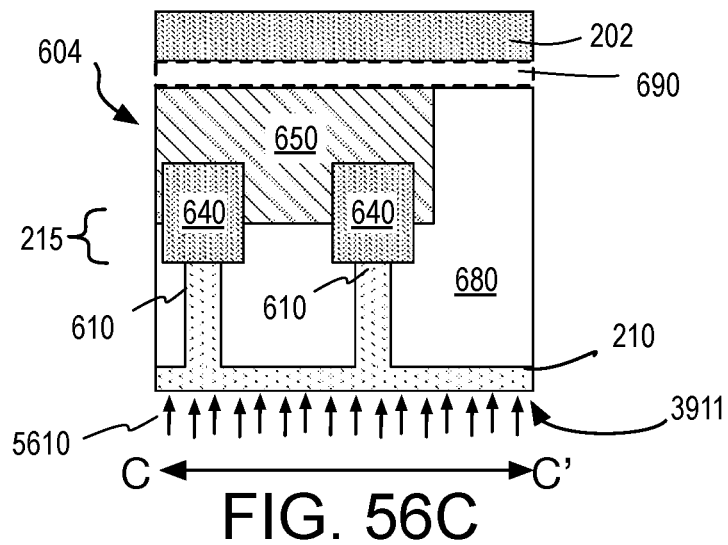
Figure 57A:
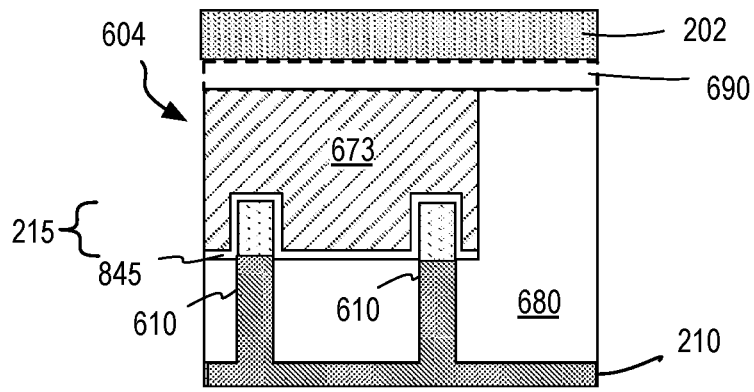
FIGS. 57A, 57B, and 57C illustrate cross-sectional views of a transistor structure with a back-side implant, in accordance with some embodiments.
Figure 57B:
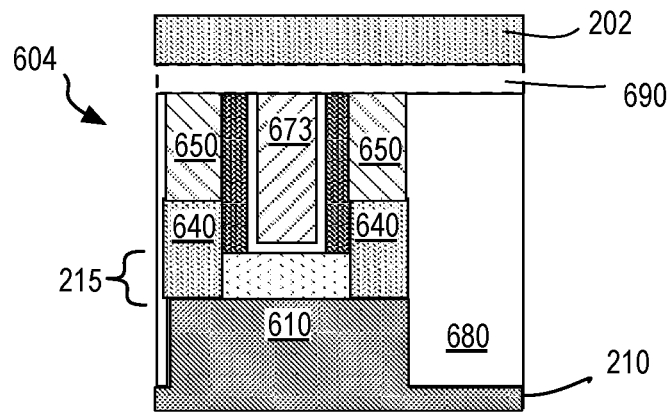
Figure 57C:
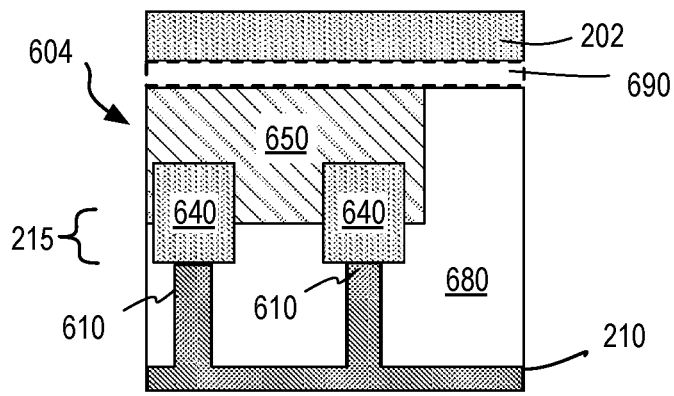

FIG. 56A, 57A illustrate cross-sectional views of transistor structure 604 along the A-A' plane denoted in FIG. 6, as operations in methods 5501 are performed, in accordance with some embodiments. FIG. 56B, 57B illustrate cross-sectional views of transistor structure 604 along the B-B' plane denoted in FIG. 6 as operations in methods 5501 are performed, in accordance with some embodiments. FIG. 56C, 57C illustrate cross-sectional views of transistor structure 604 along the C-C' plane denoted in FIG. 6 as operations in methods 5501 are performed, in accordance with some embodiments.

FIG. 56A-56C illustrate structures present in an exemplary transistor structure following front-side processing of a donor substrate. Semiconductor bodies 610 are fin structures extending vertically (e.g., z-dimension). Semiconductor bodies 610 include a channel portion comprising device layer 215. In the embodiments illustrated in FIG. 56A-56C, semiconductor bodies 610 further include a sub-fin portion having the same semiconductor composition as device layer 215 (e.g., Si). Semiconductor bodies 610 may have been formed, for example, with a patterned front-side recess etch of device layer 215. As described further elsewhere herein, semiconductor fin bodies may alternatively include a sub-fin semiconductor of a different composition than the channel portion, in which case device layer 215 may only be present within the device channel while sub-fin semiconductor may be a component of intervening layer 210 (FIG. 3A). Alternatively, the sub-fin semiconductor may be considered a spacer between device layer 215 and a back-side substrate, which may further include an intervening layer between the sub-fin semiconductor and a carrier layer. Field isolation dielectric 680 surrounds one or more sidewalls of semiconductor bodies 610. A gate stack including gate electrode 673 disposed over a gate dielectric 845 intersecting a channel portion of transistor semiconductor bodies 610 is further illustrated in FIGS. 56A and 56B, while an intersection of source/drain metallization with source/drain semiconductor 640 is shown in FIG. 56C.

In FIG. 56A-56C, back side surface 3911 of intervening layer 210 has been revealed by any technique, such as, but not limited to methods 501 (FIG. 5). A marker or etch stop, for example, may have been present within a first intervening layer 210 terminating the carrier removal operation prior to revealing the back side of field isolation dielectric 680. Although not depicted, the back side of transistor semiconductor bodies 610 may be revealed by further removing portions of bulk semiconductor to which transistor semiconductor bodies 610 are anchored, for example substantially as described above for operation 520 (FIG. 5). With the backside surface of intervening layer 210 (or of bodies 610) revealed, a backside implant 5610 is performed. Backside implant 5610 may be a blanket implant with dopant species being implanted into semiconductor bodies 610 as well as into surrounding materials, such as field isolation dielectric 680. The blanket implant takes advantage of the front-side patterning of bodies 610 with all revealed portions to receive the dopant. If fewer than all bodies 610 are to receive the implant, backside implant 5610 may be a selective (masked) implant. A backside implant may utilize any dopant species, dopant level(s), and implant energy level(s) known to be suitable for the composition of semiconductor bodies 610. In some embodiments, the backside implant entails implantation of an impurity species that can be electrically activated by a subsequent thermal anneal at any temperature above ambient (e.g., 400-800° C.) to impart n-type or p-type conductivity to the doped semiconductor.

FIG. 57A-57C illustrates transistor structures including semiconductor regions that have been doped by one or more back-side implant. As shown, intervening layer 210 and sub-fin portions of semiconductor bodies 610 have been doped with a dopant species, thereby differentiating intervening layer 210 from the device layer 215 of each semiconductor body 610. Such backside impurity doping may, for example, be employed to form well structures, such as, but not limited to an n-well suitable for the fabrication of a PMOS FET having p-type source/drain semiconductor 640. Such backside impurity doping may also be employed as a punch-through stopper. In some alternative embodiments, only intervening layer 210 is doped by the backside implant and sub-fin portions of semiconductor bodies 610 are not doped. In other alternative embodiments, only a portion of the sub-fin region is doped by the backside implant. In still other embodiments, multiple backside implants are performed to achieve a dopant gradient and/or complementarily-doped semiconductor junctions within or between semiconductor bodies 610 and intervening layer 210. For example, a p-type and n-type junction may be formed through backside implant wherein a backside portion of semiconductor bodies 610 is doped to a light-to-moderate "p-" doping while source/drain semiconductor 640 is heavily doped n-type. For example, a p-type and n-type junction may be formed through backside implant wherein a backside portion of semiconductor bodies 610 is doped to a light-to-moderate "n-" doping while source/drain semiconductor 640 is heavily doped p-type. Such complementary backside doping of semiconductor bodies 610 may serve to reduce on-state leakage between fins through intervening layer 210. For embodiments where intervening layer 210 is removed and fin-to-fin leakage is less of a concern, backside doping of semiconductor bodies 610 may provide a means of fabricating diodes into a manufacturing flow that does not distinguish the front-side processing of a transistor from that of a p/n diode.

In some embodiments, backside implant processing entails multiple selective implant operations. For example, a first backside implant may dope a first semiconductor (e.g., a first body 610 and intervening layer 210 of FIG. 57A-C) to a first conductivity type (e.g., p-type). A second backside implant may dope a second, adjacent, semiconductor region (e.g., a second body 610 and intervening layer 210 of FIG. 57A-C) to a second, complementary conductivity type (e.g., n-type). The two complementarily doped semiconductor regions may form a p/n junction, for example within intervening layer 210. Terminals to complementary ends of the junction may be through front-side and/or backside metallization. In one front-side metallization embodiment, a first transistor structure having p-type doped source/drain semiconductor 640 (e.g. PMOS FET) is backside implanted to have a p-type sub-fin and a p-type intervening layer surrounding the p-type sub-fin (e.g., a first body 610 and portion of intervening layer 210 of FIG. 57A-C). The backside p-type doping may be electrically coupled to front-side metallization though the p-type doped source/drain semiconductor 640. Gate electrode 673 may in this case become a vestigial structure in the context of a diode. A second transistor structure having n-type doped source/drain semiconductor 640 (e.g. NMOS FET) is backside implanted to have an n-type sub-fin and an n-type intervening layer surrounding the n-type sub-fin (e.g., a second body 610 and portion of intervening layer 210 of FIG. 57A-C). The backside n-type doping may be electrically coupled to front-side metallization though the n-type doped source/drain semiconductor 640. The interface between the p-type intervening layer region and n-type intervening layer region defines the p/n junction of the diode. Alternatively, the p-type intervening layer region may be separated from the n-type intervening layer region by an intrinsic (undoped) portion of the intervening layer to define a p-i-n diode.

In some embodiments, back-side processing of a revealed portion of a device stratum includes epitaxially growing a semiconductor material over a back side of a semiconductor device layer. Epitaxial growth is another example of back-side processing that may entail high processing temperatures, and so may be staged relative to front-side processing for compatibility with all materials on the device stratum. In some such embodiments, a doped source/drain semiconductor may be epitaxially grown on a backside of a device layer in conjunction with fabrication of back-side contact and/or interconnect metallization. In other embodiments, backside processing includes epitaxial growth of semiconductor material that replaces other semiconductor material removed during the back-side reveal process. The epitaxially grown semiconductor may be of a different composition and/or better crystal quality than that removed during the back-side reveal process. To perform high-temperature processing, the back-side reveal and back-side epitaxial growth may be staged to occur prior to front-side metallization, for example. Notably, epitaxial growth of semiconductor on the back side of a front-side device layer may be further utilized in subsequent incremental back-side fabrication of various back-side device structures, for example, as described further elsewhere herein.

Alternatively, low temperature depositions may be employed to form a polycrystalline (e.g., micro or nanocrystalline) or amorphous semiconductor layer, such as, but not limited to an oxide semiconductor layer (e.g., IGZO) over a revealed device layer back side. Any thin film transistor (TFT) fabrication process may then utilize this back-side thin film semiconductor to form backside TFT circuitry.

Figure 58:
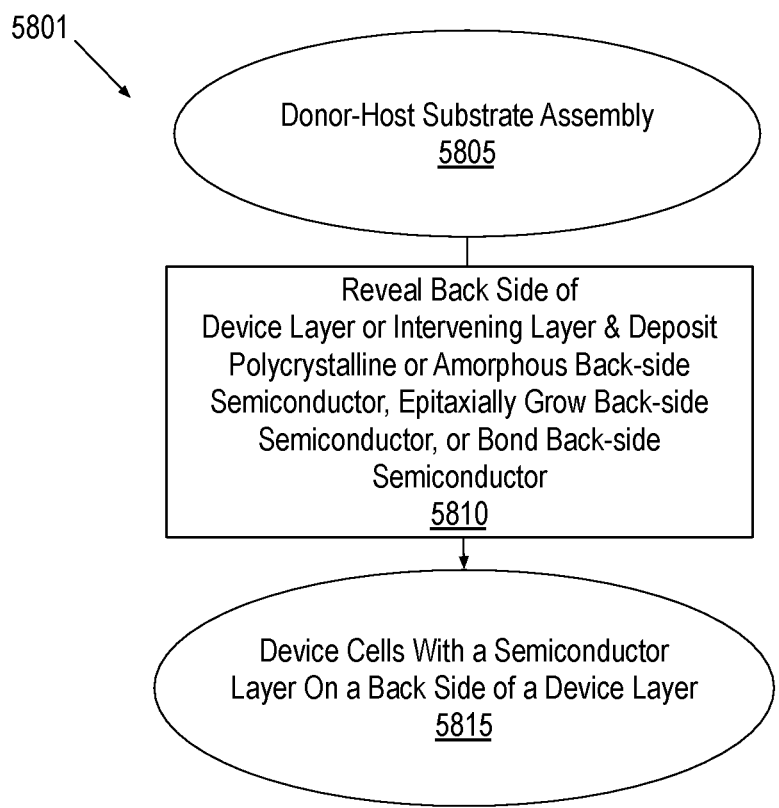
FIG. 58 is a flow diagram illustrating back-side processing methods including epitaxial growth of a semiconductor, in accordance with some embodiments.

FIG. 58 is a flow diagram illustrating back-side processing methods 5801 including epitaxial growth or bonding of a substantially monocrystalline back-side semiconductor layer, in accordance with some embodiments. Polycrystalline or amorphous semiconductors may also be formed, for example at lower temperatures (e.g., 100-400° C.). Methods 5801 further exemplify back-side processing of a device (e.g., transistor) cell stratum that may be no more than a few hundred nanometers in thickness. Methods 5801 begin with a donor-host substrate assembly including a device layer as an input 5805. The donor substrate may have one or more of the features described above, such as, but not limited to, an intervening layer and a carrier layer. Notably however, a carrier layer and/or intervening layer is not required to perform methods 5801. At operation 5810, a back side of the device layer or intervening layer is exposed during a back-side reveal process. In some embodiments, the back-side reveal process performed at operation 5810 includes one or more of the operations of methods 501 (FIG. 5). The back-side reveal process may, for example, reveal the device layer or intervening layer by removing at least at portion of the donor substrate (e.g., carrier layer). One or more semiconductor layers are then grown or deposited on the revealed device layer. Alternatively, one or more semiconductor layers are bonded to the revealed device layer, for example with a semiconductor oxide bond interface. Output 5815 includes a device cell with single-crystalline semiconductor material disposed over a back side of device layer 215. Alternatively, if low temperature deposition is employed, the output of methods 5801 is a device with polycrystalline or amorphous semiconductor material disposed over a back side of device layer 215.

Figure 59A:
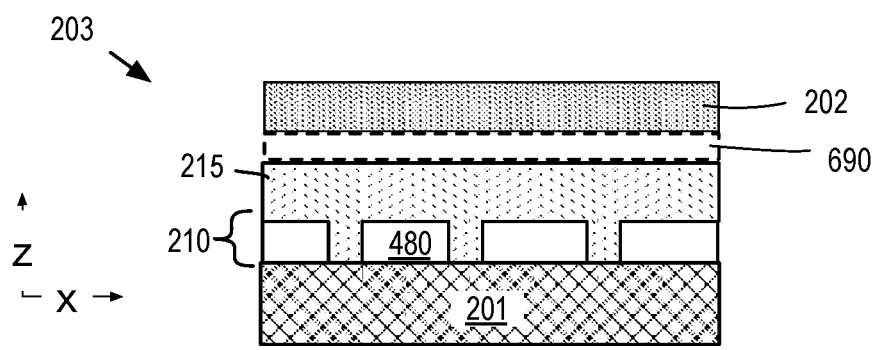
FIG. 59A, 59B, 59C illustrate cross-sectional views of a III-N semiconductor device stratum as some operations in the methods illustrated in FIG. 58 are performed, in accordance with some embodiments.
Figure 59B:
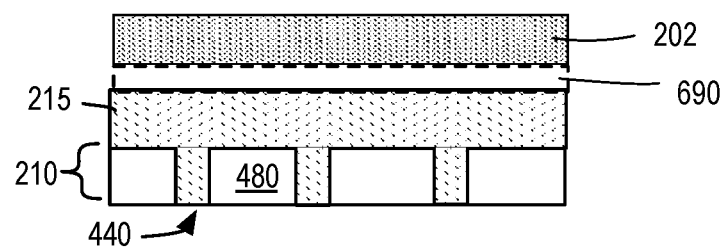
Figure 59C:
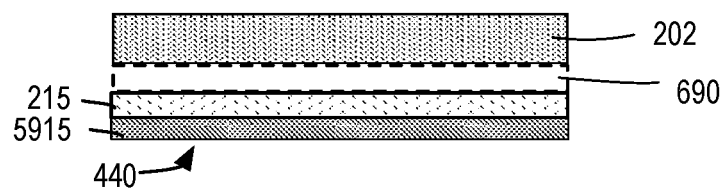

FIG. 59A, 59B, 59C illustrate cross-sectional views of a III-N semiconductor device stratum as some operations in methods 5801 are performed on donor-host assembly 203, in accordance with some embodiments. As shown in FIG. 59A, donor-host assembly 203 that includes donor substrate 201, for example substantially as described above for FIG. 4A-4C, joined to host substrate 202 with any front-side stack 690 disposed there between. Front-side stack 690 is illustrated in dashed line as being a portion of the device cell stratum that may vary without limitation and may, for example, include any number of backend interconnect metallization levels. Host substrate 202 may, for example, have any of the properties described elsewhere herein. As shown, host substrate 202 is joined to a front-side surface of front-side stack 690, for example by thermal-compression bonding. Device terminals are not yet formed in, or coupled to, device layer 215 in an embodiment further illustrating how the back-side device layer processing may precede much of the front-side device layer processing.

As further illustrated in FIG. 59B, donor substrate 201 has been removed, exposing a back-side surface of intervening layer 210, which includes semiconductor islands surrounded by isolation dielectric 480. Donor substrate 201 may be thinned and/or removed by any technique, such as, but not limited to, methods 501 (FIG. 5). The exposed surface of semiconductor may have a high number of defects 440, which propagated during heteroepitaxial growth for example. Intervening layer 210 may then be removed from device layer 215, exposing a back side of device layer 215. Intervening layer 210 may be removed by CMP, in which case both semiconductor and isolation dielectric 480 may be removed. Alternatively, intervening layer 210 may be removed with an etch process selective to semiconductor, in which case isolation dielectric 480 may be retained. For some embodiments, the back-side surface of device layer 215 (e.g., where device layer 215 is GaN) has significantly lower defect density (i.e., better crystal quality) than the semiconductor removed as part of intervening layer 210.

Semiconductor layer 5915 is then deposited or grown on a back-side surface of device layer 215, for example using any epitaxial growth or deposition technique known to be suitable for the chosen semiconductor material. Semiconductor layer 5915 may also be grown or deposited within openings in isolation dielectric 480, if it was retained. Because device layer 215 provides a high quality seeding surface, a regrown semiconductor layer 5915 is also of high quality, having few crystal defects 440. Following the back-side epitaxial growth, which may be a high-temperature process (e.g., exceeding 900° C. for III-V embodiments) back-side processing and/or front-side processing may continue with lower-temperature processes to fabricate a device (e.g., HFET) in device layer 215 and/or in epitaxially grown semiconductor layer 5915. Notably, semiconductor layer 5915 need not have the same composition as device layer 215. Compositional differences between device layer 215 and semiconductor layer 5915 may be leveraged, for example to impart strain in layers 215 or 5915 through lattice mismatch engineering. In some embodiments where device layer 215 is GaN, semiconductor layer 5915 is a III-N alloy having a different lattice constant than device layer 215. In some embodiments where device layer 215 is Si, semiconductor layer 5915 is a III-V or group IV alloy having a different lattice constant than device layer 215. For such embodiments, semiconductor layer 5915 may advantageously impart uniaxial and/or biaxial strain in device layer 215, or vice versa.

In still other embodiments where device layer 215 is a III-N alloy, epitaxially grown semiconductor layer 5915 is a transition metal dichalcongenide (TMD or TMDC). Similar to graphene, TMDCs display semiconductor properties as a monolayer sheet of $MX_2$, where M is a transition metal atom (e.g., Mo, W) and X is a chalcogen atom (S, Se, or Te). In a monolayered crystalline sheet, one layer of M atoms is disposed between two layers of X atoms. Following growth of the TMDC sheet, back-side processing may further include fabricating a TMDC-channeled transistor having any known architecture.

In some embodiments, back-side semiconductor is epitaxially grown, or deposited in polycrystalline or amorphous form, during fabrication of vertically-stacked devices or vertically-oriented devices. For some exemplary architectures, a front-side device layer is epitaxially grown on a donor substrate and then upon removal of the donor substrate, the back side reveal may expose a layer of semiconductor having crystallinity advantageous for regrowth of a second, back-side, device layer. The front-side and back-side device layers within the device stratum may then be employed for separate functional regions of a vertically-oriented transistor or may be employed for two vertically-stacked, laterally-oriented transistors. One challenge faced by many vertically-oriented device architectures is the fabrication of device terminals on opposite ends of the device, which can be difficult when relying only on front-side processing. The back-side reveal techniques described herein however enable a paradigm shift from "bottom-up" device fabrication to "center-out" device fabrication with a first portion of the device epitaxially grown from the front side and second portion of the device epitaxially grown from the back side, once revealed. As such, an exemplary vertical FET may be fabricated by first forming source (or drain) semiconductor on a front side of a device layer that provides the transistor channel. Drain (or source) semiconductor, which may be formed on the back side of the device layer, is then coupled to back-side metallization after the back-side reveal process. Bipolar transistors may be similarly fabricated, for example by first forming emitter (or collector) semiconductor on a front side of the device layer that is to provide that transistor base. The collector (or emitter) semiconductor is then formed on the back side of the device layer after the back-side reveal process.

Figure 60A:
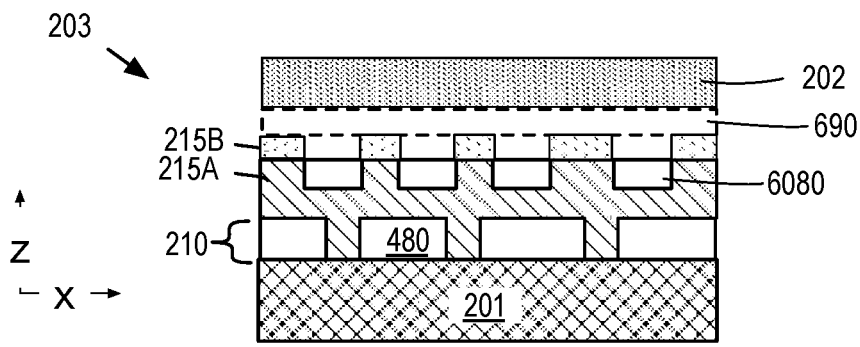
FIG. 60A, 60B, 60C illustrate cross-sectional views of semiconductor device layers as some operations in the methods illustrated in FIG. 58 are performed, in accordance with some embodiments.
Figure 60B:
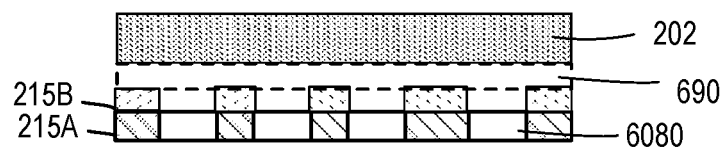
Figure 60C:
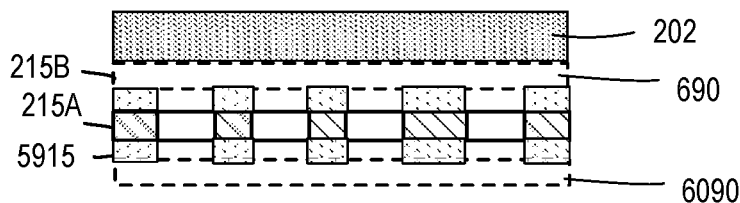

FIG. 60A, 60B, 60C illustrate cross-sectional views of semiconductor device layers as some operations in the methods 5801 are performed, in accordance with some stacked device layer embodiments. Methods 5801 begin with receiving a donor-host assembly 203 that includes host substrate 202 and donor substrate 201, for example substantially as described above for FIG. 59A. In the embodiments illustrated by FIG. 60A however, donor-host assembly 203 includes a front-side device layer 215B over a core semiconductor device layer 215A. Semiconductor material of core device layer 215A has been patterned into features (e.g., fins, pillars, dots, etc.) that are surrounded by field isolation dielectric 6080. Semiconductor features of front-side device layer 215B are over the core device layer features. Front-side stack 690 is over front-side device layer 215B. In some embodiments, where the front-side device layer features are impurity-doped source/drain semiconductor, front-side stack 690 may include a front-side source/drain contact metal. Front-side stack 690 may further include a gate electrode coupled to the core semiconductor layer features. During back-side processing, a back-side the core device layer 215A is revealed. For example, as further illustrated in FIG. 60B, donor substrate 205 and intervening layer 210 have been removed during the backside reveal operation, exposing core device layer 215A and field isolation dielectric 6080. As shown in FIG. 60C, a back-side semiconductor layer 5915 is then epitaxially grown (e.g., selectively) or deposited on the back-side surface of core device layer 215A. Semiconductor layer 5915 may be grown or deposited to form laterally-oriented or vertically oriented devices that are independent of front-side device layer 215B, or dependent on front-side device layer 215B. A back-side stack 6090 is then fabricated and/or bonded to the double-sided stratum, interconnecting features in back-side semiconductor layer 5915. For example, back-side stack 6090 may include a back-side source/drain contact metal.

In some embodiments, core device layer 215A provides electrical isolation between front-side device layer 215B and back-side semiconductor layer 5915. For example, core device layer 215A may have a wider bandgap and/or a band gap offset in one or both of the conduction band and valence band so that charge carriers are confined within the front-side and back-side device layers 215B, 5915, respectively. Homogeneous semiconductor embodiments may also rely on core device layer 215A to provide dopant junction isolation between front-side device layer 215B and back-side semiconductor layer 5915. For such architectures, front-side stack 690 may provide all terminals (e.g., gate, source, and drain) of a front-side laterally-oriented device (e.g., FET) employing front-side device layer 215B. An equivalent back-side stack may further provide all terminals (e.g., gate source and drain) to a back-side laterally oriented device (e.g., FET) employing back-side semiconductor layer 5915.

As an alternative to back-side epitaxial growths or amorphous/polycrystalline film depositions, back-side semiconductor structures may be fabricated as fins by exposing sub-fin portions of front-side fin structures, for example by selectively recessing a back-side of field isolation dielectric surrounding the front-side fins. Alternatively, back-side semiconductor bodies may be patterned from an intervening semiconductor layer exposed during the back-side reveal. For such embodiments, back-side epitaxy and/or back-side implantation may also be used to form a back-side semiconductor layer 5915 that includes back-side source/drain semiconductor regions.

Figure 61A:
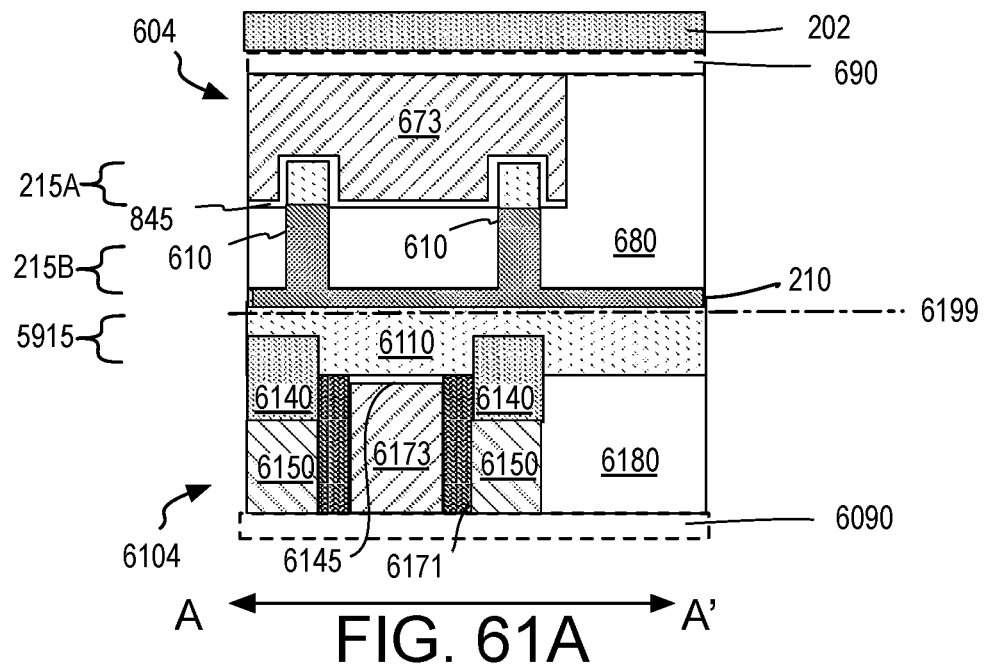
FIGS. 61A, 61B, 62A, and 62B illustrate cross-sectional views of stacked semiconductor device layers, in accordance with some embodiments.
Figure 61B:
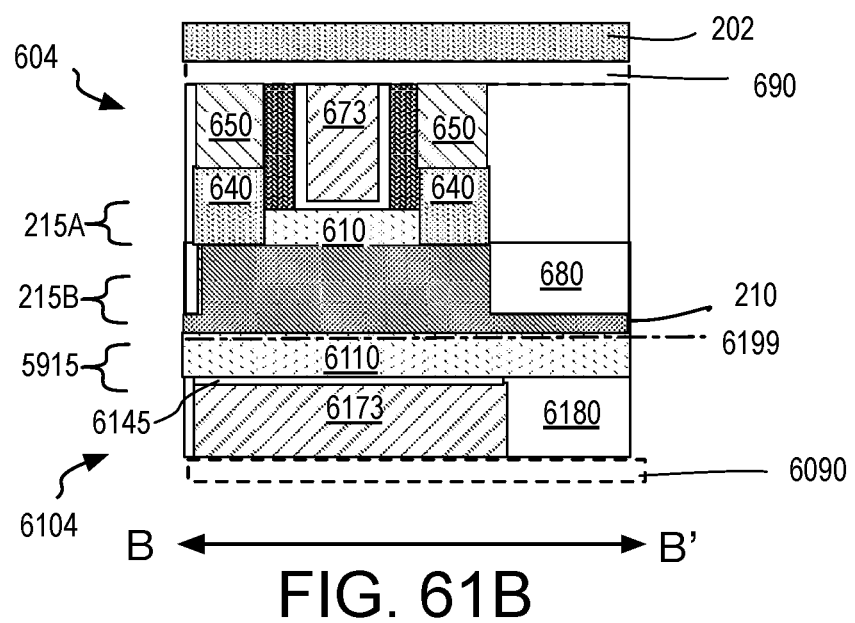

FIG. 61A illustrates a cross-sectional view of transistor structure 604 along the A-A' plane denoted in FIG. 6, stacked with a planar back-side transistor structure 6104, in accordance with some stacked FET embodiments. FIG. 61B illustrates a cross-sectional view of transistor structure 604 along the B-B' plane denoted in FIG. 6, stacked with a planar back-side transistor structure 6104, in accordance with some stacked FET embodiments. In some embodiments, back-side transistor structure 6104 is incrementally fabricated from the revealed back side of transistor structure 604. For such embodiments, the back-side reveal partitions not only front-side fabrication from back-side fabrication, but also partitions non-planar FET fabrication processes from planar FET fabrication processes. In alternative embodiments, back-side transistor structure 6104 is prefabricated and transferred as a second device stratum that is bonded to the revealed back side of transistor structure 604, for example at bonding interface 6199.

Notably, while planar FETs are advantageous for a number of applications (e.g., high current power FETs), planar FET fabrication is often incompatible with finFET fabrication making it difficult to incorporate both transistor architectures in different regions of a substrate. With the double-sided processing enabled by backside reveal techniques, such as those described elsewhere herein, planar FET fabrication can be serially integrated with finFET fabrication.

As shown in FIG. 61A, front-side device layer 215A is disposed on semiconductor bodies 610 having transverse lengths extending in the A-A' plane. Sub-fin portions of semiconductor bodies 610 and any intervening layer 210 serve as the core device layer 215B (e.g., silicon or suitably matched compound semiconductor). Back-side semiconductor layer 5915 may be epitaxially grown on a revealed back-side surface of core device layer 215B. Semiconductor layer 5915 may be of any composition, such as any of those provided for device layer 215A. In some embodiments, semiconductor layer 5915 has a different composition than device layer 215A. In some embodiments, semiconductor layer 3915 has the same composition as device layer 215A. In some embodiments, semiconductor layer 5915 has a conductivity type complementary to that of device layer 215A (e.g., semiconductor layer 5915 is p-type while device layer 215A is n-type, or visa versa). In some embodiments, semiconductor layer 5915 is a monocrystalline III-V material while device layer 215A is monocrystalline silicon. In other embodiments, device layer 215A is a monocrystalline III-V material while semiconductor layer 5915 is monocrystalline silicon. In some embodiments, device layer 215A is silicon and semiconductor layer 5915 is monocrystalline III-N (e.g., GaN). Instead of bonding or a back-side epitaxial growth of semiconductor layer 5915 (e.g., with an oxide bonding interface), intervening layer 210 may serve as the basis for a back-side device layer, for example with FET channel region 6110 disposed within intervening layer 210.

A back-side gate stack including back-side gate dielectric 6145 and back-side gate electrode 6173 is disposed on channel region 6110. Back-side source/drain semiconductor 6140 is epitaxially grown, deposited, or otherwise formed, at opposite ends of channel region 6110, and electrically isolated from back-side gate electrode 6173 by intervening back-side dielectric spacers 6171. Back-side source/drain semiconductor 6140 may be of any composition, such as any of those provided for source/drain semiconductor 640. In some embodiments, source/drain semiconductor 6140 has the same composition as source/drain semiconductor 640. In some embodiments, source/drain semiconductor 6140 is the complementary conductivity type as source/drain semiconductor 640 (e.g., 6140 is p-type where 640 is n-type, or visa versa). In some embodiments, source/drain semiconductor 6140 is the same conductivity type as source/drain semiconductor 640. Back-side field isolation dielectric 6180 surrounds the active device structures in the same manner as field isolation dielectric 680.

Notably, while gate length for front-side transistor structure 604 extends in the A-A' plane, as shown in FIG. 61B, back-side planar transistor structure 6104 has a channel length that extends in the B-B' plane, as shown in FIG. 61A. As such, current flow through the stacked channel regions is non-parallel and advantageously orthogonal. While the illustrated relative orientations of the stacked FET cells may offer advantages such as reduced parasitics (inductive, capacitive cross-talk), FET orientations resulting in parallel channel currents are also possible. Similarly, while the example illustrated in FIG. 61A, 61B illustrates planar transistor structure 6104 to have a footprint substantially equal to a transistor structure 604 employing two semiconductor bodies 610, the relative dimensions of a front-side finFET and back-side planar FET may vary. Furthermore, while the example illustrated in FIG. 61A, 61B illustrates planar transistor structure 6104 to be vertically aligned with transistor structure 604, stacked transistor embodiments may incorporate any amount of lateral offset between the front-side and back-side transistor structures.

Figure 62A:
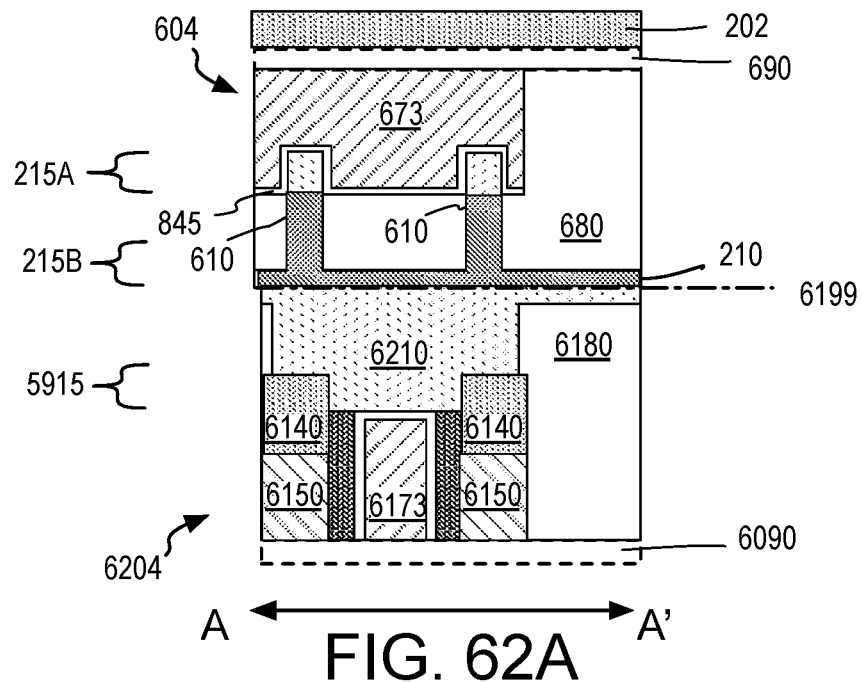
Figure 62B:
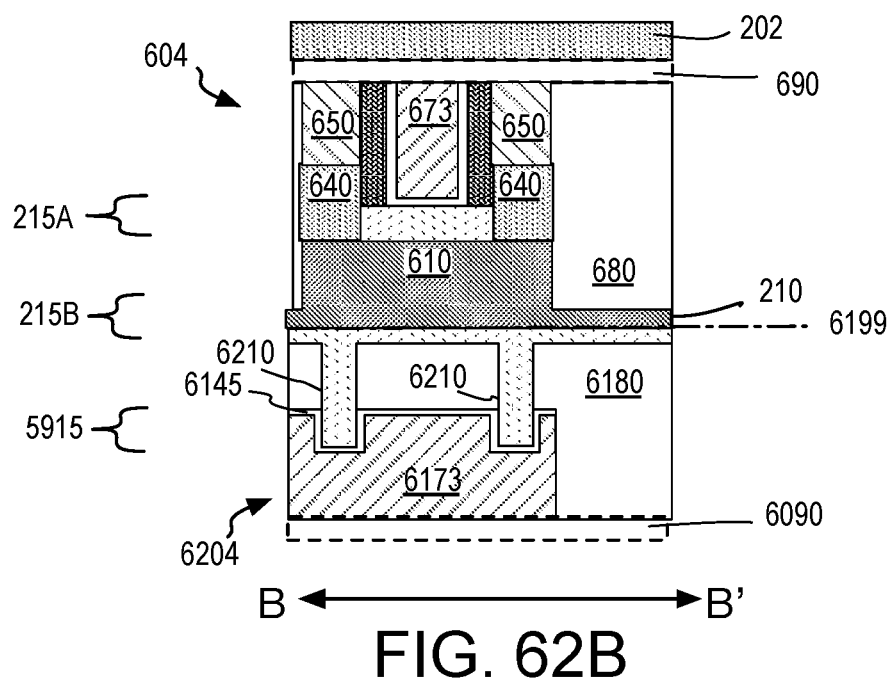

FIG. 62A illustrates a cross-sectional view of transistor structure 604 along the A-A' plane denoted in FIG. 6, stacked upon a back-side transistor structure 6204, in accordance with some stacked FET embodiments. FIG. 62B illustrates a cross-sectional view of transistor structure 604 along the B-B' plane denoted in FIG. 6, stacked upon back-side transistor structure 6204, in accordance with some stacked FET embodiments. In some embodiments, back-side transistor structure 6204 is incrementally fabricated from the revealed back side of transistor structure 604. In alternative embodiments, back-side transistor structure 6104 is pre-fabricated and transferred as a second device stratum that is bonded to the revealed back side of transistor structure 604, for example at bonding interface 6199.

Backside reveal, semiconductor layer patterning, bonding, and/or subsequent epitaxial device layer growth or deposition may be employed to increase the density of transistor gates for a given footprint (e.g., doubling finFET cell count for a given area). As shown in FIG. 62A, front-side device layer 215A is disposed on semiconductor bodies 610 having transverse lengths extending in the A-A' plane. Sub-fin portions of semiconductor bodies 610 and any intervening layer 210 serve as the core device layer 215B (e.g., silicon or suitably matched compound semiconductor). Back-side semiconductor layer 5915 may be epitaxially grown or deposited as a polycrystalline or amorphous thin film on a revealed back-side surface of core device layer 215B. Film growth or deposition may be confined (or made selective) to form non-planar back-side semiconductor bodies 6210, or a back-side patterning process may be employed to define the non-planar back-side semiconductor bodies 6210 from an epitaxially grown or non-epitaxially deposited semiconductor layer. In some alternate embodiments, intervening layer 210 may instead operate as a back-side device layer, which is patterned into back-side fin bodies.

A back-side gate stack including back-side gate dielectric 6145 and back-side gate electrode 6173 is disposed on channel region of back-side semiconductor bodies 6210. Back-side source/drain semiconductor 6140 is epitaxially grown, non-epitaxially deposited, and/or impurity-doped, at opposite ends of channel region 6110, and electrically isolated from back-side gate electrode 6173 by intervening back-side dielectric spacers 6171. Back-side field isolation dielectric 6180 surrounds the active device structures in the same manner as field isolation dielectric 680.

Notably, while gate length for front-side transistor structure 604 extends in the A-A' plane, as shown in FIG. 62B, back-side transistor structure 6204 has a channel length that extends in the B-B' plane, as shown in FIG. 62A. As such, current flow through the stacked channel regions is non-parallel and advantageously orthogonal. While the illustrated relative orientations of the stacked FET cells may offer advantages, such as reduced parasitics (inductive, capacitive cross-talk), stacked FET orientations resulting in parallel channel currents are also possible. Similarly, while the example illustrated in FIG. 62A, 62B illustrates transistor structure 6204 to have a footprint substantially equal to a transistor structure 604, the relative dimensions of front-side and back-side finFETs may vary. Furthermore, while the example illustrated in FIG. 62A, 62B illustrates transistor structure 6204 to be vertically aligned with transistor structure 604, stacked transistor embodiments may again incorporate any amount of lateral offset between the front-side and back-side transistor structures.

Figure 63A:
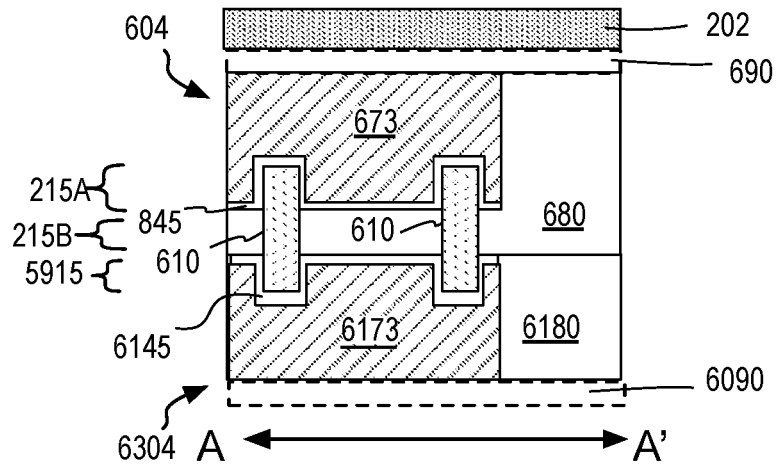
FIGS. 63A, 63B, 64A, and 64B illustrate cross-sectional views of stacked semiconductor device layers, in accordance with some embodiments.
Figure 63B:
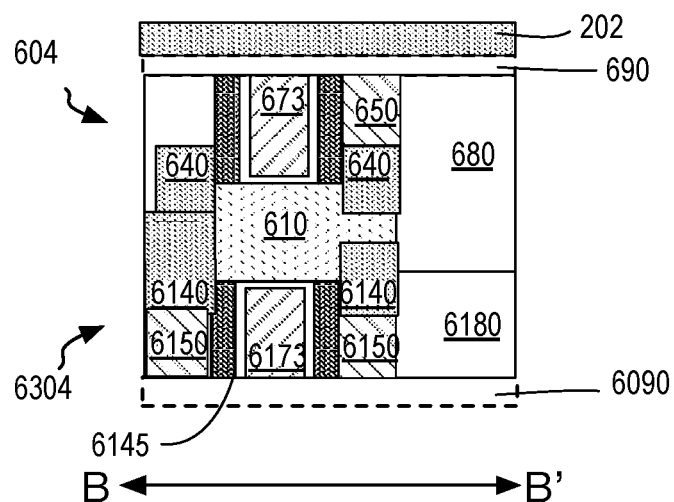

FIG. 63A illustrates a cross-sectional view of transistor structure 604 along the A-A' plane denoted in FIG. 6, and back-side transistor structure 6304, in accordance with some stacked FET embodiments. FIG. 63B illustrates a cross-sectional view of transistor structure 604 along the B-B' plane denoted in FIG. 6, and back-side transistor structure 6304, in accordance with some stacked FET embodiments. For these embodiments, back-side transistor structure 6304 is incrementally fabricated from the revealed back side of transistor structure 604. Such back-side processing may leverage self-aligned techniques to fabricate additional FET structures in front-side fabricated semiconductor bodies. Hence, a front-side FET and a back-side FET have a channel region disposed in front and back sides of a semiconductor body, respectively. In contrast to the example illustrated in FIG. 62A,B, channel current in back-side FET cell 6304 is substantially parallel with the channel current in the front-side transistor structure 604. For such embodiments, back-side semiconductor bodies 6210 may be fabricated as fins by exposing sub-fin portions of bodies 610, for example by selectively recessing a back-side of field isolation dielectric 680 surrounding the bodies.

Alternatively, in further reference to FIGS. 62A and 62B, semiconductor bodies 6210 may be patterned from an intervening semiconductor layer exposed during the back-side reveal. In other embodiments, semiconductor bodies 6210 may be epitaxially grown from a back-side seeding surface of bodies 610 during a back-side epitaxial process. Back-side epitaxy or semiconductor deposition processes may also be used to form a back-side source/drain semiconductor 6140. Alternatively, backside impurity implantation may be employed to form back-side source/drain semiconductor 6140. In still other embodiments, semiconductor bodies 6210 may be fabricated from an amorphous or polycrystalline thin film semiconductor (e.g., oxide semiconductor) deposited on a back-side surface of bodies 610 during a back-side TFT deposition process. For such embodiments, a thin film of amorphous or polycrystalline semiconductor may be deposited over a back-side isolation dielectric layer, fabricated for example according to methods 701.

In some embodiments further illustrated by FIG. 63A, 63B, a back-side source/drain semiconductor 6140 makes direct contact with a front-side source/drain semiconductor 640. In the example illustrated, source/drain semiconductor 6140 extends beyond the revealed back-side of semiconductor body 610 (e.g., as described above in the context of a fabricating a back-side source terminal) to contact front-side source/drain semiconductor 640. Source/drain semiconductor 6140 may be formed through a masked back-side implant (e.g., in accordance with methods 4901), or through backside semiconductor deposition or epitaxial growth (e.g., in accordance with methods 5801), for example. In some embodiments where back-side transistor structure 6304 is a TFET, independent formation of the complementarily doped source and drain further allows one of the source or drain to be made deeper than the other so that direct contact can be made to only one of the front-side source/drain semiconductor regions. In some embodiments where back-side transistor structure 6304 is a TFT source/drain semiconductor 6140 may be formed from a portion of a semiconductor thin film (e.g., oxide semiconductor) using any known techniques.

Figure 64A:
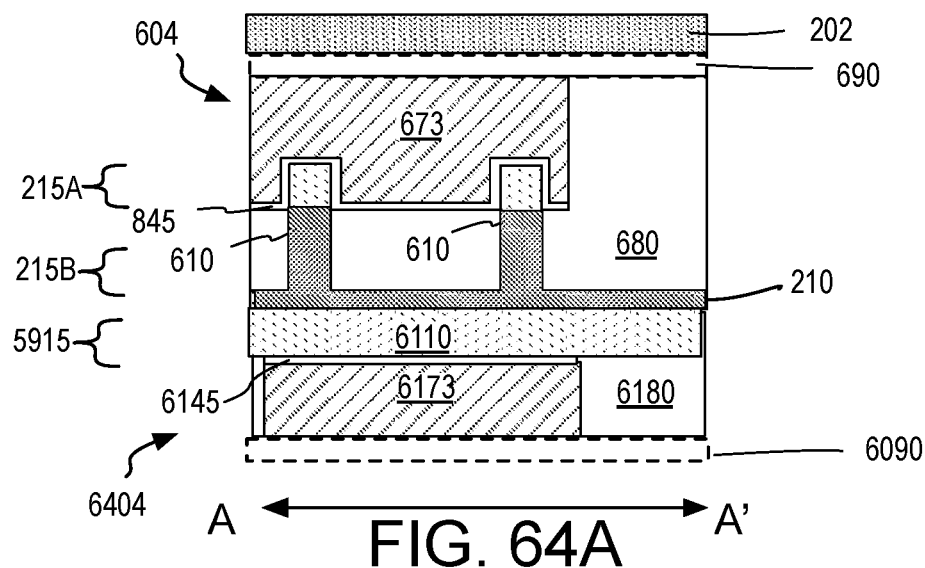
Figure 64B:
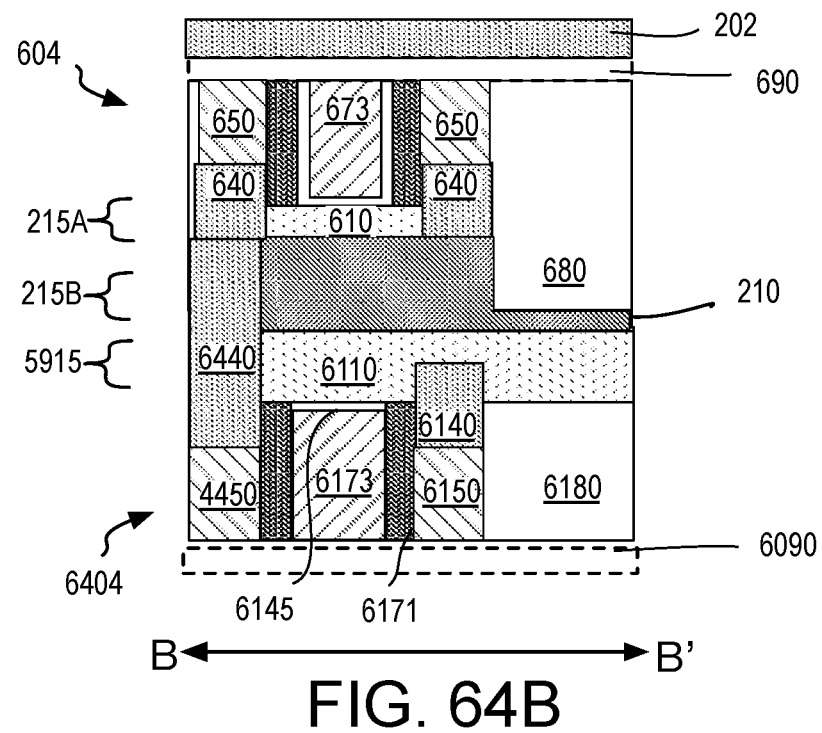

FIG. 64A illustrates a cross-sectional view of transistor structure 604 along the A-A' plane denoted in FIG. 6, and back-side transistor structure 6404, in accordance with some stacked FET embodiments. FIG. 64B illustrates a cross-sectional view of transistor structure 604 along the B-B' plane denoted in FIG. 6, and back-side transistor structure 6404, in accordance with some stacked FET embodiments. For these embodiments, back-side transistor structure 6404 is incrementally fabricated from the revealed back side of transistor structure 604. Such back-side processing may leverage self-aligned techniques to fabricate additional FET structures in front-side fabricated semiconductor bodies.

For the exemplary embodiments illustrated in FIG. 64A-64B, a front-side non-planar FET and a back-side planar FET have one source/drain semiconductor in direct contact. In contrast to the examples illustrated in FIG. 61, channel current in back-side transistor structure 6404 is substantially parallel with the channel current in the front-side transistor structure 604. In this example, source/drain semiconductor 6440 extends beyond the revealed back-side of semiconductor body 610 to contact front-side source/drain semiconductor 640. Source/drain semiconductor 6440 may be formed through a masked back-side implant, or through back-side semiconductor material deposition. Alternatively, a source/drain semiconductor 640 may extend to the revealed back-side of semiconductor body 610, which is then in electrical contact with a source/drain of back-side transistor structure 604 with only the interface between source/drain semiconductor 640 and source/drain semiconductor 6440 then deviating from that illustrated in FIG. 64B to instead be at the junction of 215B and 5915.

In some embodiments, a TFET is fabricated with front-side or back-side processing while another device is fabricated on the opposite side of the TFET. A TFET is a transistor with structure similar to a conventional metal-oxide-semiconductor FET (TFT) except that the source and drain terminals of a TFET are of opposite conductivity type. Hence, any TFT, or any TFET, may be fabricated on a back side of a device layer. The common TFET device structure consists of p-i-n (p-type-intrinsic-n-type) junctions, in which the gate electrode controls the electrostatic potential of the intrinsic region. The TFET switching mechanism is by modulating quantum tunneling through a barrier associated with the p-i-n junction instead of modulating thermionic emission over a barrier as in traditional MOSFETs. The TFET is therefor a promising candidate for low energy electronics. As noted above, back-side processing may be limited to lower processing temperatures, making it well-suited to integrating TFETs or other TFTs compatible with low-temperature processing with front-side FETs. Many oxide semiconductors can be formed at low temperatures, making such materials suitable for back-side TFT designs. For other TFT and TFET material systems (e.g., SiGe and/or III-V alloys), high processing temperatures (e.g., in excess of 600° C.) may be needed, which may be incompatible with typical CMOS circuitry. For such embodiments, TFT or TFET structures needing a high-temperature process may be fabricated first during front-side processing, and low-temperature TFT structures then fabricated during back-side processing subsequent to revealing a backside of the TFET.

A back-side or front-side TFT or TFET may be stacked with any front-side/back-side device, such as a FET, another TFET (or other TFT), a memory cell, a HFET, an HBT, a photodiode, a laser, etc. For example, one or more of transistor structures 604, 6104, 6204, 6304, 6404 may be a TFET or TFT. A planar TFT 6404 may be fabricated over a backside of a non-planar FET 604 in some embodiments. In some other embodiments, both of transistor structures 604 and 6104; 604 and 6204; 604 and 6204; or 604 and 6304 are TFTs. One or more of such TFTs may further be thin film tunneling transistors (e.g., thin film TFETs). In some such embodiments, transistor structure 604 is an n-type TFET with a n-type source semiconductor 640, a p-type drain semiconductor 640, and an intrinsic semiconductor channel region, while transistor structure 6104, 6204, 6304, or 6404 is a p-type TFET with a p-type source semiconductor 6140, a n-type drain semiconductor 6140, and an intrinsic semiconductor channel region 6110. In some other embodiments, transistor structure 604 is an n-type FET or TFT with an n-type source and drain semiconductor 640, and an intrinsic semiconductor channel region, while transistor structure 6104, 6204, 6304, or 6404 is a p-type FET or TFT with a p-type source and drain semiconductor 6140. To fabricate such TFET or TFT stacks, a back side of intrinsic semiconductor (e.g., semiconductor bodies 610 or intervening layer 210) may be revealed, for example with any of the techniques described elsewhere herein. A junction isolation layer may be formed if desired, for example through back-side implant and/or backside epitaxial semiconductor growth. Back-side source/drain semiconductor 6140 may then be formed (e.g., serially) with the desired conductivity type.

In some TFET embodiments, the TFET includes a channel material separating a p-type material having p-type conductivity from an n-type material having n-type conductivity. A gate dielectric material separates a gate electrode material from channel material. In some embodiments, the TFET is an n-type device in which p-type material functions as a source and negative charge carriers tunnel from the valence band in p-type material to the conduction band in channel material. In some embodiments, the TFET is a p-type device in which p-type material functions as a drain and positive charge carriers tunnel from the conduction band in n-type material to the valence band in channel material.

Back-side TFET or TFT embodiments may employ any materials known to be suited for a TFET or TFT, respectively. In some embodiments, at least one of p-type material, channel material, or n-type material is a semiconducting oxide (i.e., oxide semiconductor). Such embodiments are compatible with a back-side TFET (or any other TFT architecture) that is fabricated after a front-side FET, for example, because they may be deposited at low temperatures. In some embodiments, only one of p-type material, channel material, and n-type material is an oxide semiconductor, while the other materials are non-oxide semiconductors. Many oxide semiconductors have high defect density nearer the valence band, but display good n-type electrical properties. Some oxide semiconductors have high defect density in conduction band, but display good p-type electrical properties. In some advantageous embodiments, the one oxide semiconductor is p-type material. In other embodiments, the one oxide semiconductor is channel material. In still other embodiment, the one oxide semiconductor is n-type material. In some embodiments, two or more of p-type material, channel material, and n-type material is an oxide semiconductor. In some such embodiments, both channel material and n-type material are oxide semiconductors. In some embodiments, the two oxide semiconductor materials include p-type material and n-type material, and the two oxide semiconductor materials provide a type-II or type-III band offset. In still other embodiments, all of source material, channel material, and drain material are oxide semiconductors.

Use of oxide semiconductors may enable low temperature TFT (which may be TFET or FET) fabrication, and display superior transistor characteristics as a result of an ability to tune the material band gap and resistivity. While such semiconductor oxides may display some level of ordering (e.g., nanocrystallinity), in some embodiments amenable to lowest processing temperatures, the oxide semiconductor is amorphous. A variety of oxide semiconductors are known. Examples are metal oxides including a transition metal (e.g., IUPAC group 4-6) or post-transition metal (e.g., IUPAC groups 11-14). These metal oxides may suboxides ($A_2O$) monoxides (AO), binary oxides ($AO_2$), ternary oxides ($ABO_3$), and mixtures thereof. Some specific examples include tin oxide ($SnO_2$ or SnO), Zn(II) oxide, ZnO, $CuO_x$, and $NiO_x$. Some non-oxide semiconductors can also be formed with sufficient crystal quality with relatively low processing temperatures. For example, monocrystalline Ge, and GeSn may be formed at 300-400° C. while other group IV and group III-V materials may also be produced in polycrystalline form at temperatures below 400° C., and in amorphous forms at even lower temperatures.

In some TFET embodiments, at least one of p-type material, channel material, and n-type material is of a different material than the others, such that at least one of p/i or n/i junctions is a heterojunction. In some embodiments, p-type material forms a heterojunction with channel material. In some exemplary n-TFET embodiments, source p-type material has either a type-II (staggered) or type-III (broken) band offset from channel material, which is advantageous for higher tunneling probability and therefore higher on-state drain currents. For embodiments including such a heterojunction, drain n-type material may form a second heterojunction with channel material.

In some embodiments, a thin film transistor (TFT) is fabricated with front-side or back-side processing while another device is fabricated on the opposite side of the TFT. Alternatively, a TFT stratum is bonded to another stratum. As noted above, back-side processing may be limited to lower processing temperatures, making back-side TFTs well-suited to front-side FETs. Any TFTs typically employed in BEOL circuitry as top-levels over front-side FETs, may instead (or in addition) be implemented on a backside of the front-side FETs following the back-side reveal. For some such embodiments, a stacked TFT and FET may include a planar TFT fabricated on the back-side of a non-planar FET. For other such embodiments, a stacked TFT and FET may include a non-planar TFT fabricated on the back-side of a non-planar FET. Because one or more FET terminal may be exposed during the back-side reveal processing (e.g., following methods 1201), a back-side TFT terminal may directly contact a front-side FET terminal, for example as illustrated in FIG. 64B. For TFT embodiments, low-temperature back-side deposition processes may form polycrystalline or amorphous semiconductor films rather than crystalline semiconductor employed in non-TFT device embodiments. Hence, back-side semiconductor (e.g., 5915 in FIG. 64A, 64B) need not be single crystalline, and may instead be polycrystalline or amorphous material. Likewise, source/drain semiconductor (e.g., 6440 in FIG. 64A, 64B) may also be polycrystalline or amorphous. As one example, device layer 5915 may comprise $InGaO_3(ZnO)_5$, often referred to a simply as IGZO.

In some embodiments, a high-voltage transistor is fabricated with front-side or back-side processing while a low-voltage device is fabricated on the opposite side of the high-voltage device. As noted above, double-sided device fabrication may facilitate integration of planar transistors and non-planar transistors. In some embodiments, the planar transistor is configured for high-voltage operation while the non-planar transistor is configured for low-voltage operation. For example, the planar transistor may be dimensioned with a significantly larger gate width than the non-planar transistor. The planar transistor may be also be dimensioned with a significantly larger gate length, and/or greater extrinsic drain length, than the non-planar transistor. In some embodiments, a front-side finFET includes source or drain directly coupled a source or drain of a back-side planar FET. Such a circuit may be implemented with stacked planar/non-planar FETs as illustrated in FIG. 61A, 61B and FIG. 64A, 64B. Coupling between the finFET and planar FET may also be through back-side source contact metallization. In some such embodiments, the back-side source contact metallization is further coupled to back-side interconnect metallization coupling a plurality of such front-side finFET sources to the drain of one back-side planar FET.

Figure 65:
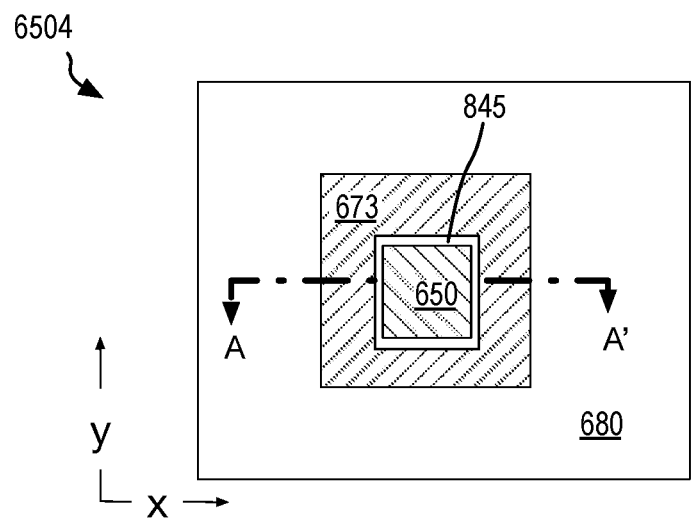
FIG. 65 illustrates a plan view of a vertically-oriented device, in accordance with some embodiments.

In addition to the laterally-oriented back-side devices described above, one or more of the back-side processing techniques described herein may be employed to form vertically-oriented devices, such as, but not limited to, a nanowire FET, TFET, bipolar transistor, or memory cell. For example, semiconductor deposition, or epitaxial growth from seeding surfaces, on both the front side and back side of a core device layer may be employed to additively fabricate a vertically-oriented device having terminals on both the front side and backside of a semiconductor device layer or stack of layers. In addition, or in the alternative, back-side metallization may be deposited on a revealed back-side of a semiconductor layer to electrically couple one or more vertically-oriented device terminal. FIG. 65 illustrates a plan view of an exemplary vertically-oriented transistor structure 6504, in accordance with some exemplary embodiments. Transistor structure 6504 may be fabricated following methods 1201 or 4101, for example, using any known front-side processing techniques supplemented with one or more of the back-side reveal operations described herein followed by one or more of the back-side processing operations described herein.

Figure 66:
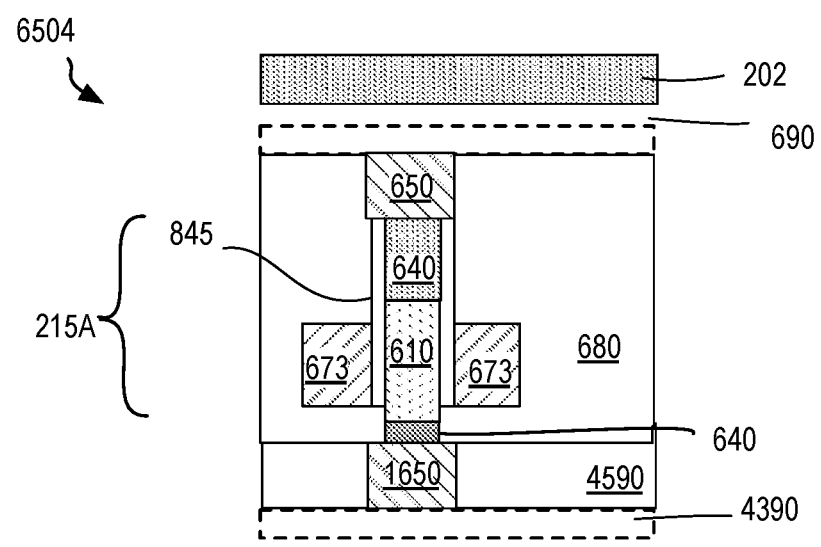
FIG. 66 illustrates a cross-sectional view of the vertically-oriented device shown in FIG. 65, in accordance with some embodiments.

FIG. 66 illustrates a cross-sectional view of transistor structure 6504 along the A-A' line denoted in FIG. 65, in accordance with some vertically-oriented FET embodiments. As shown in FIG. 66, transistor structure 6504 includes a pillar of semiconductor material surrounded on all sides by a gate stack including gate dielectric 845 and gate electrode 673, which may be any of the materials described above, for example. A front-side metallization 650 is disposed on a front-side of the semiconductor pillar. As further shown in FIG. 66, the semiconductor pillar includes source/drain semiconductor 640 disposed over semiconductor body 610. Gate dielectric 845 laterally separates gate electrode 673 from semiconductor body 610, operable as the FET channel. In the illustrated embodiments, front-side device layer 215A includes semiconductor body 610 and source and drain semiconductor 640. A back-side of impurity-doped source (drain) semiconductor 640 is revealed during backside processing, and back-side metallization 1650 is formed, for example as described elsewhere herein. Alternatively, a back side of some other portion of device layer 215A (e.g., semiconductor body 610) is revealed and a back-side device layer then epitaxially grown or otherwise deposited on the revealed semiconductor surface to extend the z-height of the semiconductor pillar. Such epitaxial growth may complete a back side of a single vertically-oriented device or form a separate back-side vertically-oriented device that stack with a front-side vertically-oriented device.

In some embodiments, front-side and back-side processing is employed to fabricate a vertically oriented TFET. Transistor structure 6504 may be a TFET cell, for example, where source semiconductor 640 has a first conductivity type (e.g., n-type) and semiconductor body 610 is intrinsic semiconductor that will function as the channel region. The back-side reveal process then exposes a backside of semiconductor body 610 and a drain semiconductor 640 of a second conductivity type (e.g., p-type) is grown by back-side epitaxy or non-epitaxially deposited (e.g., with a low-temperature process). In some other embodiments, front-side and back-side processing is employed to fabricate a vertically oriented TFT. Transistor structure 6504 may be a TFT, for example, where source semiconductor 640 has a first conductivity type (e.g., n-type) and semiconductor body 610 is intrinsic semiconductor that will function as the channel region. The back-side reveal process then exposes a backside of semiconductor body 610 and a drain semiconductor 640 of the first conductivity type (e.g., n-type) is deposited (e.g., with a low-temperature process).

In some embodiments, front-side and back-side processing is employed to fabricate a memory cell. In some embodiments, the memory cell includes an access transistor and a memory element. In one example, a FET may be fabricated during front-side processing, while a memory device, such as but not limited to a capacitive memory element may be fabricated during back-side processing for a stacked (1T1C) cell. In another example, a FET may be fabricated during front-side processing, while a memory device, such as but not limited to a resistive memory element, may be fabricated during back-side processing for a stacked (1T1R) cell. The resistive element may be an electron spin-based memory device (e.g., including a magnetic or ferroelectric tunneling junction) fabricated during back-side processing. Some of the challenges currently faced by electron spin-based devices pertain to maintaining sufficient thermodynamic stability in the tunnel junction to hold state. Hence, many spin-based memory manufacturing processes limit processing temperatures to some level below that typically needed for transistor fabrication (e.g., 500-800° C.), and even below that typically employed for backend interconnect (e.g., 300° C.). Such restrictions that can make spin-based memory devices difficult to integrate with CMOS (FET) circuitry can be overcome by fabricating the CMOS circuitry to completion during front-side processing, and subsequently revealing the back-side of a subset of the FETs that are to be integrated into a memory cell with a spin-based memory device that is fabricated to completion during back-side processing.

Fabricating a spin-based memory device sufficiently close to FET circuitry is another challenge in some memory technologies. For example, resistance changes in the tunnel device that are to be detected by FET-based sensing circuitry can be vanishingly small and correspondingly susceptible to being swamped by parasitic line resistance if there is too much routing between the FET circuitry and tunnel device. Such difficulty can also be addressed through back-side fabrication of a tunnel device as it may then be fabricated in intimate contact with a terminal of the front-side FET while still isolating the tunnel device from all the front-side CMOS circuitry fabrication by staging the back-side reveal and tunnel device fabrication to follow the CMOS circuitry fabrication.

One example of a tunnel memory device is a spin transfer torque memory (STTM) device, which is a non-volatile memory device that utilizes a phenomenon known as tunneling magnetoresistance (TMR). For a structure including two ferromagnetic layers separated by a thin insulating tunnel layer, it is more likely that electrons will tunnel through the tunnel layer when magnetizations of the two magnetic layers are in a parallel orientation than if they are not (non-parallel or antiparallel orientation). As such, a magnetic tunneling junction (MTJ), typically comprising a fixed magnetic layer and a free magnetic layer separated by a tunneling barrier layer, can be switched between two states of electrical resistance, one state having a low resistance and one state with a high resistance. Restricting both process temperatures and routing resistance may be important for implementing a memory array comprising many such devices.

Figure 67A:
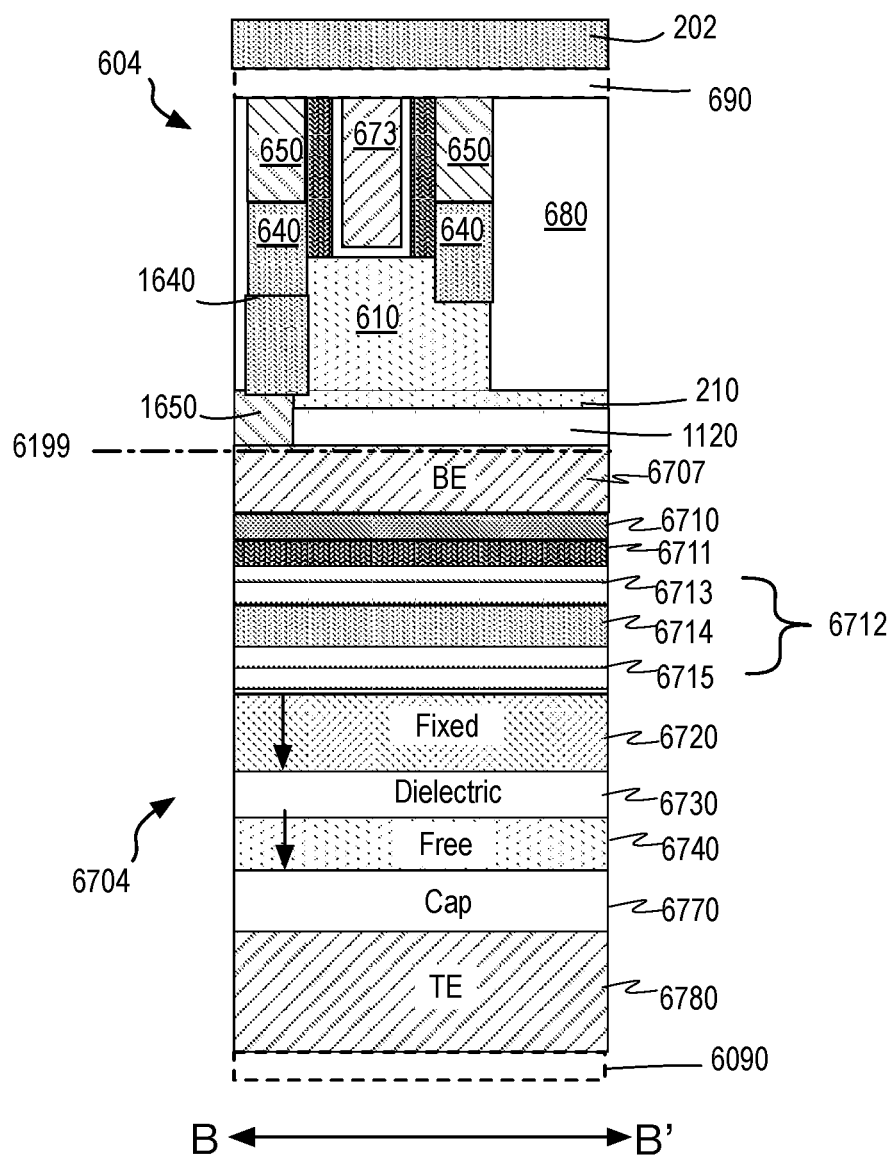
FIG. 67A illustrates a cross-sectional view of a stacked 1T1R memory cell, in accordance with some embodiments.

FIG. 67A illustrates a cross-sectional view of transistor structure 604 along the B-B' plane denoted in FIG. 6, and back-side STTM device 6704, in accordance with some stacked 1T1R embodiments. Applications for such 1T1R cells include embedded memory, embedded non-volatile memory (NVM), magnetic random access memory (MRAM), and non-embedded or stand-alone memories. For these exemplary embodiments, a source or drain terminal of a front-side non-planar transistor structure 604 and an electrode of STTM device 6704 are in direct contact. Such direct contact can be facilitated through selective back-side processing (e.g., back-side formation of source/drain semiconductor 1640 and back-side metallization 1650). Such direct contact can be also facilitated through selective front-side processing (e.g., front-side formation of a deep source/drain semiconductor 640) and back-side metallization 1650. In some such embodiments, a metal comprising titanium interfaces the source or drain contact metallization of transistor structure 604 with a bottom electrode of the STTM device 6704. Alternatively, one or more levels of back-side interconnect routing metallization may be disposed between an electrode of the back-side STTM device and the front-side FET. In FIG. 67A, material layers of STTM device 6704 may either be incrementally built-up through additional back-side processing, or a device stratum including a pre-fabricated STTM device 6704 may be bonded to the back side of Transistor structure 604 (e.g., using any known layer transfer process). Bond interface 6199, for example passing through a bond metal such as Au, is indicative of such a bonded structure.

Figure 67B:
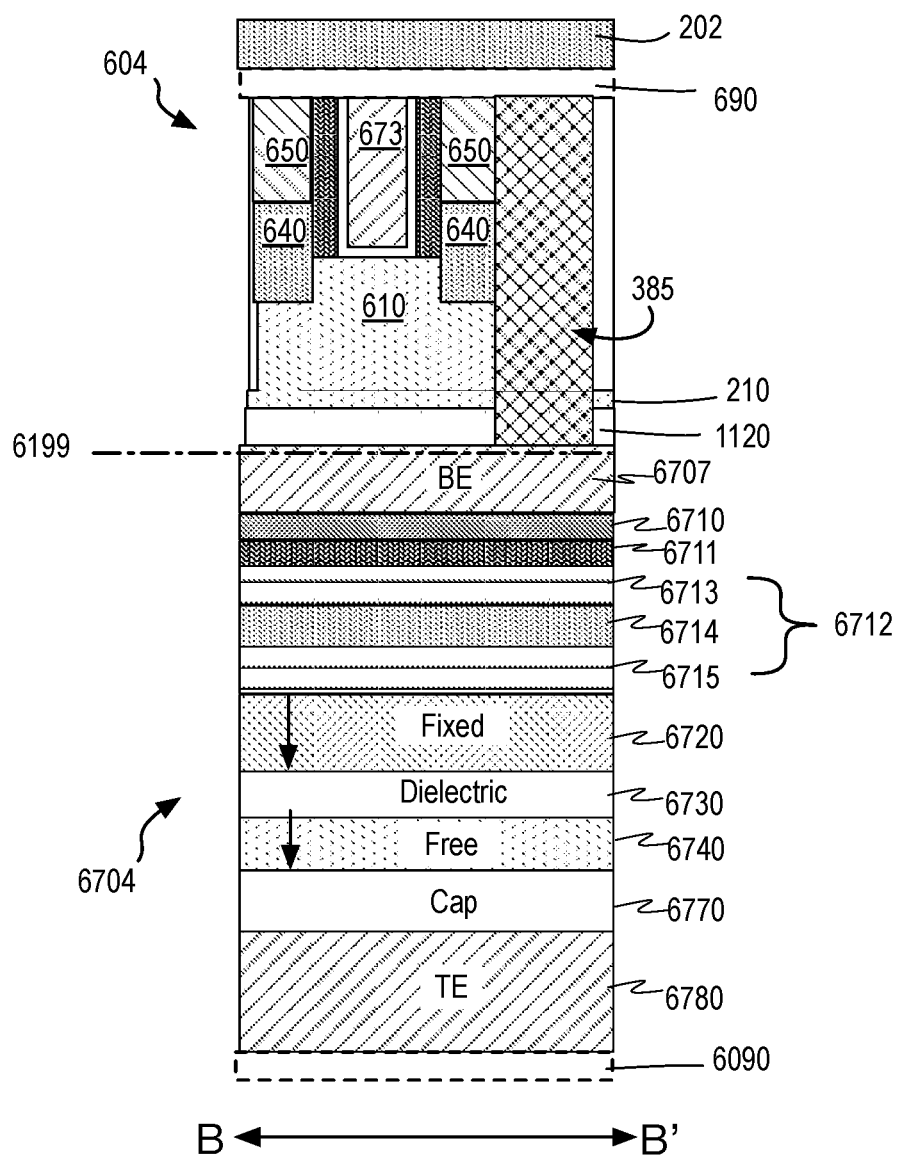
FIG. 67B illustrates a cross-sectional view of a stacked 1T1R memory cell, in accordance with some embodiments.

FIG. 67B illustrates a cross-sectional view of transistor structure 604 along the B-B' plane denoted in FIG. 6, and back-side STTM device 6704, in accordance with some alternative embodiments where STTM device 6704 has been bonded to a revealed back-side surface of transistor structure 604. For such embodiments, rather than making direct contact to a source/drain terminal of transistor structure 604, a filled deep via 385 passing through transistor structure 604 is exposed during the back-side reveal and relied upon to make electrical contact to metal electrode 6707. Following back-side reveal, a bond metal may be deposited on the back-side of transistor structure 604, making contact with filled deep via 385. The bond metal may then be bonded with another bond metal to form bond interface 6199 joining STTM device 6704 to transistor structure 604. STTM device 6704 may then be separated from the donor substrate (not depicted). Filled deep via 385 extends through the entire transistor structure thickness $T_c$ with one end of the deep via metallization in contact with source/drain metallization 650 and another end of the deep via metallization in contact with the bonding metal.

In STTM device 6704 (FIG. 67A or 67B), current-induced magnetization switching may be used to set the bit states. Polarization states of one ferromagnetic layer can be switched relative to a fixed polarization state of the second ferromagnetic layer via the spin transfer torque phenomenon, enabling states of the MTJ to be set by application of current (for example received from a drain of Transistor structure 604). Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnetic layer can be switched by a pulse of current (e.g., in about 1-10 nanoseconds) exceeding a certain critical value, while magnetization of the fixed magnetic layer remains unchanged as long as the current pulse is below some higher threshold associated with the fixed layer architecture.

STTM device 6704 includes a first metal electrode 6707 (e.g., bottom electrode) disposed over intervening layer 1410, which may be any dielectric material, for example. Metal electrode 6707 may be electrically connected to a front-side metal interconnect (e.g., source line) through transistor structure 604 and transistor structure 604 may be further connected to another front-side metal interconnect (e.g., word line). Metal electrode 6707 may comprise a stack or a plurality of material layers. In exemplary embodiments, a surface layer of metal electrode 6707 contacting FET metallization 1650 comprises titanium (Ti). In some such embodiments, the electrode surface layer comprises titanium nitride (TiN), which may have a stoichiometric 1:1 Ti:N lattice composition with Na—Cl crystallinity, or may have a sub-stoichiometric 1:m Ti:N lattice composition where m is less than 1.

STTM device 6704 further includes a SAF stack 6712 disposed over metal electrode 6707. In some exemplary embodiments, SAF stack 6712 includes a first plurality of bilayers 6713 forming a superlattice of ferromagnetic material (e.g., Co, CoFe, Ni) and a nonmagnetic material (e.g., Pd, Pt, Ru). Bi-layers 6713 may include n bi-layers (e.g., n [Co/Pt] bilayers, or n [CoFe/Pd] bilayers, etc.) that are separated from a second plurality of bilayers 6715 (e.g., p [Co/Pt]) by an intervening non-magnetic spacer 6714. The number of bi-layers n and p may be between 2 and 8, for example, and need not be equal. Layer thicknesses within bi-layers 6713 and 6715 may range from 0.1-0.4 nm, for example. Spacer 6714 provides the antiferromagnetic coupling between 6713 and 6715. Spacer 6714 may be a Ruthenium (Ru) layer less than 1 nm thick, for example.

In the exemplary embodiment illustrated, an electrode interface material layer or stack 6710 and a seed layer 6711 are disposed between electrode 6707 and SAF stack 6712. Seed layer 6711 is of a material having suitable composition and microstructure to promote advantageous crystallinity in SAF stack 6712. In some embodiments, seed layer 6711 comprises Pt and may be a substantially pure Pt (i.e. not intentionally alloyed). A seed layer of Pt is well-suited as an underlayer of a Co/Pt-based SAF structure. The Pt seed layer 6711 may have a thickness of 1-5 nm, for example. Electrode interface material layer or stack 6710 is to promote an advantageous FCC structure with (111) texture in seed layer 111. A Pt seed layer often deposits with FCC structure unless strongly templated by an underlayer. The presence of electrode interface material layer/stack 6710 may prevent seed layer from templating its crystal structure based on electrode 6707, such as a surface of TiN. As such, electrode interface material layer/stack 6710 may then be considered a crystal enhancing layer, enhancing the crystallinity of seed layer 6711 (and SAF stack 6712, etc.) relative to the crystallinity achieved when seed layer 6711 is deposited directly on electrode 6707. In accordance with some embodiments, electrode interface material/stack 6710 includes at least one material layer comprising CoFeB. CoFeB tends to have amorphous microstructure as-deposited by physical vapor deposition. Seed layer 6711 (e.g., of Pt), will form a desirable FCC crystal structure with (111) texture in the presence of CoFeB material layer 6710. Subsequent solid-phase epitaxial processes within CoFeB may then template off seed layer 6711, converting the CoFeB from amorphous to FCC with (111) texture after having served to enhance the as-deposited crystallinity of seed layer 6711.

A fixed magnetic material layer or stack 6720 including one or more layer of magnetic material is disposed over SAF stack 6712. A tunneling dielectric material layer 6730 is disposed over fixed magnetic material layer or stack 6720. A free magnetic material layer or stack 6740 is disposed over tunneling dielectric material layer 6730. Free magnetic material layer or stack 6740 includes one or more free magnetic material layers. In the exemplary embodiment illustrated, a dielectric material layer 6770, such as a metal oxide (e.g., MgO, VdO, TaO, WO, MoO, HfO), is disposed over free magnetic material layer/stack 6740. Such a capping layer may be absent for spin-hall effect (SHE) implementations. A second metal electrode 6780 (e.g., top electrode) is disposed over the capping material layer 6770. Metal electrode 6780 may be electrically coupled to a back-side metal interconnect (e.g., bit line). Notably, the order of the material layers 6707-6780 may be inverted relative to transistor structure 604.

In some embodiments, STTM device 6704 is a perpendicular system, where spins of the magnetic layers are perpendicular to the plane of the material layers (i.e., the magnetic easy axis is in the z-direction out of the plane of device footprint). Fixed magnetic layer or stack 6720 may be composed of any material or stack of materials suitable for maintaining a fixed magnetization direction while the free magnetic material stack 6755 is magnetically softer (i.e. magnetization can easily rotate to parallel and antiparallel state with respect to fixed layer). In some embodiments, STTM device 6704 is based on a CoFeB/MgO system, having an MgO tunneling material layer 6730, CoFeB fixed magnetic layer/stack 6720, and CoFeB free magnetic layer(s) 6740. In advantageous embodiments, all CoFeB layers have body-centered cubic (BCC) (001) out-of-plane texture, where texture refers to the distribution of crystallographic orientations within in the layers of STTM device 6704. For at least some such embodiments, a high percentage of CoFeB crystals have the preferred (001) out-of-plane orientation (i.e., the degree of texture is high). In some embodiments, the (001) oriented CoFeB magnetic material layers 6720 and 6740 are iron-rich alloys (i.e., Fe>Co) for increased magnetic perpendicularity. In some embodiments, Fe content is at least 66%. Exemplary embodiments include 20-30% B (e.g., $Co_{20}Fe_{60}B_{20}$). Other embodiments with equal parts cobalt and iron are also possible (e.g., $Co_{40}Fe_{40}B_{20}$). Other magnetic material compositions are also possible for the fixed and/or free magnetic layers, such as but not limited to: Co, Fe, Ni, and non-boron alloys of these metals (e.g., CoFe). Film thickness of fixed and free magnetic layers 6720, 6740 may be 0.1-2.0 nm.

Tunneling material layer 6730 is composed of a material or stack of materials suitable for allowing current of a majority spin to pass through the layer, while impeding current of a minority spin (i.e., a spin filter), impacting the tunneling magneto-resistance associated with STTM device 6704. In some exemplary embodiments, tunneling material layer 6730 is magnesium aluminum oxide (MgAlO). In other embodiments, tunneling material layer 6730 is any material known to be suitable for the present purpose. Tunneling material layer 6730 may further provide a crystallization template (e.g., polycrystalline BCC with (001) texture) for solid phase epitaxy of free magnetic material layer(s) 140 and/or fixed magnetic material layer(s) 6720, particularly for CoFeB/MgO/CoFeB embodiments.

As noted above, a back-side reveal may be performed either at the wafer-level (e.g., methods 101) or selectively (e.g., methods 3801). As also noted, wafer-level back-side reveals may be particularly useful for bonding a stratum of front-side devices (e.g., FETs) to another stratum of devices that have been pre-fabricated in donor substrates. Hence, while some of the discussion above has described how back-side processing may build up a back-side device (e.g., FET, TFET, TFT, STTM) opposite or facing a front-side device, wafer-level bonding of stratum to a revealed back-side is another technique that may generate device stacks. Either of these techniques may be better suited to a particular device stack as a function of the level of compatibility between the processing conditions and/or materials required by the front-side and back-side devices. For example, a back-side device that requires high temperature semiconductor growths or thermal anneals may not be well-suited to incremental fabrication by back-side processing, unless the back-side processing is integrated into frontend operations of the front-side processing.

Low-temperature-compatible devices such as many TFTs, oxide semiconductor TFETs, or STTM devices may be well-suited to their incremental fabrication by back-side processing, however other devices may be more readily integrated through wafer-level back-side bonding. For example, another example of a spin-based memory device is a ferroelectric memory (FEM) in which a ferroelectric tunneling junction (FTJ) includes a FE barrier disposed between two metal electrodes. In such an FEM device, polarization within the ferroelectric material may be controlled to modulate tunneling current across the FTJ in a non-volatile manner. More or less conduction electrons can quantum-mechanically tunnel through the ferroelectric barrier as a function of polarization of the ferroelectric barrier. FEM is an attractive option for advanced electronic memory applications as spin-dependent transport properties may be controlled via a pure electronic mechanism known as the tunnel electroresistance (TER) effect. Successful use of FTJs in a FEM however is again dependent on the junction having sufficient thermodynamic stability to hold a state. There are indications that nanostructural imperfections within the FE material layer, and at interfaces of that material layer, detract significantly from spontaneous polarization, resulting in lower junction stability. Hence, to form a FEM that fully leverages the TER effect, very precise high-temperature epitaxial film growths may be needed. Yet it is unclear how such high-quality ferroelectric material is to be provided in conjunction with operable transistors in a manufacturable memory bit-cell, and/or how such a memory could be embedded within a System-on-Chip (SoC) that further includes extensive logic (CMOS) circuitry. Fabricating such devices during back-side processing, such as that described herein may overcome such challenges. For example, following reveal of a transistor back-side, an FTJ stack separately formed on a donor substrate may be intimately contacted to a terminal of a FET, or any intervening interconnect metallization to form a stacked spin-based memory bit cell including one transistor and one spin-based bi-stable or multi-state resistor.

Figure 68A:
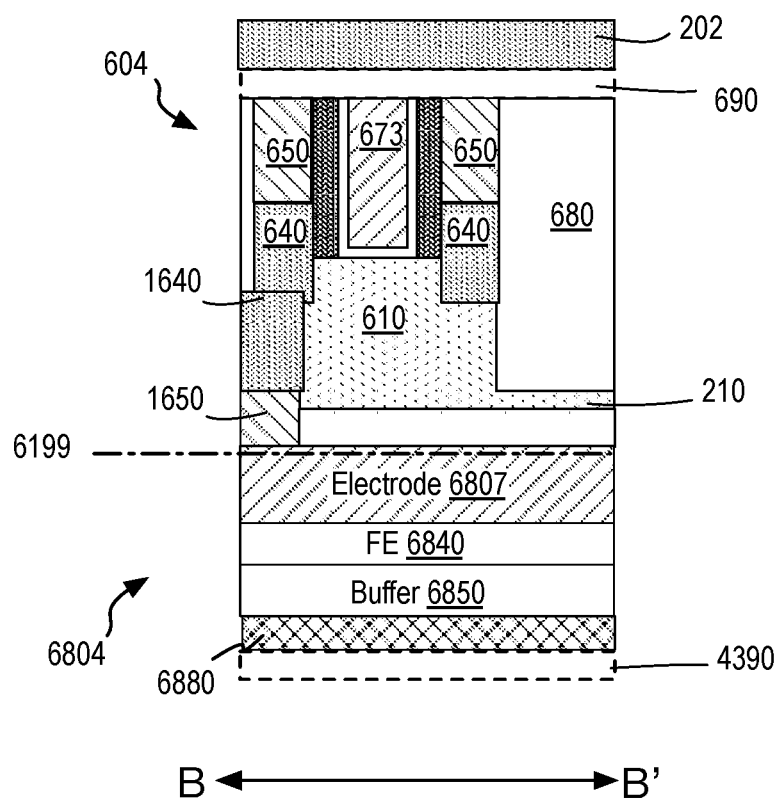
FIG. 68A illustrates a cross-sectional view of a stacked 1T1R memory cell, in accordance with some embodiments.

FIG. 68A illustrates a cross-sectional view of transistor structure 604 along the B-B' plane denoted in FIG. 6, and back-side STTM device 6804, in accordance with some stacked 1T1R embodiments. For these exemplary embodiments, a source or drain terminal of a front-side non-planar Transistor structure 604 and an electrode of STTM device 6704 are in direct contact. Such direct contact can be facilitated through selective back-side processing (e.g., back-side growth of source/drain semiconductor 1640 and back-side interconnect metallization 1650). Alternatively, one or more levels of back-side interconnect routing metallization may be disposed between an electrode of the back-side STTM device and the front-side FET. In FIG. 68A, to accommodate high epitaxial temperatures associated with FE tunneling layer 6840, a device stratum including a pre-fabricated STTM device 6804 may be bonded to the back side of Transistor structure 604 (e.g., using any known layer transfer process). Bond interface 6199, for example passing through a bond metal such as Au, is indicative of such a bonded structure.

Figure 68B:
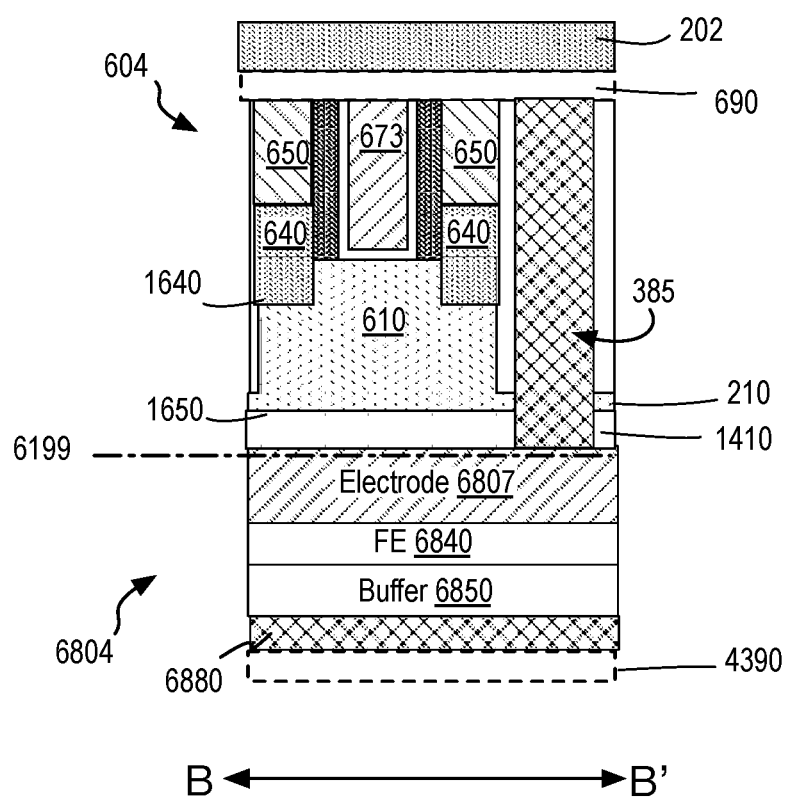
FIG. 68B illustrates a cross-sectional view of a stacked 1T1R memory cell, in accordance with some embodiments.

FIG. 68B illustrates a cross-sectional view of transistor structure 604 along the B-B' plane denoted in FIG. 6, and back-side STTM device 6804, in accordance with some alternative embodiments where STTM device 6804 has been bonded to a revealed back-side surface of transistor structure 604. For such embodiments, rather than making direct contact to a source/drain terminal of Transistor structure 604, a filled deep via 385 passing through Transistor structure 604 is exposed during the back-side reveal and relied upon to make electrical contact to STTM electrode 6807. Following back-side reveal, a bond metal may be deposited on the back-side of transistor structure 604, making contact with filled deep via 385. The bond metal may then be bonded with another bond metal to form bond interface 6199 joining STTM device 6804 to Transistor structure 604. STTM device 6804 may then be separated from the donor substrate (not depicted). Filled deep via 385 extends through the entire transistor structure thickness $T_c$ with one end of the deep via metallization in contact with source/drain metallization 650 and another end of the deep via metallization in contact with the bonding metal.

In STTM device 6804 (FIG. 68A or 68B), a ferroelectric tunneling layer 6840 is disposed between a metal electrode 6807 proximate to the FE tunneling layer 6840 and another metal electrode 6880 that is proximate to a buffer layer 6850. In some embodiments, metal electrode 6880 is electrically coupled to a back-side metal interconnect (e.g., bit line). Metal electrode 6807 is electrically connected to a front-side metal interconnect (e.g., source line) through Transistor structure 604. Transistor structure 604 may be further connected to another front-side metal interconnect (e.g., word line).

FE tunneling layer 6840 may be of any material known to have a ferroelectric phase and display the TER effect above some minimum operating temperature, such as room temperature (e.g., 25° C.). In some embodiments, FE tunneling layer 6840 has perovskite crystal structure and is monocrystalline. The spontaneous polarization field of FE tunneling layer 6840 may be aligned orthogonally to interfaces of FE tunneling layer 6840. Exemplary FE tunneling layer materials include, but are not limited to, $Bi_4Ti_3O_{12}$, $SrBi_2Ta_2O_9$, $SrRuO_3$, $(Ba,Sr)TiO_3$, $BiMnO_3$, $BiFeO_3$, $PbTiO_3$, and $Pb(Zr,Ti)O_3$. In some advantageous embodiments, FE tunneling layer 6840 is $BaTiO_3$ (i.e., BTO). In some embodiments, FE tunneling layer 6840 has a thickness less than 5 nm, advantageously less than 3 nm, and more advantageously less than 2 nm (e.g., 1-1.5 nm). For exemplary BTO embodiments, one perovskite unit cell is ~0.4 nm, so the FE tunneling layer 6840 may have a thickness as little as 2-3 BTO unit cells.

FE tunneling layer 6840 is in direct contact with buffer layer 6850. Buffer layer 6850 may have many functions, such as, but not limited to, maintaining a high quality crystal interface with FE tunneling layer 6840, setting a work function difference at the interface with FE tunneling layer 6840, tuning strain within FE tunneling layer, and facilitating transfer of FE tunneling layer 6840. In some embodiments, buffer layer 6850 is part of the same single crystal as FE tunneling layer 6840, but is of a different composition. For example, buffer layer 6850 may also have perovskite crystal structure. In other embodiments, buffer layer 6850 has different crystallinity than FE tunneling layer 6840, such as cubic rather than tetragonal (perovskite). Buffer layer 6850 need not be a FE material and may be a paraelectric, for example. In some embodiments, buffer layer 6850 is of a material having a different lattice constant of than that of FE tunneling layer 6840. In some embodiments, buffer layer 6850 has a smaller lattice constant FE tunneling layer 6840. The smaller lattice constant may beneficially strain the FE tunneling layer 6840, advantageously increasing spontaneous polarization associated with the FTJ. For such embodiments, FE tunneling layer 6840 may be pseudomorphically strained to match the lattice constant of buffer layer 6850. Exemplary buffer layer materials include, but are not limited to, $SrTiO_3$, $LaGaO_3$, $DyScO_3$, $GdScO_3$, $SmSCO_3$, $LaAlSrTi$, and $KTaO_3$. In some advantageous embodiments where FE tunneling layer 6840 is BTO, buffer layer 6850 is (La, Sr)MnO_3 (i.e., LSMO), which also has perovskite crystal structure. Buffer layer 6850 may be advantageously doped to reduce electrical resistivity, but in exemplary embodiments the specific resistivity of the material employed for buffer layer 6850 is significantly higher the specific resistivity of metal electrodes 6897, 6680. In some embodiments, buffer layer 6850 is no more than 100 nm, is advantageously less than 50 nm, and more advantageously less than 25 nm in thickness.

Metal electrode 6807 may be any metallic material known to form an FTJ with FE tunneling layer 6840. Metal electrode 6807 is advantageously polycrystalline or amorphous, not monocrystalline. Polycrystalline metallization may have texture, with the population of crystal domains favoring a particular orientation relative to the crystal orientation of FE tunneling layer 6840. Metal electrode 6807 may be an elemental metal, an alloy thereof, an oxide, or a nitride thereof. Metal electrode 6807 may have a specific resistivity less than half that of buffer layer 6850. In some embodiments, metal electrode 6807 is a ferromagnetic (FM) material, such as Co, Fe, or an alloy thereof. In alternative embodiments, metal electrode 6807 is Pt, $In_2O_3$, or $IrO_2$, any of which may advantageously reduce the depolarization field.

Metal electrode 6880 may also be polycrystalline or amorphous. Polycrystalline forms of metal electrode 6880 may also have texture, with the population of crystal domains favoring a particular orientation relative to the crystal orientation of buffer layer 6850. Metal electrode 6880 may be an elemental metal, an alloy thereof, an oxide, or a nitride thereof. Metal electrode 6880 may have a specific resistivity less than half that of buffer layer 6850. In some exemplary embodiments, metal electrode 6880 is Co or Cu, or another metal of having a comparable specific resistivity. Metal electrode 6880 may be of any thickness.

Figure 69:
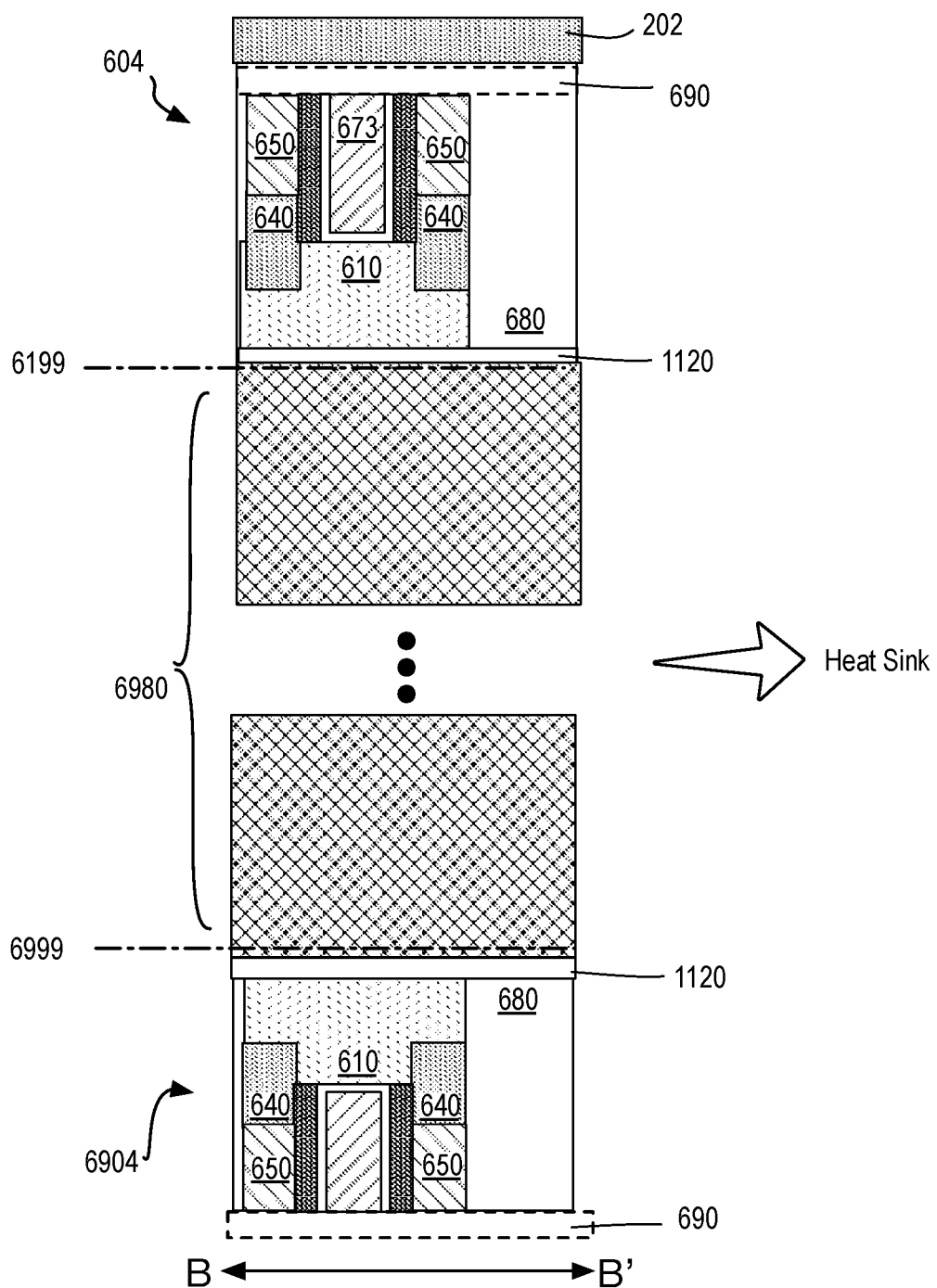
FIG. 69 illustrates a cross-sectional view of a stacked device stratum with an intervening thermal conduit, in accordance with some embodiments.

In some embodiments, a revealed back side of a device stratum is bonded to a thermal conduit, which may be further coupled to a heat sink adjacent to a footprint of the device stack providing a lateral thermal conduit capable of conveying heat generated during the operation of devices in the stratum. A second device stratum may be similarly bonded to an opposing side of the thermal conduit, for example as further illustrated in FIG. 69, which is a cross-sectional view along the B-B' also illustrated in FIG. 6. In FIG. 69, a first device stratum including transistor structure 604 is bonded to a thermal conduit 6980, for example with a bond metal deposited on the revealed backside of Transistor structure 604 that forms a bond interface 6199 with thermal conduit 6980. Depending on the conductivity of front-side structures exposed on the back-side, one or more insulative material layers may be disposed between the backside of transistor structure 604 and the bond metal. For example, in FIG. 69, back-side isolation dielectric 1120 is in contact with a revealed back-side of semiconductor body 610, electrically insulating semiconductor regions of transistor structure 604 from the bond metal and thermal conduit 6980.

Thermal conduit 6980 may be of any material with suitable thermal conductivity, such as any material having better thermal conductivity than crystalline silicon, for example. In some embodiments, thermal conduit 6980 is a bulk material, such as an elemental metal or alloyed metal, and is functional as a heat spreader. In other embodiments, thermal conduit 6980 has more complex prefabricated structure, and is functional for example as a heatpipe. Thermal conduit 6980 may be of any thickness. For some exemplary embodiments where thermal conduit 6980 is a homogenous metal slab substrate, it has thickness between 20 μm and 300 μm.

A second device stratum may be further bonded to a second side of a back-side thermal conduit. For such embodiments, the thermal conduit then serves as a core for pairs of device strata. The paired device strata may be substantially identical, for example both including transistor structures (e.g., 604 and 6904 shown in FIG. 69). Alternatively, the paired device strata may be distinct (e.g., with first device stratum including DRAM capacitor structures while the second device stratum includes access transistor structures). In the example of FIG. 69, FET cell 6904 has a back side bonded to the second side of thermal conduit 6980, with bond interface 6999 substantially mirroring that of bond interface 6199. With thermal conduit 6980 disposed between the device strata, lateral heat conduction (e.g., along the B-B' plane) is improved relative to direct device stacking where a first device is in direct contact with another (e.g., FIG. 61A-68B). Following singulation of the device strata, thermal conduit 6980 may then be further coupled to a heat sink disposed on a host adjacent to the stratified die.

Notably, electrical test of device structures can be facilitated by revealing back-side structures using techniques discussed herein. The back-side structure may include any suitable structure for testing one or more transistor devices, electrical devices, test devices, or the like. For example, a back-side structure as used herein with respect to contact by an electrical tester is any suitable conductive structure or element that provides a contact for a conductor, a prober, a probe element, a conductive pin, or the like of an electrical tester or electrical test apparatus. The back-side structure may further provide or connect to a routing, a trace, a metallization, or the like such that the back-side structure provides electrical coupling to a terminal of the transistor device, the electrical device, the test device, multiple such terminals, or the like. As used herein, a structure such as a back-side structure or a front-side structure to provide electrical coupling to a terminal of a device or terminal indicates the back-side or front-side structure is a continuous portion of the terminal (e.g., the back- or front-side structure and the terminal are the same material), the back- or front-side structure is contiguous with respect to the terminal (e.g., the back- or front-side structure and the terminal are in direct contact), or the back- or front-side structure is electrically coupled to the terminal (e.g., there is an electrical routing, trace, wiring or the like between the back- or front-side structure and the terminal). A back-side structure may be exposed via a back-side of the die using any technique or techniques suitable discussed herein. Similarly, a front-side structure may be exposed via a front-side of the die using any suitable technique or techniques discussed herein. Such back-side structures and/or front-side structures may provide local coupling (e.g., to a single device under test) or global coupling (e.g., to multiple devices under test).

For example, electrical test of a die may include electrical test of a transistor device (e.g., a planar or non-planar transistor) having a source terminal, a drain terminal, and a gate terminal. In an embodiment, the source terminal is electrically coupled to the electrical tester via a back-side structure exposed by a back-side of the die. In an embodiment, the drain terminal is electrically coupled to the electrical tester via a back-side structure exposed by a back-side of the die. In another embodiment, the gate terminal is electrically coupled to the electrical tester via a back-side structure exposed by a back-side of the die. Furthermore, during the contacting of the back-side structure, a front-side structure may be contacted such that the front-side structure provides electrical coupling to another terminal of the transistor device, the electrical device, the test device, or the like. In either back-side only testing or back and front-side contemporaneous testing, during the contacting of the terminals of the transistor device, the electrical device, the test device, or the like, an electrical test is executed on the die to generate electrical test data, which may be stored to storage (e.g., computer memory), transmitted to a remote device, or the like. The electrical coupling of such a device may be provided such that coupling is only to the device or such that coupling is made to several devices simultaneously or such that coupling is made to one or more terminals (e.g., a source terminal) that service several devices while coupling is made to another terminal (e.g., a gate electrode) that services only the particular device under test.

In an embodiment, a method of electrical testing a die includes aligning a back-side structure exposed by a back-side of the die to a first conductive pin of multiple conductive pins of a prober of an electric tester. The first conductive pin is then contacted to the back-side structure. The back-side structure may be any suitable back-side structure discussed herein and may provide electrical coupling to any device or devices for testing such as a planar transistor device, a non-planar transistor device, or the like. In an embodiment, the back-side structure is a back-side source or drain contact metallization. In an embodiment, the back-side structure is a back-side gate electrode. In an embodiment, the back-side structure is a metallization structure of a first back-side metallization layer (e.g., a metal 1 layer) such that an electrical routing is provided to a source terminal, a drain terminal, or a gate terminal of the transistor. In an embodiment, the back-side structure provides electrical coupling to a transistor terminal of a transistor of the die. An electrical test algorithm is then executed on the die through at least the first conductive pin to generate electrical test data corresponding to the die (e.g., to the device(s) of the die being tested). For example, the electrical test data may be stored to electronic storage of the electric tester or other device. In parallel or in series, any number of devices of the die may be tested or any number of devices across two or more dice may be tested. In an embodiment, all the subject devices (e.g., devices to be tested) of a die may be tested simultaneously using either back-side only testing or back and front-side contemporaneous testing. In an embodiment, subject devices across multiple dice (e.g., two or more) may be tested simultaneously using either back-side only testing or back and front-side contemporaneous testing.

Such back-side reveal based electrical test techniques may be provided before completion of die processing or at end of line (e.g., end of front line processing). For example, if multiple back-side metal layers are to be provided in the final device, electrical test may be performed after a first metal layer (e.g., metal 1) of multiple metal layers (e.g., 8 metal layers) is applied such that the first metal layer provides the back-side structure(s) for electrical test as described herein. In addition, or in the alternative, electrical test may be performed after completion of a back-side metal stack (e.g., the multiple metal layers and intervening via layers) such that the final metal layer provides the back-side structure(s) for electrical test (e.g., the back-side structure(s) are in the final metal layer or the like).

Furthermore, in some embodiments, such electrical testing (e.g., contacting a back-side structure for the execution of an electrical test algorithm), may include contemporaneously contacting one or more front-side structures. For example, a front-side structure exposed by a front-side of the die may be aligned to a conductive pin of multiple pins of another prober of the electrical tester. For example, one prober may be electrically coupled to the front-side of the die and another prober may be electrically coupled to the back-side of the die during the execution of the electrical test algorithm. The conductive pin of the front-side prober may then be contacted to the front-side structure contemporaneously with contacting the conductive pin of the back-side prober to the back-side structure discussed above. The front-side structure may thereby provide electrical coupling to a second terminal of the device under test and the electrical test algorithm may be executed through the front- and back-side conductive pins to generate the electrical test data.

The front-side structure contacted by the front-side prober pin may be any suitable structure and may provide electrical coupling to any suitable terminal of the device under test. In an embodiment, the device under test is a transistor device, the back-side structure provides electrical coupling to a source terminal and the front-side structure provides electrical coupling to a gate terminal or a drain terminal. In an embodiment, the device under test is a transistor device, the back-side structure provides electrical coupling to a source terminal and the front-side structure provides electrical coupling to a gate terminal such that a second front-side structure (coupled to another front-side prober pin) provides electrical coupling to a drain terminal. In an embodiment, the device under test is a transistor device, the back-side structure provides electrical coupling to a gate terminal and the front-side structure provides electrical coupling to a source terminal or a drain terminal.

The front-side and back-sides of the die being tested may be exposed for electrical test using any suitable technique or techniques. In an embodiment, electrical test may be performed at wafer level (e.g., prior to dicing) and, for the purpose of support, the wafer may have a host substrate over a front-side thereof such that the host substrate is over the front-side of the die being tested. In such embodiments, the front-side structure being contacted by the conductive pin may be a metallization structure of the host substrate such that the metallization structure and/or a trace or wiring electrically coupled to the metallization structure provides electrical coupling to the device terminal under electrical test. That is, the host substrate may include routing for electrical testing of the die over which the host substrate is disposed. In other embodiments with such host substrates, the host substrate may include one or more openings to provide for the conductive pin to contact an underlying front-side structure such as a device terminal itself or a metallization structure of a metallization layer disposed over the device terminal. In other embodiments, a host substrate may not be provided during electrical test. In such embodiments, metallization layers built up over the front-side of the dice (e.g., the wafer) may provide mechanical support during electrical test. For example, front-side metallization layers (e.g., 8 metallization layer or the like and corresponding via layers and insulation materials) may be built up, a back-side of the die may be revealed (either with or without a front-side support structure such as a host substrate), and the metallization layers may provide support during electrical test via the front-side and back-side as discussed.

Figure 70:
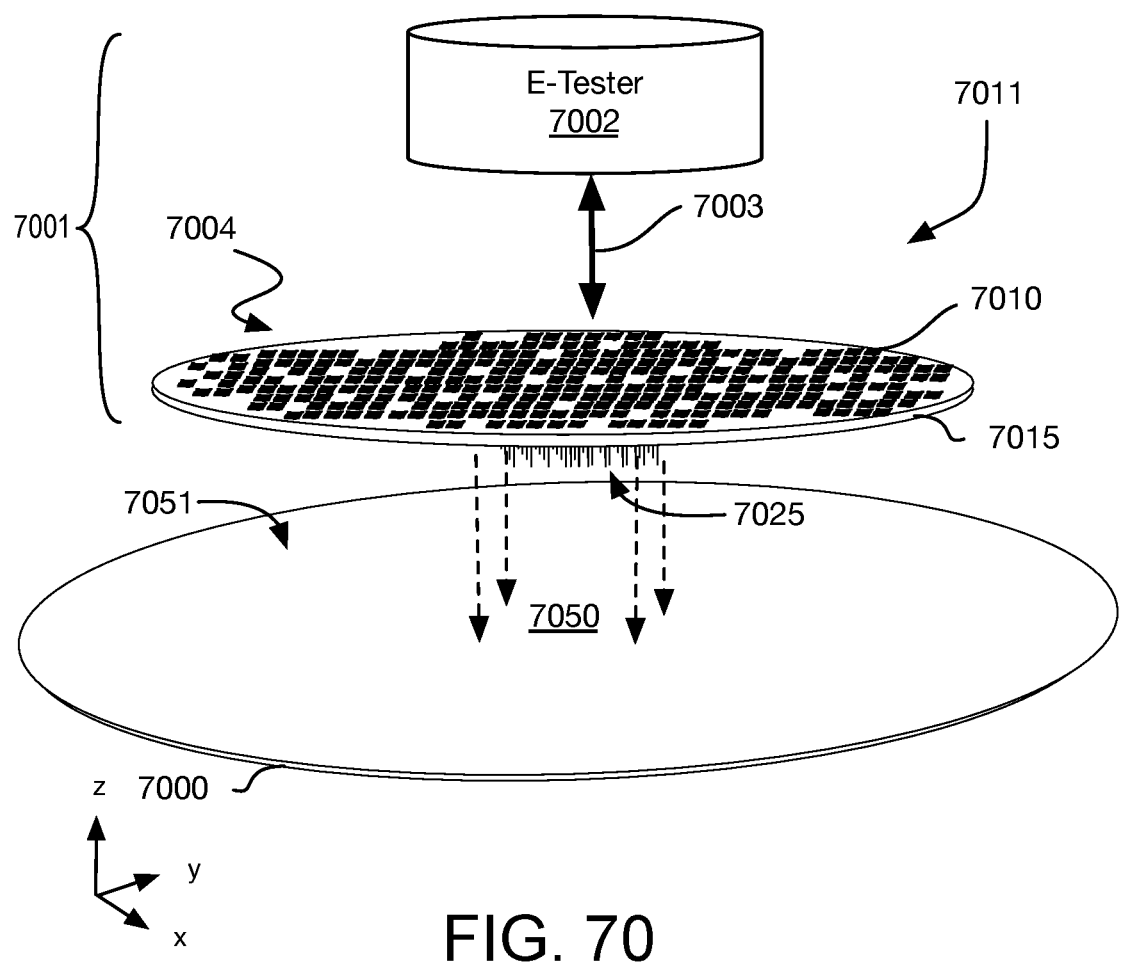
FIG. 70 is an isometric view of an electrical testing apparatus testing a test die via a back-side, in accordance with some embodiments.

FIG. 70 is an isometric view of an electrical testing apparatus 7001 testing a test die 7050 via a back-side 7051, in accordance with some embodiments. As shown, electrical testing apparatus 7001 includes an electrical tester (E-tester) 7002 electrically coupled to a prober 7011 that includes a space transformer 7004. In some embodiments, electrical tester 7002 is commercially available automated test equipment (ATE) configured for functional, performance, and/or stress testing of an IC. In an embodiment, electrical tester 7002 includes storage (e.g., computer memory for storing electrical test data) and/or communications devices to transmit electrical test data to a remote device. As shown, an electrical coupling 7003 is provided between electrical tester 7002 and space transformer 7004. Electrical coupling 7003 may be provided using any suitable structures and techniques such as using a prober Interface Test Adapter (ITA) or the like. As shown, space transformer 7004 further provides electrical connections between electrical coupling 7003 and back-side 7051 of test die 7050. In the illustrated embodiment, space transformer 7004 includes a substrate 7015, and electrical coupling 7003 makes electrical connections to a metallization 7010 disposed on a first side of substrate 7015. Space transformer 7004 further includes conductive trace routing (not shown) electrically coupling metallization 7010 to a probe pin array 7025 extending from a second side of substrate 7015. Substrate 7015 may further include additional circuitry to adapt signals between the electrical tester 7002 and test die 7050. In some exemplary embodiments, substrate 7015 is an organic polymer, which may advantageously facilitate fabrication of probe pin array 7025.

As shown in FIG. 70, a back-side 7051 of test die 7050 and other dice of a wafer 7000 to be tested may be exposed to probe pin array 7025 of electrical testing apparatus 7001. For example, back-side 7051 of test die 7050 may include back-side structures (not shown in FIG. 70) that may be electrically contacted by conductive pins of probe pin array 7025. The back-side reveal techniques discussed herein may advantageously provide for the reveal of back-side structures for electrical testing of test die 7050 such that the back-side structures may be readily contacted by probe pin array 7025 as is further illustrated and discussed herein. For example, conductive pins of probe pin array 7025 may access local (e.g., single device level) terminals by reveal via back-side 7051.

During an electrical die testing operation, back-side structures (e.g., test points) of test die 7050 are aligned with probe pin array 7025 and brought into electrical contact with probe pin array 7025. Such alignment and electrical contact may be performed using any suitable technique or techniques such as automated test equipment handler techniques. In some embodiments, back-side structures exposed by back-side 7051 of test die 7050 are brought into contact with probe pin array 7025 and an electrical test algorithm is executed on test die 7050 (e.g., test devices of test die 7050) through probe pin array 7025 to generate electrical test data. As shown, in some embodiments, electrical testing apparatus 7001 includes space transformer 7004 to provide connection between electrical tester 7002 and test die 7050. In other embodiments, electrical testing apparatus 7001 includes a test die socket or similar structure to provide connection between electrical tester 7002 and test die 7050.

As is discussed further herein, any suitable back-side structure of test die 7050 may be electrically contacted by one or more pins of probe pin array 7025. In some embodiments, testing of devices of test die 7050 may be performed entirely via back-side 7051 of test die 7050. In other embodiments, back-side and front-side structures of test die 7050 may be simultaneously contacted during the electrical test algorithm is executed on test die 7050.

Figure 71:
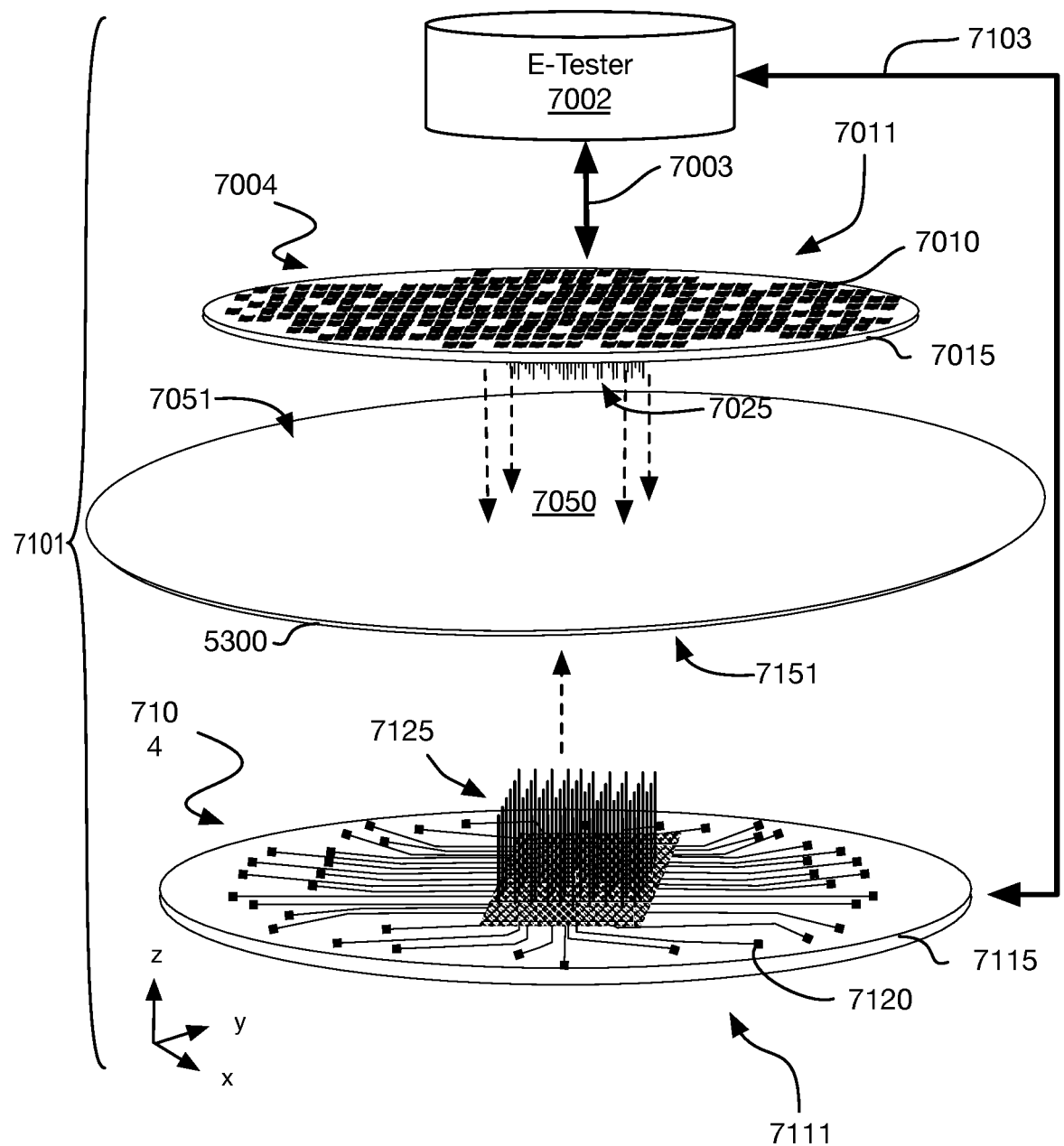
FIG. 71 is an isometric view of an electrical testing apparatus testing test die simultaneously via a back-side and a front-side, in accordance with some embodiments.

FIG. 71 is an isometric view of an electrical testing apparatus 7101 testing test die 7050 simultaneously via back-side 7051 and front-side 7151, in accordance with some embodiments. As shown, electrical testing apparatus 7101 includes electrical tester 7002 electrically coupled to prober 7011 including space transformer 7004 and a prober 7111 including a space transformer 7104. Electrical testing apparatus 7101 may be an automated test equipment configured for functional, performance, and/or stress testing of an IC using a simultaneous front- and back-side test. As discussed, electrical tester 7002 may include storage and/or communications devices to store and/or transmit electrical test data. As shown, electrical coupling 7003 is provided between electrical tester 7002 and space transformer 7004 and an electrical coupling 7103 is provided between electrical tester 7002 and space transformer 7104. Electrical couplings 7003, 7103 may be provided using any suitable structures and techniques such as using a prober Interface Test Adapter or the like. Space transformer 7004 may provide any connections and have any characteristics as discussed herein. Also as shown, space transformer 7104 provides electrical connections between electrical coupling 7103 and front-side 7151 of test die 7050. In the illustrated embodiment, space transformer 7004 includes a substrate 7115, and electrical coupling 7103 makes electrical connections to a metallization (not shown) disposed on a first side of substrate 7115. Space transformer 7104 further includes conductive trace routing 7120 (or metallization) electrically coupling the metallization to a probe pin array 7125 extending from a second side of substrate 7115. As with substrate 7015, substrate 7115 may further include additional circuitry to adapt signals between the electrical tester 7002 and test die 7050 and substrate 7115 may be organic polymer to facilitate fabrication of probe pin array 7025. However, substrates 7015, 7115 may include any suitable material or materials (which may be the same or different with respect to one another).

As shown in FIG. 71, back-side 7051 of test die 7050 and other dice of a wafer 7000 to be tested may be exposed to probe pin array 7025 simultaneously with front-side 7151 of test die 7050 and other dice of a wafer 7000 to be tested being exposed to probe pin array 7125. For example, back-side 7051 of test die 7050 may include back-side structures (not shown in FIG. 71) that may be electrically contacted by conductive pins of probe pin array 7025 and front-side 7151 of test die 7050 may include front-side structures (also not shown in FIG. 71) that may be electrically contacted by conductive pins of probe pin array 7125.

During an electrical die testing operation, back- and front-side structures (e.g., test points) of test die 7050 are aligned and brought into electrical contact with probe pin array 7025 and probe pin array 7125, respectively. Such alignment and electrical contact may be performed using any suitable technique or techniques such as automated test equipment handler techniques or the like. For example, back-side structures exposed by back-side 7051 of test die 7050 and front-side structures exposed by front-side 7151 of test die 7050 are contemporaneously brought into contact with probe pin array 7025 and probe pin array 7125, respectively, and an electrical test algorithm is executed on test die 7050 through the arrays of conductive probe pins to generate electrical test data, which may saved in storage of electrical tester 7002 and/or transmitted to a remote device (not shown). In the illustrated embodiment, electrical testing apparatus 7101 includes space transformer 7004 and space transformer 7104 to provide connection between electrical tester 7002 and test die 7050. In other embodiments, in place of either or both of space transformer 7004 and space transformer 7104, test die socket(s) or similar structure(s) may be provided to provide connection between electrical tester 7002 and test die 7050.

Figure 72:
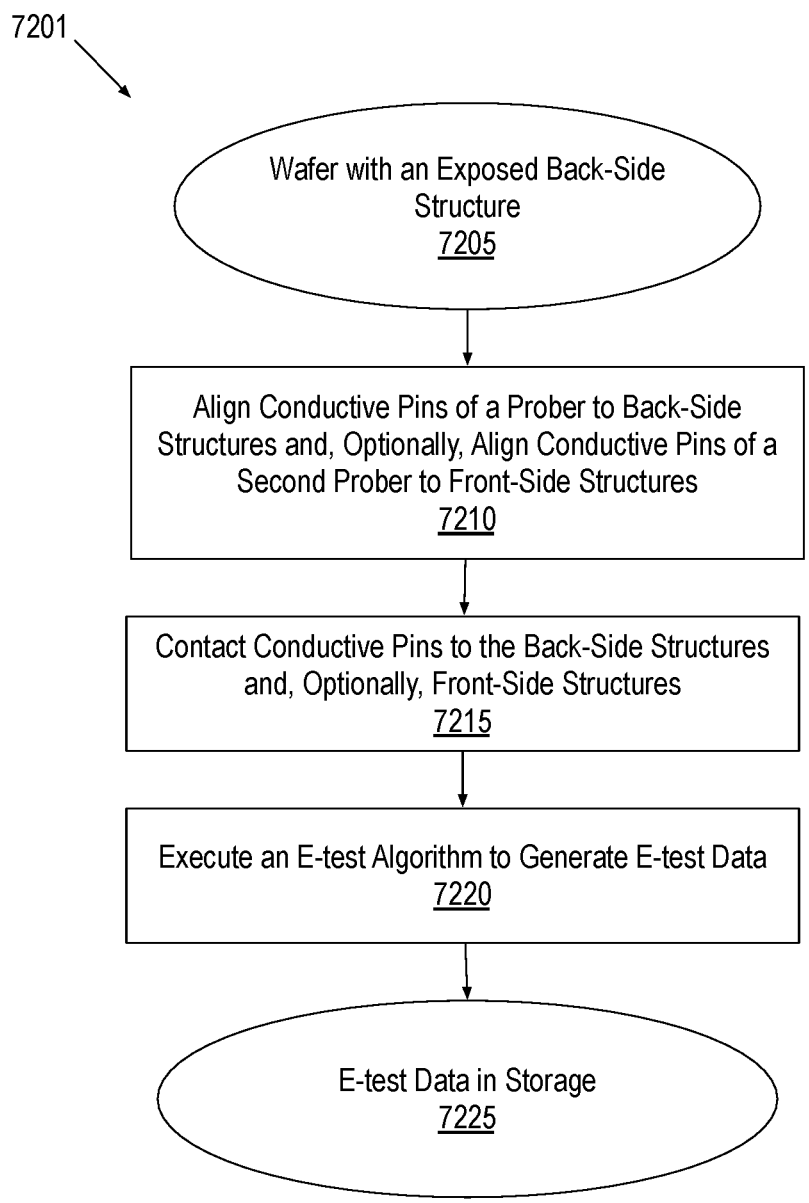
FIG. 72 is a flow diagram illustrating an electrical test processing method, in accordance with some embodiments.

FIG. 72 is a flow diagram illustrating an electrical test processing method 7201, in accordance with some embodiments. Method 7201 may be practiced at the wafer-level. In some exemplary embodiments, a large substrate (e.g., 300 or 450 mm diameter) wafer may be processed through method 7201. For example, wafer 7000 including test die 7050 and other dice to be tested may be processed through method 7201. As used herein, the term test die is used to signify a die that is to be tested or is under test. The device or structure of the test die to be tested may be integrated in the die or provided separately either in a field portion or scribe portion of the test die or the like. Furthermore, the device or structure of the test die to be tested may be any suitable device or structure such as a transistor device, an electrical device, a test device, a test patch, a test material, or the like. Electrical test of the device or structure is performed by electrically coupling an electrical tester to one or more terminals of the device or structure. Such electrical coupling is provided via a back-side structure and/or a front-side structure of the test die to be tested.

Method 7201 begins at operation 7205 with a wafer including an exposed back-side structure of a die. For example, the wafer may include a die for electrical testing such that the die includes a device (e.g., a transistor device) for testing. A back-side structure exposed by a back-side of the die is or provides electrical coupling to a terminal of the device (e.g., a transistor terminal of a transistor device) for testing. In some embodiments, the exposed back-side structure is a terminal of the device or structure to be tested. For example, if the device to be tested is a transistor device (e.g., a planar or non-planar device), the exposed back-side structure may be a source terminal, a drain terminal, a gate terminal, a source metallization, a drain metallization, a gate metallization, or any combination thereof. If the device to be tested is a test device (e.g., a chain of electrically coupled fins, material samples for test, or the like), the exposed back-side structure may be a terminal thereof.

As one example, in a transistor device (e.g., a FET transistor) of a test die, the exposed back-side structure is a source metallization of the FET. In an embodiment, the exposed back-side structure is a metallization structure contiguous with the terminal. In other embodiments, the exposed back-side structure is a metallization structure of a metallization layer disposed over the transistor device or test device such that the metallization layer provides selective routing from the metallization structure to a terminal. For example, the metallization structure and the terminal may be contiguous in that they are either in electrical contact with one another or in electrical contact with any number of intermediary conductive materials. For example, the metallization structure may be a structure of a metal 1 layer or the like and electrical contact or coupling to a terminal may be made via the following sequence: metallization structure of metal 1, contact, terminal metallization, terminal. In another example, the metallization structure is a structure of a final metal layer (e.g., metal 8 or the like) and electrical contact or coupling to a terminal may be made via the following sequence: metallization structure of metal 8, routing through lower level metal and contact layers, terminal metallization, terminal. Any suitable electrical coupling between the metallization structure and the terminal may be provided.

Method 7201 continues at operation 7210 where conductive pins of a prober are aligned with corresponding exposed back-side structures of the die received or generated at operation 7205. The conductive pins of the prober may be aligned to corresponding exposed back-side structures using any suitable technique or techniques such as registration techniques or the like. For example, a back-side structure exposed by a back-side of the die is aligned to a conductive pin of multiple conductive pins of a prober of an electrical test apparatus. As shown, optionally, conductive pins of a second prober may be aligned with corresponding exposed front-side structures of the die received or generated at operation 7205. For example, a front-side structure exposed by a front-side of the die may be aligned to a second conductive pin of multiple conductive pins of a second prober of the electric tester. For example, method 7201 may provide either back-side only electrical test or simultaneous back- and front-side electrical test.

In examples where simultaneous back- and front-side electrical test is performed, the exposed front-side structures may be any suitable structures such as device terminals themselves, metallization structures providing electrical coupling to the terminals, or the like. In some embodiments, structural support of the wafer received at operation 7205 is provided substantially by the front-side using a host substrate, a stack of metallization layers, or the like. In examples where a host substrate is used, either openings in the host substrate may be provided to expose the front-side structures for electrical test contact or the host substrate may provide or include front-side structures electrical test contact along with electrical routing to the terminal. Such electrical routing may be provided using contiguous structures of conductive materials as discussed herein.

Such simultaneous back- and front-side electrical test provides a variety of combinations for accessing terminals of devices or structures to be tested. For example, in the context of testing a planar or non-planar transistor any of the terminals (e.g., source, drain, gate) may be contacted from the front- or back-sides depending on the configuration of the transistor. In an embodiment, the source terminal is contacted from the back-side and the drain and gate terminals are contacted from the front-side. In an embodiment, the gate terminal is contacted from the back-side and the source and drain and gate terminals are contacted from the front-side. However, any combination of terminal contacts may be practiced using the techniques discussed herein. Furthermore, for a test structure (e.g., a chain of electrically coupled fins, material samples for test, or the like), a first terminal of the test structure may be contacted from the back-side and a second terminal of the test structure may be contacted from the front-side. Such contact may be made, as discussed herein, by contacting a conductive pin of a prober to an exposed front- or back-side structure such that the exposed structure is further electrically coupled or provides electrical coupling to the pertinent terminal.

Method 7201 continues at operation 7215 where the conductive pins aligned at operation 7210 (e.g., either only back-side prober pins or both back- and front-side prober pins) are contacted with the respective structures to provide electrical coupling to an electric tester. For example, the conductive pin is contacted to the back-side structure such that the back-side structure provides electrical coupling to a transistor terminal of a transistor device and/or the second conductive pin is contacted, contemporaneously, to the front-side structure such that the front-side structure provides electrical coupling to a second transistor terminal of the transistor device. The conductive pins may be contacted to the corresponding exposed back-side structures and/or front-side structures using any suitable technique or techniques such as automated test equipment handler techniques or the like. The conductive pins contacted at operation 7210 may provide electrical testing at any spatial level and/or device integration level with respect to the wafer received at operation 7205.

For example, spatially, the electrical testing may provide testing of a single die, two or more dice simultaneously, wafer-wide testing, or the like. Such electrical testing may be provided by a single back-side prober, multiple back-side probers, a single back-side prober and a single front-side prober, or multiple of either back- or front-side probers, or the like. In an embodiment, a second back-side structure exposed by a back-side of a second die is aligned to a second conductive pin of multiple conductive pins of a second prober of the electric tester, contemporaneously with contacting the conductive pin to the back-side structure, the second conductive pin is contacted to the second back-side structure such that the second back-side structure provides electrical coupling to a second transistor terminal of a second transistor device of the second die, and, contemporaneously with executing the electrical test algorithm, a second electrical test algorithm is executed on the second die through at least the second conductive pin to generate second electrical test data corresponding to the second die. For example, the terminal is a source terminal and the second terminal is a gate terminal. However, any combination of terminals may be coupled to using such techniques.

Furthermore, the devices and/or structures tested may be partially formed devices, fully formed devices, fully formed devices integrated by one or more metallization layers, or the like. Also, the devices and/or structures tested may be devices formed for test purposes. In an embodiment, a second back-side structure is aligned to a second conductive pin of the one or more conductive pins of the prober and, contemporaneously with contacting the conductive pin to the back-side structure, the second conductive pin is contacted to the second back-side structure such that the second back-side structure provides electrical coupling to a test device of the die. For example, the test device may be a chain of electrically coupled semiconductor fins, a test patch, a test material, or the like.

Method 7201 continues at operation 7220 where an electrical test algorithm is executed via the conductive pins contacted at operation 7215 to generate electrical test data. For example, during the contacting of the conductive pin to the back-side structure, an electrical test algorithm may be executed on the die through at least the first conductive pin to generate electrical test data corresponding to the die. Furthermore, the electrical test algorithm may be executed on the die through any or all of the conductive pins contacted to back- and/or front-side structures of the die. The electrical test algorithm performed at operation 7220 may include any suitable electrical probing, functional defect testing, electrical test pattern(s), or the like.

Method 7201 completes with the output of electrical test data and/or storage of such electrical test data to storage (e.g., computer memory). The electrical test data may be stored locally at the electrical tester and/or a remote device or devices. For example, the electrical test data may be transmitted from the electrical tester to a remote device or devices using a communications functionality of the electrical tester.

As discussed, simultaneous back- and front-side electrical test provides a variety of combinations for accessing terminals of devices or structures to be tested. FIGS. 73-80 provide example simultaneous back- and front-side electrical test configurations according to some embodiments. However, the electrical test techniques discussed herein may be implemented by back-side access only and/or by any configuration of terminals accessed by the back- and/or front-side.

Figure 73:
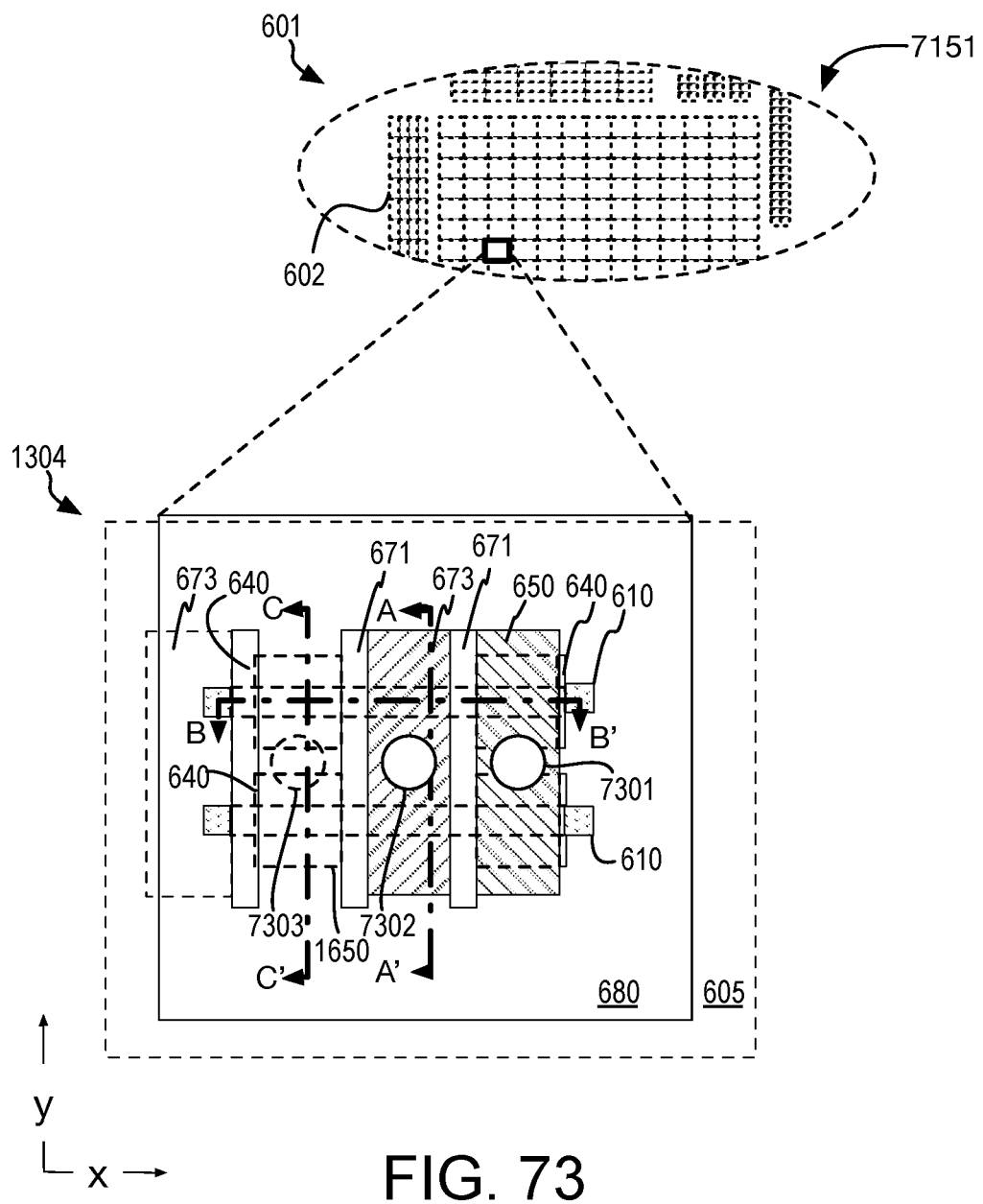
FIG. 73 is a plan view of a non-planar transistor structure under electrical test using simultaneous back- and front-side contacts, in accordance with some embodiments.

FIG. 73 is a plan view of a non-planar transistor structure 1304 under electrical test using simultaneous back- and front-side contacts, in accordance with some embodiments. Heavy dot-dashed lines illustrated with respect to non-planar transistor structure 1304 denote planes along which cross-sectional views are further provided as FIGS. 74A-74C, 75A-75C and 76A-76C. Using the techniques discussed herein and shown with respect to method 7201, back-side electrical test processing may be provided for non-planar transistor structure 1304 via an exposed back-side thereof.

As shown in FIG. 73, in some embodiments, non-planar transistors may be electrically tested using conductive pins 7301, 7302, and 7303. For example, non-planar transistor structure 1304 may be a transistor device under electrical test. Additional device cells 772 may be, for example, any of memory cells, power transistor structures, RF transistor structures, optical device cells, or the like, which may be electrically tested in parallel with non-planar transistor structure 1304, before or after non-planar transistor structure 1304, or not at all. In the illustrated example, IC die 771 may be provided as a test die (e.g., test die 7050) for electrical test and one or more transistors of IC die 771 may be tested via contact by conductive pins 7301, 7302, and 7303. As shown, non-planar transistor structure 1304 includes source/drain semiconductor 640, source/drain metallization 650, spacer dielectric 671 separating gate electrode 673 from source/ drain metallization 650 and/or source/drain semiconductor 640, and field isolation dielectric 680 over back-side substrate 775.

In the illustrated example, conductive pins 7301, 7302 are provided via front-side 7151 of IC die 771 and conductive pin 7303 is provided via a back-side of IC die 771 (as illustrated by conductive pin 7303 having a hatched line). It is noted that the die of FIG. 73 is upside-down with respect to the die of FIGS. 70 and 71 for the sake of clarity of presentation. Furthermore, source/drain metallization 1650 in contact with conductive pin 7303 is on a back-side of IC die 771 as is illustrated further herein. Although FIG. 73 and the subsequent cross-sections illustrate an example with gate electrode 673 and source/drain metallization 650 and source/drain semiconductor 640 (e.g., either a source or a drain) contacted from front-side 7151 and source/drain metallization 1650 and source/drain semiconductor (e.g., either a source or a drain) contacted from a back-side, any combination of front- and back-side terminal contacts of non-planar transistor structure 1304 may be made using the electrical test techniques discussed herein.

For example, depending on the configuration of the device under test, front- and back-side contact may be made accordingly. In an embodiment, all of the gate, source, and drain terminals of a transistor device are contacted from a back-side. In an embodiment, the gate terminal of the transistor device is contacted from a back-side and both the source and drain terminals are contacted from a front-side. In an embodiment, the source and drain terminals of the transistor device are contacted from a front-side and the gate terminal is contacted a back-side of. Furthermore, although discussed with respect to non-planar transistor structure 1304, such contacts may be made with a planar transistor, a test structure, another device type (e.g., memory devices, power transistor devices, RF transistor devices, optical devices, or the like). Although conductive pins 7301, 7302, and 7303 are shown directly over or under corresponding terminals, in some embodiments, intervening structures that are not directly over corresponding terminals may be provided for the contact of conductive pins 7301, 7302, and 7303. For example, the required density of conductive pins 7301, 7302, and 7303 may be relaxed by providing routing to corresponding terminals.

Figure 74A:
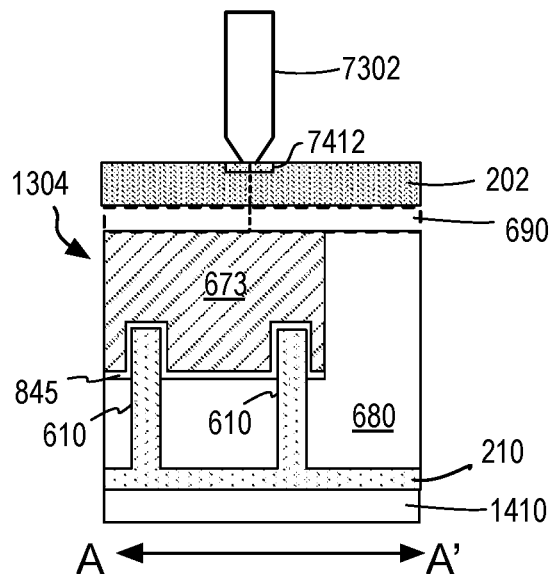
FIGS. 74A, 74B, 74C illustrate cross-sectional views of non-planar transistor structure contacted by conductive pins for electrical test, in accordance with some embodiments.
Figure 74B:
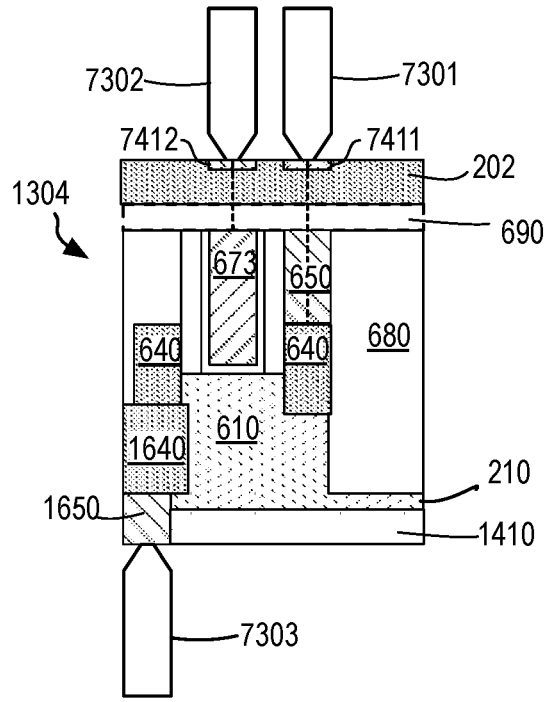
Figure 74C:
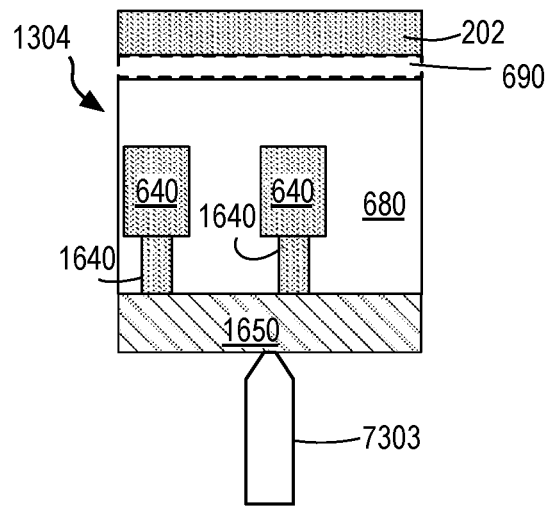
Figure 75A:
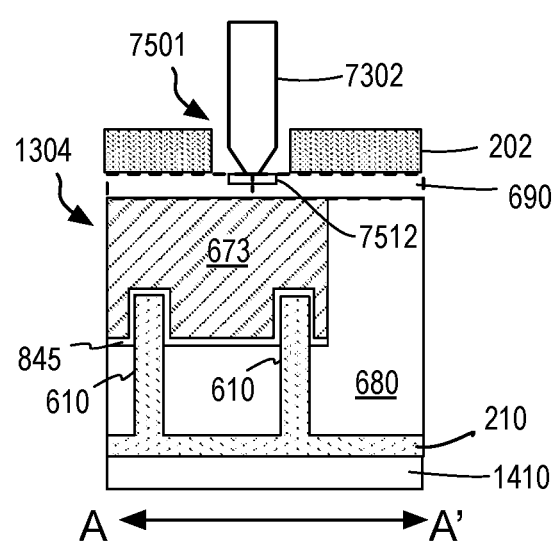
FIGS. 75A, 75B, 75C illustrate cross-sectional views of non-planar transistor structure contacted by conductive pins for electrical test, in accordance with some embodiments.
Figure 75B:
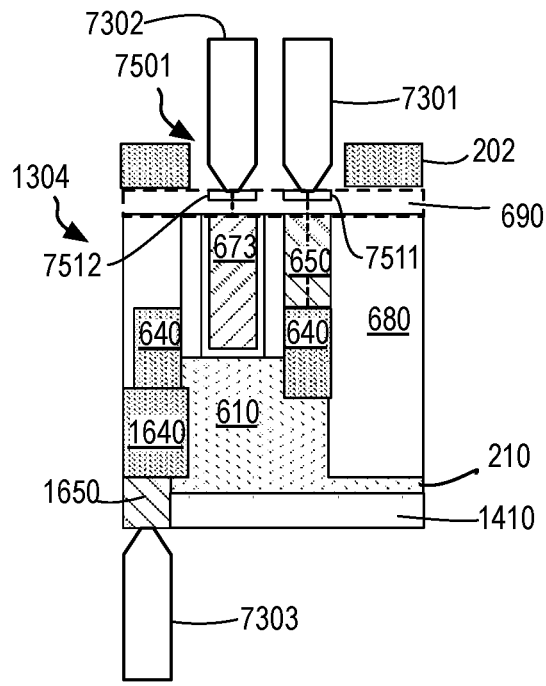
Figure 75C:
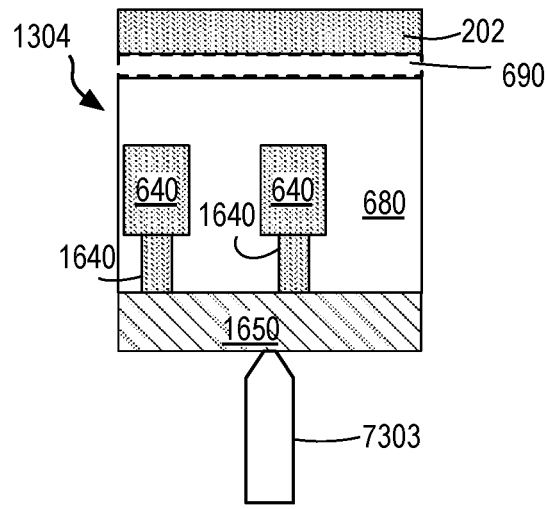
Figure 76A:
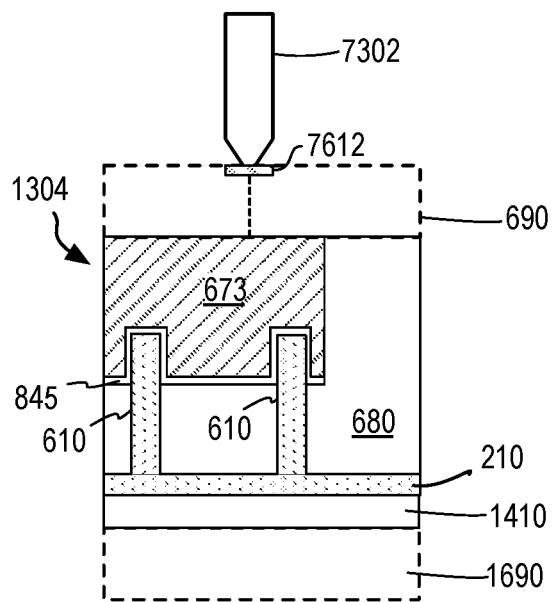
FIGS. 76A, 76B, 76C illustrate cross-sectional views of non-planar transistor structure contacted by conductive pins for electrical test, in accordance with some embodiments.
Figure 76B:
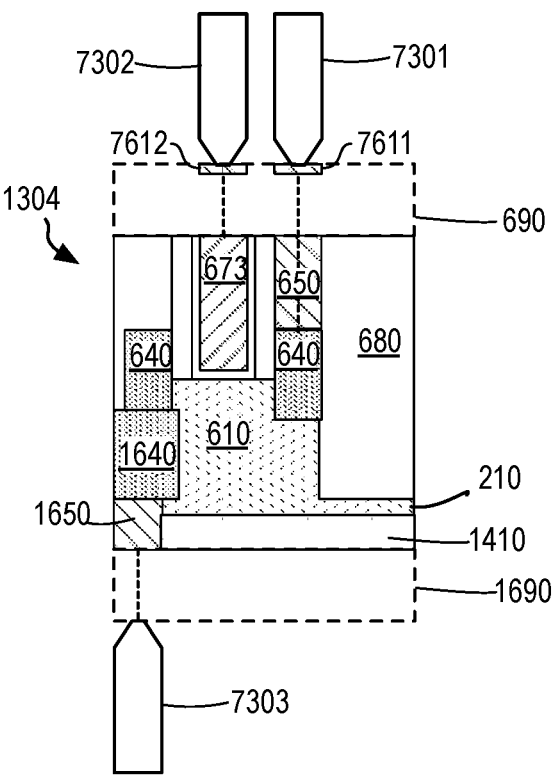
Figure 76C:
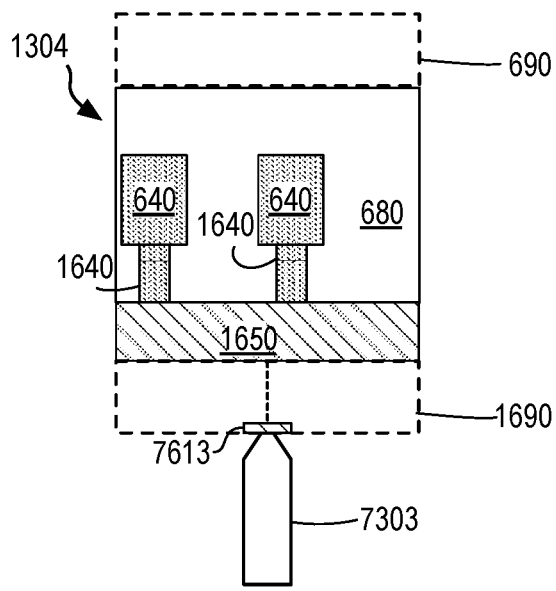

FIGS. 74A, 75A and 76A illustrate cross-sectional views of non-planar transistor structure 1304 along the A-A' plane denoted in FIG. 73 with respect to various embodiments of back- and front-side electrical test contact. FIGS. 74B, 75B and 76B illustrate cross-sectional views of non-planar transistor structure 1304 along the B-B' plane denoted in FIG. 73 with respect to various embodiments of back- and front-side electrical test contact. FIGS. 74C, 75C and 76C illustrate cross-sectional views of non-planar transistor structure 1304 along the C-C' plane denoted in FIG. 73 with respect to various embodiments of back- and front-side electrical test contact.

FIGS. 74A, 74B, 74C illustrate cross-sectional views of non-planar transistor structure 1304 contacted by conductive pins for electrical test, in accordance with some embodiments. For example, FIGS. 74A, 74B, 74C provide an electrical test structure for embodiments where non-planar transistor structure 1304 includes front-side stack 690 and host substrate 202 disposed over a front-side thereof such that host substrate 202 includes front-side structures for contacting electrical test pins. The structural features illustrated in FIGS. 74A, 74B, 74C may have any of the properties described herein for like reference numbers. As shown, non-planar transistor structure 1304 includes semiconductor bodies 780, gate electrode 673 disposed over gate dielectric 845, source/drain metallization 650 coupled to source/drain semiconductor 640, source/drain metallization 1650 coupled to source/drain semiconductor 1640, intervening layer 210, and etch mask 1410. For example, source/drain metallization 650 and source/drain semiconductor 640 may be either a source or a drain while source/drain metallization 1650 and source/drain semiconductor 1640 would then be the opposite (e.g., drain or source). As used herein, any of gate electrode 673, source/drain semiconductor 640, and source/drain semiconductor 1640 may be a transistor terminal. In the context of electrical test, electrical coupling to such terminals may be achieved and non-planar transistor structure 1304 may be tested.

Also as shown in FIGS. 74A and 74B, conductive pins 7301, 7302 are in physical contact with host substrate 202. Furthermore, conductive pin 7302 is electrically coupled to gate electrode 673 through host substrate 202 and front-side stack 690 and conductive pin 7301 is electrically coupled to source/drain semiconductor 640 through host substrate 202, front-side stack 690, and source/drain metallization 650. In the embodiment of FIGS. 74A, 74B, 74C, host substrate 202 includes front-side structures 7411, 7412 such that conductive pins 7301, 7302 may be aligned and then contacted to front-side structures 7411, 7412 for electrical testing. For example, conductive pins 7301, 7302 may be individual conductive pins of multiple pins of a prober. Conductive pins 7301, 7302 are aligned to front-side structures 7411, 7412, respectively, of host substrate 202 and contacted with the front-side structures 7411, 7412 as discussed herein. After such front-side contact and back-side contact (as is discussed below) electrical testing is performed.

Front-side structures 7411, 7412 of host substrate 202 may include any suitable structures and materials for electrically coupling conductive pins 7301, 7302 to source/drain metallization 650 and gate electrode 673, respectively. For example, front-side structures 7411, 7412 may be conductive pads, traces, or the like. For example, front-side structures 7411, 7412 may be or include metals such as copper or the like. Furthermore, host substrate 202 and front-side stack 690 provide electrical wiring, routing, contact or the like from front-side structures 7411, 7412 to the corresponding terminal (and optional metallization in the case of source/drain terminals) for electrical test. Such electrical coupling is shown by the hatched lines connecting conductive pins 7301, 7302 to source/drain semiconductor 640 and gate electrode 673, respectively. As will be appreciated, front-side structures 7411, 7412 need not be directly over their corresponding feature and/or terminal (such an orientation is illustrated for the sake of clarity of presentation). Furthermore, the routing from a front-side structure to a corresponding feature and/or terminal may take any suitable route through host substrate 202 and front-side stack 690.

Also as shown in FIGS. 74B and 74C, conductive pin 7303 is in physical contact with source/drain metallization 1650, which provides electrical coupling to source/drain semiconductor 1640. In the context of electrical test, source/drain metallization 1650 provides a back-side structure exposed by a back-side of non-planar transistor structure 1304. As discussed with respect to conductive pins 7301, 7302, conductive pin 7303 may be an individual conductive pin of multiple pins of a prober. Conductive pin 7303 is aligned to and contacted with source/drain metallization 1650. After contact, and during the coupling of conductive pins 7301, 7302 to source/drain semiconductor 640 and gate electrode 673, electrical testing is performed to generate electrical test data. In some embodiments, as discussed further with respect to FIGS. 76A, 76B, 76C, conductive pin 7303 may contact a back-side structure of a back-side metallization stack and/or host substrate and electrical routing may be provided to gate electrode 673.

Conductive pins 7301, 7302, 7303 and any other conductive pins (e.g., of conducive probe pin arrays) discussed herein may have any suitable size, shape, and material(s) for electrically and physically contacting their respective electrical test structures. For example, the conductive pins may include metals or other conductors such as copper or the like and may have cylindrical shapes and/or tapered tips or the like. Furthermore, although shown coupled to particular terminals of a single transistor or transistor structure, such conductive pins may also be coupled to any device terminal as discussed herein. Also, such conductive pins may also be coupled to any number of terminals of any such devices. For example, conductive pin 7303 may contact a terminal of only transistor structure 1304 while conductive pins 7301, 7303 are electrically coupled to any number of gate and drain terminals of any number of transistors (e.g., by routing in host substrate 202 and/or front-side stack 690). For example, any conductive pin discussed herein may be coupled to multiple terminals of multiple transistor devices, transistor structures, test devices, power rails, ground structures, or the like.

FIGS. 75A, 75B, 75C illustrate cross-sectional views of non-planar transistor structure 1304 contacted by conductive pins for electrical test, in accordance with some embodiments. For example, FIGS. 75A, 75B, 75C provide an electrical test structure for embodiments where non-planar transistor structure 1304 includes front-side stack 690 and host substrate 202 disposed over a front-side thereof such that host substrate 202 includes openings to pass electric test pins through to front-side structures of front-side stack 690. The structural features illustrated in FIGS. 75A, 75B, 75C may have any of the properties described herein for like reference numbers. As discussed herein, non-planar transistor structure 1304 includes gate electrode 673 disposed over gate dielectric 845, source/drain metallization 650 coupled to source/drain semiconductor 640, and source/drain metallization 1650 coupled to source/drain semiconductor 1640 and any of gate electrode 673, source/drain semiconductor 640, and source/drain semiconductor 1640 may be a transistor terminal. In the context of electrical test, electrical coupling to such terminals may be achieved and non-planar transistor structure 1304 may be tested.

Also as shown in FIGS. 75A and 75B, an opening or openings 7501 may be provided in host substrate 202 such that conductive pins 7301, 7302 pass through host substrate 202 to physically contact front-side structures 7511, 7512 of front-side stack 690 for electrical test. Furthermore, conductive pin 7302 is electrically coupled to gate electrode 673 and conductive pin 7301 is electrically coupled to source/drain semiconductor 640 through front-side stack 690. In the embodiment of FIGS. 75A, 75B, 75C, front-side stack 690 includes front-side structures 7511, 7512 such that conductive pins 7301, 7302 may be aligned and then contacted to front-side structures 7511, 7512 for electrical testing as discussed herein. For example, conductive pins 7301, 7302 may be individual conductive pins of multiple pins of a prober. Conductive pins 7301, 7302 are aligned to front-side structures 7511, 7512, respectively, of front-side stack 690 and contacted with the front-side structures. After such front-side contact and back-side contact (as is discussed below) electrical testing is performed.

Front-side structures 7511, 7512 of front-side stack 690 may include any suitable structures and materials for electrically coupling conductive pins 7301, 7302 to source/drain metallization 650 and gate electrode 673, respectively. For example, front-side structures 7511, 7512 may be conductive pads, traces, or the like. For example, front-side structures 7511, 7512 may be or include metals such as copper or the like. Furthermore, front-side stack 690 provides electrical wiring, routing, contact or the like from front-side structures 7511, 7512 to corresponding terminals for electrical test. Such electrical coupling is shown by the hatched lines connecting conductive pins 7301, 7302 to source/drain semiconductor 640 and gate electrode 673, respectively. As will be appreciated, front-side structures 7511, 7512 need not be directly over their corresponding feature and/or terminal (such an orientation is illustrated for the sake of clarity of presentation). Furthermore, the routing from front-side structures 7511, 7512 to corresponding features and/or terminals may take any suitable route through front-side stack 690.

Also as shown in FIGS. 75B and 75C, conductive pin 7303 is in physical contact with source/drain metallization 1650, which provides electrical coupling to source/drain semiconductor 1640 such that, in the context of electrical test, source/drain metallization 1650 provides a back-side structure exposed by a back-side of non-planar transistor structure 1304. As discussed herein, conductive pin 7303 may be an individual conductive pin of multiple pins of a prober. Conductive pin 7303 is aligned to and contacted with source/drain metallization 1650. After contact, and during the coupling of conductive pins 7301, 7302 to source/drain semiconductor 640 and gate electrode 673, electrical testing is performed to generate electrical test data. In some embodiments, as discussed further with respect to FIGS. 76A, 76B, 76C, conductive pin 7303 may contact a back-side structure of a back-side metallization stack and/or host substrate and electrical routing may be provided to gate electrode 673.

FIGS. 76A, 76B, 76C illustrate cross-sectional views of non-planar transistor structure 1304 contacted by conductive pins for electrical test, in accordance with some embodiments. For example, FIGS. 76A, 76B, 76C provide an electrical test structure for embodiments where non-planar transistor structure 1304 includes front-side stack 690 disposed over a front-side thereof such that front-side stack 690 includes front-side structures for contacting electrical test pins and a back-side stack 1690 disposed over a backside thereof such that back-side stack 1690 includes back-side structures for contacting electrical test pins. The structural features illustrated in FIGS. 76A, 76B, 76C may have any of the properties described herein for like reference numbers. Furthermore, back-side stack 1690 may be optionally included in any of the examples discussed herein such as those of FIGS. 74A, 74B, 74C and FIGS. 75A, 75B, 75C. As discussed herein, non-planar transistor structure 1304 includes gate electrode 673 disposed over gate dielectric 845, source/drain metallization 650 coupled to source/drain semiconductor 640, and source/drain metallization 1650 coupled to source/drain semiconductor 1640 and any of gate electrode 673, source/drain semiconductor 640, and source/drain semiconductor 1640 may be a transistor terminal. In the context of electrical test, electrical coupling to such terminals may be achieved and non-planar transistor structure 1304 may be tested.

Also as shown in FIGS. 76A and 76B, conductive pins 7301, 7302 are in physical contact with front-side stack 690. Furthermore, conductive pin 7302 is electrically coupled to gate electrode 673 and conductive pin 7301 is electrically coupled to source/drain semiconductor 640 through front-side stack 690. In the embodiment of FIGS. 76A, 76B, 76C, front-side stack 690 includes front-side structures 7781, 7782 such that conductive pins 7301, 7302 may be aligned and then contacted to front-side structures 7781, 7782 for electrical testing. For example, conductive pins 7301, 7302 may be individual conductive pins of multiple pins of a prober. Conductive pins 7301, 7302 are aligned to front-side structures 7781, 7782 of front-side stack 690 and contacted with the front-side structures. After such front-side contact and back-side contact (as is discussed below) electrical testing is performed.

Front-side structures 7781, 7782 of front-side stack 690 may include any suitable structures and materials for electrically coupling conductive pins 7301, 7302 to source/drain metallization 650 and gate electrode 673, respectively. For example, front-side structures 7781, 7782 may be conductive pads, traces, or the like. For example, front-side structures 7781, 7782 may be metals such as copper or the like. In an embodiment, front-side structures 7781, 7782 are metallization structures of a final front-side metallization layer (e.g., metal 8) of multiple front-side metallization layers. Furthermore, front-side stack 690 provides electrical wiring, routing, contact or the like from front-side structures 7781, 7782 to the corresponding terminals for electrical test. Such electrical coupling is shown by the hatched lines connecting conductive pins 7301, 7302 to source/drain semiconductor 640 and gate electrode 673, respectively. As will be appreciated, the front-side structures need not be directly over their corresponding feature and/or terminal. Furthermore, the routing from a front-side structure to a corresponding feature and/or terminal may take any suitable route through front-side stack 690.

Also as shown in FIG. 76C, conductive pin 7303 is in physical contact with back-side stack 1690. Back-side stack 1690 is illustrated in dashed line as being a portion of the transistor structure stratum that may vary without limitation and may, for example, include any number of backend interconnect metallization levels. Such levels may be separated from each other by one or more inter-level dielectric (ILD) layer. As shown, conductive pin 7303 is electrically coupled to source/drain semiconductor 1640 through back-side stack 1690. In the embodiment of FIGS. 76A, 76B, 76C, back-side stack 1690 includes back-side structure 7783 such that conductive pin 7303 may be aligned and then contacted for electrical testing. For example, conductive pin 7303 may be an individual conductive pin of multiple pins of a prober. Conductive pin 7303 is aligned to back-side structure 7783 of back-side stack 1690 and contacted. After contact, and during the coupling of conductive pins 7301, 7302 to source/drain semiconductor 640 and gate electrode 673, electrical testing is performed to generate electrical test data.

Back-side structure 7783 of back-side stack 1690 may include any suitable structures and materials for electrically coupling conductive pin 7303 to source/drain metallization 1650. For example, back-side structure 7783 may be conductive pads, traces, or the like. For example, back-side structure 7783 may be a metal such as copper or the like. In an embodiment, back-side structures 7783 are metallization structures of a final back-side metallization layer (e.g., metal 8) of multiple back-side metallization layers. Furthermore, back-side stack 1690 provides electrical wiring, routing, contact or the like from the back-side structures to the corresponding terminal for electrical test. Such electrical coupling is shown by the hatched lines connecting conductive pin 7303 to source/drain metallization 1650. As will be appreciated, the back-side structures need not be directly in-line with their corresponding feature and/or terminal, which is shown for the sake of clarity of presentation. Furthermore, the routing from a back-side structure to a corresponding feature and/or terminal may take any suitable route through back-side stack 1690.

Figure 77:
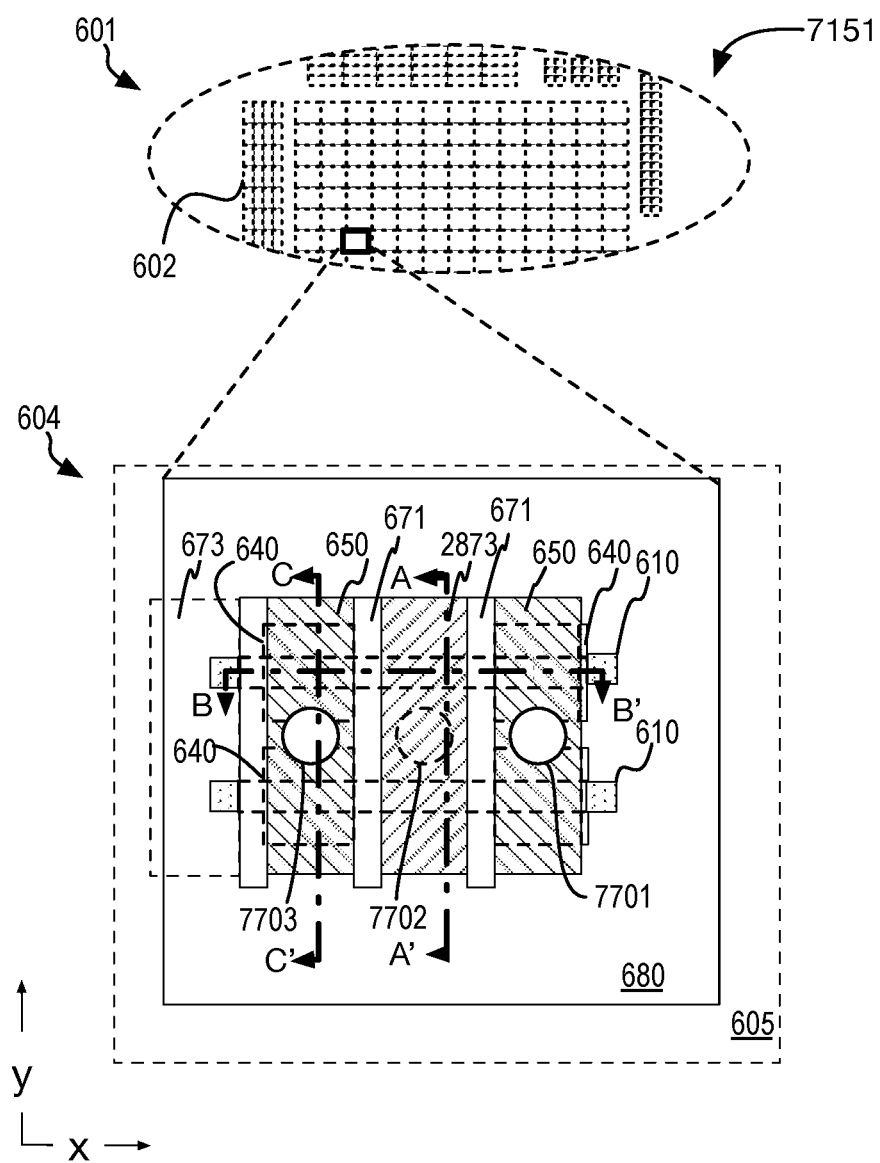
FIG. 77 is a plan view of a logic transistor structure under electrical test using simultaneous back- and front-side contacts, in accordance with some embodiments.

FIG. 77 is a plan view of a logic transistor structure 774 under electrical test using simultaneous back- and front-side contacts, in accordance with some embodiments. Heavy dot-dashed lines illustrated with respect to logic transistor structure 774 denote planes along which cross-sectional views are further provided as FIGS. 78A-78C, 79A-79C and 80A-80C. Using the techniques discussed herein and shown with respect to method 7201, back-side electrical test processing may be provided for logic transistor structure 774 via an exposed back-side thereof.

As shown in FIG. 77, in some embodiments, transistors may be electrically tested using conductive pins 7701, 7702, and 7703. For example, logic transistor structure 774 may be a transistor device under electrical test. Additional device cells 772 may be, for example, any of memory cells, power transistor structures, RF transistor structures, optical device cells, or the like, which may be electrically tested in parallel with logic transistor structure 774, before or after logic transistor structure 774, or not at all. In the illustrated example, IC die 771 may be provided as a test die (e.g., test die 7050) for electrical test and one or more transistors of IC die 771 may be tested via contact by conductive pins 7701, 7702, and 7703. As shown, logic transistor structure 774 includes source/drain semiconductor 640, source/drain metallization 650, spacer dielectric 671 separating back-side gate electrode 2873 from source/drain metallization 650 and/or source/drain semiconductor 640, and field isolation dielectric 680 over back-side substrate 775.

In the illustrated example, conductive pins 7701, 7703 are provided via front-side 7151 of IC die 771 and conductive pin 7702 is provided via a back-side of IC die 771 (as illustrated by conductive pin 7702 having a hatched line). It is noted that the die of FIG. 77 is upside-down with respect to the die of FIGS. 70 and 71 for the sake of clarity of presentation. Furthermore, back-side gate electrode 2873 in contact with conductive pin 7303 extends to (e.g., wraps around to) a back-side of IC die 771 as is illustrated further herein. Although FIG. 77 and the subsequent cross-sections illustrate an example with source/drain metallizations 650 and source/drain semiconductors 640 (e.g., a source and a drain) contacted from front-side 7151 and gate electrode 2873 contacted from a back-side, any combination of front- and back-side terminal contacts of logic transistor structure 774 may be made using the electrical test techniques discussed herein. Although conductive pins 7701, 7702, and 7703 are shown directly over or under corresponding terminals, in some embodiments, intervening structures that are not directly over corresponding terminals may be provided for the contact of conductive 7701, 7702, and 7703. For example, the required density of conductive pins 7701, 7702, and 7703 may be relaxed by providing routing to corresponding terminals.

Figures 79A, 79B, 79C:
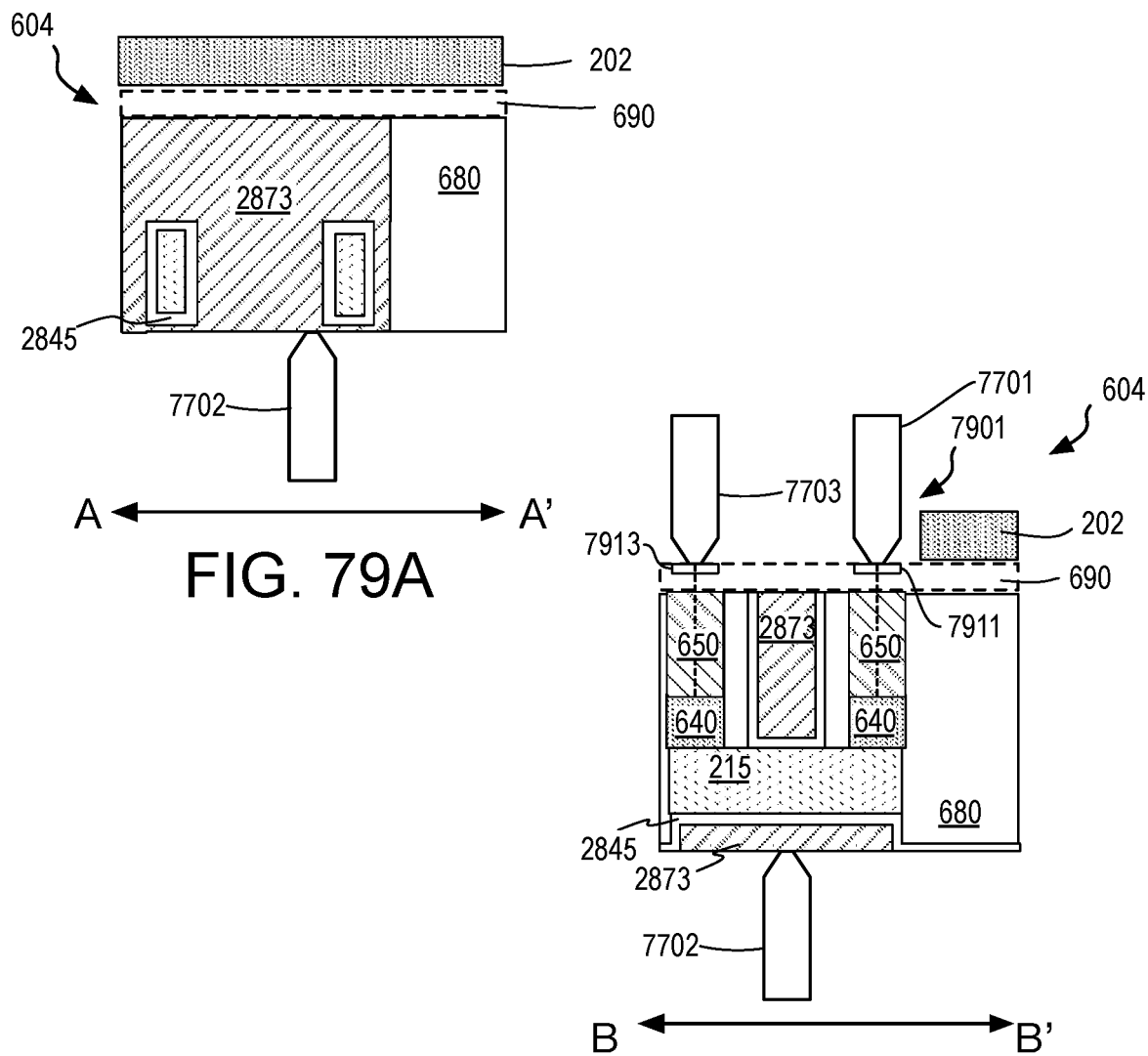
FIGS. 79A, 79B, 79C illustrate cross-sectional views of logic transistor structure contacted by conductive pins for electrical test, in accordance with some embodiments.
Figure 80A:
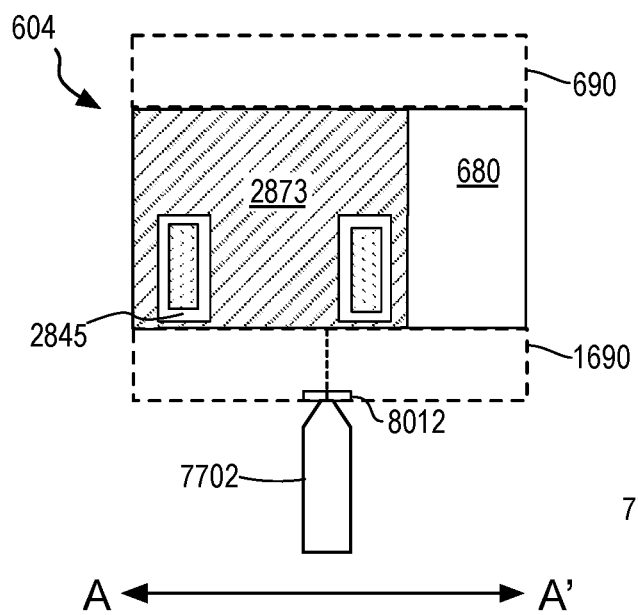
FIGS. 80A, 80B, 80C illustrate cross-sectional views of logic transistor structure contacted by conductive pins for electrical test, in accordance with some embodiments.
Figure 80B:
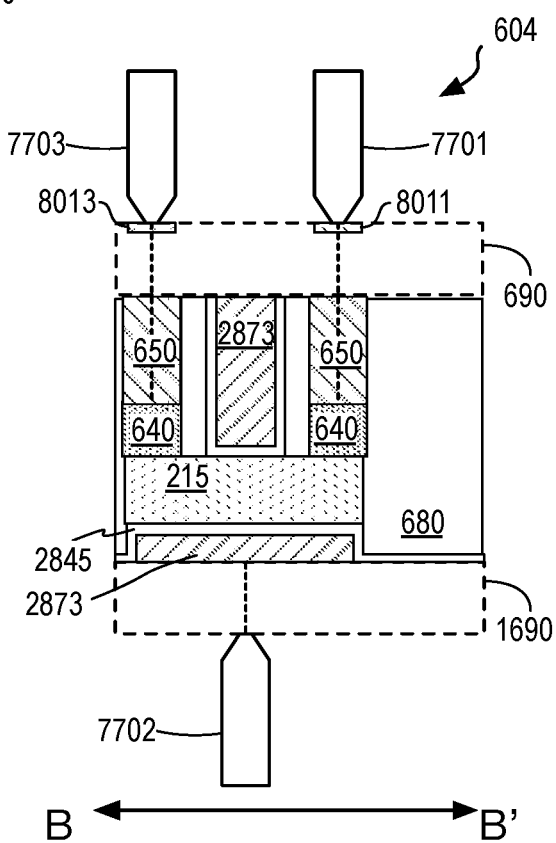
Figure 80C:
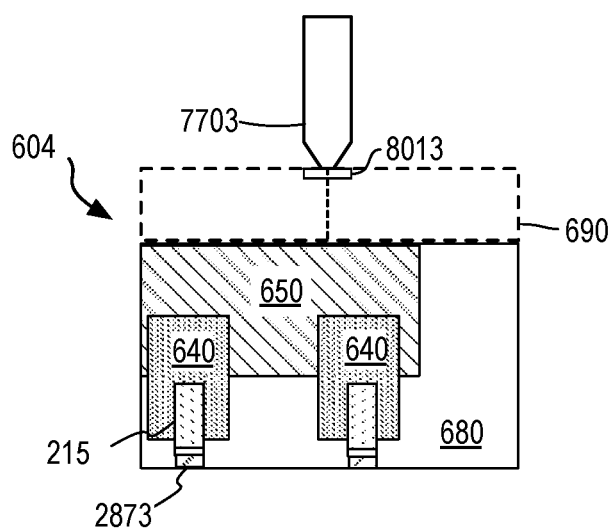

FIGS. 78A, 79A and 80A illustrate cross-sectional views of logic transistor structure 774 along the A-A' plane denoted in FIG. 77 with respect to various embodiments of back- and front-side electrical test contact. FIGS. 78B, 79B and 80B illustrate cross-sectional views of logic transistor structure 774 along the B-B' plane denoted in FIG. 77 with respect to various embodiments of back- and front-side electrical test contact. FIGS. 78C, 79C and 80C illustrate cross-sectional views of logic transistor structure 774 along the C-C' plane denoted in FIG. 77 with respect to various embodiments of back- and front-side electrical test contact.

FIGS. 78A, 78B, 78C illustrate cross-sectional views of logic transistor structure 774 contacted by conductive pins for electrical test, in accordance with some embodiments. For example, FIGS. 78A, 78B, 78C provide an electrical test structure for embodiments where logic transistor structure 774 includes front-side stack 690 and host substrate 202 disposed over a front-side thereof such that host substrate 202 includes front-side structures for contacting electrical test pins. The structural features illustrated in FIGS. 78A, 78B, 78C may have any of the properties described herein for like reference numbers. As shown, logic transistor structure 774 includes device layer 215, gate electrode 2873 disposed on and over back-side gate dielectric 2845, and source/drain metallizations 650 coupled to source/drain semiconductors 640. As used herein, any of gate electrode 2873 and/or source/drain semiconductors 640 may be a transistor terminal. In the context of electrical test, electrical coupling to such terminals may be achieved and logic transistor structure 774 may be tested.

Also as shown in FIGS. 78B and 78C, conductive pins 7701, 7703 are in physical contact with host substrate 202. Furthermore, conductive pin 7701, 7703 are electrically coupled to source/drain semiconductors 640 through host substrate 202, front-side stack 690, and source/drain contact metallizations 650. In the embodiment of FIGS. 78A, 78B, 78C, host substrate 202 includes front-side structures 7811, 7813 such that conductive pins 7701, 7703 may be aligned and then contacted to front-side structures 7811, 7813 for electrical testing. For example, conductive 7701, 7703 may be individual conductive pins of multiple pins of a prober. Conductive pins 7701, 7703 are aligned to front-side structures 7811, 7813, respectively, of host substrate 202 and contacted with the front-side structures 7811, 7813 as discussed herein. After such front-side contact and back-side contact (as is discussed below) electrical testing is performed.

Front-side structures 7811, 7813 of host substrate 202 may include any suitable structures and materials for electrically coupling conductive pins 7701, 7703 to source/drain semiconductors 640. For example, front-side structures 7811, 7813 may be conductive pads, traces, or the like, and front-side structures 7811, 7813 may be or include metals such as copper or the like. Furthermore, host substrate 202 and front-side stack 690 provide electrical wiring, routing, contact or the like from front-side structures 7811, 7813 to the corresponding terminals for electrical test. Such electrical coupling is shown by the hatched lines connecting conductive pins 7701, 7703 to source/drain semiconductors 640. As discussed, front-side structures 7811, 7813 need not be directly over their corresponding feature and/or terminal (such an orientation is illustrated for the sake of clarity of presentation). Furthermore, the routing from a front-side structure to a corresponding feature and/or terminal may take any suitable route through host substrate 202 and front-side stack 690.

Also as shown in FIGS. 78A and 78B, conductive pin 7702 is in physical contact with back-side gate electrode 2873. In the context of electrical test, back-side gate electrode 2873 provides a back-side structure exposed by a back-side of logic transistor structure 774. As discussed with respect to conductive pins 7701, 7703, conductive pin 7702 may be an individual conductive pin of multiple pins of a prober. Conductive pin 7702 is aligned to and contacted with back-side gate electrode 2873. After contact, and during the coupling of conductive pins 7701, 7703 to source/drain semiconductors 640, electrical testing is performed to generate electrical test data. In some embodiments, as discussed further with respect to FIGS. 76A, 76B, 76C, conductive pin 7702 may contact a back-side structure of a back-side metallization stack and/or host substrate and electrical routing may be provided to back-side gate electrode 2873.

The embodiments of FIGS. 77-80 illustrate a wrap around back-side gate electrode 2873. In an embodiment, front side contact may be provided to a front side of back-side gate electrode 2873 in analogy to the couplings of conductive pins 7701, 7703 to source/drain semiconductors 640. In other embodiments, back-side gate electrode 2873 may be a dual gate electrode such that a separate front- and back-side gate electrodes are provided as discussed herein. In such embodiments, either or both of such dual gate electrodes may be contacted from the front- and/or back side of logic transistor structure 774.

FIGS. 79A, 79B, 79C illustrate cross-sectional views of logic transistor structure 774 contacted by conductive pins for electrical test, in accordance with some embodiments. For example, FIGS. 79A, 79B, 79C provide an electrical test structure for embodiments where logic transistor structure 774 includes front-side stack 690 and host substrate 202 disposed over a front-side thereof such that host substrate 202 includes openings to pass electric test pins through to front-side structures of front-side stack 690. The structural features illustrated in FIGS. 79A, 79B, 79C may have any of the properties described herein for like reference numbers. As shown, logic transistor structure 774 includes device layer 215, gate electrode 2873 disposed on and over back-side gate dielectric 2845, and source/drain metallizations 650 coupled to source/drain semiconductors 640. As used herein, any of gate electrode 2873 and/or source/drain semiconductors 640 may be a transistor terminal. In the context of electrical test, electrical coupling to such terminals may be achieved and logic transistor structure 774 may be tested.

Also as shown in FIGS. 79B and 79C, an opening or openings 7901 may be provided in host substrate 202 such that conductive pins 7701, 7703 pass through host substrate 202 to physically contact front-side structures 7911, 7913 of front-side stack 690 for electrical test. Furthermore, conductive pins 7701, 7703 are electrically coupled to source/drain semiconductors 640 through front-side stack 690 and source/drain metallizations 650. In the embodiment of FIGS. 79A, 79B, 79C, front-side stack 690 includes front-side structures 7911, 7913 such that conductive pins 7701, 7703 may be aligned and then contacted to front-side structures 7911, 7913 for electrical testing as discussed herein. For example, conductive pins 7701, 7703 may be individual conductive pins of multiple pins of a prober. Conductive pins 7701, 7703 are aligned to front-side structures 7911, 7913, respectively, of front-side stack 690 and contacted with the front-side structures. After such front-side contact and back-side contact (as is discussed below) electrical testing is performed.

Front-side structures 7911, 7913 of front-side stack 690 may include any suitable structures and materials for electrically coupling conductive pins 7701, 7703 to source/drain metallizations 650, respectively. For example, front-side structures 7911, 7913 may be conductive pads, traces, or the like and may be or include metals such as copper or the like. Furthermore, front-side stack 690 provides electrical wiring, routing, contact or the like from front-side structures 7911, 7913 to corresponding terminals for electrical test. Such electrical coupling is shown by the hatched lines connecting conductive pins 7701, 7703 to source/drain semiconductors 640. As will be appreciated, front-side structures 7911, 7913 need not be directly over their corresponding feature and/or terminal (such an orientation is illustrated for the sake of clarity of presentation). Furthermore, the routing from front-side structures 7911, 7913 to corresponding features and/or terminals may take any suitable route through front-side stack 690.

Also as shown in FIGS. 79A and 79B, conductive pin 7702 is in physical contact with back-side gate electrode 2873. In the context of electrical test, back-side gate electrode 2873 provides a back-side structure exposed by a back-side of logic transistor structure 774. As discussed herein, conductive pin 7702 may be an individual conductive pin of multiple pins of a prober. Conductive pin 7702 is aligned to and contacted with back-side gate electrode 2873. After contact, and during the coupling of conductive pins 7701, 7703 to source/drain semiconductors 640, electrical testing is performed to generate electrical test data. In some embodiments, as discussed further with respect to FIGS. 76A, 76B, 76C, conductive pin 7702 may contact a back-side structure of a back-side metallization stack and/or host substrate and electrical routing may be provided to back-side gate electrode 2873.

FIGS. 80A, 80B, 80C illustrate cross-sectional views of logic transistor structure 774 contacted by conductive pins for electrical test, in accordance with some embodiments. For example, FIGS. 80A, 80B, 80C provide an electrical test structure for embodiments where logic transistor structure 774 includes front-side stack 690 disposed over a front-side thereof such that front-side stack 690 includes front-side structures for contacting electrical test pins and back-side stack 1690 disposed over a backside thereof such that back-side stack 1690 includes back-side structures for contacting electrical test pins. The structural features illustrated in FIGS. 80A, 80B, 80C may have any of the properties described herein for like reference numbers. Furthermore, back-side stack 1690 may be optionally included in any of the examples discussed herein such as those of FIGS. 78A, 78B, 78C and FIGS. 79A, 79B, 79C. As discussed herein, logic transistor structure 774 includes back-side gate electrode 2873 disposed on and over back-side gate dielectric 2845, source/drain metallization 650 coupled to source/drain semiconductor 640, and source/drain metallizations 650 coupled to source/drain semiconductors 640. As used herein, any of gate electrode 2873 and/or source/drain semiconductors 640 may be a transistor terminal. In the context of electrical test, electrical coupling to such terminals may be achieved and logic transistor structure 774 may be tested.

Also as shown in FIGS. 80B and 80C, conductive pins 7701, 7703 are in physical contact with front-side stack 690. Furthermore, conductive pin 7701, 7703 are electrically coupled to source/drain semiconductors 640 through front-side stack 690. In the embodiment of FIGS. 80A, 80B, 80C, front-side stack 690 includes front-side structures 8011, 8013 such that conductive pins 7701, 7703 may be aligned and then contacted to front-side structures 8011, 8013 for electrical testing. For example, conductive pins 7701, 7703 may be individual conductive pins of multiple pins of a prober. Conductive pins 7701, 7703 are aligned to front-side structures 8011, 8013 of front-side stack 690 and contacted with the front-side structures. After such front-side contact and back-side contact (as is discussed below) electrical testing is performed.

Front-side structures 8011, 8013 of front-side stack 690 may include any suitable structures and materials for electrically coupling conductive pins 7701, 7703 to source/drain semiconductors 640. For example, front-side structures 8011, 8013 may be conductive pads, traces, or the like and may be or include metals such as copper or the like. In an embodiment, front-side structures 8011, 8013 are metallization structures of a final front-side metallization layer (e.g., metal 8) of multiple front-side metallization layers. Furthermore, front-side stack 690 provides electrical wiring, routing, contact or the like from front-side structures 8011, 8013 to the corresponding terminals for electrical test. Such electrical coupling is shown by the hatched lines connecting conductive pins 7701, 7703 to source/drain semiconductors 640. As discussed, front-side structures 7701, 7703 need not be directly over their corresponding feature and/or terminal. Furthermore, the routing from a front-side structure to a corresponding feature and/or terminal may take any suitable route through front-side stack 690.

Also as shown in FIGS. 80A and 80B, conductive pin 7702 is in physical contact with back-side stack 1690. Conductive pin 7702 is electrically coupled back-side gate electrode 2873 through back-side stack 1690. In the embodiment of FIGS. 80A, 80B, 80C, back-side stack 1690 includes a back-side structure 8012 such that conductive pin 7702 may be aligned and then contacted for electrical testing. For example, conductive pin 7702 may be an individual conductive pin of multiple pins of a prober. Conductive pin 7702 is aligned to back-side structure 8012 of back-side stack 1690 and contacted. After contact, and during the coupling of conductive pins 7701, 7703 to source/drain semiconductors 640, electrical testing is performed to generate electrical test data.

Back-side structure 8012 of back-side stack 1690 may include any suitable structures and materials for electrically coupling conductive pin 7702 to back-side gate electrode 2873. For example, back-side structure 8012 may be conductive pads, traces, or the like and may be a metal such as copper or the like. In an embodiment, back-side structures 8012 are metallization structures of a final back-side metallization layer (e.g., metal 8) of multiple back-side metallization layers. Furthermore, back-side stack 1690 provides electrical wiring, routing, contact or the like from back-side structure 8012 to the corresponding terminal for electrical test. Such electrical coupling is shown by the hatched lines connecting conductive pin 7702 to back-side gate electrode 2873. Back-side structures need not be directly in-line with their corresponding feature and/or terminal and the routing from a back-side structure to a corresponding feature and/or terminal may take any suitable route through back-side stack 1690.

Figure 81:
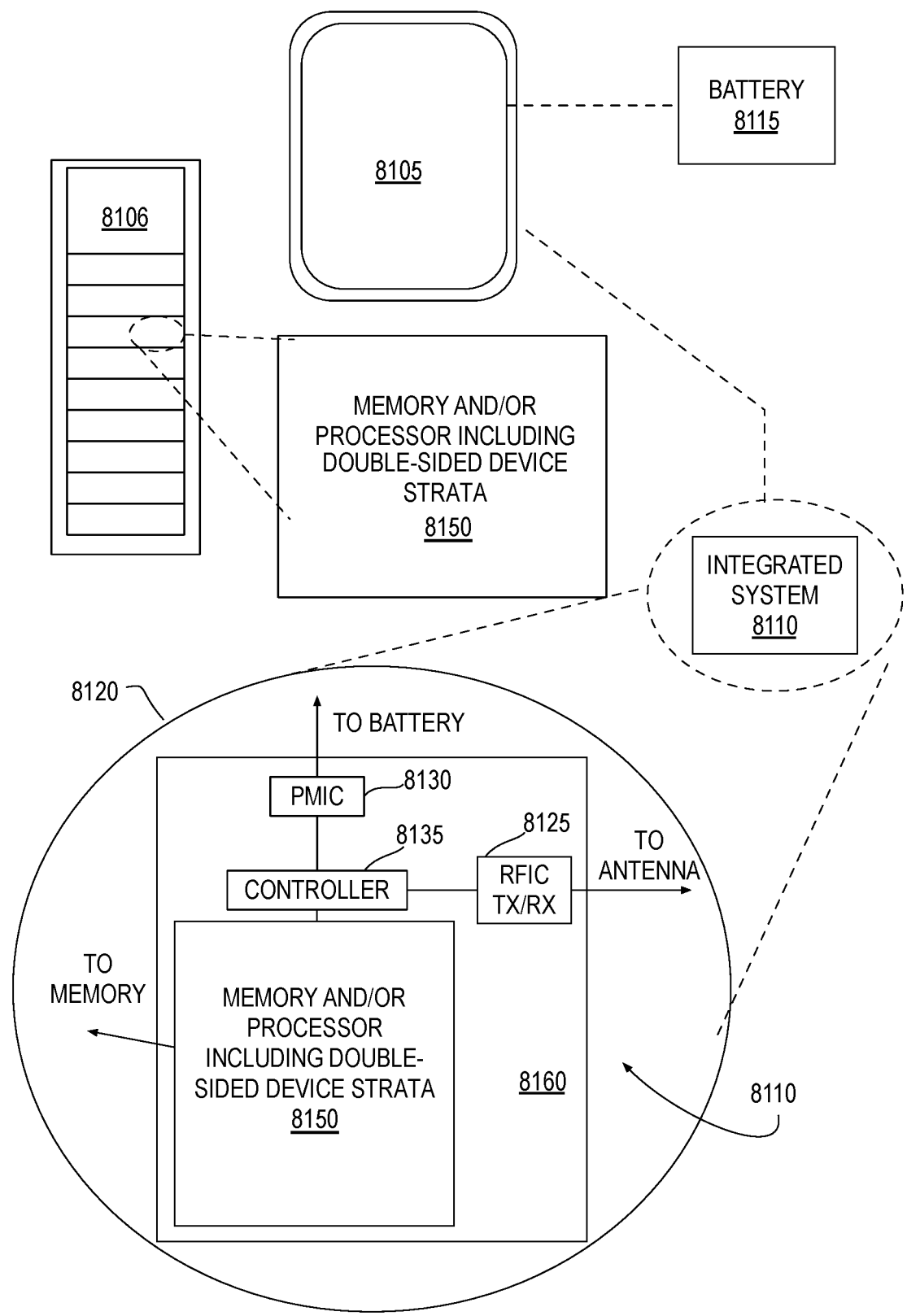
FIG. 81 illustrates a mobile computing platform and a data server machine employing an SoC having a plurality of FETs including a double-side interconnection, in accordance with embodiments.

FIG. 81 illustrates a mobile computing platform and a data server machine employing an integrated circuit including at least one device stratum including front-side structures that have been revealed from the back side, for example as described elsewhere herein. The server machine 8106 may be any commercial server, for example including any number of high-performance computing platforms disposed within a rack and networked together for electronic data processing, which in the exemplary embodiment includes a packaged monolithic SoC 8150. The mobile computing platform 8105 may be any portable device configured for each of electronic data display, electronic data processing, wireless electronic data transmission, or the like. For example, the mobile computing platform 8105 may be any of a tablet, a smart phone, laptop computer, etc., and may include a display screen (e.g., a capacitive, inductive, resistive, or optical touchscreen), a chip-level or package-level integrated system 8110, and a battery 8115.

Either disposed within the integrated system 8110 illustrated in the expanded view 8120, or as a stand-alone packaged chip within the server machine 8106, monolithic SoC 8150 includes a memory block (e.g., RAM), a processor block (e.g., a microprocessor, a multi-core microprocessor, graphics processor, or the like) including at least one device stratum including front-side structures that have been revealed from the back side, for example as described elsewhere herein. The monolithic SoC 8150 may be further coupled to a board, a substrate, or an interposer 8160 along with, one or more of a power management integrated circuit (PMIC) 8130, RF (wireless) integrated circuit (RFIC) 8125 including a wideband RF (wireless) transmitter and/or receiver (TX/RX) (e.g., including a digital baseband and an analog front end module further comprises a power amplifier on a transmit path and a low noise amplifier on a receive path), and a controller 8135.

Functionally, PMIC 8130 may perform battery power regulation, DC-to-DC conversion, etc., and so has an input coupled to battery 8115 and with an output providing a current supply to other functional modules. As further illustrated, in the exemplary embodiment, RFIC 8125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 8150.

Figure 82:
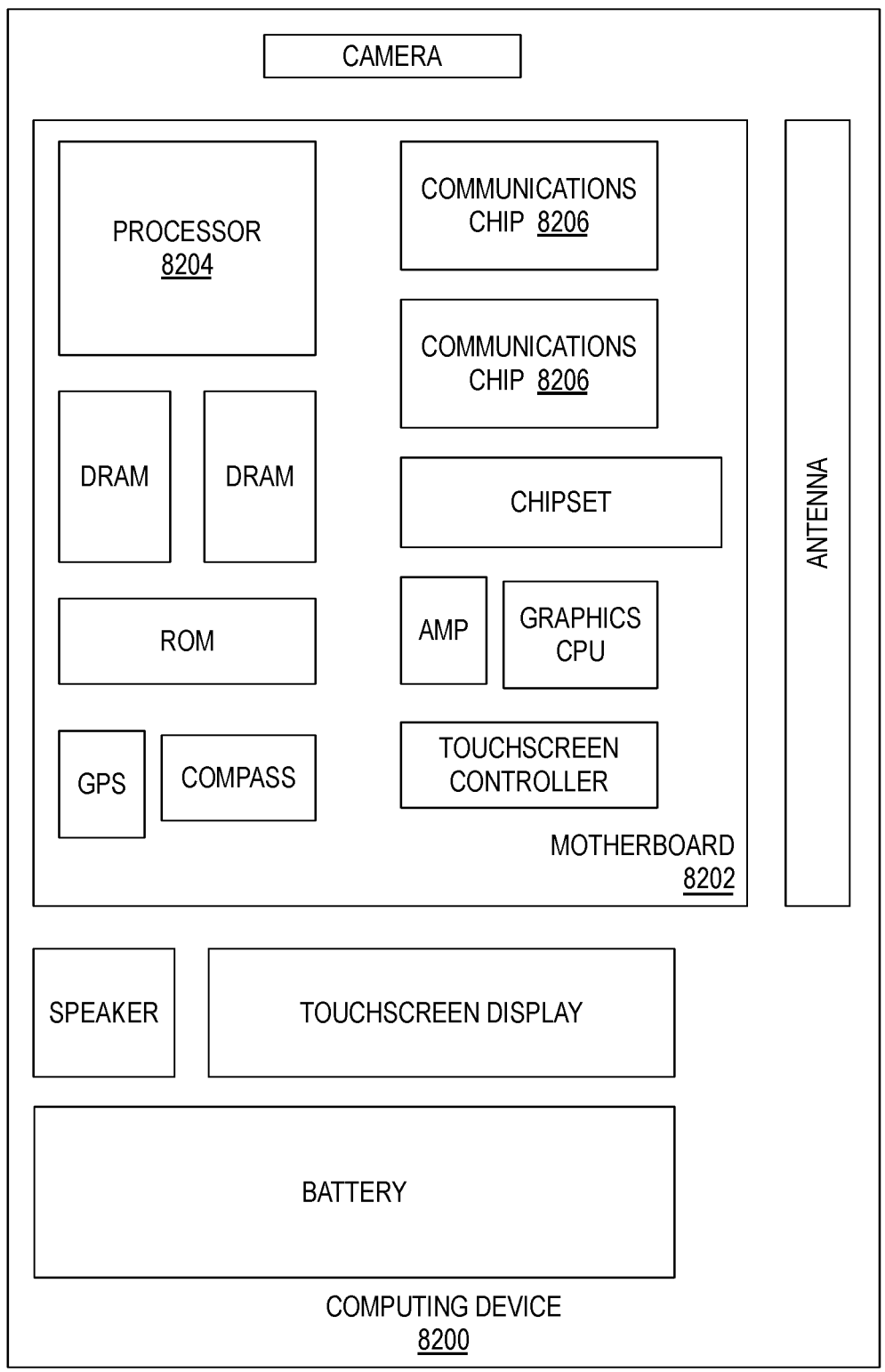
FIG. 82 is a functional block diagram of an electronic computing device, in accordance with some embodiments.

FIG. 82 is a functional block diagram of an electronic computing device, in accordance with some embodiments. Computing device 8200 may be found inside platform 8205 or server machine 8206, for example. Device 8200 further includes a motherboard 8202 hosting a number of components, such as, but not limited to, a processor 8204 (e.g., an applications processor), which may further incorporate at least one device stratum including front-side structures that have been revealed from the back side, for example as described elsewhere herein. Processor 8204 may be physically and/or electrically coupled to motherboard 8202. In some examples, processor 8204 includes an integrated circuit die packaged within the processor 8204. In general, the term "processor" or "microprocessor" may refer to any device or portion of a device that processes electronic data from registers and/or memory to transform that electronic data into other electronic data that may be further stored in registers and/or memory.

In various examples, one or more communication chips 8206 may also be physically and/or electrically coupled to the motherboard 8202. In further implementations, communication chips 8206 may be part of processor 8204. Depending on its applications, computing device 8200 may include other components that may or may not be physically and electrically coupled to motherboard 8202. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 8206 may enable wireless communications for the transfer of data to and from the computing device 8200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 8206 may implement any of a number of wireless standards or protocols, including but not limited to those described elsewhere herein. As discussed, computing device 8200 may include a plurality of communication chips 8206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first examples, a transistor structure comprises one or more bodies adjacent to a field isolation dielectric, the bodies comprising semiconductor. One or more gate stack is disposed adjacent to a sidewall of the bodies, the gate stack including a gate dielectric and a gate electrode. The structure comprises a source and drain coupled to the bodies, a front-side interconnect metallization level coupled to at least one of the source, drain or gate electrode, and disposed over a first side of the bodies and a first side of the field isolation dielectric. The structure comprises a back-side isolation dielectric disposed on a second side of the bodies and on a second side of the field isolation dielectric, opposite the first side, wherein the back-side isolation dielectric has a relative permittivity below 3.9.

In one or more second examples, for any of the first examples the back-side isolation dielectric has a relative permittivity below that of any material layer in the field isolation dielectric.

In one or more third examples, for any of the first through second examples the back-side isolation dielectric is in direct contact with a surface of the bodies that is substantially planar with a surface of the isolation dielectric in direct contact with the back-side isolation dielectric.

In one or more fourth examples, for any of the first through third examples the front-side interconnect metallization level is a level in a front-side back-end interconnect metallization stack comprising a plurality of interconnect metallization levels separated from the bodies, or from each other, by at least one layer of the same material as the back-side isolation dielectric.

In one or more fifth examples, for any of the first through fourth examples the back-side isolation dielectric comprises at least one of SiOC, SiOCH, HSQ, or MSQ.

In one or more sixth examples, for any of the first through fifth examples the back-side isolation dielectric is within a back-side trench landing on the second side of the bodies.

In one or more seventh examples, for any of the first through sixth examples the back-side isolation dielectric is further disposed on a sidewall of the gate stack, separating the gate stack from the source and drain.

In one or more eighth examples, for any of the seventh examples the back-side isolation dielectric is further disposed on a sidewall of the bodies.

In one or more ninth examples, for any of the first through eighth examples the structure further comprises a void separating the gate stack from the source and drain, the void occluded by the back-side isolation dielectric.

In one or more tenth examples, a transistor structure comprises one or more bodies adjacent to a field isolation dielectric, the bodies comprising a semiconductor material. The structure comprises one or more gate stack disposed adjacent to a sidewall of the bodies, a source and drain coupled to the bodies, a front-side interconnect metallization level coupled to the source, drain, or gate stack, and disposed over a first side of the bodies and the field isolation dielectric. The structure comprises a back-side interconnect metallization level disposed on a second side of the bodies and the field isolation dielectric, opposite the first side, wherein the back-side interconnect metallization level has a different composition than the front-side interconnect metallization level.

In one or more eleventh examples, for any of the tenth examples the front-side interconnect metallization level is predominantly copper and the back-side interconnect metallization is predominantly other than copper, or the front-side interconnect metallization level is predominantly other than copper and the back-side interconnect metallization is predominantly copper.

In one or more twelfth examples, for any of the tenth through eleventh examples the structure further comprises source or drain semiconductor disposed within a back-side trench in the field isolation dielectric, the trench landing on the second side of the bodies.

In one or more thirteenth examples, for any of the tenth through twelfth examples the trench has a longitudinal length less than that of the bodies and a transverse width substantially equal to that of the bodies.

In one or more fourteenth examples, a structure comprises one or more bodies comprising a monocrystalline semiconductor material adjacent to an isolation dielectric. The structure comprises one or more gate stack disposed adjacent to a sidewall of the bodies, and a source and a drain comprising semiconductor coupled to the bodies. The structure comprises a back-side device layer disposed over a back-side surface of the bodies not contacted by the gate stack, wherein the back-side device layer comprises a semiconductor material having a different composition than that of the bodies. The structure comprises a back-side device terminal electrically coupled to the back-side device layer.

In one or more fifteenth examples, for any of the fourteenth examples the structure comprises a field effect transistor (FET) stacked over a thin film transistor (TFT), the back-side device layer further comprises a gated semiconductor portion of the TFT, and the back-side device terminal further comprises a source or drain of the TFT that is coupled to the second gated semiconductor portion.

In one or more sixteenth examples, for any of the fifteenth examples the back-side device layer comprises a polycrystalline or amorphous semiconductor.

In one or more seventeenth examples, for any of the sixteenth examples the metal oxide comprises IZGO.

In one or more eighteenth examples, for any of the fifteenth through seventeenth examples the TFT further comprises a tunneling FET (TFET) including two or more polycrystalline or amorphous semiconductors.

In one or more nineteenth examples, for any of the fifteenth through eighteenth examples an intervening back-side isolation dielectric is disposed between the bodies and the back-side device layer, wherein the back-side isolation dielectric has a relative permittivity below 3.9.

In one or more twentieth examples, a method of fabricating a transistor structure comprises receiving a donor substrate comprising a first device layer disposed over a back-side carrier layer, the first device layer comprising a semiconductor material. The method comprises forming one or more first device layer features in the first device layer with a field isolation dielectric adjacent to a sidewall of the first device layer features. The method comprises forming a first front-side device terminal coupled to a first device layer feature. The method comprises joining a host substrate with the donor substrate, the host substrate to face the first device layer features on a side opposite the carrier layer. The method comprises revealing a back side of the first device layer features by removing at least a portion of the carrier layer. The method comprises depositing a second device layer on back side of the first device layer features, the second device layer comprising a semiconductor material. The method comprises forming a back-side device terminal coupled to the second device layer.

In one or more twenty-first examples, for any of the twentieth examples the method further comprises depositing a first source or drain comprising semiconductor on the first device layer features, and forming a first contact metal coupled to the first source or drain. Depositing the second device layer further comprises depositing a second source or drain comprising semiconductor, and forming the back-side device terminal further comprises forming a second contact metal coupled to the first source or drain.

In one or more twenty-second examples, for any of the twentieth through twenty-first examples forming the first device layer features further comprises forming a first transistor channel. Forming the first front-side device terminal further comprises forming a first gate electrode. Depositing the back-side device layer further comprises depositing a second transistor channel semiconductor. Forming the back-side device terminal further comprises forming a second gate electrode over the second transistor channel.

In one or more twenty-third examples, for any of the twenty-second examples the method further comprises forming a source or drain contact to the first device layer, and forming a source or drain contact to the second device layer.

In one or more twenty-fourth examples a method of fabricating a transistor structure comprises forming one or more transistor device regions from a semiconductor device layer of a substrate. The method comprises fabricating, over a first side of the semiconductor device layer, a front-side stack comprising one or more interconnect metallization level. The method comprises revealing at least a portion of a second side of the semiconductor device layer or transistor device regions, opposite the first side, by removing or thinning one or more layer of the substrate. The method comprises forming a back-side isolation dielectric layer over the revealed second side of the semiconductor device layer or transistor device regions, wherein the back-side isolation dielectric layer has a relative permittivity below 3.9.

In one or more twenty-fifth examples, for any of the twenty-fourth examples the back-side isolation dielectric layer comprises at least one of SiOC, SiOCH, HSQ, or MSQ.

In one or more twenty-sixth examples, for any of the twenty-fourth through twenty-fifth examples fabricating the front-side stack further comprises depositing an inter-level dielectric (ILD) layer comprising a low-k dielectric material having a relative permittivity below 3.9, and forming the back-side isolation dielectric layer further comprises depositing the low-k dielectric material over the revealed second side of the field isolation dielectric and the semiconductor device layer or transistor device regions.

In one or more twenty-seventh examples, for any of the twenty-fourth through twenty-sixth examples forming the back-side isolation dielectric layer further comprises converting a portion of the device layer into a dielectric material.

In one or more twenty-eighth examples, for any of the twenty-fourth through twenty-seventh examples the device layer comprises silicon, and forming the back-side isolation dielectric layer further comprises converting a portion of the silicon into silicon dioxide with a thermal or plasma-enhanced oxidation process.

In one or more twenty-ninth examples, for any of the twenty-fourth through twenty-eighth examples forming the one or more transistor device regions further comprises patterning the device layer into a plurality of bodies, and depositing a field isolation dielectric between the bodies, wherein the field isolation dielectric has a different material composition than the back-side isolation dielectric.

In one or more thirtieth examples, for any of the twenty-ninth examples the back-side isolation dielectric has a lower relative permittivity than the field isolation dielectric.

In one or more thirty-first examples, for any of the twenty-ninth examples revealing at least a portion of the second side of the semiconductor device layer or transistor device regions further comprises recess etching the second side of the semiconductor device layer selectively to the field isolation dielectric to form a trench aligned with each of the r bodies, and forming the back-side isolation dielectric further comprises back-filling the trenches with the back-side isolation dielectric.

In one or more thirty-second examples, for any of the twenty-fourth through thirty-first examples the transistor device regions comprise semiconductor fins, and revealing at least a portion of the second side of the transistor device regions further comprises etching a dielectric spacer selectively from a sidewall of the semiconductor fins.

In one or more thirty-third examples, for any of the thirty-second examples etching the dielectric spacer further comprises etching the dielectric spacer from a sidewall of a gate stack disposed over a sidewall of the semiconductor fin.

In one or more thirty-fourth examples, for any of the thirty-second examples the method further comprises replacing the dielectric spacer by backfilling a recess formed by etching the dielectric spacer, the backfilling comprising deposition of one or more dielectric materials having a relative permittivity lower than that of the dielectric spacer.

In one or more thirty-fifth examples, for any of the twenty-fourth through thirty-fourth examples the backfilling comprises deposition of one or more dielectric materials having a relative permittivity below 3.9

In one or more thirty-sixth examples, for any of the thirty-fifth examples the backfilling comprises deposition of one or more dielectric materials selected from the group consisting of SiOC, SiOCH, HSQ, or MSQ.

In one or more thirty-seventh examples, for any of the thirty-second examples the method further comprises replacing the dielectric spacer with a void by occluding a recess formed by the dielectric spacer etching with a non-conformally deposited dielectric material.

In one or more thirty-eighth examples, a method of fabricating an integrated circuit (IC), comprises receiving a substrate comprising a front-side device layer disposed over a back-side layer, the device layer including a first device region of a first device and a second device region of a second device. The method comprises revealing a back-side of the first device region selectively to the second device region by removing at least a partial thickness of the back-side layer. The method comprises forming a material over the revealed first device region.

In one or more thirty-ninth examples, for any of the thirty-eighth examples the first device is a planar transistor and the second device is a non-planar transistor.

In one or more fortieth examples for any of the thirty-eighth through thirty-ninth examples the first device is an n-type transistor and the second device is a p-type transistor.

In one or more forty-first examples for any of the thirty-eighth through fortieth examples the first device is one of a logic transistor, a memory transistor, or a power transistor and the second device is a different one of a logic transistor, a memory transistor, or a power transistor.

In one or more forty-second examples for any of the thirty-eighth through forty-first examples the first and second devices are provided within the same cell of the integrated circuit.

In one or more forty-third examples for any of the thirty-eighth through forty-second examples the first and second device are provided within different cells of the integrated circuit.

In one or more forty-fourth examples for any of the thirty-eighth through forty-third examples the first and second device regions comprise at least one of a channel semiconductor or a source/drain semiconductor.

In one or more forty-fifth examples for any of the thirty-eighth through forty-fourth examples revealing the first device region selectively to the second device region comprises forming a patterned mask over the back-side layer, the patterned mask protecting a back-side of the second device region, and etching a recess in unmasked portions of the back-side layer to expose the first device region.

In one or more forty-sixth examples for any of the thirty-eighth through forty-fifth examples revealing the first device region selectively to the second device region comprises performing a full back-side removal of a first thickness of the back-side layer to reveal an intervening layer comprising two or more materials adjacent to the front-side semiconductor device layer, and etching a first intervening layer material selectively to the second intervening material layer material to expose the first device region.

In one or more forty-seventh examples for any of the thirty-eighth through forty-sixth examples the first and second devices regions have non-planar backside surfaces, and revealing the first device region selectively to the second device region comprises removing a thickness of the back-side layer across both the first device region and the second device region in a planarized manner to reveal the back-side of the first device region without revealing the back-side of the second device region.

In one or more forty-eighth examples, a method of fabricating an integrated circuit (IC) comprises receiving a donor substrate comprising a front-side semiconductor device layer disposed over a back-side carrier layer with an intervening layer disposed there between. The method comprises fabricating a device having one or more semiconductor regions from the device layer. The method comprises joining a host substrate with the donor substrate, the host substrate to face the device layer on a side opposite the carrier layer. The method comprises revealing the device layer or the one or more device regions formed in the device layer by removing at least a portion of the carrier layer and the intervening layer. The method comprises depositing a non-native material over the revealed device layer or semiconductor regions.

In one or more forty-ninth examples, for any of the forty-eighth examples removing at least the portion of the carrier layer comprises at least one of chemical mechanical polishing (CMP) through a thickness of the carrier layer to expose the intervening layer, plasma etching through a thickness of the carrier layer to expose the intervening layer, or wet chemical etching through a thickness of the carrier layer to expose the intervening layer.

In one or more fiftieth examples, for any of the forty-ninth examples removing at least a portion of the carrier layer further comprises cleaving the carrier layer along a fracture plane substantially parallel to the intervening layer prior to polishing or etching through a remaining thickness of the carrier layer to expose the intervening layer.

In one or more fifty-first examples, for any of the forty-ninth through fiftieth examples removing at least a portion of the intervening layer further comprises etching or polishing through the intervening layer to expose the back side of the device layer.

In one or more fifty-second examples, for any of the fifty-first examples revealing the one or more device regions in the device layer further comprises etching or polishing through a thickness of the device layer disposed between the intervening layer and the one or more device regions.

In one or more fifty-third examples, for any of the forty-eighth through fifty-second examples the intervening layer comprises a marker detectable during the removal of the carrier.

In one or more fifty-fourth examples, for any of the fifty-third examples the intervening layer comprises an etch stop layer, and the removing of the carrier is selective to the carrier relative to the etch stop layer.

In one or more fifty-fifth examples, for any of the fifty-third examples detecting the marker by monitoring for a change in one or more of: optical absorbance or emission during a polishing or an etching of a back-side surface of the donor substrate; optical absorbance or emission of byproducts during a polishing or an etching of a back-side surface of the donor substrate; mass of species in byproducts of an etching of a back-side surface of the donor substrate; or friction between a back-side surface of the donor substrate and a polishing surface in contact with the back-side surface of the donor substrate.

In one or more fifty-sixth examples, for any of the forty-eighth through fifty-fifth examples depositing the non-native material comprises electrically interconnecting one of the device regions by depositing a back-side metal over a back side of at least one of the device regions.

In one or more fifty-seventh examples, for any of the fifty-sixth examples the device comprises a field effect transistor (FET) with a source and a drain separated by a channel semiconductor. The one or more device regions include the channel semiconductor. A gate electrode stack including a gate electrode and a gate dielectric is over the channel semiconductor. The front-side contact metal is in contact with at least a front side of at least one of the gate electrode, source semiconductor, and drain semiconductor. Electrically interconnecting the device region further comprises revealing a back side of at least one of the source semiconductor and drain semiconductor, gate electrode or front-side contact metal, and depositing the back-side contact metal in contact with at least a back side of at least one the source semiconductor and drain semiconductor, gate electrode or front-side contact metal.

In one or more fifty-eighth examples, for any of the forty-eighth through fifty-seventh examples depositing the non-native material further comprises electrically isolating a back side of the device by depositing a back-side isolation dielectric over a least a portion of the back side of the device layer or one of the device regions.

In one or more fifty-ninth examples, for any of the fifty-eighth examples the device comprises a field effect transistor (FET) with a source and a drain separated by a channel semiconductor. The one or more semiconductor regions include the channel semiconductor. A gate electrode stack including a gate electrode and a gate dielectric is over the channel semiconductor. The front-side contact metal is in contact with at least a front side of at least one of the gate electrode, source semiconductor, and drain semiconductor. Electrically isolating the device region further comprises revealing a back side of at least one of the source semiconductor, channel semiconductor, drain semiconductor, gate electrode or front-side contact metal, and depositing the back-side isolation dielectric in contact with at least a back side of at least one the source semiconductor, channel semiconductor, drain semiconductor, gate electrode or front-side contact metal.

In one or more sixtieth examples, for any of the forty-eighth through fifty-ninth examples depositing the non-native material further comprises depositing a back-side doped semiconductor over a least a portion of the back side of the semiconductor region.

In one or more sixty-first examples, for any of the sixtieth examples the device comprises a field effect transistor (FET) with a source and a drain separated by a channel semiconductor. The one or more device regions in the device layer include the channel semiconductor. A gate electrode stack including a gate electrode and a gate dielectric is over the channel semiconductor. The front-side contact metal is in contact with at least a front side of at least one of the gate electrode, source semiconductor, and drain semiconductor. Electrically interconnecting at least one of the device regions further comprises revealing a back side of at least one of the source semiconductor, channel semiconductor, drain semiconductor, gate electrode or front-side contact metal, and depositing the back-side doped semiconductor in contact with a back side of at least one of the source semiconductor, channel semiconductor, drain semiconductor, or front-side contact metal.

In one or more sixty-second examples, for any of the forty-eighth through sixty-first examples the method further comprises forming the donor substrate, the forming further comprising forming the intervening layer by at least one of epitaxially growing the intervening layer from a surface of the carrier layer or the device layer, implanting a species into at least one of the carrier layer and device layer, or depositing the intervening layer over a surface of the carrier layer or device layer.

In one or more sixty-third examples, for any of the forty-eighth through sixty-second examples the carrier layer comprises a crystalline group IV semiconductor, the intervening layer comprises a first heteroepitaxial crystalline semiconductor, and the device layer comprises a second heteroepitaxial crystalline semiconductor.

In one or more sixty-fourth examples, for any of the sixty-third examples the first heteroepitaxial crystalline semiconductor comprises a first group III-V or first group III-N material disposed within openings of the field isolation dielectric. The second heteroepitaxial crystalline semiconductor comprises either a second group III-V material disposed on the first group III-V material and within the openings of the field isolation dielectric, or a second group III-N material disposed on the first group III-V material and laterally overgrown over the field isolation dielectric.

In one or more sixty-fifth examples, a method of electrical testing a die comprises aligning a back-side structure coupled through a back-side of the die to a first conductive pin of multiple conductive pins of a prober of an electrical test apparatus. The method comprises contacting the first conductive pin to the back-side structure, wherein the back-side structure provides electrical coupling to a transistor terminal of a transistor device. The method comprises executing, while the first conductive pin is contacting the back-side structure, an electrical test algorithm on the die through at least the first conductive pin to generate electrical test data corresponding to the die.

In one or more sixty-sixth examples, for any of the sixty-fifth examples the method further comprises aligning a front-side structure coupled through a front-side of the die to a second conductive pin of multiple conductive pins of a second prober of the electric tester, and contacting, while the first conductive pin is contacting the back-side structure, the second conductive pin to the front-side structure, wherein the front-side structure provides electrical coupling to a second transistor terminal of the transistor device and the electrical test algorithm is executed through the second conductive pin.

In one or more sixty-seventh examples, for any of the sixty-sixth examples the transistor terminal comprises a source terminal and the second transistor terminal comprises a gate terminal or a drain terminal.

In one or more sixty-eighth examples, for any of the sixty-sixth examples the transistor terminal comprises a source terminal and the second transistor terminal comprises a gate terminal, and wherein a third conductive pin of the conductive pins of the second prober contacts a second front-side structure exposed through the die front-side and provides electrical coupling to a drain terminal of the transistor device.

In one or more sixty-ninth examples, for any of the sixty-sixth examples the transistor terminal comprises a gate terminal of the transistor device and the second transistor terminal comprises a source terminal or a drain terminal.

In one or more seventieth examples, for any of the sixty-ninth examples the gate terminal comprises a wrap-around gate terminal and a third conductive pin of the multiple conductive pins of the second prober contacts a second front-side structure exposed through the front-side of the die that provides electrical coupling to the wrap around gate terminal.

In one or more seventy-first examples, for any of the sixty-sixth examples the transistor terminal comprises a first gate terminal of a dual gate transistor device and the second transistor terminal comprises a second gate terminal of the dual gate transistor device.

In one or more seventy-second examples, for any of the sixty-sixth examples the transistor terminal comprises a first gate terminal of a dual gate transistor device and the second transistor terminal comprises a second gate terminal of the dual gate transistor device. A third conductive pin of the second prober contacts a second front-side structure exposed through the front-side of the die that provides electrical coupling to a source terminal of the transistor device. A fourth conductive pin of the second prober contacts a third front-side structure exposed through a front-side of the die that provides electrical coupling to a drain terminal of the transistor device.

In one or more seventy-third examples, for any of the sixty-sixth examples the front-side structure comprises a metallization structure of a first front-side metallization layer and contacting the front-side structure comprises contacting through an opening in a host substrate adjacent to the first front-side metallization layer.

In one or more seventy-fourth examples, for any of the sixty-fifth examples the back-side structure comprises one of a back-side source or drain contact metallization, a back-side gate electrode, or a metallization structure of a back-side metallization stack.

In one or more seventy-fifth examples, for any of the sixty-fifth examples the method further comprises aligning a second back-side structure exposed through a back-side of a second die to a second conductive pin of multiple conductive pins of a second prober of the electric tester contacting, while contacting the first conductive pin to the back-side structure, the second conductive pin to the second back-side structure, wherein the second back-side structure provides electrical coupling to a second transistor terminal of a second transistor device of the second die, and executing, while executing the electrical test algorithm, a second electrical test algorithm on the second die through at least the second conductive pin to generate second electrical test data corresponding to the second die.

In one or more seventy-sixth examples, for any of the sixty-fifth examples the transistor terminal comprises a source terminal and the second transistor terminal comprises a gate terminal.

In one or more seventy-seventh examples, for any of the sixty-fifth examples the method further comprises aligning a second back-side structure to a second conductive pin of the one or more conductive pins of the prober, and contacting, while contacting the first conductive pin to the back-side structure, the second conductive pin to the second back-side structure, wherein the second back-side structure provides electrical coupling to a test device of the die.

In one or more seventy-eighth examples, for any of the seventy-seventh examples the test device comprises a chain of electrically coupled semiconductor fins.

In one or more seventy-ninth examples, a device structure comprises a body, comprising a monocrystalline semiconductor material, adjacent to an isolation dielectric. The structure comprises a gate stack adjacent to a sidewall of the body, the gate stack including a gate electrode separated from the sidewall by a gate dielectric. The structure comprises a source and a drain coupled to the body on opposite sides of the gate stack. The structure comprises a front-side interconnect metallization layer coupled to at least one of the source, drain, or gate electrode. The structure comprises a back-side device layer over a back-side surface of the body, opposite the front-side interconnect metallization layer, wherein the back-side device layer comprises a second semiconductor material having a different composition than that of the body. The structure comprises a back-side device terminal electrically coupled to the back-side device layer.

In one or more eightieth examples, for any of the seventy-ninth examples the structure comprises a first field effect transistor (FET) stacked over a second FET. The second semiconductor material is monocrystalline. A second gate stack is coupled to the second semiconductor material. The back-side device terminal further comprises a source or a drain of the second FET, which is coupled to the second semiconductor material.

In one or more eighty-first examples, for any of the eightieth examples the monocrystalline semiconductor material comprises a first Group IV or Group III-V semiconductor. The second semiconductor material comprises a second Group IV or Group III-V semiconductor.

In one or more eighty-second examples, for any of the eightieth examples the structure further comprises a back-side interconnect metallization layer coupled to the back-side device terminal, wherein the body and the back-side device layer are located between the front-side interconnect metallization layer and the back-side interconnect metallization layer.

In one or more eighty-third examples, for any of the seventy-ninth examples the back-side device terminal is in contact with one of the source or drain of the FET.

In one or more eighty-fourth examples, for any of the seventy-ninth examples the structure comprises a field effect transistor (FET) stacked over a thin film transistor (TFT). The second semiconductor material is polycrystalline or amorphous. A second gate stack is coupled to the second semiconductor material. The back-side device terminal further comprises a source or drain of the TFT, which is coupled to the second semiconductor material.

In one or more eighty-fifth examples, an integrated circuit (IC) structure comprises a transistor body adjacent to a field isolation dielectric, the transistor body comprising a monocrystalline semiconductor material. The IC structure comprises a gate stack adjacent to a sidewall of the body, the gate stack including a gate electrode separated from the sidewall by a gate dielectric. The IC structure comprises a source and a drain coupled to the transistor body on opposite sides of the gate stack. The IC structure comprises a front-side interconnect metallization layer over a first side of the transistor body and the field isolation dielectric, the front-side interconnect metallization layer coupled to a first of the source, drain, or gate electrode. The IC structure comprises a back-side interconnect metallization layer over a second side of the bodies and the field isolation dielectric, the back-side interconnect metallization layer coupled to a second of the source, drain, or gate electrode, and wherein the back-side interconnect metallization layer has a different composition than the front-side interconnect metallization layer.

In one or more eighty-sixth examples, for any of the eighty-fifth examples the front-side interconnect metallization layer comprises a higher proportion of Cu than any metal alloy of the back-side interconnect metallization layer, or the back-side interconnect metallization layer comprises a higher proportion of Cu than any metal alloy of the front-side interconnect metallization layer.

In one or more eighty-seventh examples, for any of the eighty-sixth examples the front-side interconnect metallization layer comprises an alloy of one or more of Ru, Rh, Pd, Ir, Pt, Au, W, Cr, or Co, and the back-side interconnect metallization layer comprises Cu.

In one or more eighty-eighth examples, for any of the eighty-seventh examples the back-side interconnect layer is coupled to the source, the front-side interconnect layer is coupled to the gate electrode, and the back-side interconnect metallization layer comprises features having at least one of larger lateral dimensions or greater thickness than the front-side interconnect metallization layer.

In one or more eighty-ninth examples, a method of fabricating a transistor structure comprises receiving a donor substrate comprising a first device layer disposed over a back-side carrier layer, the first device layer comprising a first semiconductor material. The method comprises forming one or more first device layer features in the first device layer with a field isolation dielectric adjacent to a sidewall of the first device layer features. The method comprises forming a first front-side device terminal coupled to a first device layer feature. The method comprises joining a host substrate with a side of the donor substrate opposite the carrier layer. The method comprises revealing a back side of the first device layer features by removing at least a portion of the carrier layer. The method comprises depositing a second device layer on back side of the first device layer features, the second device layer comprising a second semiconductor material having a different composition than the first. The method comprises forming a back-side device terminal coupled to the second device layer.

In one or more eighty-ninth examples, for any of the eighty-eighth examples the method further comprises depositing a first source or drain comprising semiconductor on the first device layer features, forming a first contact metal coupled to the first source or drain. Depositing the second device layer further comprises depositing a second source or drain comprising semiconductor. Forming the back-side device terminal further comprises forming a second contact metal coupled to the first source or drain.

In one or more ninetieth examples, for any of the eighty-ninth examples forming the first device layer features further comprises forming a first transistor channel. Forming the first front-side device terminal further comprises forming a first gate electrode. Depositing the back-side device layer further comprises depositing a second transistor channel semiconductor. Forming the back-side device terminal further comprises forming a second gate electrode over the second transistor channel.

In one or more ninety-first examples, for any of the ninetieth examples the method further comprises forming a source or drain contact to the first device layer, and forming a source or drain contact to the second device layer.

In one or more ninety-second examples, a method of fabricating an integrated circuit IC strata comprises receiving a donor substrate having a device layer comprising a first semiconductor material. The method comprises fabricating transistors within the device layer. The method comprises forming a front-side interconnect metallization layer, comprising at least a first metal, over a first side of the transistors, the front-side interconnect metallization layer coupled to a first of a source, drain, or gate electrode of one or more of the transistors. The method comprises forming a back-side interconnect metallization layer, comprising at least a second metal, over a second side of the transistors, the back-side interconnect metallization layer coupled to a second of the source, drain, or gate electrode of one or more of the transistors.

In one or more ninety-second examples, for any of the ninety-first examples the host substrate includes a back-side carrier layer, and the method further comprises joining the host substrate with a donor substrate, the host substrate to join with the donor substrate on a side opposite the carrier layer, and revealing a back side of one or more of the transistors by removing at least a portion of the carrier layer.

In one or more ninety-third examples, for any of the ninety-first examples the front-side interconnect metallization layer comprises a higher proportion of Cu than the back-side interconnect metallization layer, or the back-side interconnect metallization layer comprises a higher proportion Cu than the front-side interconnect metallization layer.

In one or more ninety-fourth examples, for any of the ninety-third examples the first metal comprises one or more of Ru, Rh, Pd, Ir, Pt, Au, W, Cr, or Co, and the second metal comprises Cu.

In one or more ninety-fifth examples, for any of the ninety-fourth examples the back-side interconnect layer is coupled to the source, the front-side interconnect layer is coupled to the gate electrode, and the back-side interconnect metallization layer comprises features having at least one of larger lateral dimensions or greater thickness than the front-side interconnect metallization layer.

It will be recognized that principles of the disclosure are not limited to the examples so described, but can be practiced with modification and alteration without departing from the scope of the appended claims. For example the above examples may include specific combinations of features as further provided below.

What is claimed is:

1. A device structure, comprising:
  a body, comprising a monocrystalline semiconductor material, adjacent to an isolation dielectric;
  a gate stack adjacent to a sidewall of the body, the gate stack including a gate electrode separated from the sidewall by a gate dielectric;
  a source and a drain coupled to the body on opposite sides of the gate stack;
  a front-side interconnect metallization layer coupled to at least one of the source, drain, or gate electrode; and
  a back-side device layer over a back-side surface of the body, opposite the front-side interconnect metallization layer, wherein the back-side device layer comprises a second semiconductor material having a different composition than that of the body; and
  a back-side device terminal electrically coupled to the back-side device layer, wherein:
    the structure comprises a first field effect transistor (FET) stacked over a second FET;
    the second semiconductor material is monocrystalline;
    a second gate stack is coupled to the second semiconductor material; and
    the back-side device terminal further comprises a source or a drain of the second FET, which is coupled to the second semiconductor material.

2. The structure of claim 1, wherein:
  the monocrystalline semiconductor material comprises a first Group IV or Group III-V semiconductor; and
  the second semiconductor material comprises a second Group IV or Group III-V semiconductor.

3. The structure of claim 1, further comprising:
  a back-side interconnect metallization layer coupled to the back-side device terminal, wherein
    the body and the back-side device layer are located between the front-side interconnect metallization layer and the back-side interconnect metallization layer.

4. The structure of claim 1, wherein the back-side device terminal is in contact with one of the source or drain of the FET.

5. The structure of claim 1, wherein
  the back-side interconnect metallization layer has a different composition than the front-side interconnect metallization layer.

6. The structure of claim 5, wherein:
  the front-side interconnect metallization layer comprises an alloy having more Cu than any metal alloy of the back-side interconnect metallization layer, or the back-side interconnect metallization layer comprises an alloy having more Cu than any metal alloy of the front-side interconnect metallization layer.

7. The IC structure of claim 6, wherein the front-side interconnect metallization layer comprises one or more of Ru, Rh, Pd, Jr, Pt, Au, W, Cr, or Co, and the back-side interconnect metallization layer comprises Cu.

8. A device structure, comprising:
  a body, comprising a monocrystalline semiconductor material, adjacent to an isolation dielectric;
  a gate stack adjacent to a sidewall of the body, the gate stack including a gate electrode separated from the sidewall by a gate dielectric;
  a source and a drain coupled to the body on opposite sides of the gate stack;
  a front-side interconnect metallization layer coupled to at least one of the source, drain, or gate electrode; and
  a back-side device layer over a back-side surface of the body, opposite the front-side interconnect metallization layer, wherein the back-side device layer comprises a second semiconductor material having a different composition than that of the body; and
  a back-side device terminal electrically coupled to the back-side device layer, wherein:
    the structure comprises a field effect transistor (FET) stacked over a thin film transistor (TFT);
    the second semiconductor material is polycrystalline or amorphous;
    a second gate stack is coupled to the second semiconductor material; and
    the back-side device terminal further comprises a source or drain of the TFT, which is coupled to the second semiconductor material.

9. An integrated circuit (IC) structure, comprising:
  a transistor body adjacent to a field isolation dielectric, the transistor body comprising a monocrystalline semiconductor material;
  a gate stack adjacent to a sidewall of the body, the gate stack including a gate electrode separated from the sidewall by a gate dielectric;
  a source and a drain coupled to the transistor body on opposite sides of the gate stack;
  a front-side interconnect metallization layer over a first side of the transistor body and the field isolation dielectric, the front-side interconnect metallization layer coupled to a first one of the source, drain, or gate electrode; and
  a back-side interconnect metallization layer over a second side of the body and the field isolation dielectric, the back-side interconnect metallization layer coupled to a second one of the source, drain, or gate electrode, and wherein the front-side interconnect metallization layer comprises an alloy having more Cu than any metal alloy of the back-side interconnect metallization layer, or the back-side interconnect metallization layer comprises an alloy having more Cu than any metal alloy of the front-side interconnect metallization layer.

10. The IC structure of claim 9, wherein the front-side interconnect metallization layer comprises one or more of Ru, Rh, Pd, Jr, Pt, Au, W, Cr, or Co, and the back-side interconnect metallization layer comprises Cu.

11. The IC structure of claim 10, wherein the back-side interconnect layer is coupled to the source, the front-side interconnect layer is coupled to the gate electrode, and the back-side interconnect metallization layer comprises features having at least one of larger lateral dimensions or greater thickness than the front-side interconnect metallization layer.

* * * * *